US012757625B2

(12) United States Patent
Sunwoo et al.

(10) Patent No.: US 12,757,625 B2
(45) Date of Patent: Oct. 6, 2026

(54) LIGHT EMITTING DEVICE

(71) Applicant: Samsung Display Co., Ltd., Yongin-si (KR)

(72) Inventors: Kyoung Sunwoo, Hwaseong-si (KR); Taeil Kim, Hwaseong-si (KR); Junha Park, Gwacheon-si (KR); MinJae Sung, Hwaseong-si (KR); Mun-Ki Sim, Seoul (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 926 days.

(21) Appl. No.: 17/992,745

(22) Filed: Nov. 22, 2022

(65) Prior Publication Data

US 2023/0232715 A1 Jul. 20, 2023

(30) Foreign Application Priority Data

Jan. 17, 2022 (KR) ........................ 10-2022-0006504

(51) Int. Cl.

| | |
|---|---|
| ***H10K 85/30*** | (2023.01) |
| ***H10K 50/15*** | (2023.01) |
| ***H10K 85/60*** | (2023.01) |

(52) U.S. Cl.

CPC ........... *H10K 85/322* (2023.02); *H10K 50/15* (2023.02); *H10K 85/6572* (2023.02); *H10K 85/6574* (2023.02); *H10K 85/6576* (2023.02)

(58) Field of Classification Search

None

See application file for complete search history.

(56) References Cited

U.S. PATENT DOCUMENTS

| | | | |
|---|---|---|---|
| 10,374,166 B2 | 8/2019 | Hatakeyama et al. | |
| 10,680,186 B2 | 6/2020 | Hatakeyama et al. | |
| 10,790,337 B2 | 9/2020 | Jeong et al. | |
| 10,981,938 B2 | 4/2021 | Joo et al. | |
| 11,248,009 B2 | 2/2022 | Hatakeyama et al. | |
| 11,489,124 B2 | 11/2022 | Lee et al. | |
| 11,527,725 B2 | 12/2022 | Kim et al. | |
| 12,568,759 B2 | 3/2026 | Kim et al. | |
| 2019/0207112 A1 | 7/2019 | Hatakeyama et al. | |
| 2019/0214579 A1 | 7/2019 | Seda et al. | |
| 2020/0058885 A1 | 2/2020 | Hong et al. | |
| 2020/0144513 A1 | 5/2020 | Hatakeyama et al. | |
| 2020/0176679 A1 | 6/2020 | Jeong et al. | |
| 2020/0185626 A1 | 6/2020 | Yuuki | |
| 2020/0190115 A1 | 6/2020 | Hatakeyama et al. | |
| 2020/0259097 A1* | 8/2020 | Zink ...................... | C07F 5/027 |
| 2020/0266350 A1 | 8/2020 | Hatakeyama et al. | |
| 2021/0062078 A1 | 3/2021 | Kato et al. | |
| 2021/0066616 A1 | 3/2021 | Fleetham et al. | |
| 2021/0104682 A1 | 4/2021 | Shin et al. | |
| 2021/0175423 A1 | 6/2021 | Kuwabara et al. | |
| 2021/0277026 A1 | 9/2021 | Geum et al. | |
| 2022/0131086 A1 | 4/2022 | Lee et al. | |
| 2022/0158096 A1* | 5/2022 | Fleetham ............... | C09K 11/06 |
| 2022/0209116 A1 | 6/2022 | Pak et al. | |
| 2022/0393111 A1 | 12/2022 | Cho et al. | |
| 2023/0034026 A1 | 2/2023 | Sharifidehsari et al. | |
| 2023/0134165 A1 | 5/2023 | Saito et al. | |
| 2023/0225208 A1 | 7/2023 | Hoshi et al. | |
| 2023/0232715 A1 | 7/2023 | Sunwoo et al. | |
| 2023/0320215 A1 | 10/2023 | Pak et al. | |
| 2023/0403934 A1 | 12/2023 | Oh et al. | |
| 2024/0215445 A1 | 6/2024 | Miyazaki et al. | |

FOREIGN PATENT DOCUMENTS

| | | |
|---|---|---|
| CN | 110407859 A | 11/2019 |
| CN | 111647009 A | 9/2020 |
| CN | 112028912 A | 12/2020 |
| CN | 112490382 A | 3/2021 |
| CN | 112778343 A | 5/2021 |
| CN | 112920211 A | 6/2021 |
| CN | 113135945 A | 7/2021 |
| CN | 114605449 A | 6/2022 |
| CN | 115772185 A | 3/2023 |
| EP | 3109253 A1 | 12/2016 |
| KR | 10-2016-0119683 A | 10/2016 |
| KR | 10-2017-0040418 A | 4/2017 |
| KR | 10-2017-0126888 A | 11/2017 |
| KR | 10-2018-0122298 A | 11/2018 |
| KR | 10-2018-0134850 A | 12/2018 |
| KR | 10-1955647 B1 | 3/2019 |

(Continued)

OTHER PUBLICATIONS

Machine translation of KR-20220098515-A, translation generated Dec. 2025, 14 pages. (Year: 2025).*

Liang, Xiao, et al. "Peripheral amplification of multi-resonance induced thermally activated delayed fluorescence for highly efficient OLEDs." Angew. Chem. Int. Ed. 2018, 57, 11316-11320. (Year: 2018).*

Kondo Yasuhiro et al., "Narrowband deep-blue organic light-emitting diode featuring an organoboron-based emitter", Nature Photonics (2019) vol. 13, Springer Nature, pp. 678-682; https://doi.org/10.1038/s41566-019-0476-5 (6 pages).

Pershin Anton et al., "Highly emissive excitons with reduced exchange energy in thermally activated delayed fluorescent molecules", Nature Communications (2019) 10 (597), Springer Nature (5 pages).

Stavrou, Kleitos et al. "Hot Vibrational States in a High-Performance Multiple Resonance Emitter and the Effect of Excimer Quenching on Organic Light Emitting Diodes" ACS Applied Mater. Interfaces (2021) 13 pages.

(Continued)

*Primary Examiner* — Robert S Loewe

(74) *Attorney, Agent, or Firm* — Womble Bond Dickinson (US) LLP

(57) ABSTRACT

A light emitting device that includes a first electrode, a second electrode facing the first electrode, and an emission layer between the first electrode and the second electrode is provided. The emission layer includes a first compound represented by Formula 1, and at least one of a second compound represented Formula H-1, a third compound represented Formula H-2, or a fourth compound represented Formula D-2, thereby exhibiting improved luminous efficiency characteristics.

20 Claims, 8 Drawing Sheets

(56) References Cited

FOREIGN PATENT DOCUMENTS

| | | | | |
|---|---|---|---|---|
| KR | 10-1955648 | B1 | | 3/2019 |
| KR | 10-1976556 | B1 | | 5/2019 |
| KR | 10-2019-0127529 | A | | 11/2019 |
| KR | 10-2019-0139492 | A | | 12/2019 |
| KR | 10-2053324 | B1 | | 12/2019 |
| KR | 10-2020-0071192 | A | | 6/2020 |
| KR | 10-2128687 | B1 | | 6/2020 |
| KR | 10-2020-0081269 | A | | 7/2020 |
| KR | 10-2020-0091544 | A | | 7/2020 |
| KR | 10-2021-0006554 | A | | 1/2021 |
| KR | 10-2021-0015722 | A | | 2/2021 |
| KR | 10-2021-0019987 | A | | 2/2021 |
| KR | 10-2021-0030888 | A | | 3/2021 |
| KR | 10-2021-0041165 | A | | 4/2021 |
| KR | 10-2021-0041167 | A | | 4/2021 |
| KR | 10-2021-0045339 | A | | 4/2021 |
| KR | 10-2250392 | B1 | | 5/2021 |
| KR | 10-2021-0067946 | A | | 6/2021 |
| KR | 10-2021-0073694 | A | | 6/2021 |
| KR | 10-2021-0134559 | A | | 11/2021 |
| KR | 10-2022-0033994 | A | | 3/2022 |
| KR | 10-2377685 | B1 | | 3/2022 |
| KR | 20220098515 | A | * | 7/2022 ............ C09K 11/06 |
| KR | 10-2473633 | B1 | | 12/2022 |
| WO | WO 2018-212169 | A1 | | 11/2018 |
| WO | WO 2019/003615 | A1 | | 1/2019 |
| WO | WO 2019/132040 | A1 | | 7/2019 |
| WO | WO 2020/022770 | A1 | | 1/2020 |
| WO | WO 2020/108899 | A1 | | 6/2020 |
| WO | WO 2020/200884 | A1 | | 10/2020 |
| WO | WO 2021/013993 | A1 | | 1/2021 |
| WO | WO 2021-014001 | A1 | | 1/2021 |
| WO | WO 2021/049889 | A1 | | 3/2021 |
| WO | WO 2021/199948 | A1 | | 10/2021 |
| WO | WO 2022/078961 | A1 | | 4/2022 |

OTHER PUBLICATIONS

US Office Action dated Dec. 23, 2025, issued in U.S. Appl. No. 18/057,124 (38 pages).
US Notice of Allowance dated Apr. 28, 2026, issued in U.S. Appl. No. 18/122,266 (8 pages).
US Final Office Action dated Jun. 15, 2026, issued in U.S. Appl. No. 18/057,124 (26 pages).

* cited by examiner

LIGHT EMITTING DEVICE

CROSS-REFERENCE TO RELATED APPLICATION

This application claims priority to and the benefit of Korean Patent Application No. 10-2022-0006504, filed on Jan. 17, 2022, the entire content of which is hereby incorporated by reference.

BACKGROUND

1. Field

Aspects of one or more embodiments of the present disclosure relate to a light emitting device, and for example, to a light emitting device including, in an emission layer, a plurality of materials, including a fused polycyclic compound utilized as a luminescent material.

2. Description of the Related Art

Recently, the development of an organic electroluminescence display apparatus as an image display apparatus is being actively conducted. Unlike liquid crystal display apparatuses and/or the like, the organic electroluminescence display apparatus is a self-luminescent display apparatus in which holes and electrons injected from a first electrode and a second electrode recombine in an emission layer, and thus a luminescent material including an organic compound in the emission layer emits light to implement a display (e.g., to display an image).

In the application of an organic electroluminescence device to a display apparatus, there is a demand for an organic electroluminescence device relatively having a low driving voltage, a high luminous efficiency, and a long service life, and the development of materials, for an organic electroluminescence device, capable of stably attaining such characteristics is being continuously required (sought).

For example, recently, in order to accomplish (achieve) an organic electroluminescence device with high efficiency, techniques on phosphorescence emission which uses energy in a triplet state or delayed fluorescence emission which uses the generating phenomenon of singlet excitons by the collision of triplet excitons (triplet-triplet annihilation, TTA) are being developed, and development of a material for thermally activated delayed fluorescence (TADF) utilizing delayed fluorescence phenomenon is being conducted.

SUMMARY

An aspect of one or more embodiments of the present disclosure is directed toward a light emitting device in which luminous efficiency and a device service life are improved.

An aspect of one or more embodiments of the present disclosure is directed toward a fused polycyclic compound capable of improving luminous efficiency and a device service life of a light emitting device.

Additional aspects will be set forth in part in the description which follows and, in part, will be apparent from the description, or may be learned by practice of the presented embodiments of the disclosure.

An embodiment of the present disclosure provides a light emitting device including: a first electrode; a second electrode facing the first electrode; and an emission layer between the first electrode and the second electrode, wherein the emission layer includes a first compound represented by Formula 1, and at least one of a second compound represented by Formula H-1, a third compound represented by Formula H-2, or a fourth compound represented by Formula D-2.

Formula 1

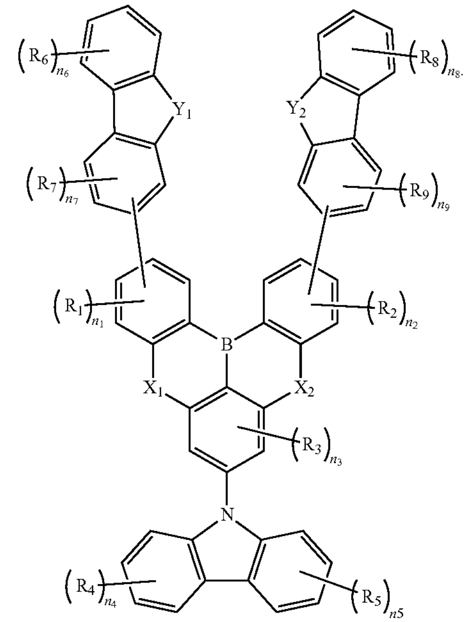

In Formula 1, $X_1$ and $X_2$ may each independently be $NR_a$, O, or S, at least one of $X_1$ or $X_2$ may be $NR_a$, $Y_1$ and $Y_2$ may each independently be $NR_b$, O, or S, $R_1$ to $R_9$ may each independently be a hydrogen atom, a deuterium atom, a halogen atom, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $R_a$ and $R_b$ may each independently be a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $n_1$, $n_2$, $n_7$, and $n_9$ may each independently be an integer from 0 to 3, $n_3$ may be an integer of 0 to 2, and $n_4$ to $n_6$ and $n_8$ may each independently be an integer from 0 to 4.

Formula H-1

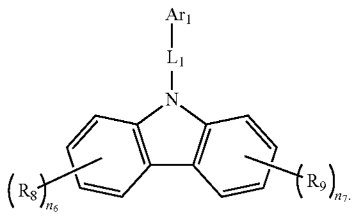

In Formula H-1, $L_1$ may be a direct linkage, a substituted or unsubstituted arylene group having 6 to 30 ring-forming carbon atoms, or a substituted or unsubstituted heteroarylene group having 2 to 30 ring-forming carbon atoms, $Ar_1$ may be a substituted or unsubstituted aryl group having 6 to 30 ring-forming carbon atoms, or a substituted or unsubstituted heteroaryl group having 2 to 30 ring-forming carbon atoms, $R_8$ and $R_9$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $n_6$ and $n_7$ may each independently be an integer of 0 to 4.

Formula H-2

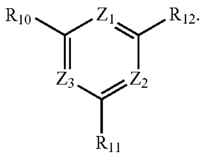

In Formula H-2, at least one selected from among $Z_1$ to $Z_3$ may be N, the rest (i.e., substituents that are not N) are $CR_{16a}$, and $R_{10}$ to $R_{13}$ may each independently be a hydrogen atom, a deuterium atom, a cyano group, a substituted or unsubstituted silyl group, a substituted or unsubstituted aryl group having 6 to 30 ring-forming carbon atoms, or a substituted or unsubstituted heteroaryl group having 2 to 30 ring-forming carbon atoms.

Formula D-2

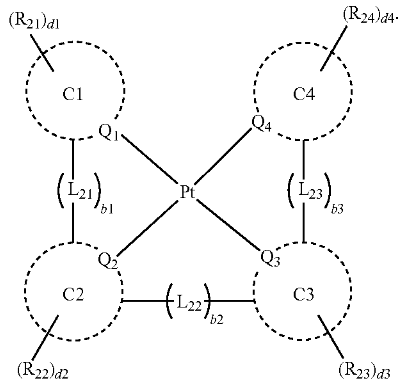

In Formula D-2, $Q_1$ to $Q_4$ may each independently be C or N, C1 to C4 may each independently be a substituted or unsubstituted hydrocarbon ring group having 5 to 30 ring-forming carbon atoms, or a substituted or unsubstituted heterocycle having 2 to 30 ring-forming carbon atoms. $L_{21}$ to $L_{23}$ may each independently be a direct linkage,

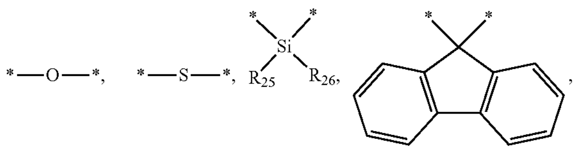

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, b1 to b3 may each independently be 0 or 1, $R_{21}$ to $R_{26}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or are bonded to an adjacent group to form a ring, and d1 to d4 may each independently be an integer from 0 to 4.

In an embodiment, the emission layer may emit delayed fluorescence.

In an embodiment, the emission layer may include the first compound, the second compound, and the third compound.

In an embodiment, the emission layer may include the first compound, the second compound, the third compound, and the fourth compound.

In an embodiment, the emission layer may emit light having a luminescence center wavelength of about 430 nm to about 490 nm.

In an embodiment, the first compound represented by Formula 1 may be represented by Formula 2-1 or Formula 2-2:

Formula 2-1

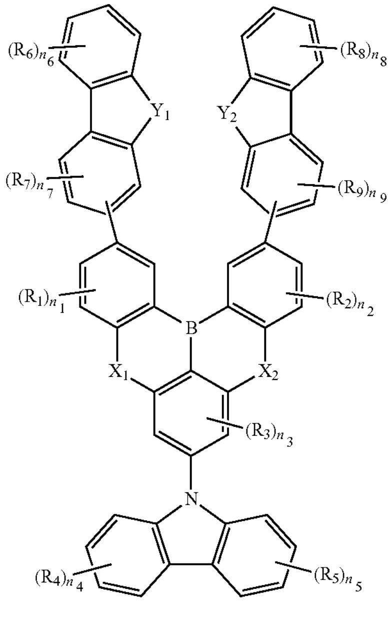

-continued
Formula 2-2
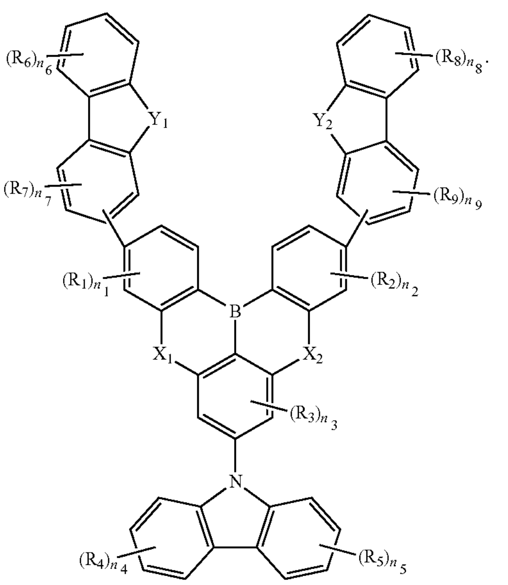
-continued
Formula 3-2
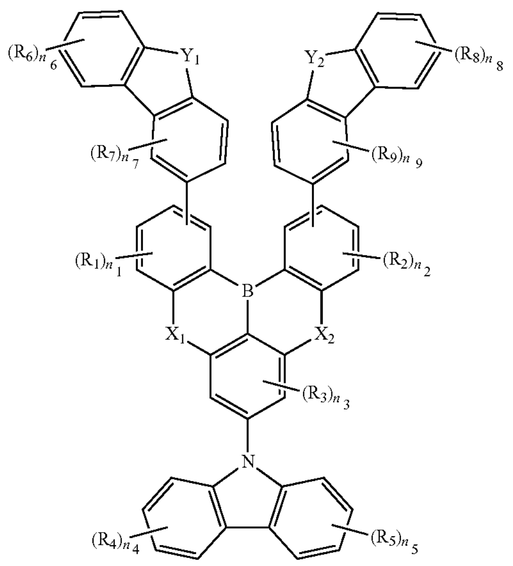
In Formula 2-1 and Formula 2-2, the same as described in Formula 1 may be applied to $X_1$, $X_2$, $Y_1$, $Y_2$, $R_a$, $R_b$, $R_1$ to $R_9$, and $n_1$ to $n_9$.
Formula 3-1
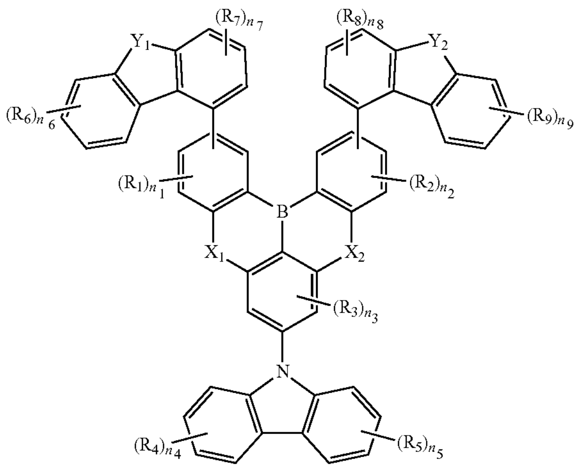
Formula 3-3
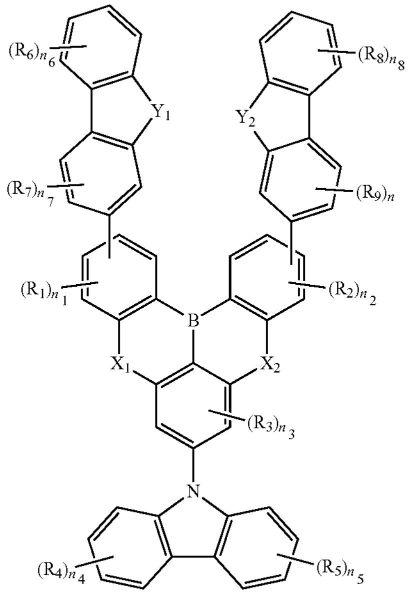

-continued

Formuls 3-4

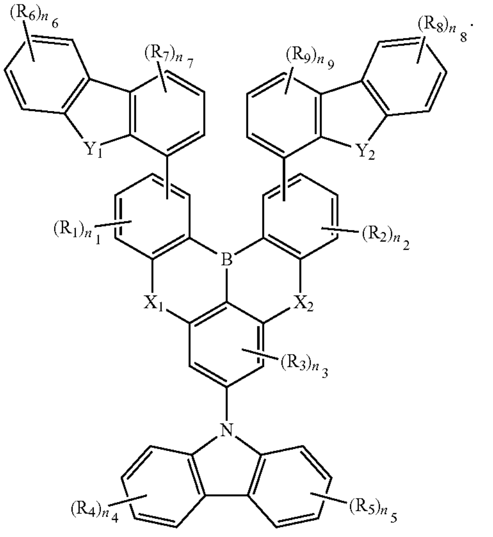

In an embodiment, the first compound represented by Formula 1 may be represented by any one selected from among Formula 3-1 to Formula 3-4:

In Formula 3-1 to Formula 3-4, the same as described in Formula 1 may be applied to $X_1$, $X_2$, $Y_1$, $Y_2$, $R_a$, $R_b$, $R_1$ to $R_9$, and $n_1$ to $n_9$.

In an embodiment, the first compound represented by Formula 1 may be represented by any one selected from among Formula 4-1 to Formula 4-3:

Formula 4-1]

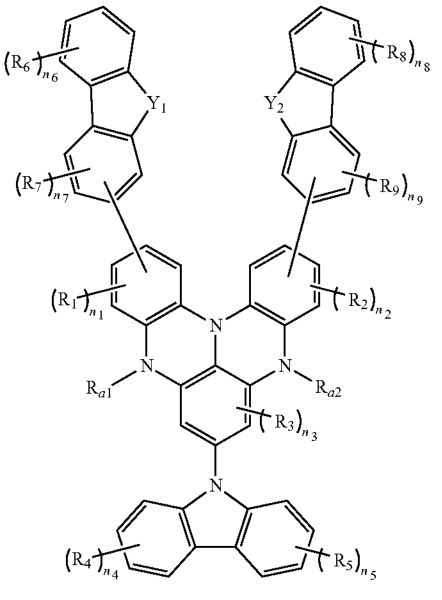

-continued

Formula 4-2

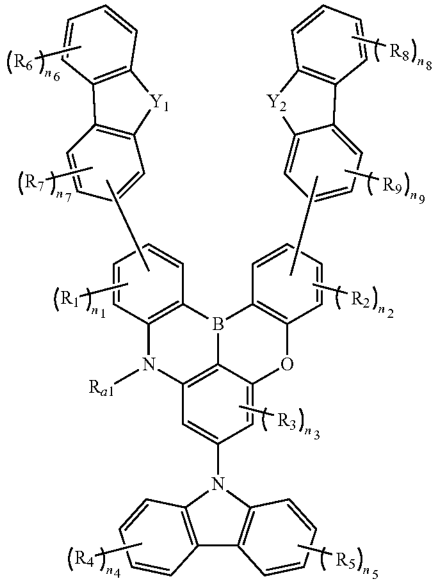

Formula 4-3

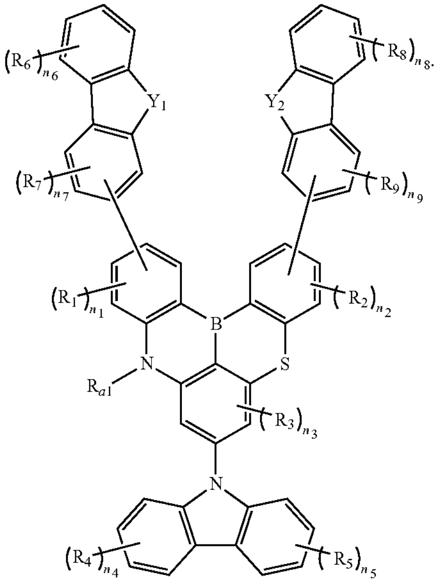

In Formula 4-1 to Formula 4-3, $R_{a1}$ and $R_{a2}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 4-1 to Formula 4-3, the same as described in Formula 1 may be applied to $Y_1$, $Y_2$, $R_a$, $R_b$, $R_1$ to $R_9$, and $n_1$ to $n_9$.

In an embodiment, the first compound represented by Formula 1 may be represented by any one selected from among Formula 5-1 to Formula 5-3:

Formula 5-1

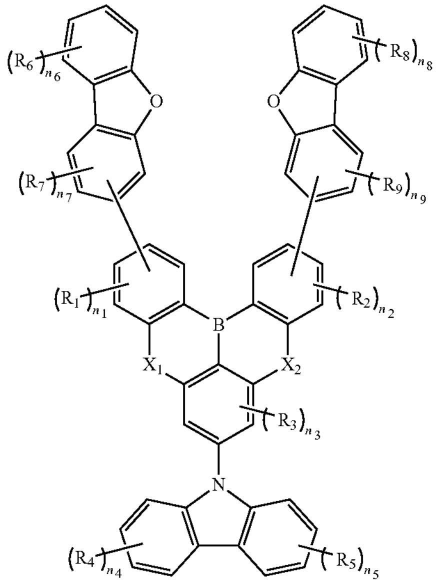

Formula 5-2

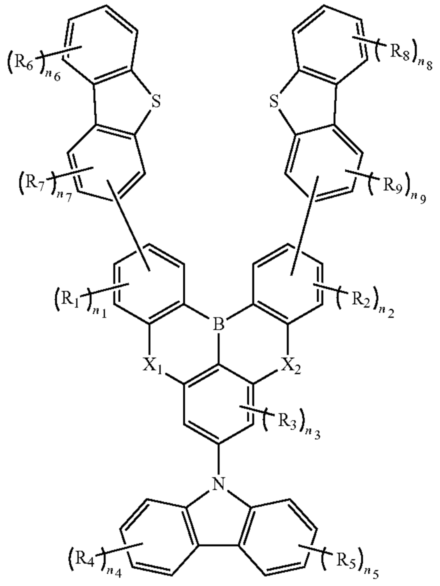

-continued

Formula 5-3

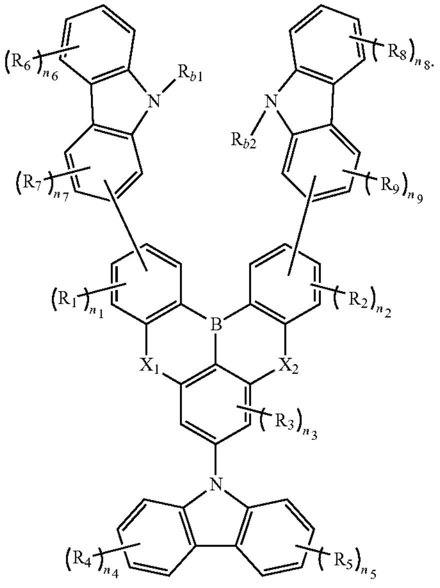

In Formulae 5-1 to 5-3, $R_{b1}$ and $R_{b2}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formulae 5-1 to 5-3, the same as described in Formula 1 may be applied to $X_1$, $X_2$, $R_a$, $R_b$, $R_1$ to $R_9$, and $n_1$ to $n_9$.

In an embodiment, in Formula 1, when each of $X_1$ and $X_2$ is $NR_a$, $R_a$ may be represented by any one selected from among Formulae 6-1 to 6-4:

Formula 6-1

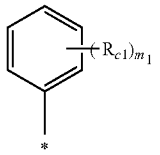

Formula 6-2

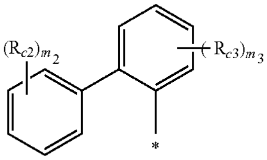

Formula 6-3

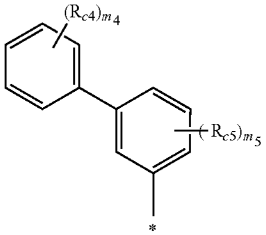

-continued

Formula 6-4

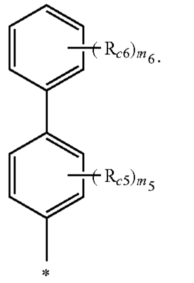

In Formula 6-1 to Formula 6-4, $R_{c1}$ to $R_{c7}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $m_1$, $m_2$, $m_4$, and $m_6$ may each independently be an integer of 0 to 5, $m_3$, $m_5$, and $m_7$ may each independently be an integer from 0 to 4, and "——* *" is a position linked to a nitrogen atom.

In an embodiment, $R_1$ to $R_9$ may each independently be a hydrogen atom, a deuterium atom, a substituted or unsubstituted t-butyl group, or a substituted or unsubstituted phenyl group.

In an embodiment, the light emitting device may further include a capping layer on the second electrode, wherein the capping layer may have a refractive index of about 1.6 or more.

In an embodiment of the present disclosure, a light emitting device includes a first electrode, a hole transport region on the first electrode, an emission layer on the hole transport region, an electron transport region on the emission layer, and a second electrode on the electron transport region, wherein the emission layer includes the first compound represented by Formula 1, and the hole transport region includes a hole transport compound represented by Formula H-a:

Formula H-a

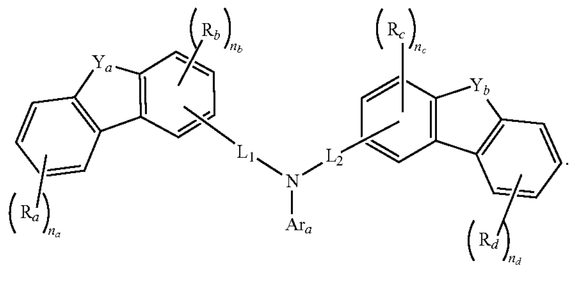

In Formula H-1, $Y_a$ and $Y_b$ may each independently be $CR_eR_f$, $NR_g$, O, or S, $Ar_a$ may be a substituted or unsubstituted aryl group having 6 to 30 ring-forming carbon atoms, or a substituted or unsubstituted heteroaryl group having 2 to 30 ring-forming carbon atoms, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms, $R_a$ to $R_g$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroayl group having 2 to 30 ring-forming carbon atoms, and/or bonded to an adjacent group to form a ring, $n_a$ and $n_d$ may each independently be an integer from 0 to 4, and $n_b$ and ne may each independently be an integer from 0 to 3.

In an embodiment of the present disclosure, a fused polycyclic compound is represented by Formula 1.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure.

In the drawings.

Figure 7:
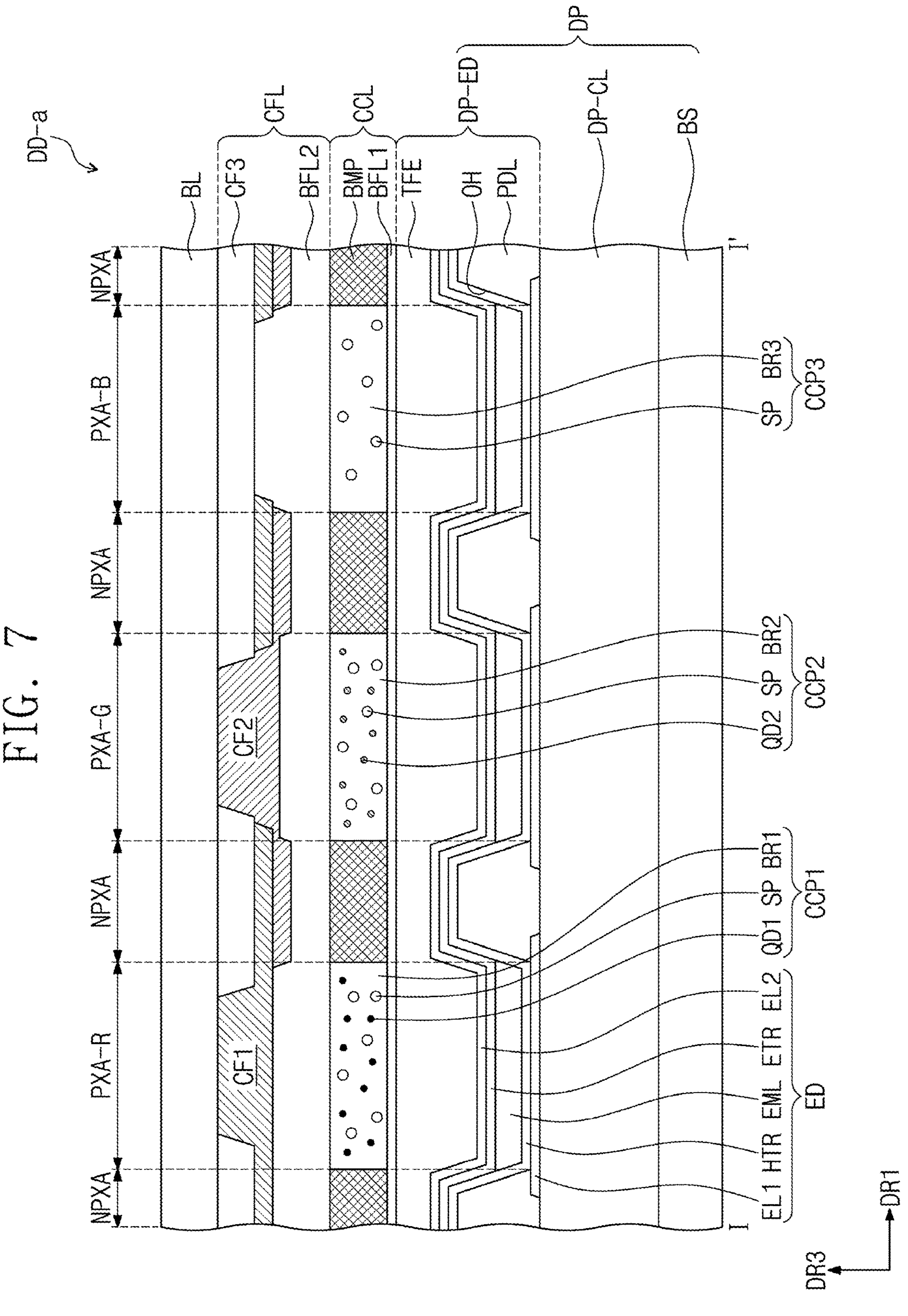
Figure 8:
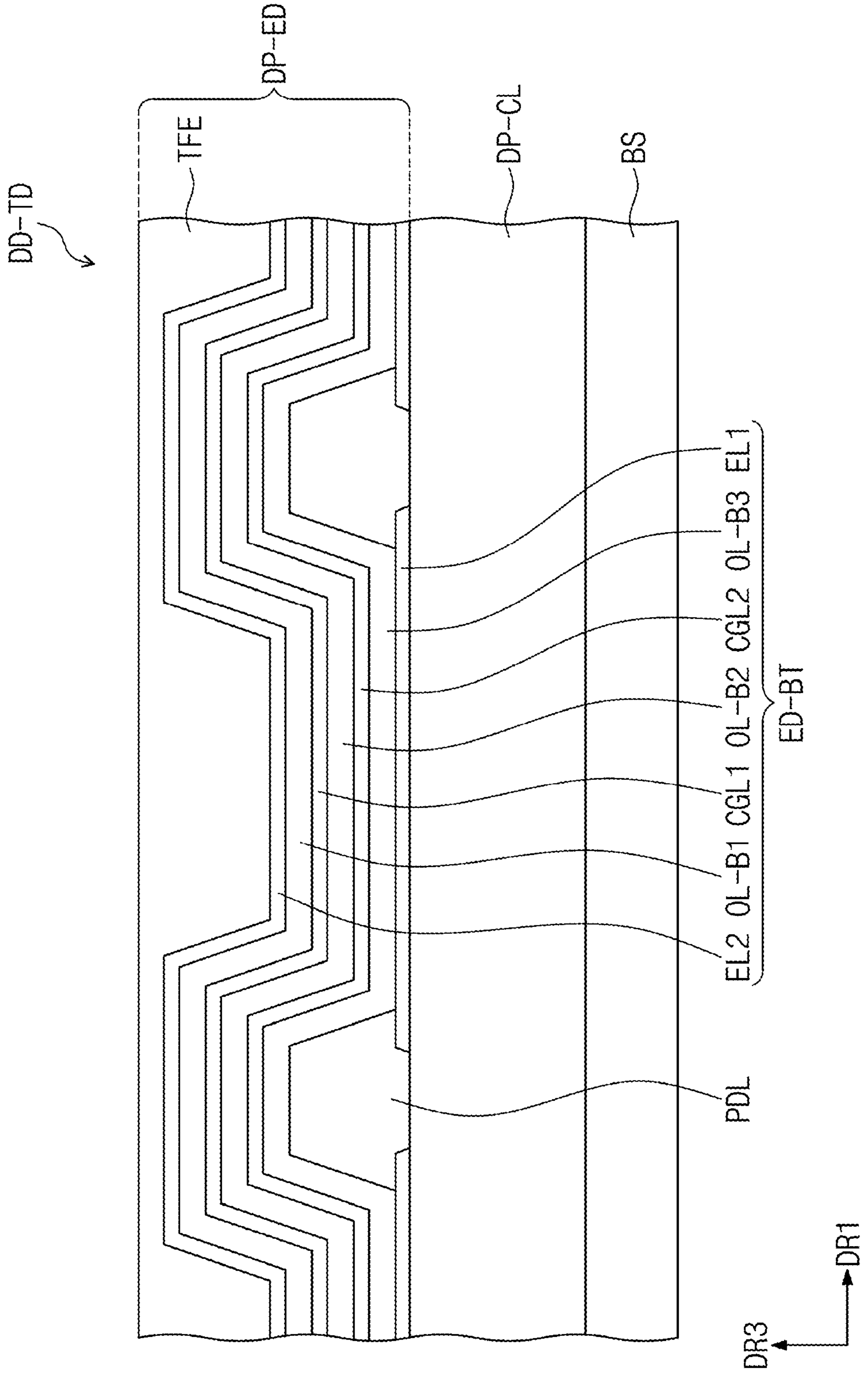
Figure 9:
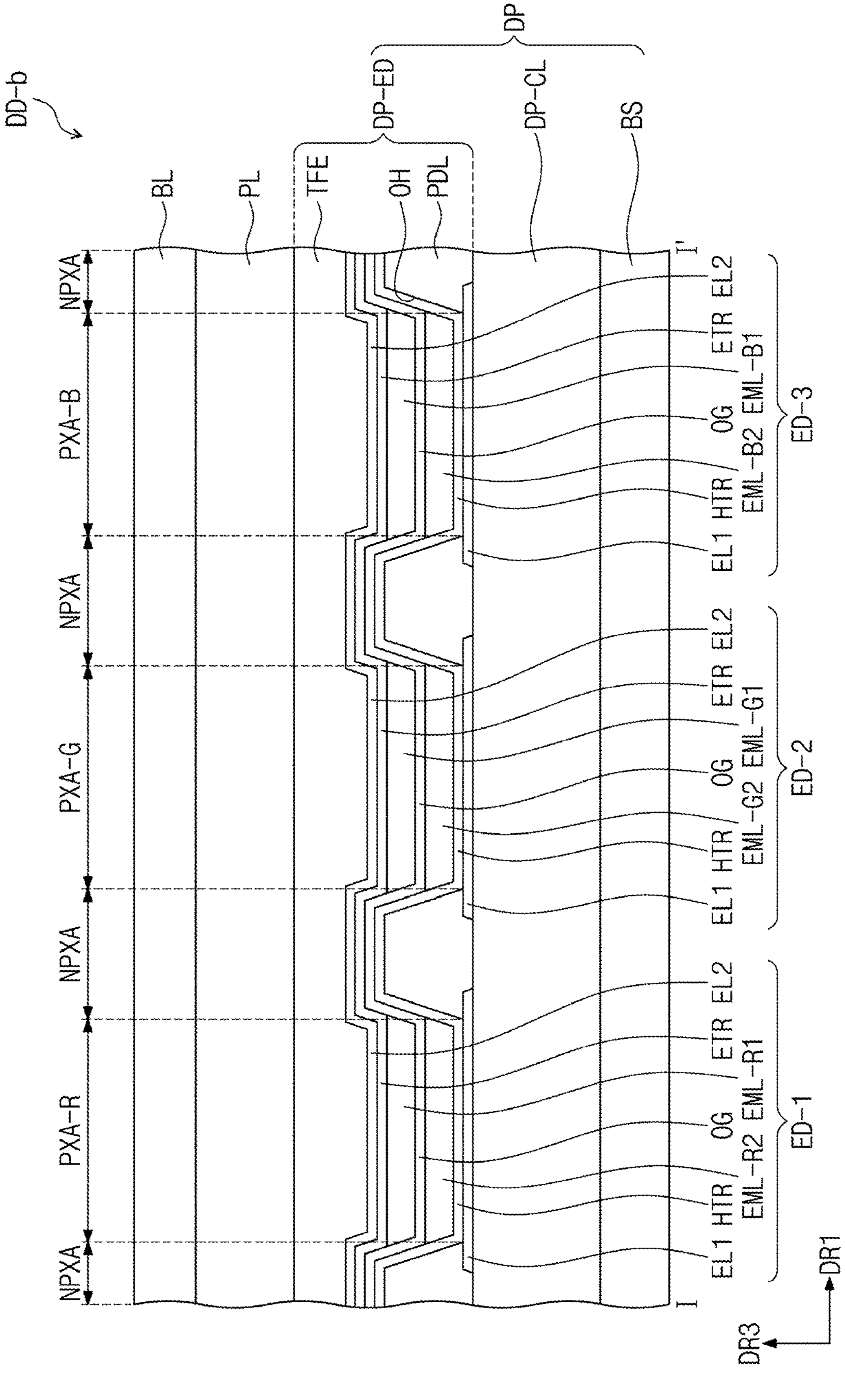
Figure 10:
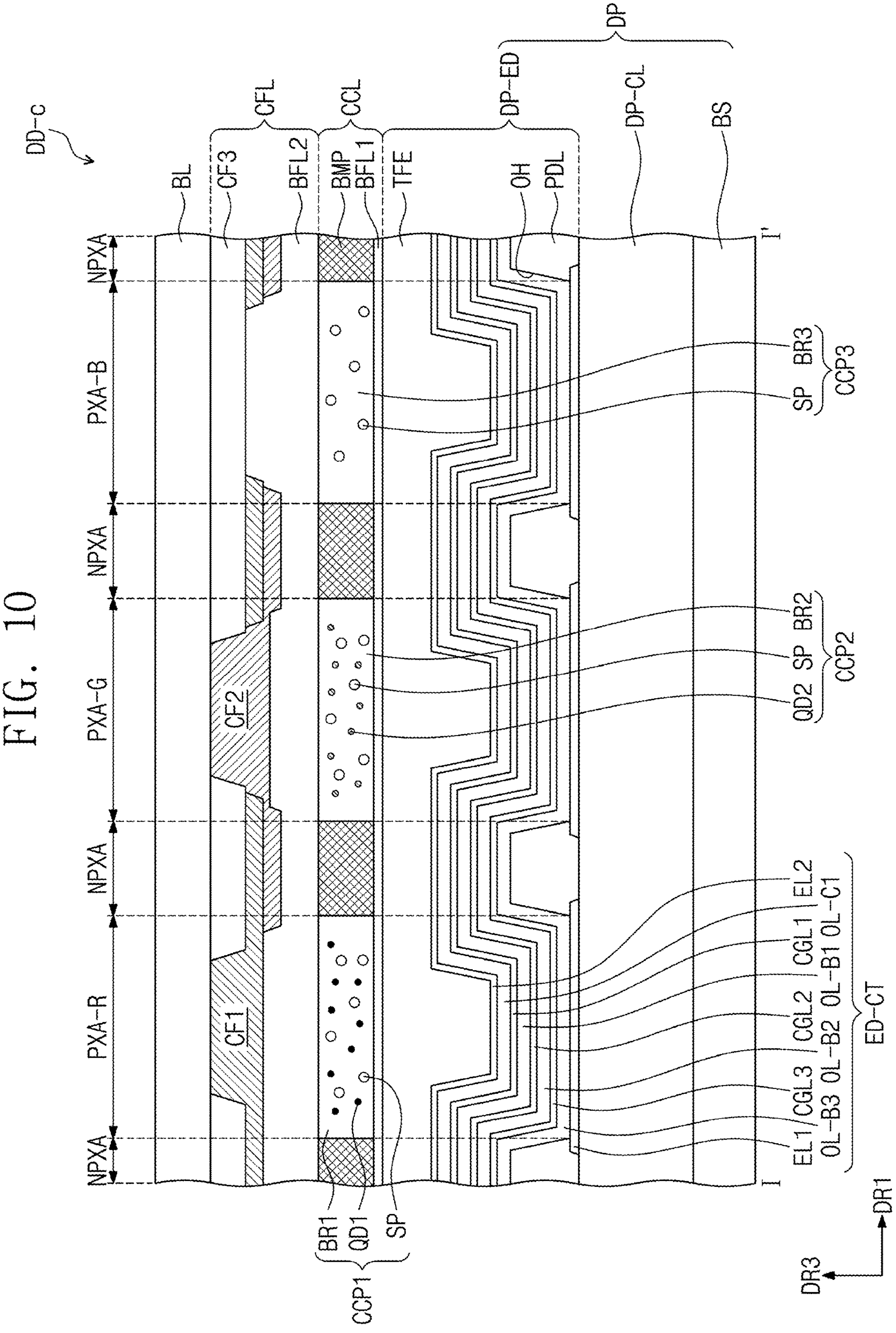

Each of FIGS. 7 and 8 is a cross-sectional view of a display apparatus according to an embodiment;

FIG. 9 is a cross-sectional view illustrating a display apparatus according to an embodiment; and FIG. 10 is a cross-sectional view illustrating a display apparatus according to an embodiment.

DETAILED DESCRIPTION

The present disclosure may be modified in many alternate forms, and thus specific embodiments will be exemplified in the drawings and described in this text in more detail. It should be understood, however, that it is not intended to limit the present disclosure to the particular forms disclosed, but rather, is intended to cover all modifications, equivalents, and alternatives falling within the spirit and scope of the present disclosure.

When explaining each of drawings, like reference numerals are utilized for referring to like elements. In the accompanying drawings, the dimensions of each structure may be exaggeratingly illustrated for clarity of the present disclosure. It will be understood that, although the terms "first", "second", etc. may be utilized herein to describe one or more suitable elements, these elements should not be limited by these terms. These terms are only utilized to distinguish one element from another. For example, a first element could be termed a second element, and, similarly, a second element could be termed a first element, without departing from the scope of the present disclosure. As utilized herein, the singular forms, "a," "an," and "the" are intended to include the plural forms as well, unless the context clearly indicates otherwise.

In the present disclosure, it will be understood that the terms "include," "have" etc., specify the presence of a feature, a fixed number, a step, an operation, an element, a component, or a combination thereof disclosed in the specification, but do not exclude the possibility of presence or addition of one or more other features, fixed numbers, steps, operations, elements, components, or combination thereof.

In the present disclosure, when a part such as a layer, a film, a region, or a plate is referred to as being "on" or "above" another part, it can be directly on the other part, or an intervening part may also be present. In contrast, when a part such as a layer, a film, a region, or a plate is referred to as being "under" or "below" another part, it can be directly under the other part, or an intervening part may also be present. In some embodiments, it will be understood that when a part is referred to as being "on" another part, it can be disposed above the other part, or disposed under the other part as well.

In the disclosure, the term "substituted or unsubstituted" may refer to substituted or unsubstituted with at least one substituent selected from the group including (e.g., consisting of) a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the substituents exemplified above may be substituted or unsubstituted. For example, a biphenyl group may be interpreted as an aryl group or a phenyl group substituted with a phenyl group.

In the disclosure, the phrase "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and/or an aromatic hydrocarbon ring. The heterocycle includes an aliphatic heterocycle and/or an aromatic heterocycle. The hydrocarbon ring and the heterocycle may be monocyclic or polycyclic. In some embodiments, the rings formed by being bonded to each other may be connected to another ring to form a spiro structure.

In the disclosure, the term "adjacent group" may refer to a substituent substituted for an atom which is directly linked to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. In some embodiments, two methyl groups in 4,5-dimethylphenanthrene may be interpreted as "adjacent groups" to each other.

In the disclosure, examples of the halogen atom may include a fluorine atom, a chlorine atom, a bromine atom, or an iodine atom.

In the disclosure, the alkyl group may be a linear, branched, or cyclic type or kind. The number of carbons in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the embodiment of the present disclosure is not limited thereto.

In the disclosure, a cycloalkyl group may refer to a cyclic alkyl group. The number of carbons in the cycloalkyl group may be 3 to 50, 3 to 30, 3 to 20, or 3 to 12. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptanyl group, a bicyclooctanyl group, a bicyclononanyl group, etc., but the embodiment of the present disclosure is not limited thereto.

In the disclosure, an alkenyl group refers to a hydrocarbon group including at least one carbon double bond in the middle or terminal of an alkyl group having at least two carbon atoms. The alkenyl group may be a linear chain or a branched chain. The carbon number is not limited, but may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

In the disclosure, an aryl group refers to any suitable functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the embodiment of the present disclosure is not limited thereto.

In the disclosure, the fluorenyl group may be substituted, and two substituents may be bonded to each other to form a spiro structure. Examples of embodiments in which the fluorenyl group is substituted are as follows. However, the embodiment of the present disclosure is not limited thereto.

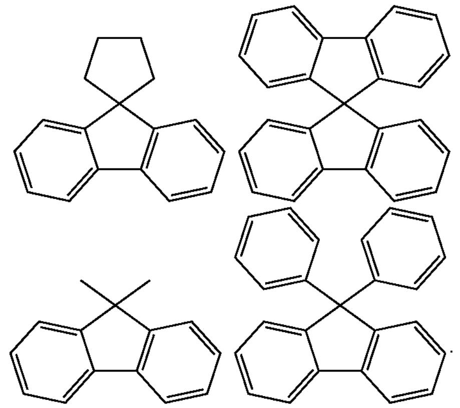

In the disclosure, the heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heterocyclic group or polycyclic heterocyclic group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the embodiment of the present disclosure is not limited thereto.

In the disclosure, the above description of the aryl group may be applied to an arylene group except that the arylene group is a divalent group. The above description of the heteroaryl group may be applied to a heteroarylene group except that the heteroarylene group is a divalent group.

In the disclosure, the silyl group includes an alkylsilyl group and/or an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the present disclosure is not limited thereto.

In the disclosure, a thio group may include an alkylthio group and/or an arylthio group. The thio group may refer to a sulfur atom that is bonded to the alkyl group or the aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but the embodiment of the present disclosure is not limited thereto.

In the disclosure, an oxy group may refer to an oxygen atom that is bonded to the alkyl group or the aryl group as defined above. The oxy group may include an alkoxy group and/or an aryl oxy group. The alkoxy group may be a linear chain, a branched chain, or a ring chain. The number of carbon atoms in the alkoxy group is not limited, and may be, for example, 1 to 20 or 1 to 10. Examples of the oxy group include methoxy, ethoxy, n-propoxy, isopropoxy, butoxy, pentyloxy, hexyloxy, octyloxy, nonyloxy, decyloxy, benzyloxy, etc., but the embodiment of the present disclosure is not limited thereto.

The boron group herein may refer to a boron atom that is bonded to the alkyl group or the aryl group as defined above. The boron group includes an alkyl boron group and/or an aryl boron group. Examples of the boron group may include a trimethylboron group, a triethylboron group, a t-butyldimethylboron group, a triphenylboron group, a diphenylboron group, a phenylboron group, etc., but the embodiment of the present disclosure is not limited thereto.

In the disclosure, the number of carbon atoms in an amine group is not limited, and may be 1 to 30. The amine group may include an alkyl amine group and/or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but the embodiment of the present disclosure is not limited thereto.

In the disclosure, the aryl group selected from among an aryloxy group, an arylthio group, an arylsulfoxy group, an arylamino group, an arylboron group, an arylsilyl group, an arylamine group is the same as the examples of the aryl group described above.

In the disclosure, a direct linkage may refer to a single bond.

In some embodiments, "—* *" herein refers to a position to be connected.

Hereinafter, embodiments of the present disclosure will be described in more detail with reference to the accompanying drawings.

Figure 1:
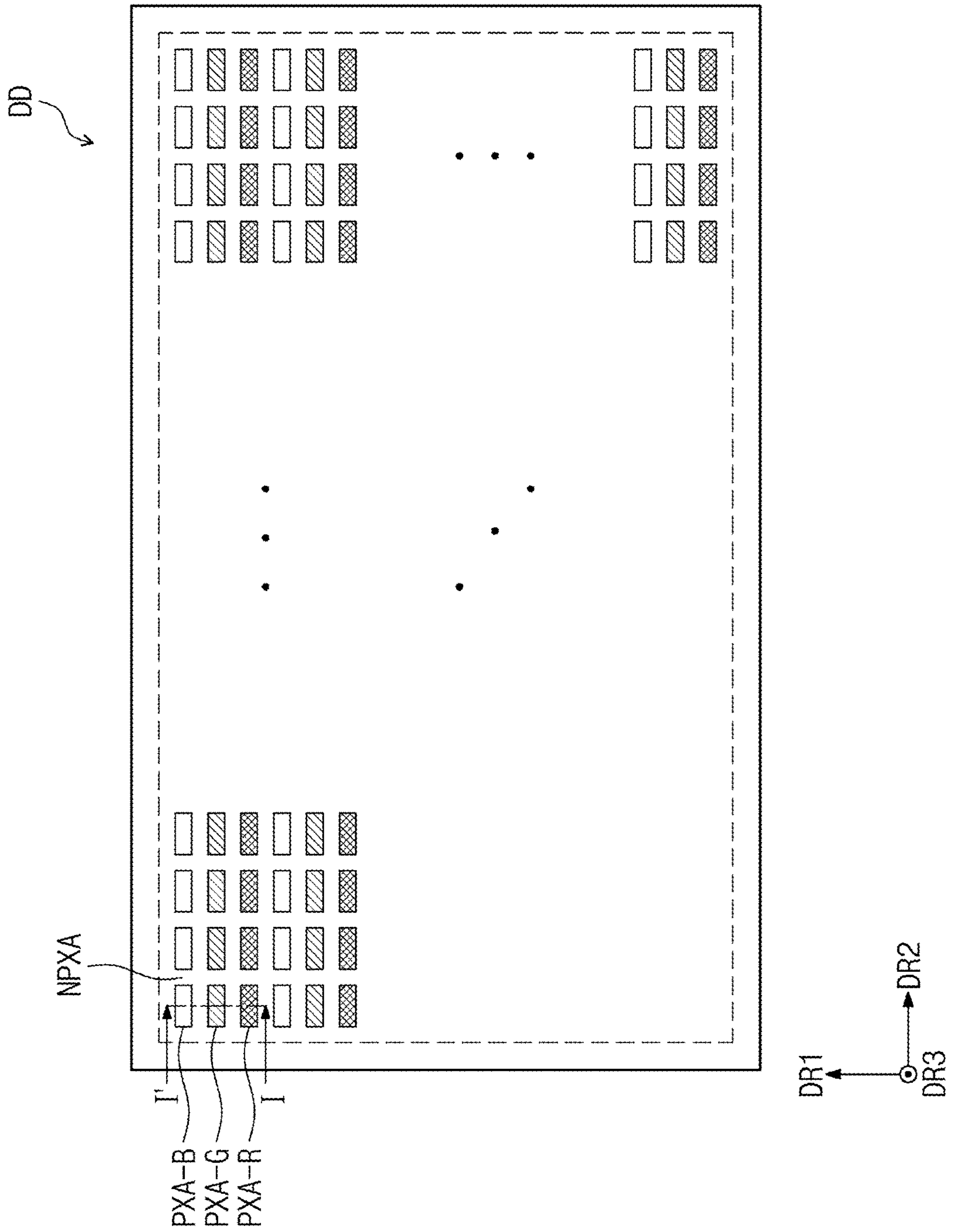
FIG. 1 is a plan view of a display apparatus according to an embodiment.
Figure 2:
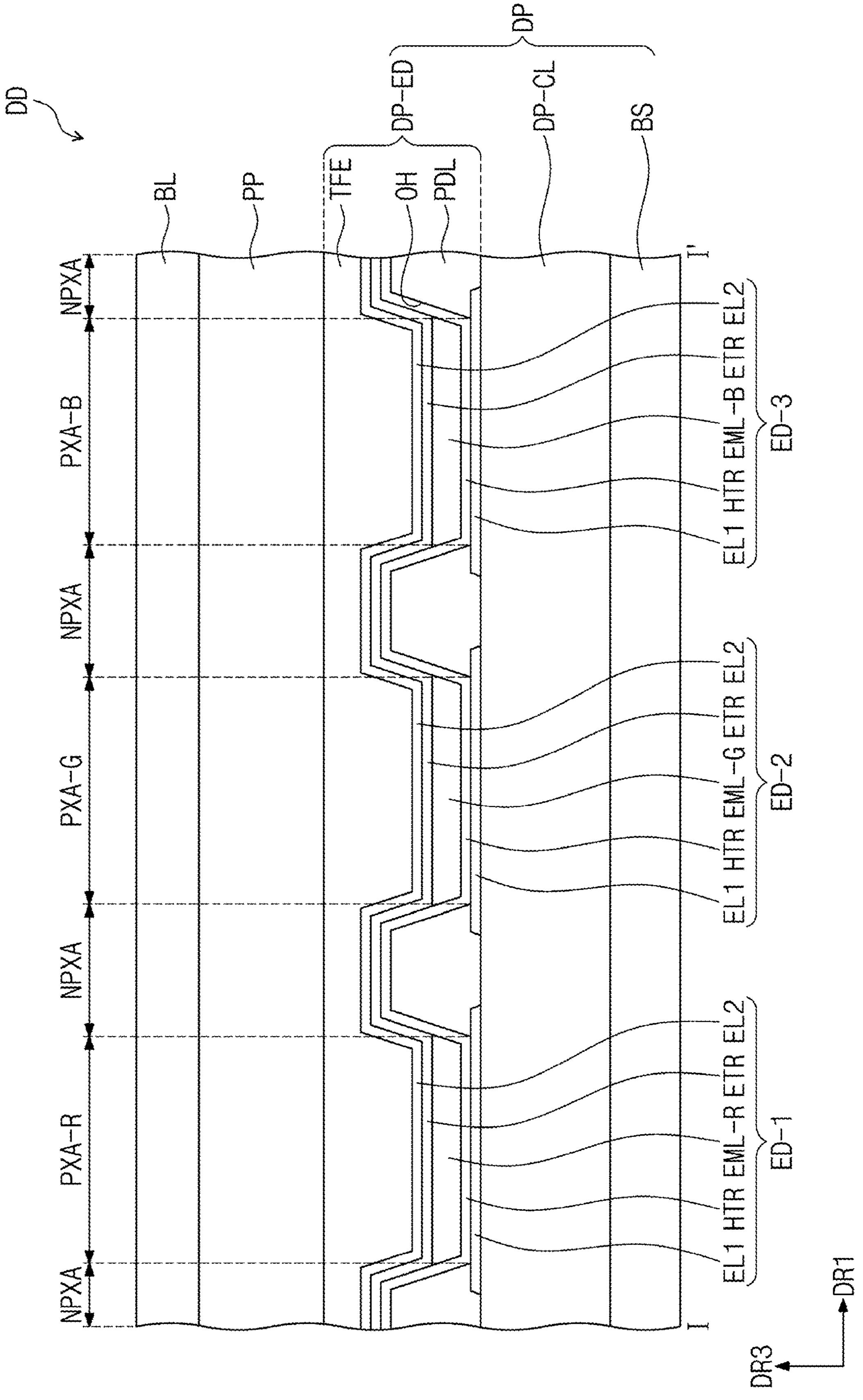
FIG. 2 is a cross-sectional view of a display apparatus according to an embodiment.

FIG. 1 is a plan view illustrating an embodiment of a display apparatus DD. FIG. 2 is a cross-sectional view of the display apparatus DD of the embodiment. FIG. 2 is a cross-sectional view illustrating a part taken along line I-I' of FIG. 1.

The display apparatus DD may include a display panel DP and an optical layer PP on the display panel DP. The display panel DP includes light emitting devices ED-1, ED-2, and ED-3. The display apparatus DD may include a plurality of light emitting devices ED-1, ED-2, and ED-3. The optical layer PP may be on the display panel DP to control reflected light in the display panel DP due to external light. The optical layer PP may include, for example, a polarization layer or a color filter layer. In some embodiments, the optical layer PP may not be provided from the display apparatus DD of an embodiment.

A base substrate BL may be on the optical layer PP. The base substrate BL may be a member which provides a base surface on which the optical layer PP disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer. In some embodiments, the base substrate BL may not be provided.

The display apparatus DD according to an embodiment may further include a filling layer. The filling layer may be between a display device layer DP-ED and the base substrate BL. The filling layer may be an organic material layer.

The filling layer may include at least one of an acrylic-based resin, a silicone-based resin, or an epoxy-based resin.

The display panel DP may include a base layer BS, a circuit layer DP-CL provided on the base layer BS, and the display device layer DP-ED. The display device layer DP-ED may include a pixel defining film PDL, the light emitting devices ED-1, ED-2, and ED-3 disposed between portions of the pixel defining film PDL, and an encapsulation layer TFE on the light emitting devices ED-1, ED-2, and ED-3.

The base layer BS may be a member which provides a base surface on which the display device layer DP-ED is disposed. The base layer BS may be a glass substrate, a metal substrate, a plastic substrate, etc. However, the embodiment is not limited thereto, and the base layer BS may be an inorganic layer, an organic layer, or a composite material layer.

In an embodiment, the circuit layer DP-CL is on the base layer BS, and the circuit layer DP-CL may include a plurality of transistors. Each of the transistors may include a control electrode, an input electrode, and an output electrode. For example, the circuit layer DP-CL may include a switching transistor and a driving transistor for driving the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be described in more detail. Each of the light emitting devices ED-1, ED-2 and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the light emitting devices ED-1, ED-2, and ED-3 are disposed in openings OH defined in the pixel defining film PDL, and the hole transport region HTR, the electron transport region ETR, and the second electrode EL2 are provided as a common layer in the entire light emitting devices ED-1, ED-2, and ED-3. However, the embodiment of the present disclosure is not limited thereto, and the hole transport region HTR and the electron transport region ETR in an embodiment may be provided by being patterned inside the openings OH defined in the pixel defining film PDL. For example, the hole transport region HTR, the emission layers EML-R, EML-G, and EML-B, and the electron transport region ETR of the light emitting devices ED-1, ED-2, and ED-3 in an embodiment may be provided by being patterned in an inkjet printing method.

The encapsulation layer TFE may cover the light emitting devices ED-1, ED-2, and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects (reduces exposure to moisture/oxygen) the display device layer DP-ED from moisture/oxygen, and the encapsulation-organic film protects (reduces exposure to foreign substances) the display device layer DP-ED from foreign substances such as dust particles. The encapsulation-inorganic film may include silicon nitride, silicon oxynitride, silicon oxide, titanium oxide, aluminum oxide, and/or the like, but the embodiment of the present disclosure is not limited thereto. The encapsulation-organic film may include an acrylic-based compound, an epoxy-based compound, and/or the like. The encapsulation-organic film may include a photopolymerizable organic material, but the embodiment of the present disclosure is not limited thereto.

The encapsulation layer TFE may be on the second electrode EL2 and may be disposed filling the opening OH.

Referring to FIGS. 1 and 2, the display apparatus DD may include a non-light emitting region NPXA and light emitting regions PXA-R, PXA-G, and PXA-B. The light emitting regions PXA-R, PXA-G, and PXA-B may be regions in which light generated by the respective light emitting devices ED-1, ED-2 and ED-3 is emitted. The light emitting regions PXA-R, PXA-G, and PXA-B may be spaced apart from (separated from) each other on a plane (e.g., in a plan view).

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. In some embodiments, in the disclosure, the light emitting regions PXA-R, PXA-G, and PXA-B may respectively correspond to pixels. The pixel defining film PDL may divide the light emitting devices ED-1, ED-2, and ED-3. The emission layers EML-R, EML-G, and EML-B of the light emitting devices ED-1, ED-2, and ED-3 may be disposed in openings OH defined in the pixel defining film PDL and separated from each other.

The light emitting regions PXA-R, PXA-G, and PXA-B may be divided into a plurality of groups according to the color of light generated from the light emitting devices ED-1, ED-2, and ED-3. In the display apparatus DD of an embodiment shown in FIGS. 1 and 2, three light emitting regions PXA-R, PXA-G, and PXA-B which emit red light, green light, and blue light, respectively are illustrated as an example. For example, the display apparatus DD of an embodiment may include the red light emitting region PXA-R, the green light emitting region PXA-G, and the blue light emitting region PXA-B that are separated from each other.

In the display apparatus DD according to an embodiment, the plurality of light emitting devices ED-1, ED-2, and ED-3 may emit light beams having wavelengths different from each other. For example, in an embodiment, the display apparatus DD may include a first light emitting device ED-1 that emits red light, a second light emitting device ED-2 that emits green light, and a third light emitting device ED-3 that emits blue light. For example, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, the embodiment of the present disclosure is not limited thereto, and the first to third light emitting devices ED-1, ED-2, and ED-3 may emit light beams in substantially the same wavelength range or at least one light emitting device may emit a light beam in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the plurality of red light emitting regions PXA-R may be arranged with each other along a second direction axis DR2, the plurality of green light emitting regions PXA-G may be arranged with each other along the second direction axis DR2, and the plurality of blue light emitting regions PXA-B each may be arranged with each other along the second direction axis DR2. In some embodiments, the red light emitting region PXA-R, the green light emitting region PXA-G, and the blue light emitting region PXA-B may be alternately arranged in this order along a first direction axis DR1. (DR3 is a third direction which is normal or perpendicular to the plane defined by the first direction DR1 and the second direction DR2).

FIGS. 1 and 2 illustrate that all the light emitting regions PXA-R, PXA-G, and PXA-B have similar area, but the embodiment of the present disclosure is not limited thereto. Thus, the light emitting regions PXA-R, PXA-G, and PXA-B may have different areas from each other according to the wavelength range of the emitted light. In this case, the areas of the light emitting regions PXA-R, PXA-G, and PXA-B may refer to areas when viewed on a plane defined by the first direction axis DR1 and the second direction axis DR2.

In some embodiments, an arrangement form of the light emitting regions PXA-R, PXA-G, and PXA-B is not limited to the configuration illustrated in FIG. 1, and the order in which the red light emitting region PXA-R, the green light emitting region PXA-G, and the blue light emitting region PXA-B are arranged may be provided in one or more suitable combinations according to the characteristics of display quality required in the display apparatus DD. For example, the arrangement form of the light emitting regions PXA-R, PXA-G, and PXA-B may be a pentile (PENTILE®) arrangement form (for example, an RGBG matrix, an RGBG structure, or RGBG matrix structure) or a diamond arrangement form (e.g., a display (e.g., an OLED display) containing red, blue, and green (RGB) light emitting regions arranged in the shape of diamonds. PENTILE® is a duly registered trademark of Samsung Display Co., Ltd. Diamond Pixel™ is a trademark of Samsung Display Co., Ltd.

In some embodiments, the areas of the light emitting regions PXA-R, PXA-G, and PXA-B may be different from each other. For example, in an embodiment, the area of the green light emitting region PXA-G may be smaller than that of the blue light emitting region PXA-B, but the embodiment of the present disclosure is not limited thereto.

Hereinafter, FIGS. 3 to 6 are cross-sectional views schematically illustrating light emitting devices according to embodiments. The light emitting devices ED according to embodiments each may include a first electrode EL1, a second electrode EL2 facing the first electrode EL1, and at least one functional layer between the first electrode EL1 and the second electrode EL2. The at least one functional layer may include a hole transport region HTR, an emission layer EML, and an electron transport region ETR that are sequentially stacked (in the stated order). For example, each of the light emitting devices ED of embodiments may include the first electrode EL1, the hole transport region HTR, the emission layer EML, the electron transport region ETR, and the second electrode EL2 that are sequentially stacked.

Figure 3:
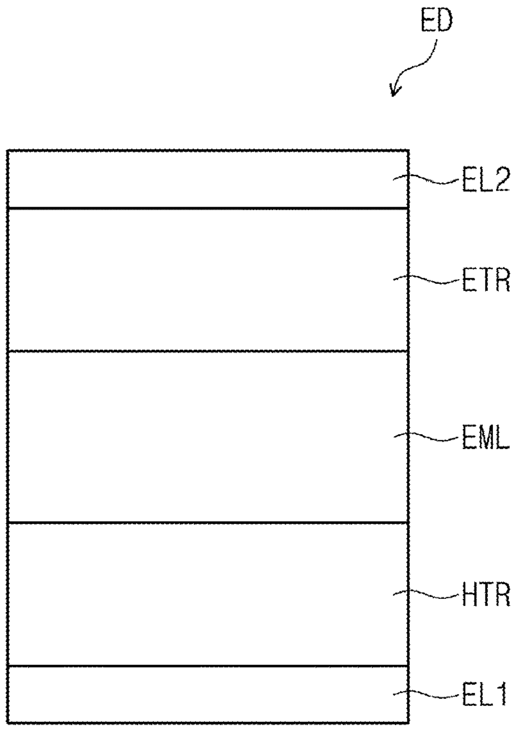
FIG. 3 is a cross-sectional view schematically illustrating a light emitting device according to an embodiment.
Figure 4:
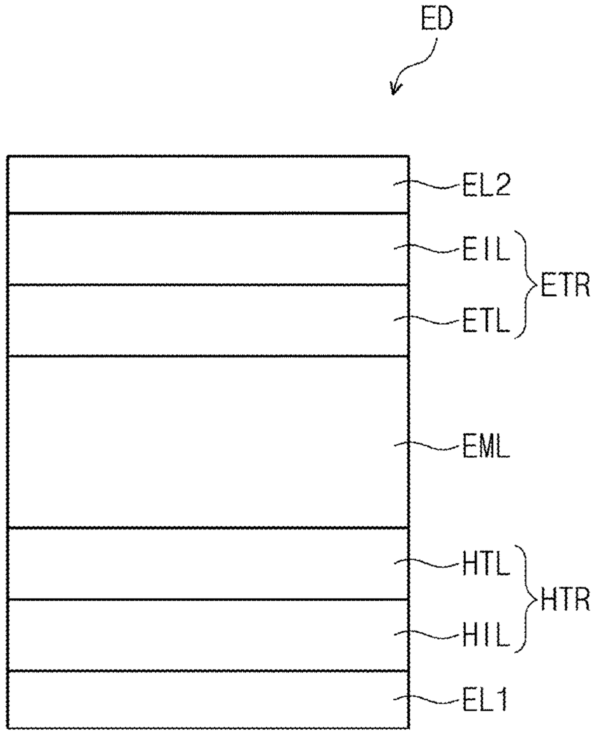
FIG. 4 is a cross-sectional view schematically illustrating a light emitting device according to an embodiment.
Figure 5:
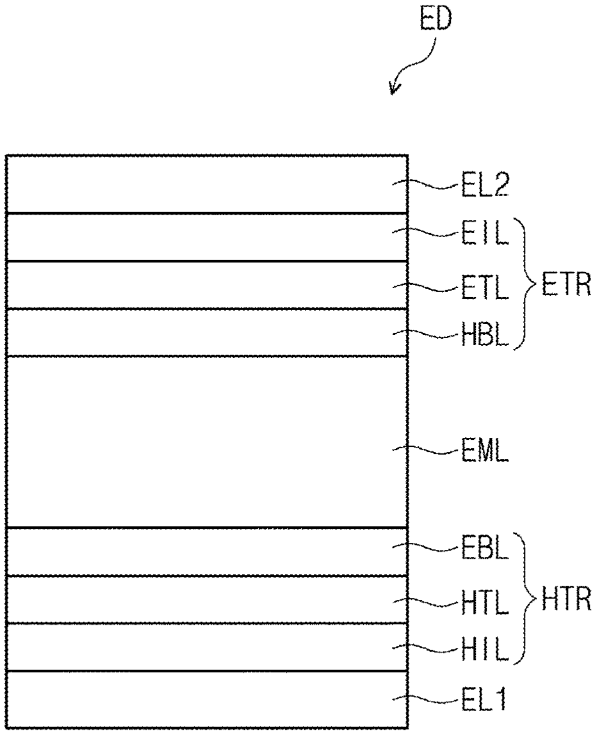
FIG. 5 is a cross-sectional view schematically illustrating a light emitting device according to an embodiment.
Figure 6:
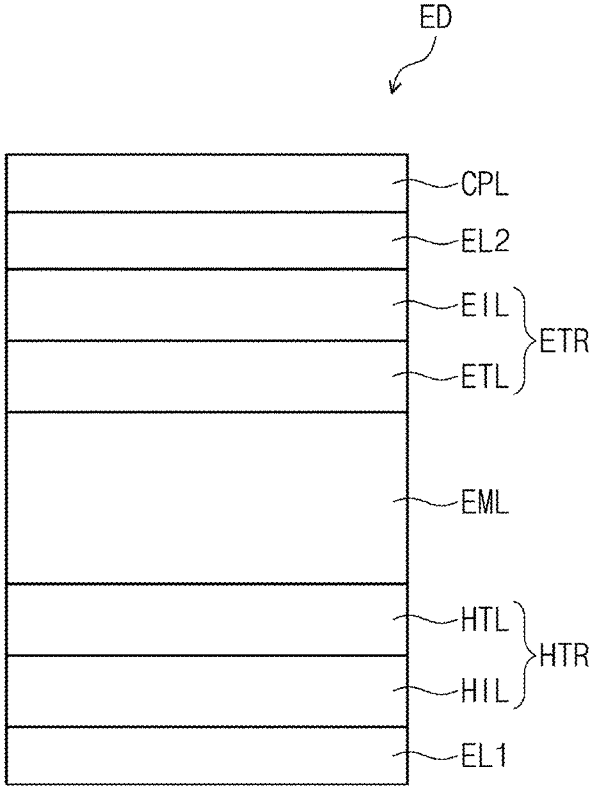
FIG. 6 is a cross-sectional view schematically illustrating a light emitting device according to an embodiment.

Compared with FIG. 3, FIG. 4 illustrates a cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In some embodiments, compared with FIG. 3, FIG. 5 illustrates a cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared with FIG. 4, FIG. 6 illustrates a cross-sectional view of a light emitting device ED of an embodiment including a capping layer CPL on a second electrode EL2.

The first electrode EL1 has conductivity (e.g., is a conductor). The first electrode EL1 may be formed of a metal material, a metal alloy, or a conductive compound. The first electrode EL1 may be an anode or a cathode. However, the embodiment of the present disclosure is not limited thereto. In some embodiments, the first electrode EL1 may be a pixel electrode. The first electrode EL1 may be a transmissive electrode, a transflective electrode, or a reflective electrode. The first electrode EL1 may be a transmissive electrode, a transflective electrode, or a reflective electrode. The first electrode EL1 may include at least one selected from among Ag, Mg, Cu, Al, Pt, Pd, Au, Ni, Nd, Ir, Cr, Li, Ca, LiF, Mo, Ti, W, In, Sn, and Zn, a compound of two or more selected from among these, a mixture of two or more selected from among these, or one or more oxides thereof.

When the first electrode EL1 is the transmissive electrode, the first electrode EL1 may include a transparent metal oxide such as indium tin oxide (ITO), indium zinc oxide (IZO), zinc oxide (ZnO), or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a stacked structure of LiF and Ca), LiF/AI (a stacked structure of LiF and Al), Mo, Ti, W, compounds or mixtures thereof (e.g., a mixture of Ag and Mg). In some embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but the embodiment of the present disclosure is not limited thereto. For example, the first electrode EL1 may include the above-described one or more of the metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer or an emission-auxiliary layer, or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but the embodiment of the present disclosure is not limited thereto.

The hole transport region HTR may be formed utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1:

Formula H-1

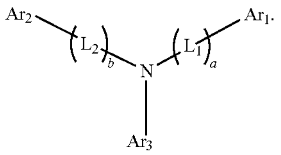

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer from 0 to 10. In some embodiments, when a or b is an integer of 2 or greater, a plurality of $L_1$s and $L_2$s may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In some embodiments, in Formula H-1, $Ar_3$ may be a substituted or unsubstituted aryl group having 6 to 30 ring-forming carbon atoms.

The compound represented by Formula H-1 may be a monoamine compound. In some embodiments, the compound represented by Formula H-1 may be a diamine compound in which at least one selected from among $Ar_1$ to $Ar_3$ includes the amine group as a substituent. In some embodiments, the compound represented by Formula H-1 may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one selected from among the compounds of Compound Group H. However, the compounds listed in Compound Group H are merely examples, and the compounds represented by Formula H-1 are not limited to those represented by Compound Group H:

Compound Group H

H-1-1

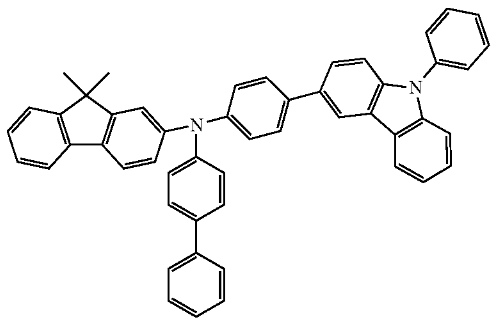

H-1-2

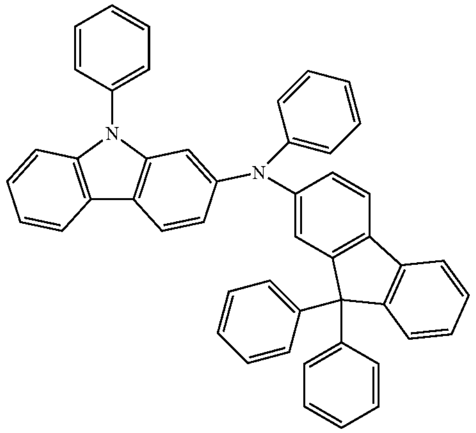

H-1-3

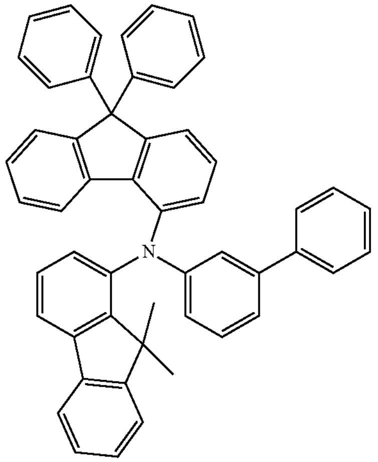

H-1-4

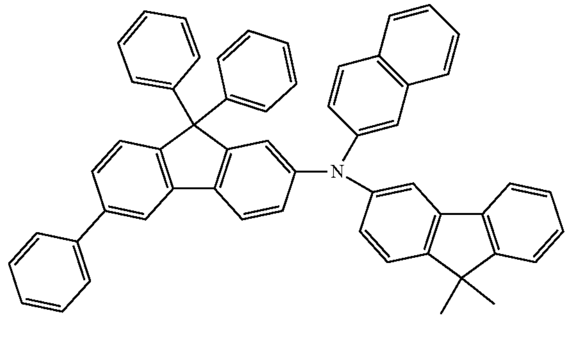

-continued
H-1-5
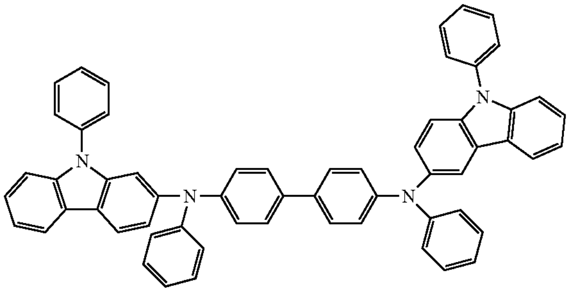
H-1-6
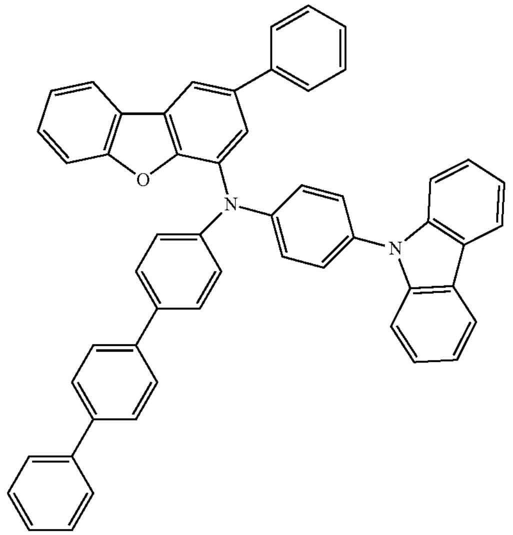
H-1-7
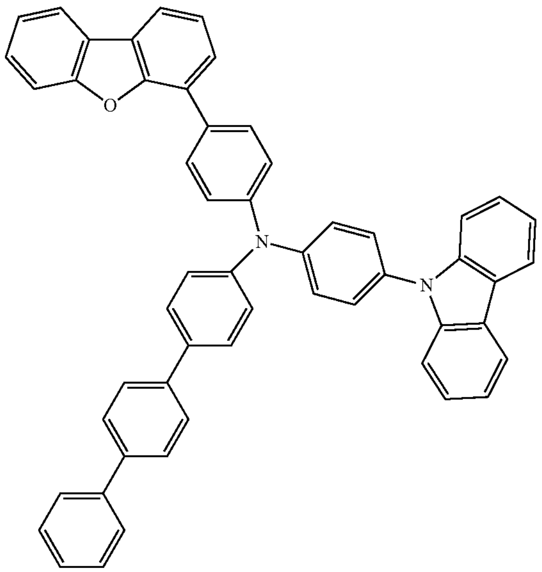
-continued
H-1-8
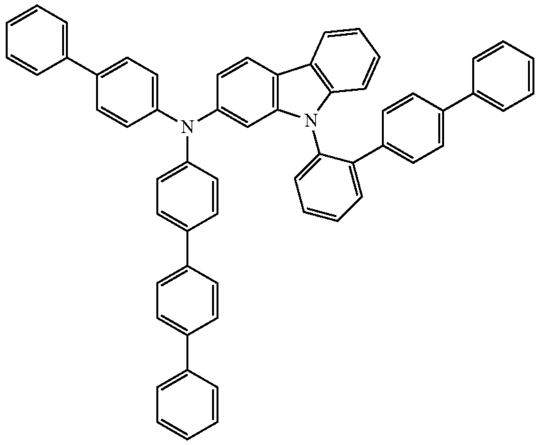
H-1-9
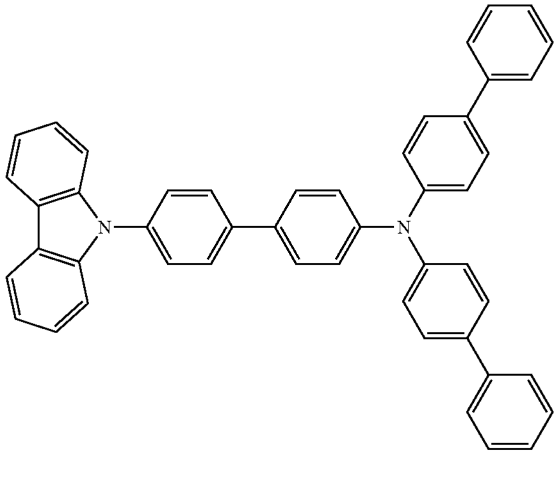
H-1-10
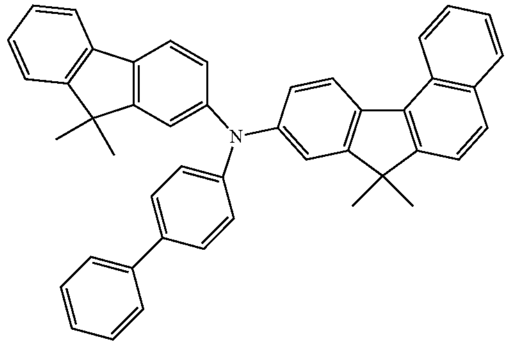

-continued
H-1-11
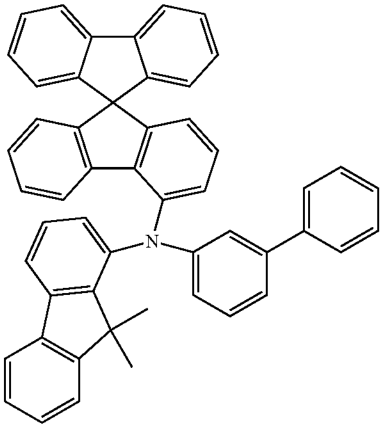
H-1-12
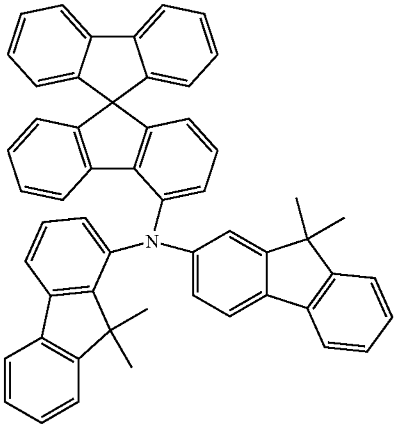
H-1-13
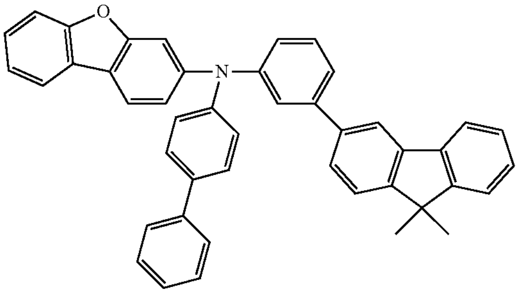
H-1-14
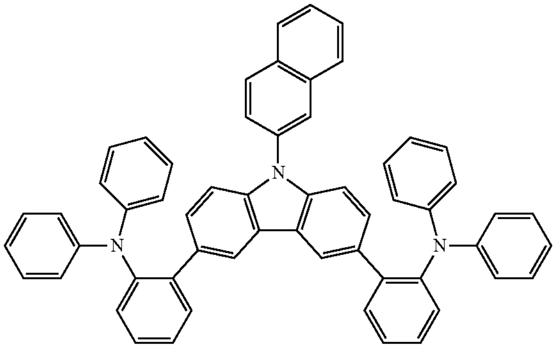
-continued
H-1-15
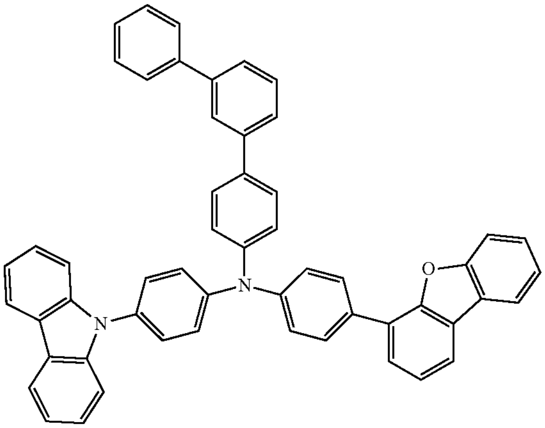
H-1-16
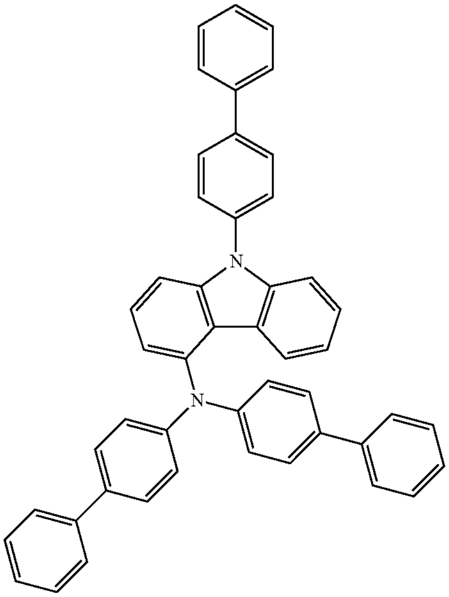
H-1-17
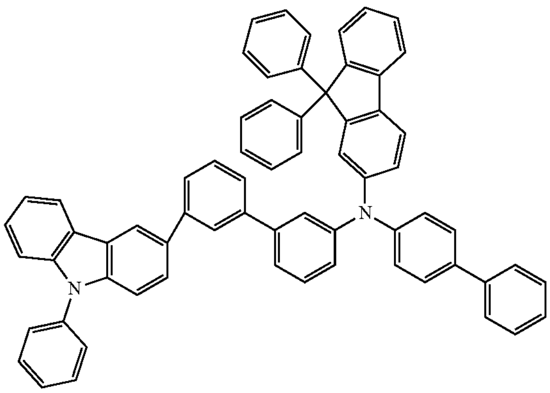

-continued

H-1-18

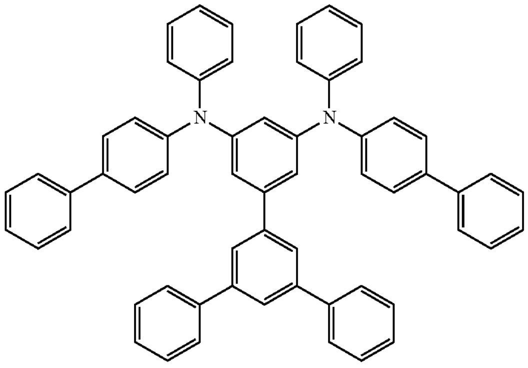

H-1-19

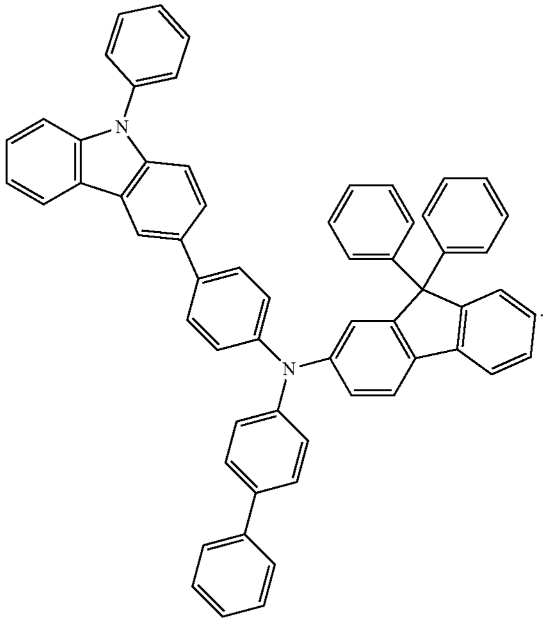

The hole transport region may include a compound represented by Formula H-a. The compound represented by Formula H-a may be a monoamine compound.

Formula H-a

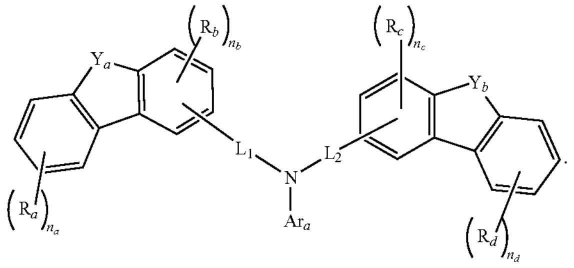

In Formula H-a, $Y_a$ and $Y_b$ may each independently be $CR_eR_f$, $NR_g$, O, or S. $Y_a$ and $Y_b$ may be the same as or different from each other. In an embodiment, both (e.g., simultaneously) $Y_a$ and $Y_b$ may be $CR_eR_f$. In some embodiments, any one selected from among $Y_a$ and $Y_b$ may be $CR_eR_f$, and the other (the substituent that is not $CR_eR_f$) may be $NR_g$.

In Formula H-a, $Ar_a$ may be a substituted or unsubstituted aryl group having 6 to 30 ring-forming carbon atoms, or a substituted or unsubstituted heteroaryl group having 2 to 30 ring-forming carbon atoms. For example, $Ar_a$ may be a substituted or unsubstituted phenyl group, a substituted or unsubstituted biphenyl group, a substituted or unsubstituted naphthyl group, a substituted or unsubstituted fluorenyl group, or a substituted or unsubstituted terphenyl group.

In Formula H-a, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. For example, $L_1$ and $L_2$ may be a direct linkage, a substituted or unsubstituted phenylene group, or a substituted or unsubstituted divalent biphenyl group.

In Formula H-a, $R_a$ to $R_g$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring. For example, $R_a$ to $R_g$ may each independently be a hydrogen atom, a substituted or unsubstituted methyl group, or a substituted or unsubstituted phenyl group.

In Formula H-a, $n_a$ and $n_d$ may each independently be an integer from 0 to 4, and $n_b$ and $n_c$ may each independently be an integer from 0 to 3.

The hole transport region HTR may include a phthalocyanine compound such as copper phthalocyanine; $N^1$, $N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N (2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium [tetrakis(pentafluorophenyl) borate], dipyrazino[2,3-f: 2',3'-h]quinoxaline-2,3,6,7,10,11-hexacarbonitrile (HATCfN), etc.

The hole transport region HTR may include a carbazole-based derivative such as N-phenyl carbazole or polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) or 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl]benzenamine](TAPC), 4,4'-bis[N,N'-(3-tolyl)amino]-3,3'-dimethylbiphenyl (HMTPD), 1,3-bis(N-carbazolyl)benzene (mCP), etc.

In some embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one of a hole injection layer HIL, a hole transport layer HTL, or an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 250 Å to about 1,000 Å. For example, when the hole transport region HTR includes the electron blocking layer EBL, the electron blocking layer EBL may have a thickness of about 10 Å to about 1,000 Å. When the thicknesses of the hole transport region HTR, the hole injection layer HIL, the hole transport layer HTL and the electron blocking layer EBL satisfy the above-described ranges, satisfactory (suitable) hole transport properties may be achieved without a substantial increase in driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but the embodiment of the present disclosure is not limited thereto. For example, the p-dopant may include a metal halide compound such as Cul or Rbl, a quinone derivative such as tetracyanoquinodimethane (TCNQ) or 2,3,5,6-tetrafluoro-7,7'8,8-tetracyanoquinodimethane (F4-TCNQ), a metal oxide such as tungsten oxide or molybdenum oxide, a cyano group-containing compound such as dipyrazino[2,3-f: 2',3'-h]quinoxaline-2,3,6,7,10,11-hexacarbonitrile (HATCN) or 4-[[2,3-bis [cyano-(4-cyano-2,3,5,6-tetrafluorophenyl)methylidene]cyclopropylidene]-cyanomethyl]-2,3,5,6-tetrafluorobenzonitrile (NDP9), etc., but the embodiment of the present disclosure is not limited thereto.

As described above, the hole transport region HTR may further include at least one of the buffer layer or the electron blocking layer EBL in addition to the hole injection layer HIL and the hole transport layer HTL. The buffer layer may compensate for a resonance distance according to the wavelength of light emitted from the emission layer EML and may thus increase light emission efficiency. A material that may be contained in the hole transport region HTR may be utilized as a material to be contained in the buffer layer. The electron blocking layer EBL is a layer that serves to prevent or reduce the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

In the light emitting device ED of an embodiment, the emission layer EML may include a plurality of luminescent materials. In the light emitting device ED of an embodiment, the emission layer EML may include a first compound, and at least one of a second compound, a third compound, or a fourth compound. In the light emitting device ED of an embodiment, the emission layer EML may include at least one host and at least one dopant. For example, the emission layer EML of an embodiment may include a first dopant, and include, as a host, a first host and a second host that are different. The emission layer EML of an embodiment may include the first host and the second host as described above, and a first dopant and a second dopant that are different.

In the emission layer EML of the light emitting device ED of an embodiment, the first compound may include a fused polycyclic compound having a structure in which a plurality of aromatic rings are fused via one boron atom and two heteroatoms. The first compound of an embodiment may include a structure in which a plurality of aromatic rings are fused via one boron atom and at least two heteroatoms selected from the group including (e.g., consisting of) nitrogen, oxygen, and sulfur. In some embodiments, the first compound of an embodiment includes a structure in which at least three electron donating substituents are bonded to a fused cyclic core. In the first compound of an embodiment, three electron donating substituents are bonded to different benzene rings, and one selected from among the electron donating substituents is a carbazole group, which is bonded to the fused cyclic core via a carbon-nitrogen bond, and the other two electron donating substituents are bonded to the fused cyclic core via a carbon-carbon bond.

The first compound of an embodiment is represented by Formula 1:

Formula 1]

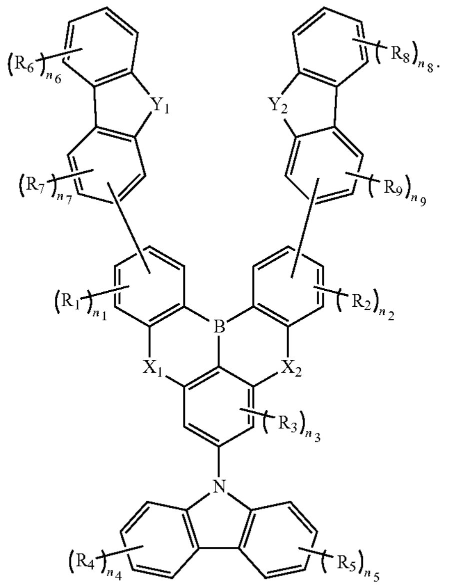

In Formula 1, $X_1$ and $X_2$ may each independently be $NR_6$, O, or S. However, at least one of $X_1$ or $X_2$ is $NR_a$. For example, both (e.g., simultaneously) $X_1$ and $X_2$ may be $NR_a$. In some embodiments, any one selected from among $X_1$ and $X_2$ may be O or S, and the other (the substituent that is not O or S) may be $NR_a$.

In Formula 1, $Y_1$ and $Y_2$ may each independently be $NR_b$, O, or S. For example, both (e.g., simultaneously) $Y_1$ and $Y_2$ may be $NR_b$. In some embodiments, both (e.g., simultaneously) $Y_1$ and $Y_2$ may be O. In some embodiments, both (e.g., simultaneously) $Y_1$ and $Y_2$ may be S.

In Formula 1, $R_1$ to $R_9$ may each independently be a hydrogen atom, a deuterium atom, a halogen atom, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $R_1$ to $R_9$ may each independently be bonded to an adjacent group to form a ring. For example, $R_1$ to $R_9$ may each independently be a hydrogen atom, a deuterium atom, a substituted or unsubstituted t-butyl group, or a substituted or unsubstituted phenyl group.

In Formula 1, $R_a$ and $R_b$ may each independently be a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $R^a$ and $R_b$ may each independently be bonded to an adjacent group to form a ring. In an embodiment, when each of $X_1$ and $X_2$ is $NR_a$, $R_a$ may be a substituted or unsubstituted phenyl group, a substituted or unsubstituted biphenyl group, or a substituted or unsubstituted terphenyl group. In an embodiment, when each of $Y_1$ and $Y_2$ is $NR_b$, $R_b$ may be a substituted or unsubstituted phenyl group, or a substituted or unsubstituted terphenyl group.

In Formula 1, $n_1$, $n_2$, $n_7$, and ng may each independently be an integer from 0 to 3, $n_3$ is an integer from 0 to 2, and $n_4$ to ne, and ns may each independently be an integer from 0 to 4. When each of $n_1$ to ng is 0, the first compound of an embodiment may not be substituted with each of $R_1$ to $R_9$. When each of $n_1$ to ng is an integer of 2 or more, a plurality of $R_1$s and $R_9$s each may be the same or at least one among the plurality of $R_1$s and $R_9$s may be different. The embodiment in which $n_1$ is 3 and a plurality of $R_1$s are all hydrogen atoms in Formula 1 may be the same as the embodiment in which $n_1$ is 0 in Formula 1. The embodiment in which $n_2$ is 3 and a plurality of $R_2$s are all hydrogen atoms in Formula 1 may be the same as the embodiment in which $n_2$ is 0 in Formula 1. The embodiment in which $n_3$ is 2 and a plurality of $R_3$s are all hydrogen atoms in Formula 1 may be the same as the embodiment in which $n_3$ is 0 in Formula 1. The embodiment in which $n_4$ is 4 and a plurality of $R_4$s are all hydrogen atoms in Formula 1 may be the same as the embodiment in which $n_4$ is 0 in Formula 1. The embodiment in which $n_5$ is 4 and a plurality of $R_5$s are all hydrogen atoms in Formula 1 may be the same as the embodiment in which $n_5$ is 0 in Formula 1. The embodiment in which $n_6$ is 4 and a plurality of $R_6$s are all hydrogen atoms in Formula 1 may be the same as the embodiment in which $n_6$ is 0 in Formula 1. The embodiment in which $n_7$ is 3 and a plurality of $R_7$s are all hydrogen atoms in Formula 1 may be the same as the embodiment in which $n_7$ is 0 in Formula 1. The embodiment in which $n_8$ is 4 and a plurality of $R_8$s are all hydrogen atoms in Formula 1 may be the same as the embodiment in which $n_8$ is 0 in Formula 1. The embodiment in which $n_9$ is 3 and a plurality of $R_9$s are all hydrogen atoms in Formula 1 may be the same as the embodiment in which $n_9$ is 0 in Formula 1.

The first compound of an embodiment has a planar skeleton structure around one boron atom, and includes a structure in which at least three electron donating substituents in a form of a fused cyclic ring are bonded to the planar skeleton structure. In some embodiments, in the first compound, three electron donating substituents are bonded to different benzene rings, and one selected from among the electron donating substituents is a carbazole group, which is bonded to the fused cyclic core via a carbon-nitrogen bond, and the other two electron donating substituents are bonded to the fused cyclic core via a carbon-carbon bond. The first compound of an embodiment has an increase in an electron donor property through the three electron donating substituents bonded to the core skeleton structure, thereby increasing electron density in the compound structure, and because the electron donating substituents are linked to the central core via a carbon-carbon bond, it may be expected to have (increase) the chemical stability in the whole molecule.

In the first compound of an embodiment, the electron donating substituents have a robust structure of a fused ring form, and thus may have a stronger bond energy than an unfused substituent such as aryl or amine, and the introduction of a substituent having a higher extinction coefficient may increase a light absorption rate of the compound in itself, and thus energy may be efficiently delivered from a host, thereby improving the luminous efficiency of the light emitting device. The first compound of an embodiment has reinforced electron donor property in the whole molecule by the electron donating substituents, and thus the multiple resonance structure may be reinforced to reduce the difference ($\Delta E_{ST}$) between the lowest triplet (exciton energy level (T1 level) and the lowest singlet exciton energy level (S1 level), thereby reinforcing thermally activated delayed fluorescence (TADF) characteristics.

In some embodiments, for the first compound, one electron donating substituent is linked via a carbon-nitrogen bond while the other two electron donating substituents are introduced via a carbon-carbon bond rather than a carbon-nitrogen bond having a weaker bond energy, and thus the chemical stability of the material in itself is increased, and accordingly, when the first compound is applied to the light emitting device ED, the efficiency and service life of the light emitting device ED may be improved (increased).

The first compound of an embodiment may be represented by Formula 2-1 or Formula 2-2:

Formula 2-1

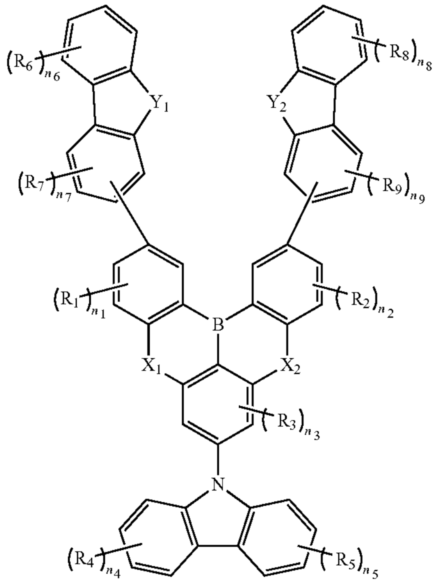

-continued

Formula 2-2

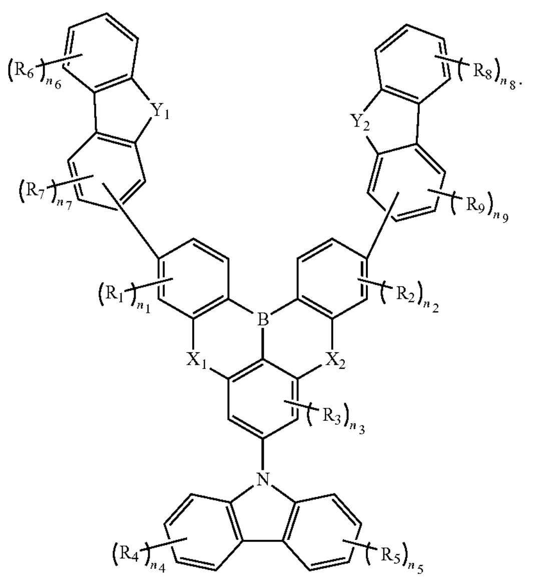

Formula 2-1 and Formula 2-2 represent the embodiments in which a position at which the electron donating substituents including each of $Y_1$ and $Y_2$ in Formula 1 are bonded to the core skeleton structure is specified. Formula 2-1 is the embodiment in which the electron donating substituents in Formula 1 are bonded at the meta-position of the central boron atom, and Formula 2-2 is the embodiment in which the electron donating substituents in Formula 1 are bonded at the para-position of the central boron atom.

In some embodiments, in Formula 2-1 and Formula 2-2, the same as described in Formula 1 may be applied to $X_1$, $X_2$, $Y_1$, $Y_2$, $R_a$, $R_b$, $R_1$ to $R_9$, and $n_1$ to $n_9$.

In an embodiment, the first compound represented by Formula 1 may be represented by any one selected from among Formula 3-1 to Formula 3-4:

Formula 3-1

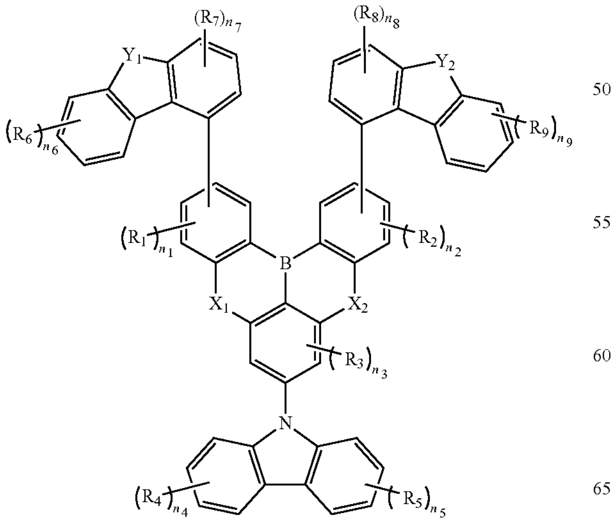

-continued

Formula 3-2

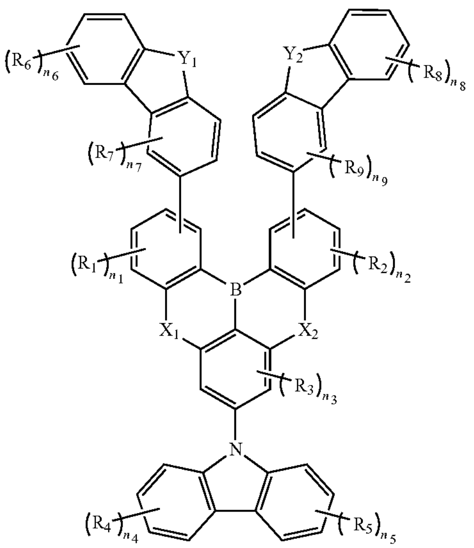

Formula 3-3

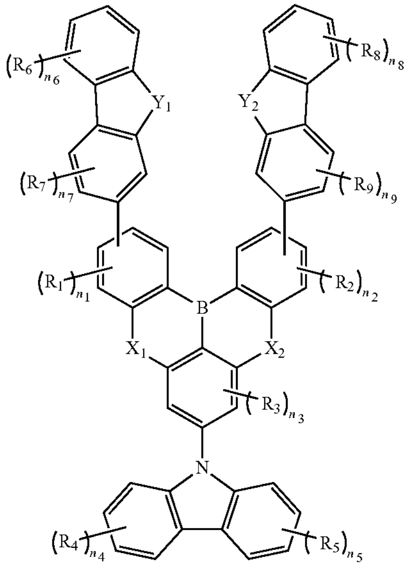

-continued

Formula 3-4

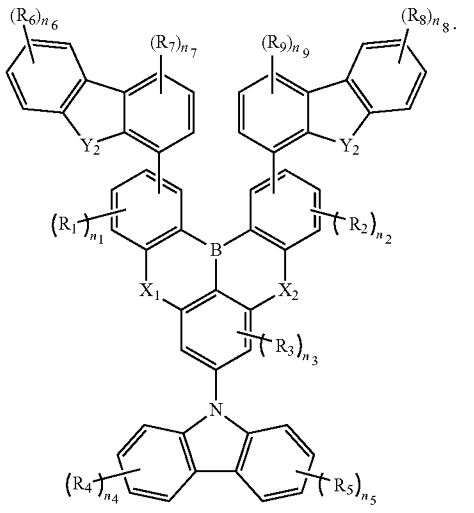

Formula 3-1 to Formula 3-4 represent the embodiments in which a carbon position in the electron donating substituents at which the electron donating substituents including each of $Y_1$ and $Y_2$ in Formula 1 are bonded to the core skeleton structure is specified. Formula 3-1 is the embodiment in which the two electron donating substituents including each of $Y_1$ and $Y_2$ in Formula 1 are bonded to the core skeleton structure at the first carbon position, Formula 3-2 is the embodiment in which the two electron donating substituents including each of $Y_1$ and $Y_2$ in Formula 1 are bonded to the core skeleton structure at the second carbon position, Formula 3-3 is the embodiment in which the two electron donating substituents including each of $Y_1$ and $Y_2$ in Formula 1 are bonded to the core skeleton structure at the third carbon position, and Formula 3-4 is the embodiment in which the two electron donating substituents including each of $Y_1$ and $Y_2$ in Formula 1 are bonded to the core skeleton structure at the fourth carbon position. In some embodiments, in the disclosure, the carbon number of the electron donating substituents including each of $Y_1$ and $Y_2$ is described as represented in Formula a. In Formula a, Y refers to $Y_1$ or $Y_2$ represented in Formula 1.

Formula a

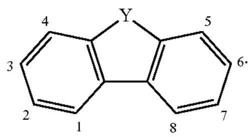

In some embodiments, in Formula 3-1 to Formula 3-4, the same as described in Formula 1 may be applied to $X_1$, $X_2$, $Y_1$, $Y_2$, $R_a$, $R_b$, $R_1$ to $R_9$, and $n_1$ to $n_9$.

In an embodiment, the first compound represented by Formula 1 may be represented by any one selected from among Formula 4-1 to Formula 4-3:

Formula 4-1

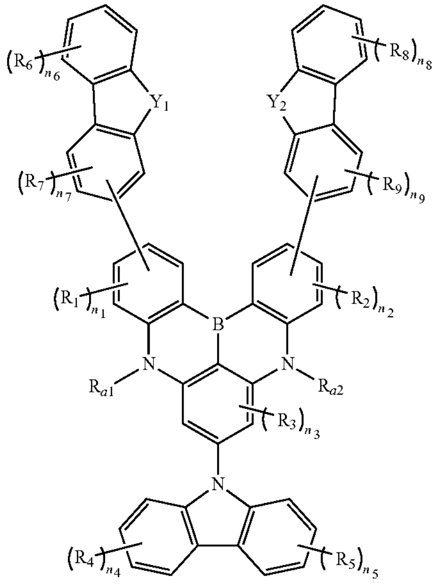

Formula 4-2

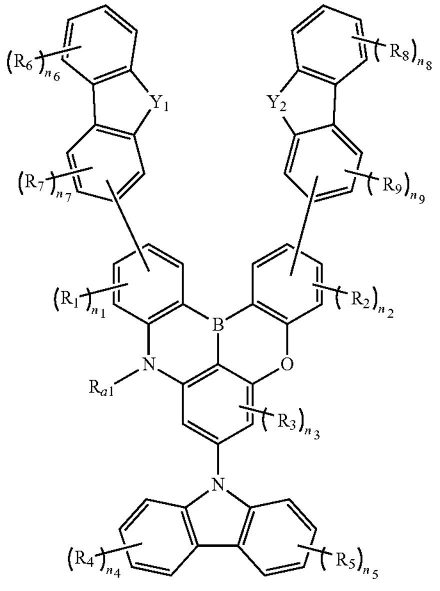

-continued

Formula 4-3

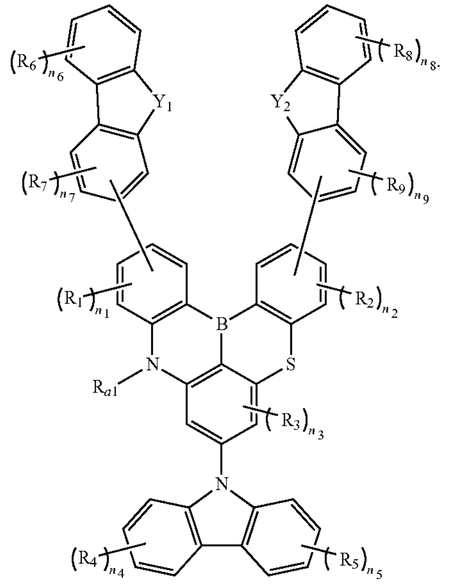

Formula 4-1 to Formula 4-3 represent the embodiments in which $X_1$ and $X_2$ in Formula 1 are specified. Formula 4-1 is the embodiment in which both (e.g., simultaneously) $X_1$ and $X_2$ in Formula 1 are specified, Formula 4-2 is the embodiment in which $X_1$ in Formula 1 is $NR_a$ and $X_2$ is O, and Formula 4-3 is the embodiment in which $X_1$ in Formula 1 is $NR_a$ and $X_2$ is S.

In Formula 4-1 to Formula 4-3, $R_{a1}$ and $R_{a2}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{a1}$ and $R_{a2}$ may each independently be a substituted or unsubstituted phenyl group, a substituted or unsubstituted biphenyl group, or a substituted or unsubstituted terphenyl group.

In some embodiments, in Formula 4-1 to Formula 4-3, the same as described in Formula 1 may be applied to $Y_1$, $Y_2$, $R_a$, $R_b$, $R_1$ to $R_9$, and $n_1$ to $n_9$.

In an embodiment, the first compound represented by Formula 1 may be represented by any one selected from among Formula 5-1 to Formula 5-3:

Formula 5-1

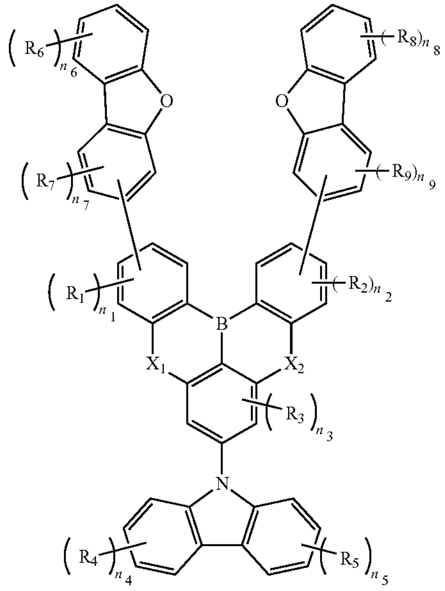

Formula 5-2

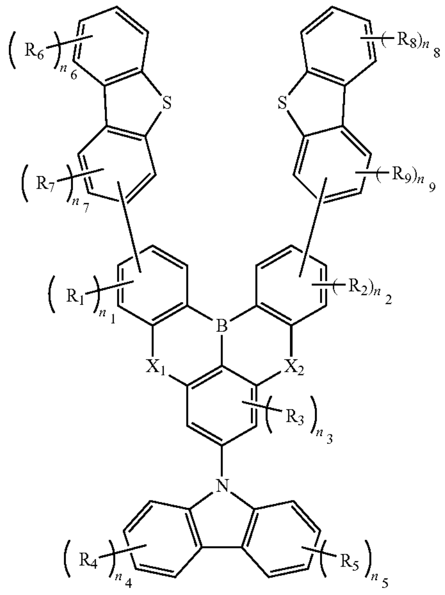

-continued

Formula 5-3

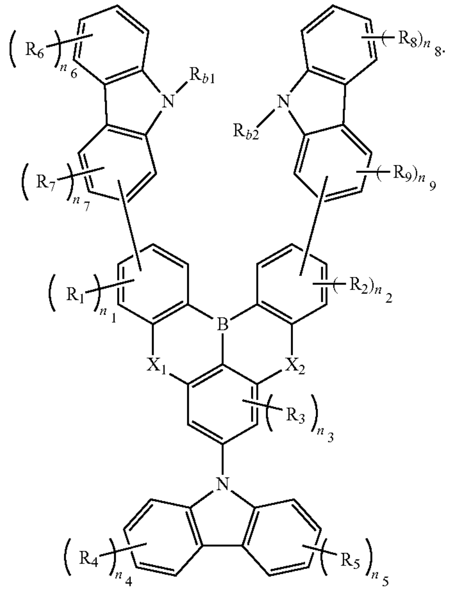

Formulae 5-1 to 5-3 represent the embodiments in which $Y_1$ and $Y_2$ in Formula 1 are specified. Formula 5-1 is the embodiment in which both (e.g., simultaneously) $Y_1$ and $Y_2$ in Formula 1 are O, Formula 5-2 is the embodiment in which both (e.g., simultaneously) $Y_1$ and $Y_2$ in Formula 1 are S, and Formula 5-3 is the embodiment in which both (e.g., simultaneously) $Y_1$ and $Y_2$ in Formula 1 are $NR_b$.

In Formulae 5-1 to 5-3, $R_{b1}$ and $R_{b2}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{b1}$ and $R_{b2}$ may each independently be a substituted or unsubstituted phenyl group, or a substituted or unsubstituted terphenyl group.

In some embodiments, in Formulae 5-1 to 5-3, the same as described in Formula 1 may be applied to $X_1$, $X_2$, $R_a$, $R_b$, $R_1$ to $R_9$, and $n_1$ to $n_9$.

Referring to Formula 1 again, in Formula 1, when each of $X_1$ and $X_2$ is $NR_a$, $R_a$ may be represented by any one selected from among Formulae 6-1 to 6-4:

Formula 6-1

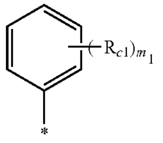

Formula 6-2

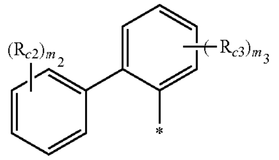

-continued

Formula 6-3

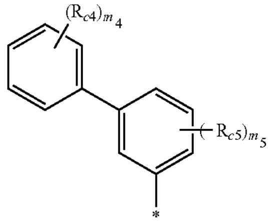

Formula 6-4

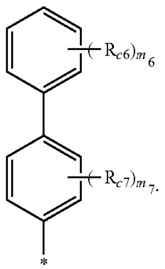

In Formulae 6-1 to 6-4, $R_{c1}$ to $R_{c7}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{c1}$ to $R_{c7}$ may each independently be a hydrogen atom, a deuterium atom, a substituted or unsubstituted methyl group, a substituted or unsubstituted t-butyl group, or a substituted or unsubstituted phenyl group.

In Formula 6-1 to Formula 6-4, $m_1$, $m_2$, $m_4$, and $m_6$ may each independently be an integer from 0 to 5, and $m_3$, $m_5$, and $m_7$ may each independently be an integer from 0 to 4. When each of $m_1$ to $m_7$ is 0, a structure of $R_a$, a substituent according to an embodiment may not be substituted with each of $R_{c1}$ to $R_{c7}$. When each of $m_1$ to $m_7$ is an integer of 2 or more, a plurality of $R_{c1}$s and $R_{c7}$s each may be the same or at least one selected from among the plurality of $R_{c1}$s and $R_{c7}$s may be different. The embodiment in which $m_1$ is 5 and a plurality of $R_{c1}$s are all hydrogen atoms in Formula 6-1 may be the same as the embodiment in which $m_1$ is 0 in Formula 6-1. The embodiment in which $m_2$ is 5 and a plurality of $R_{c2}$s are all hydrogen atoms in Formula 6-2 may be the same as the embodiment in which $m_2$ is 0 in Formula 6-2. The embodiment in which $m_3$ is 2 and a plurality of $R_{c3}$s are all hydrogen atoms in Formula 6-2 may be the same as the embodiment in which $m_3$ is 0 in Formula 6-2. The embodiment in which $m_4$ is 5 and a plurality of $R_{c4}$' are all hydrogen atoms in Formula 6-3 may be the same as the embodiment in which $m_4$ is 0 in Formula 6-3. The embodiment in which $m_5$ is 4 and a plurality of $R_{c5}$s are all hydrogen atoms in Formula 6-3 may be the same as the embodiment in which $m_5$ is 0 in Formula 6-3. The embodiment in which me is 5 and a plurality of $R_{c6}$s are all hydrogen atoms in Formula 6-4 may be the same as the embodiment in which me is 0 in Formula 6-4. The embodiment in which $m_7$ is 4 and a plurality of $R_{c7}$s are all hydrogen atoms in Formula 6-4 may be the same as the embodiment in which $m_7$ is 0 in Formula 6-4.

In an embodiment, $R_a$ may be represented by any one among Formulae 7-1 to 7-7:

Formula 7-1

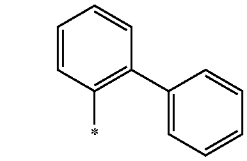

Formula 7-2

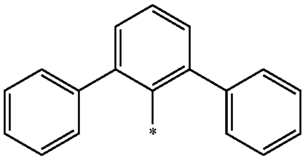

Formula 7-3

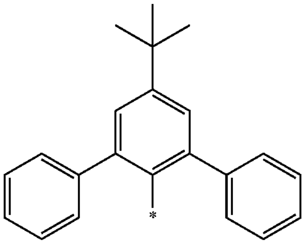

Formula 7-4

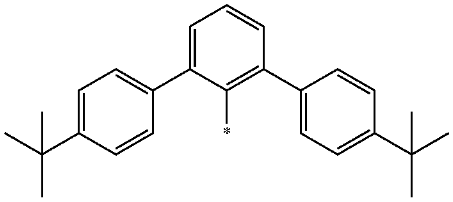

Formula 7-5

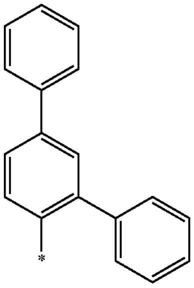

Formula 7-6

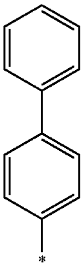

-continued

Formula 7-7

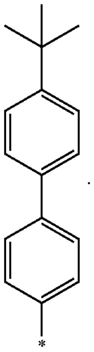

In some embodiments, in addition to the structure represented by each of Formulae 7-1 to 7-7, Ra may be represented by a structure in which at least some hydrogen atoms in the structure represented by each of Formulae 7-1 to 7-7 are substituted with deuterium atoms.

The first compound of an embodiment may be any one selected from among the compounds represented in Compound Group 1. The light emitting device ED of an embodiment may include, as the first compound, at least one fused polycyclic compound selected from among the compounds represented by Compound Group 1 in the emission layer EML.

Compound Group 1

1

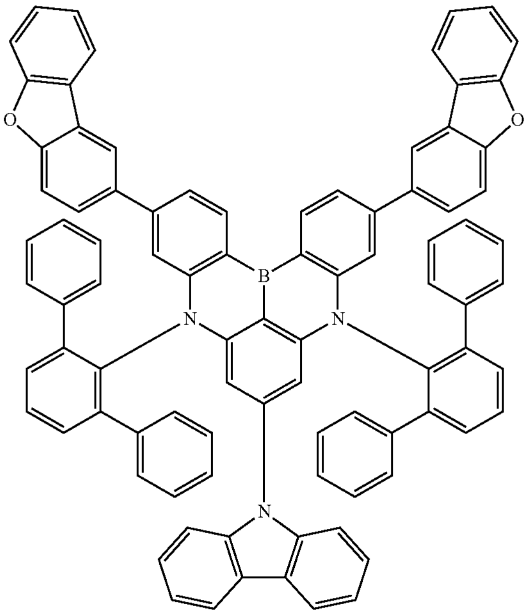

-continued
2
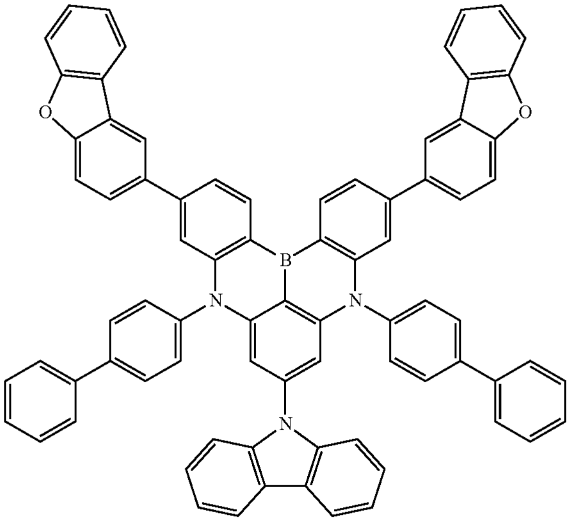
3
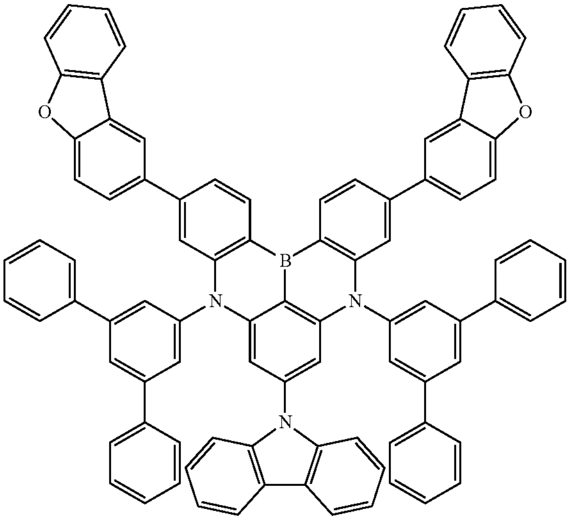
4
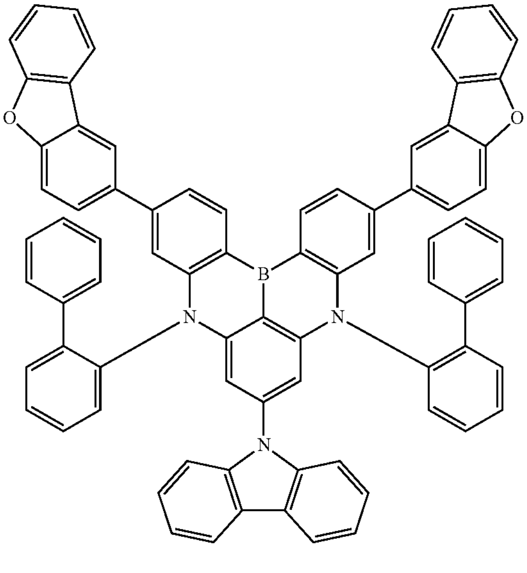
-continued
5
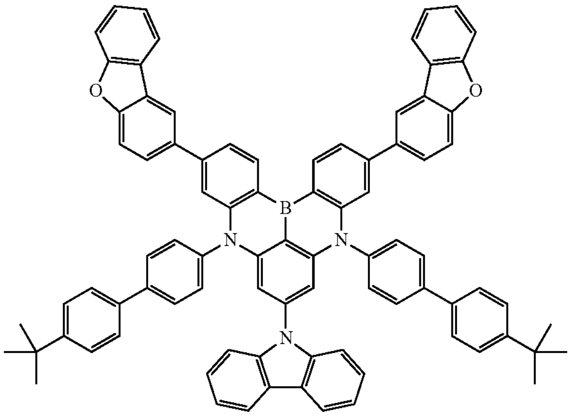
6
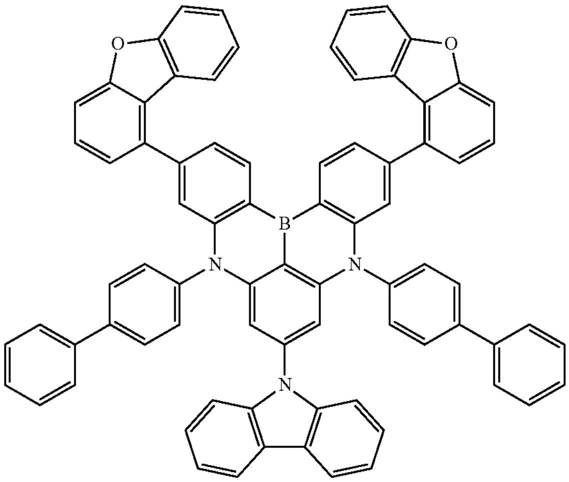
7
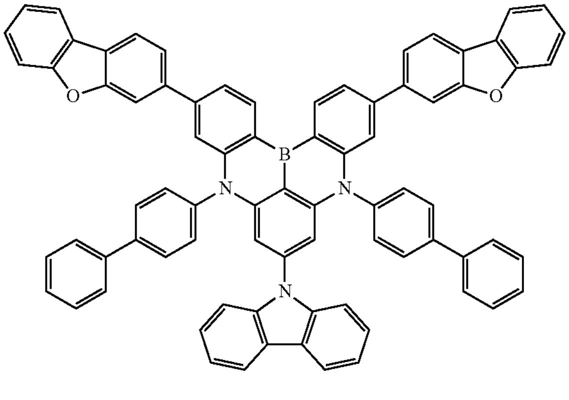

-continued
8
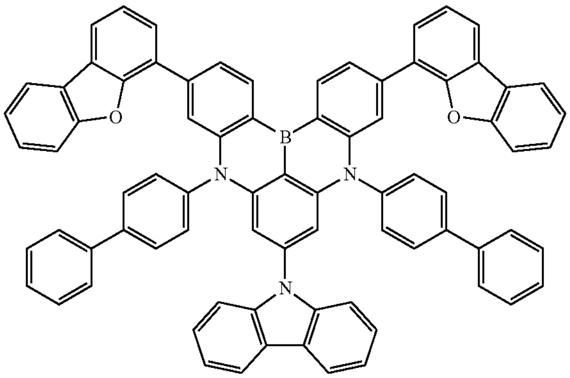
9
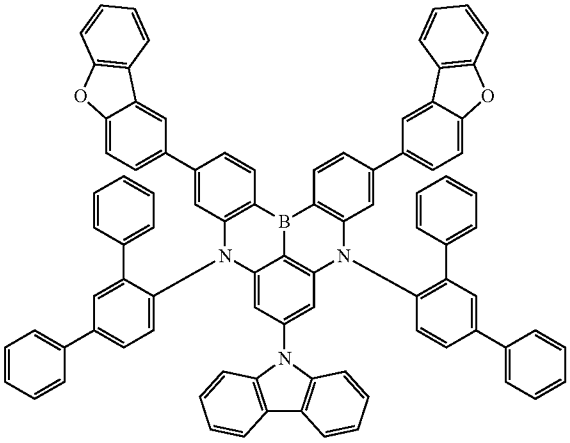
10
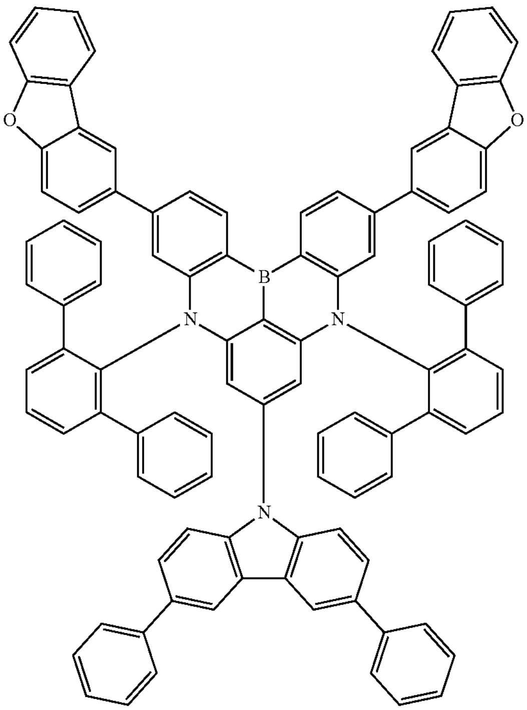
-continued
11
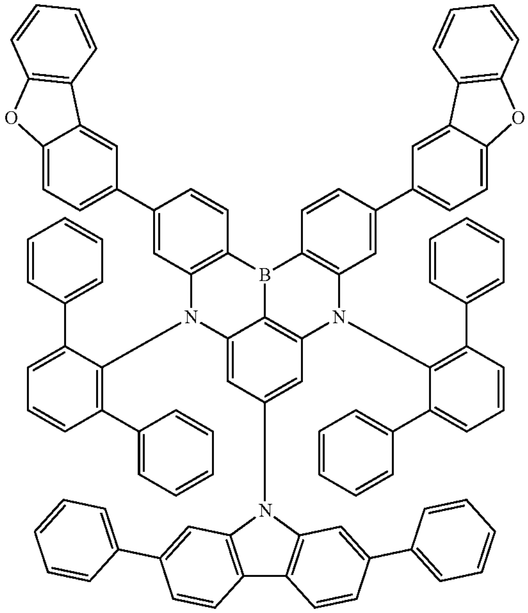
12
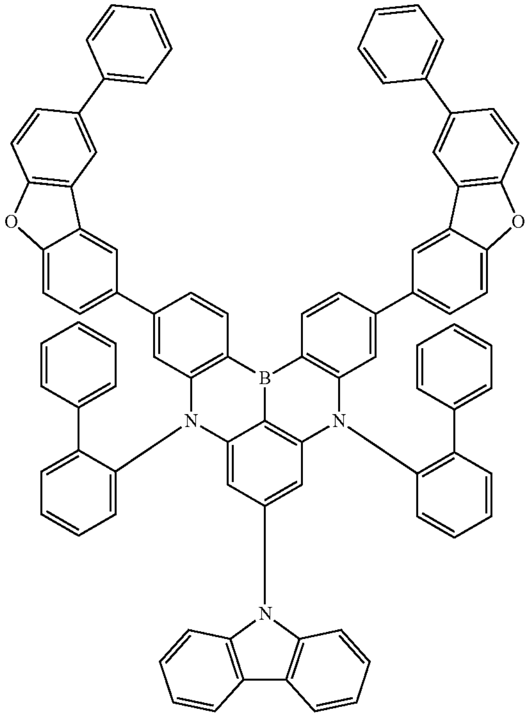

-continued
13
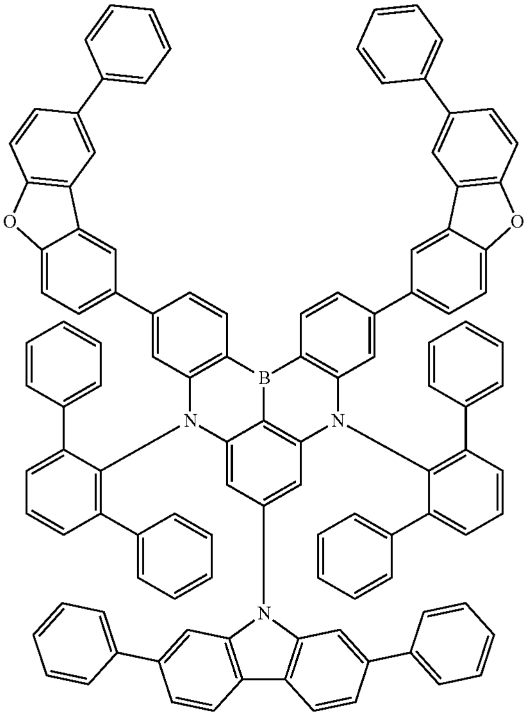
14
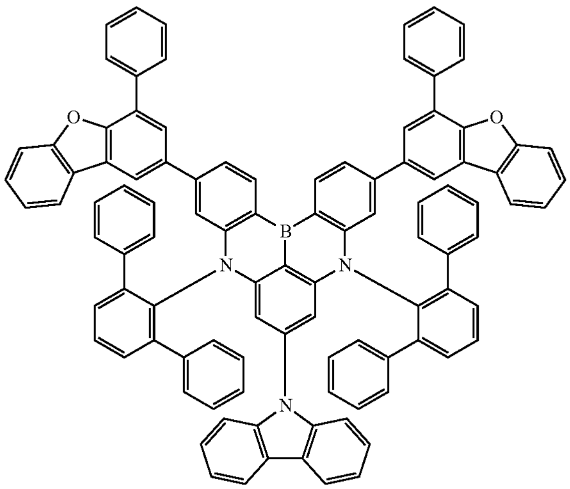
15
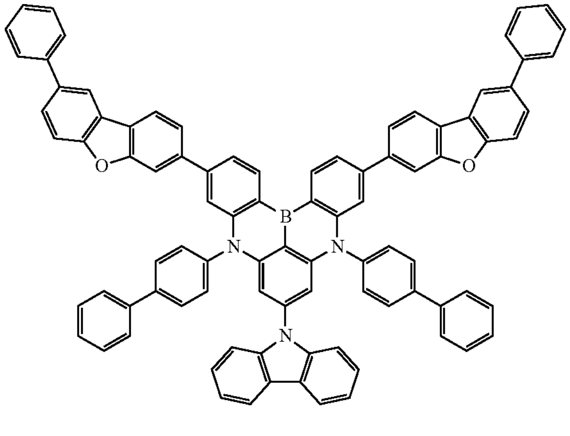
-continued
16
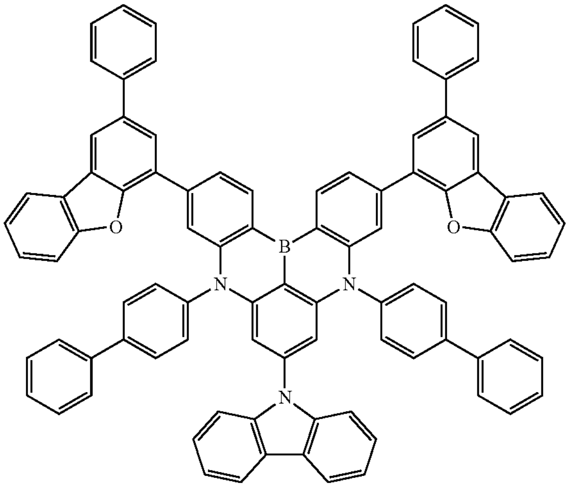
17
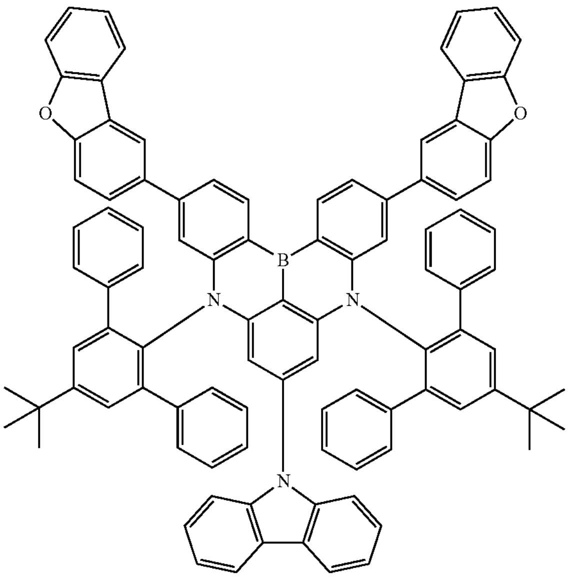
18
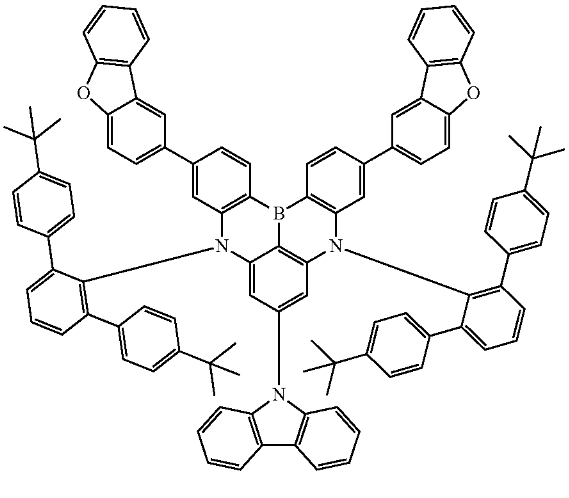

19
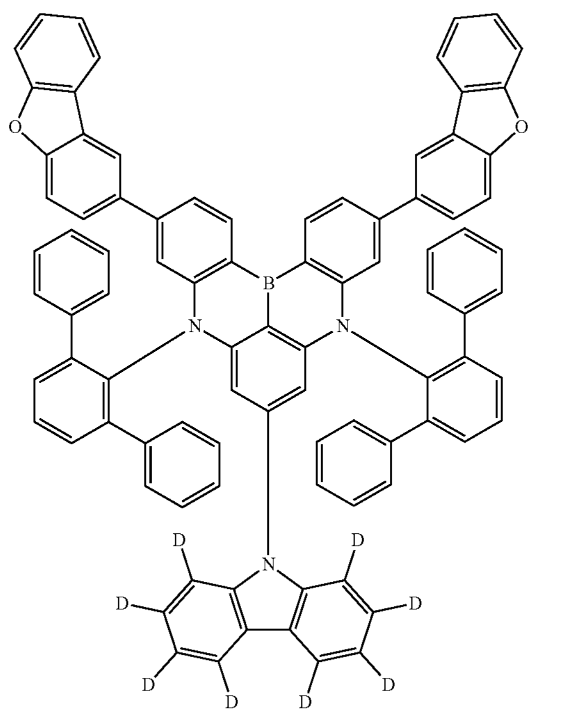
20
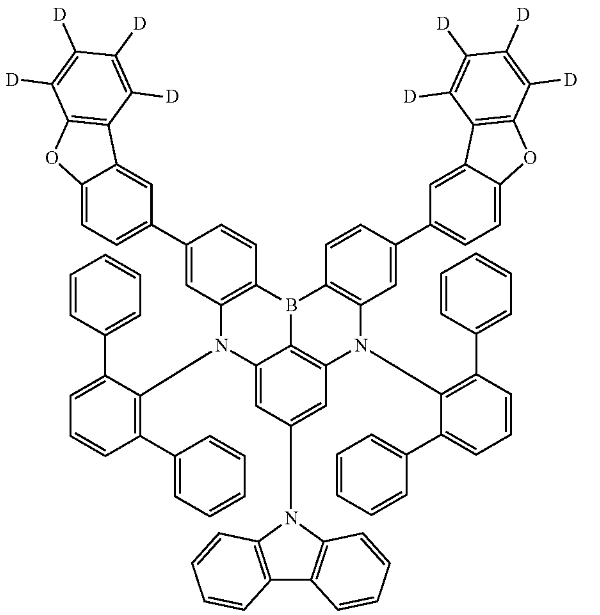
21
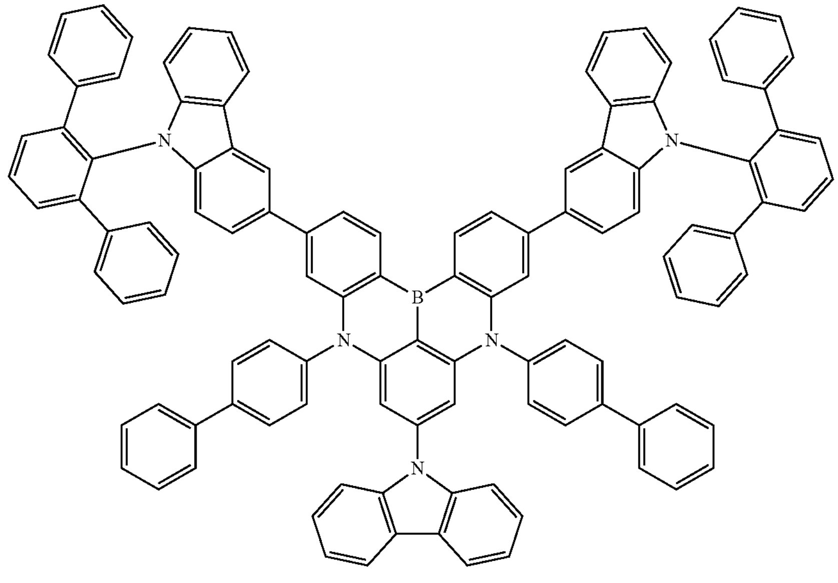

-continued
22
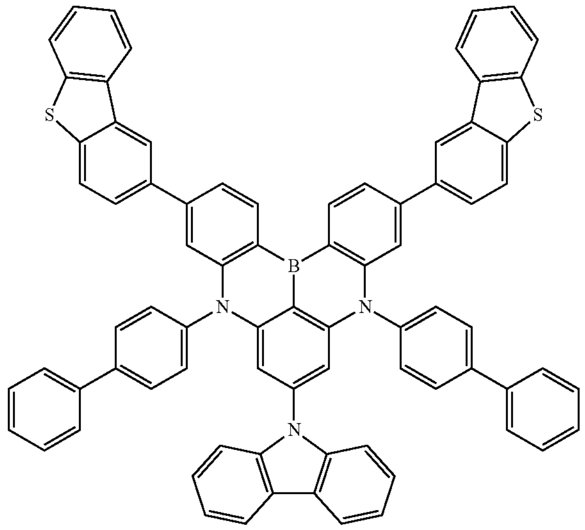
23
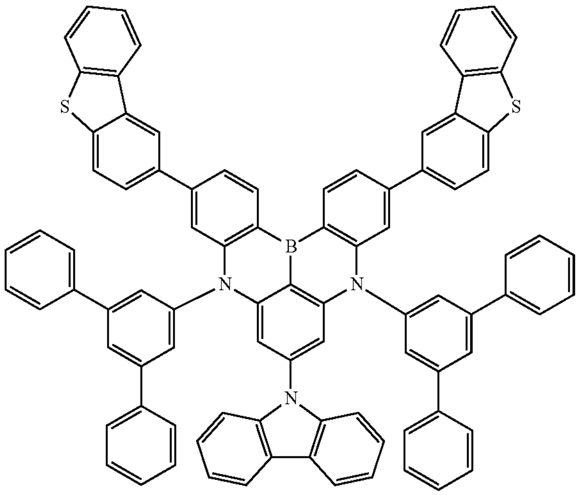
24
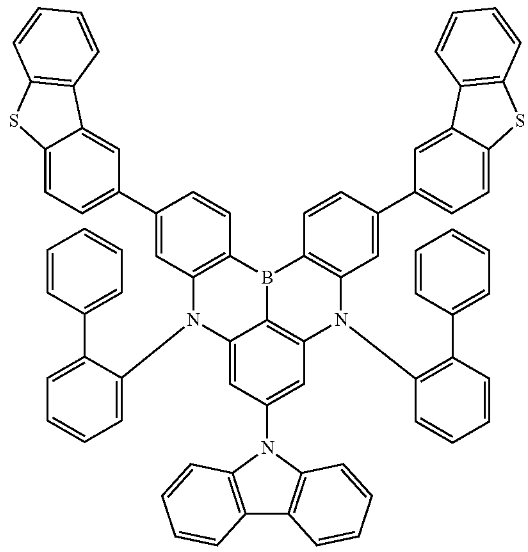
25
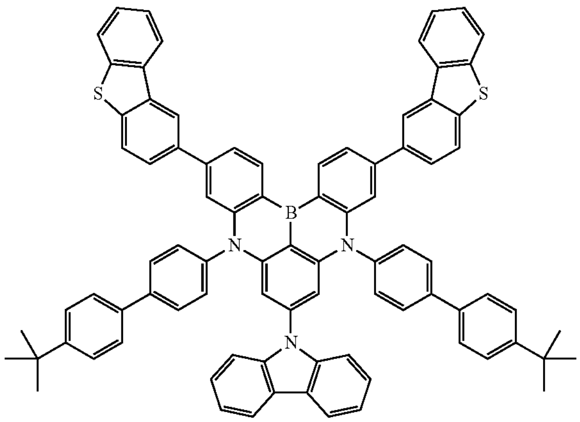

-continued
26
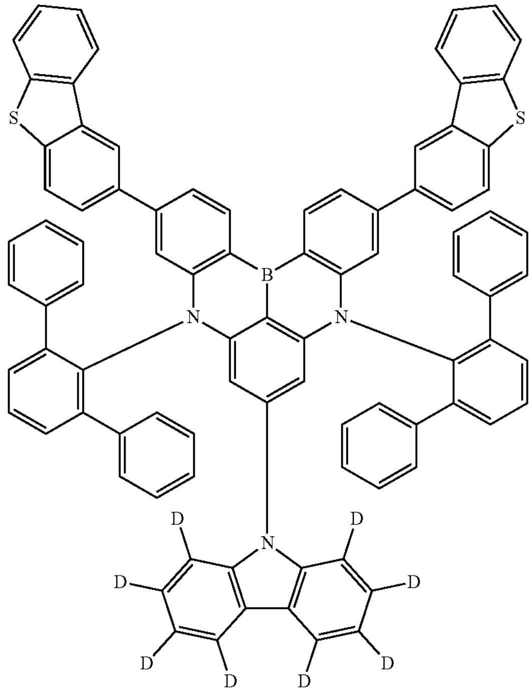
27
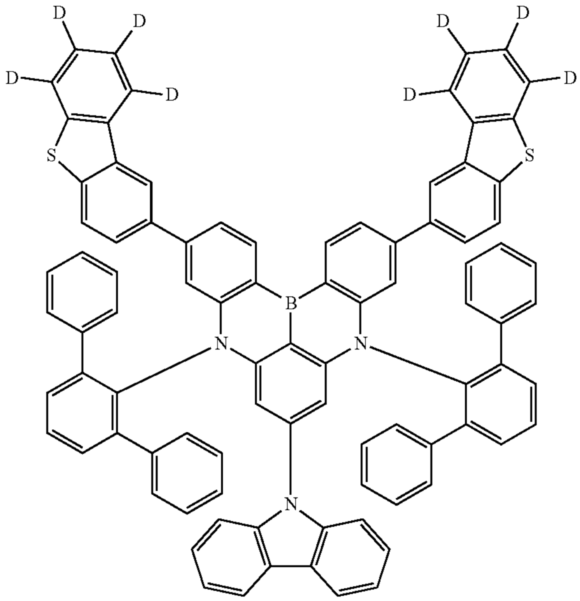
28
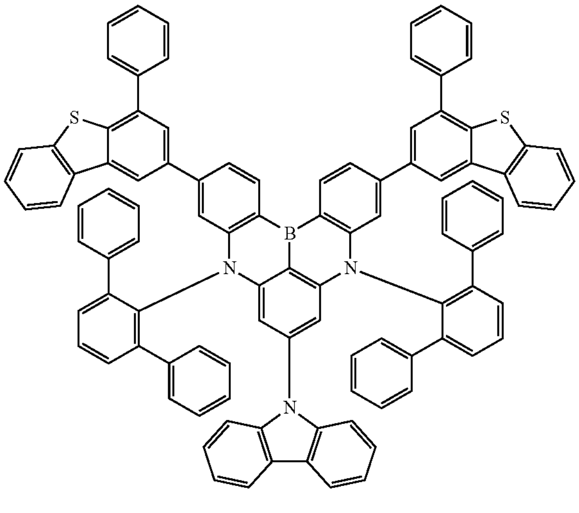
29
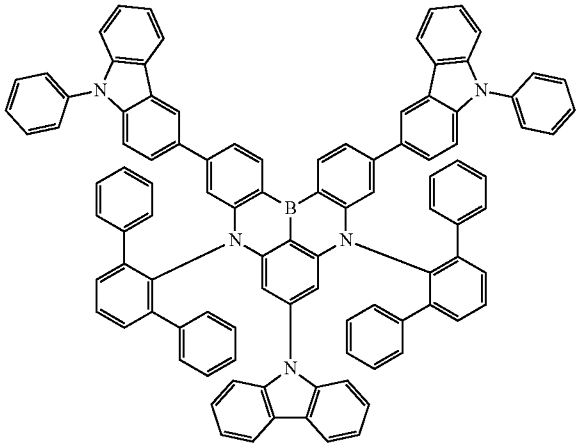

-continued
30
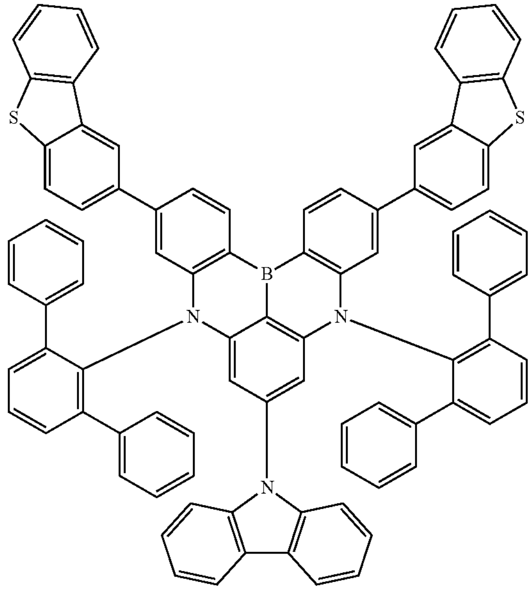
31
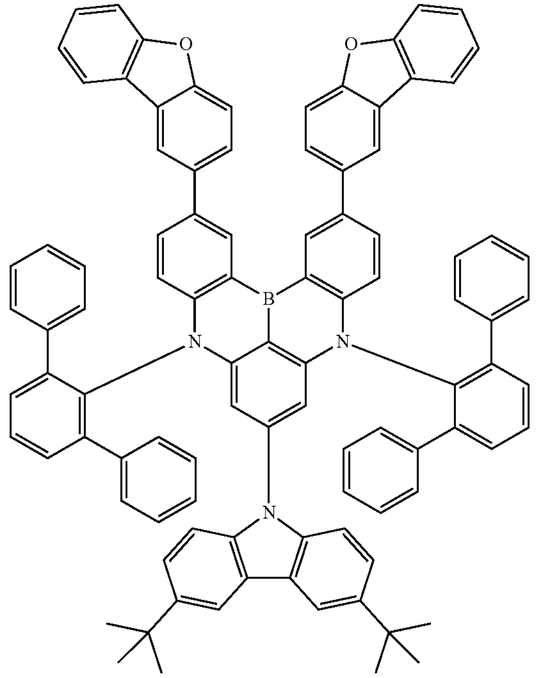
32
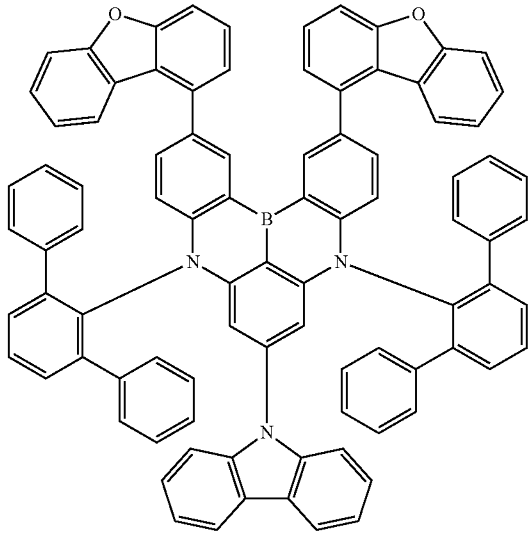

-continued
33
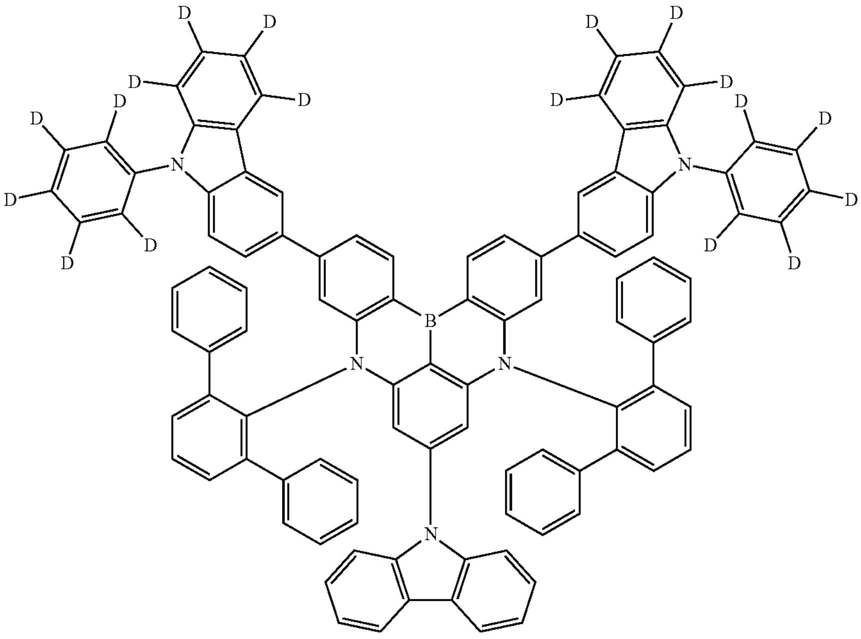
34
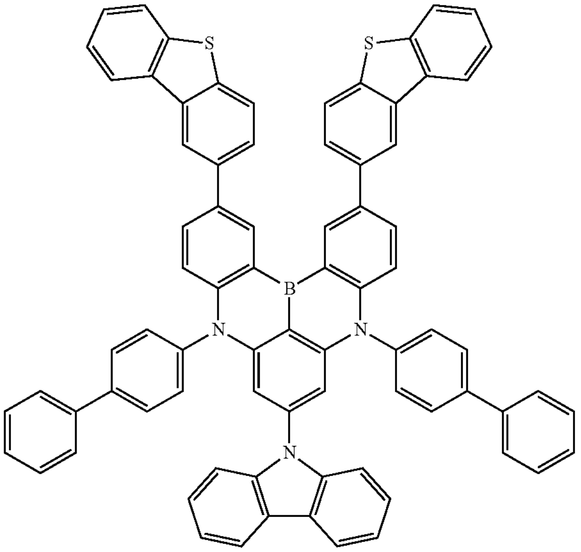
35
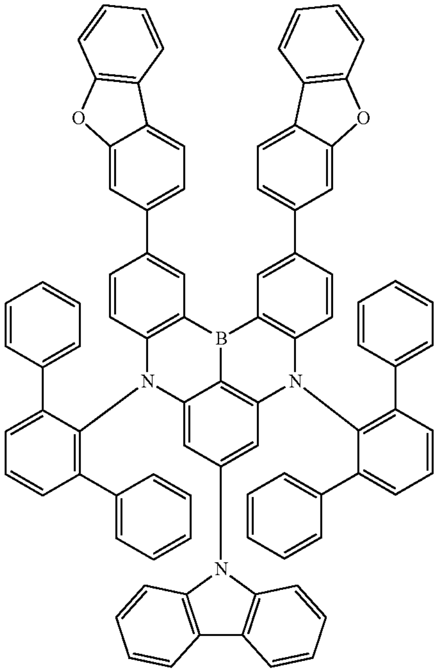

-continued
36
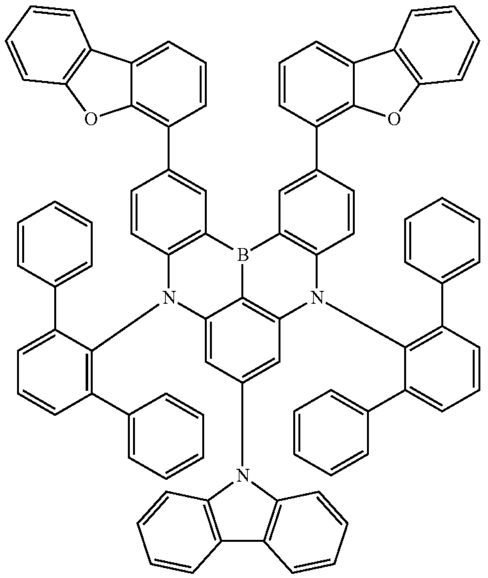
37
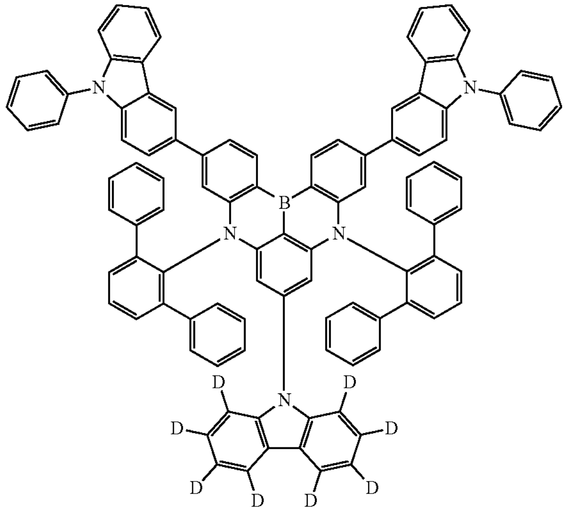
-continued
38
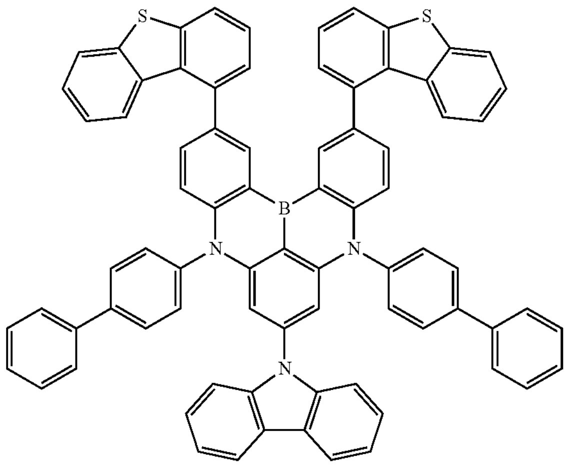

-continued
39
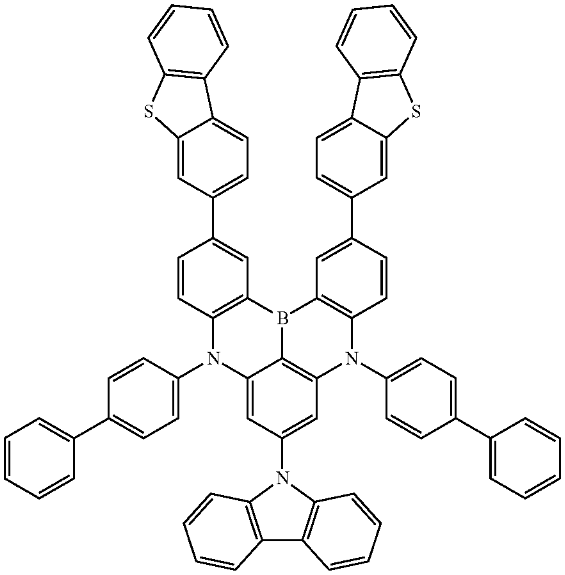
40
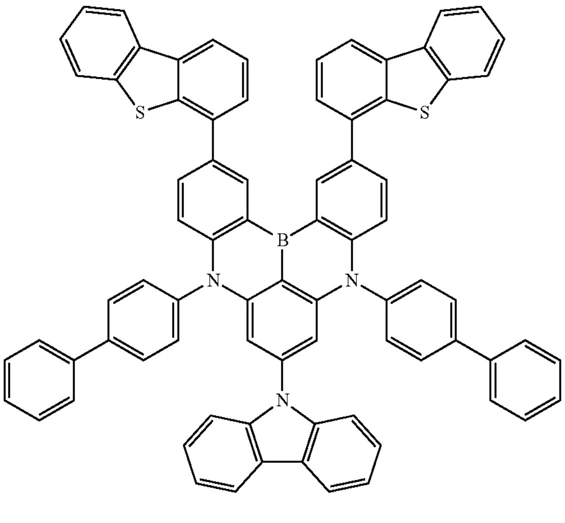
-continued
41
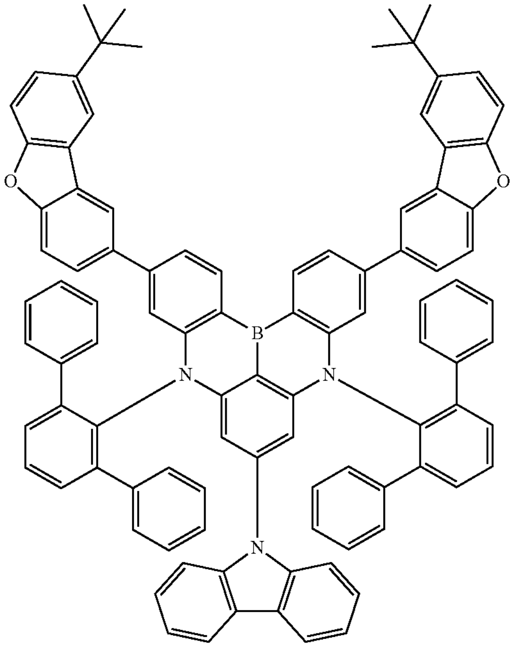
42
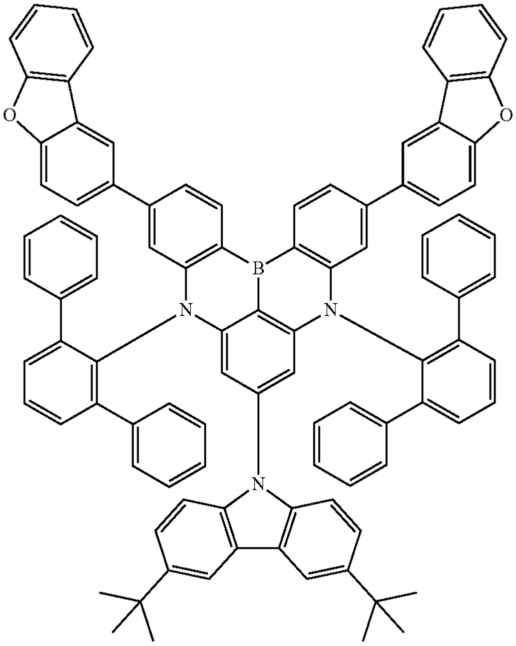

-continued
43
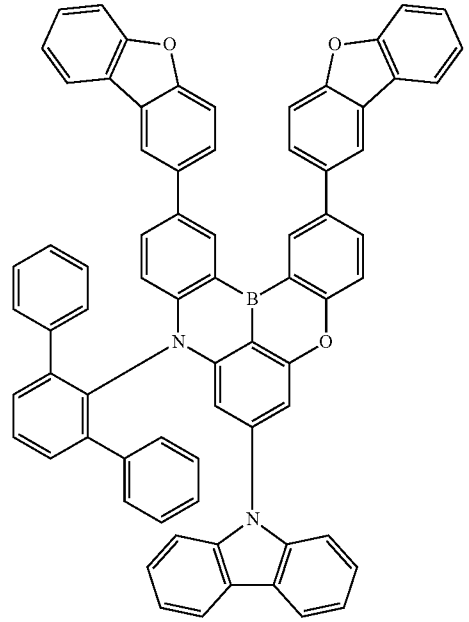
-continued
45
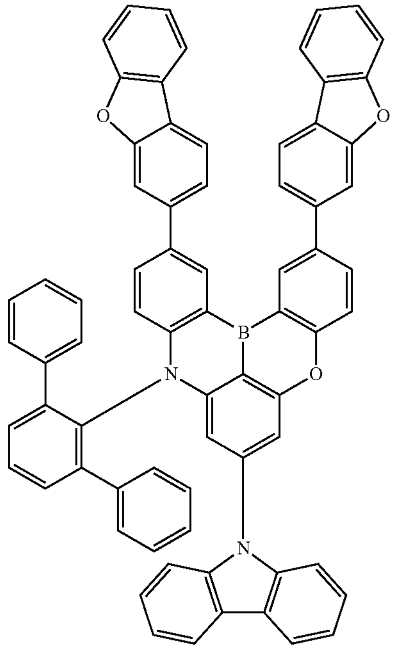
44
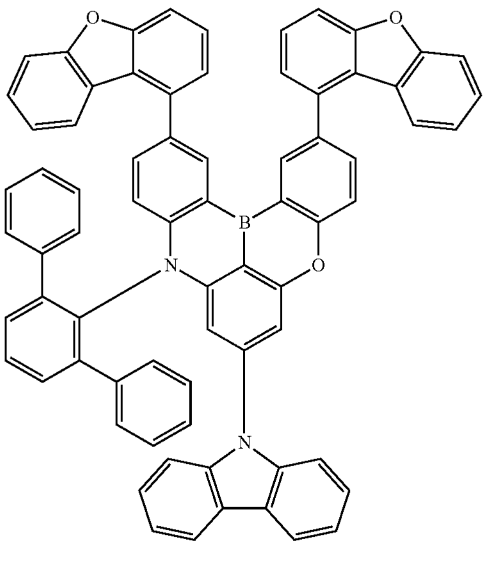
46
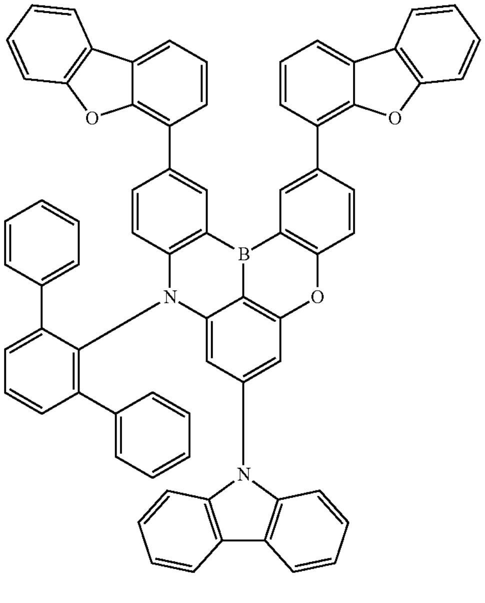

-continued
47
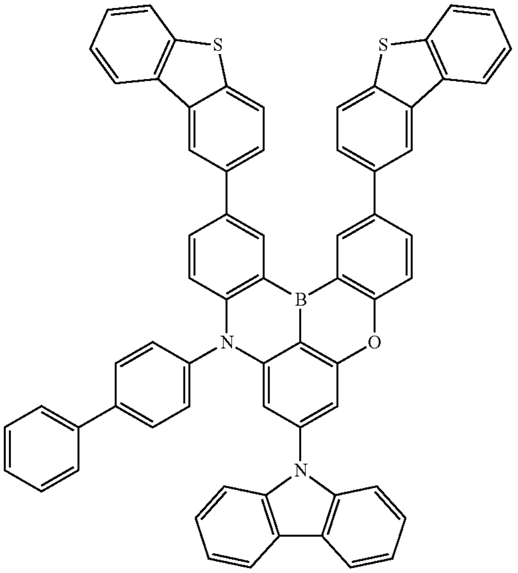
48
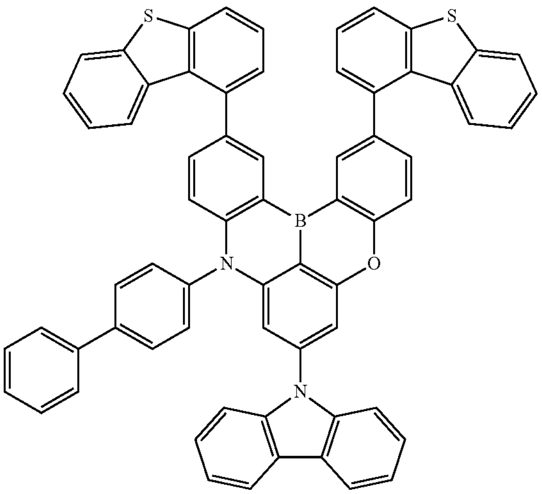
-continued
49
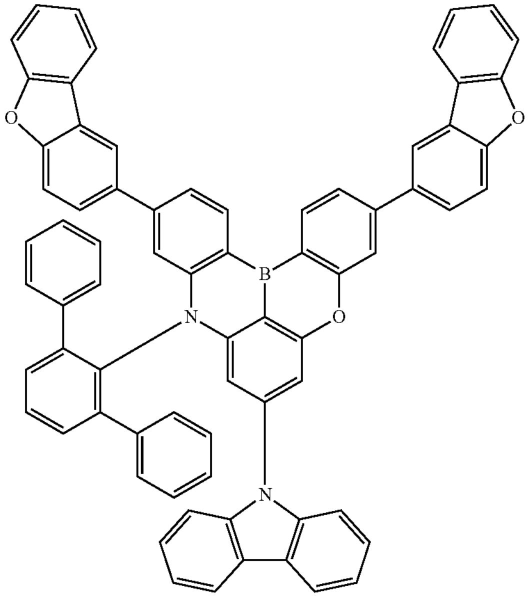
50
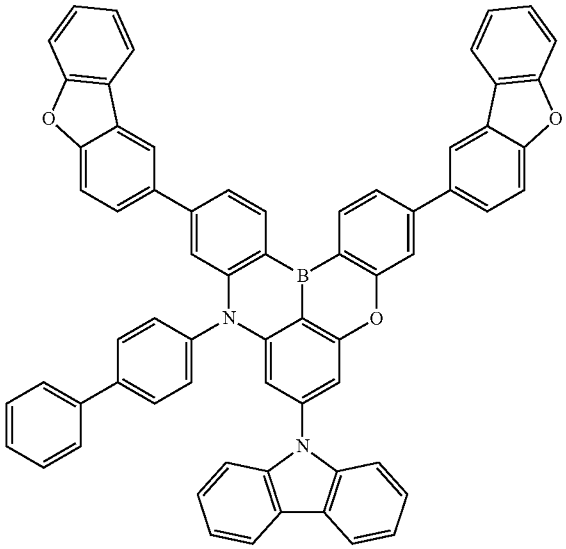

-continued
51
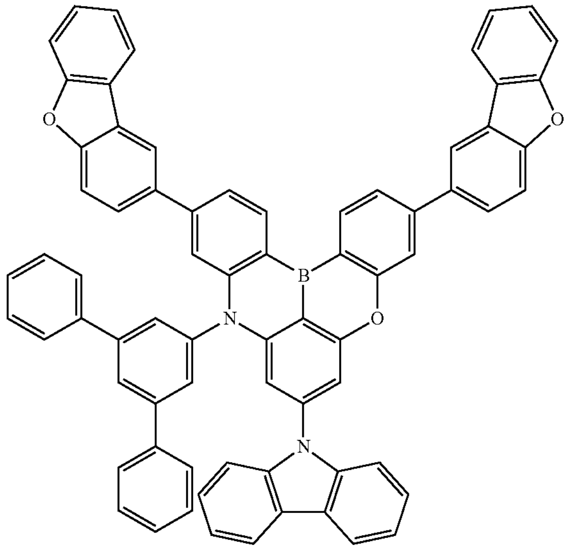
-continued
53
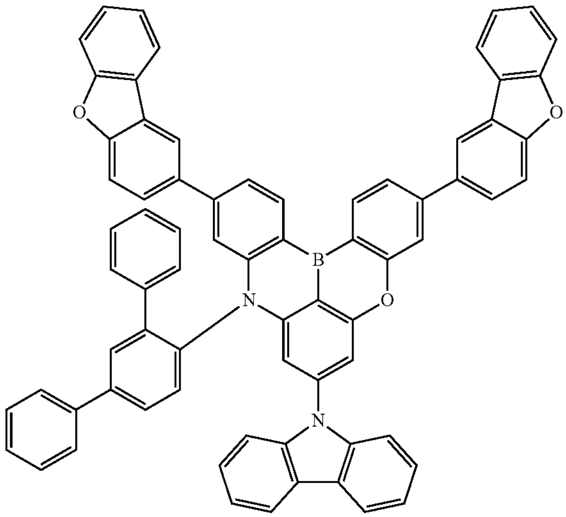
52
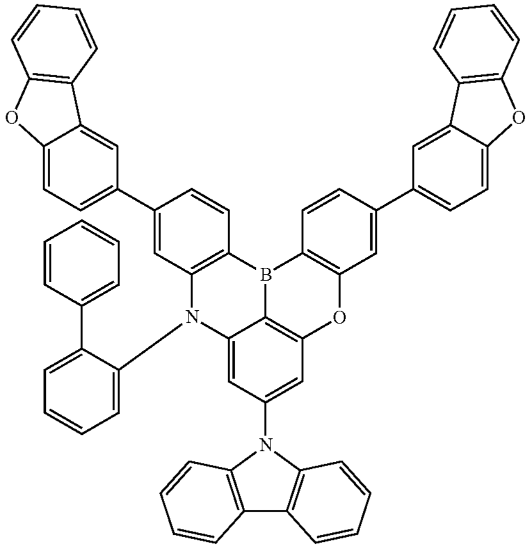
54
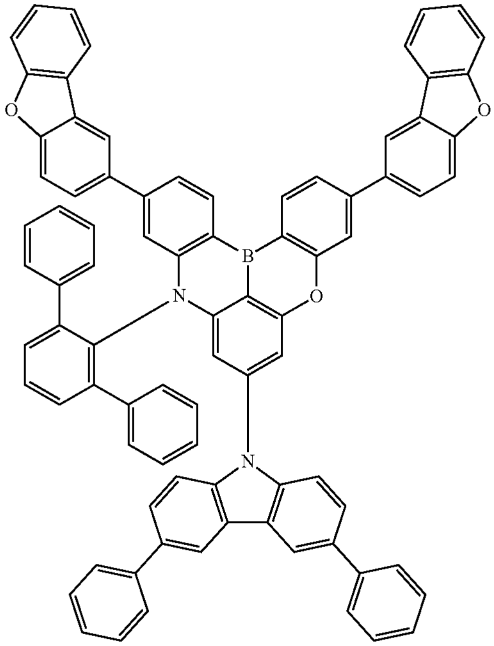

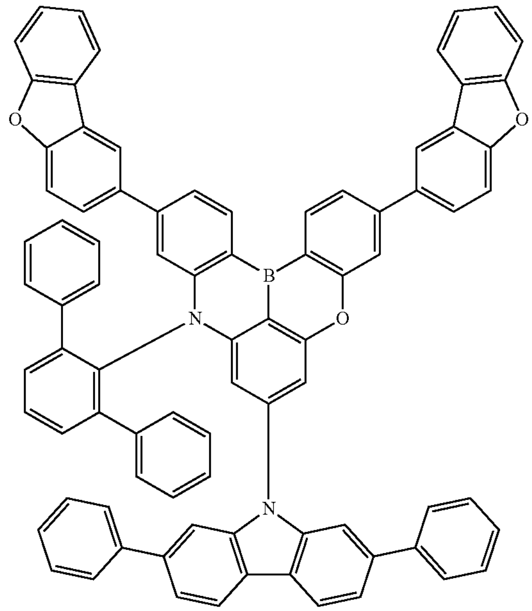
55
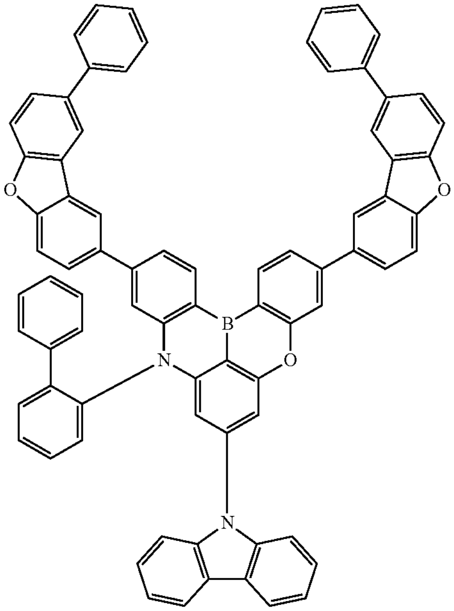
56
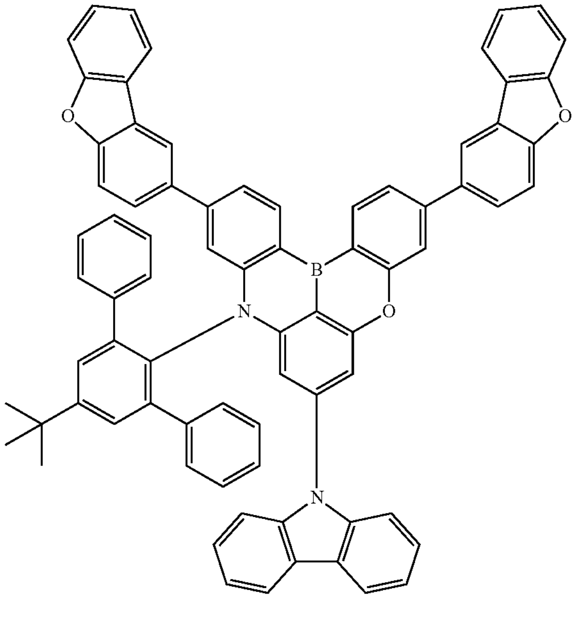
57
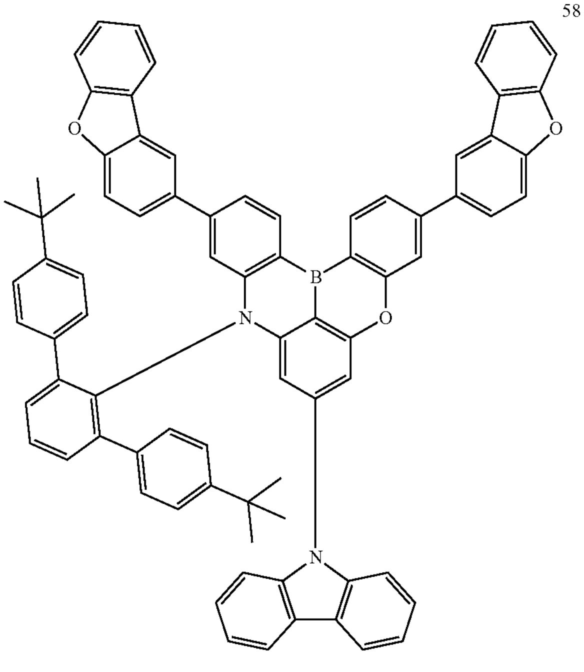
58

-continued
59
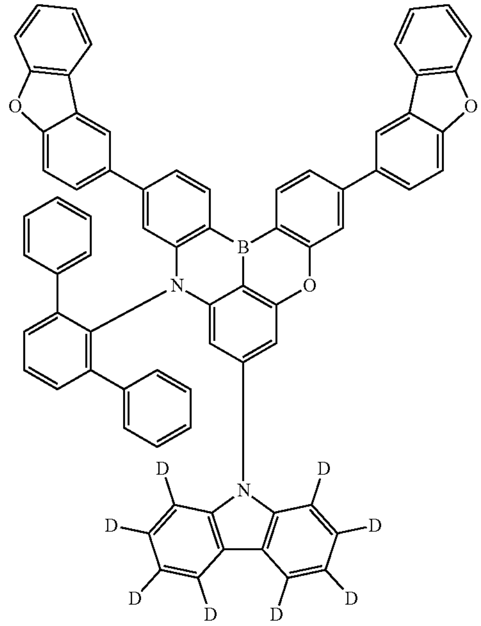
60
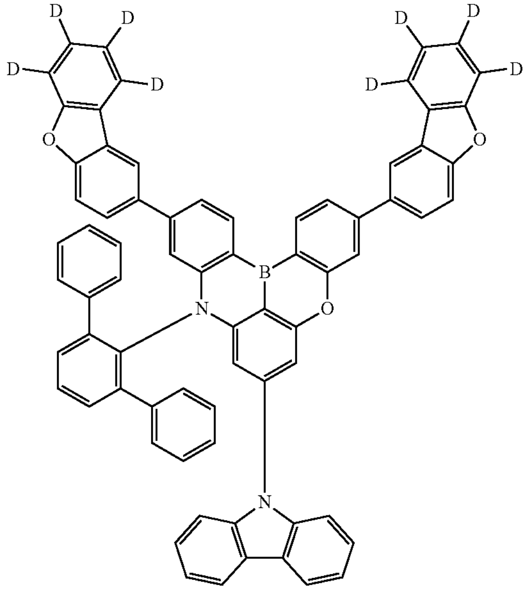
61
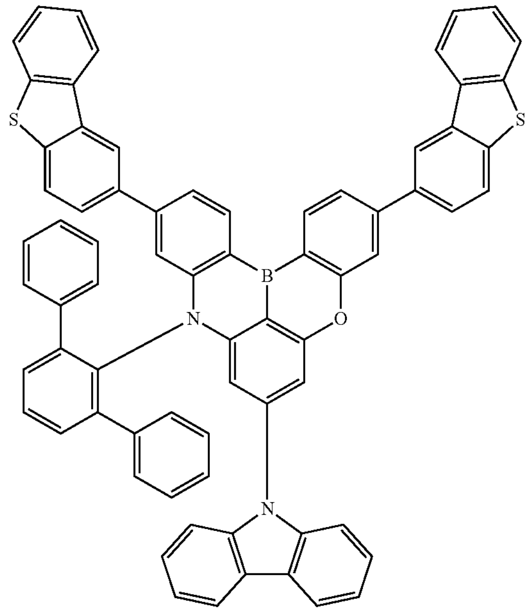
62
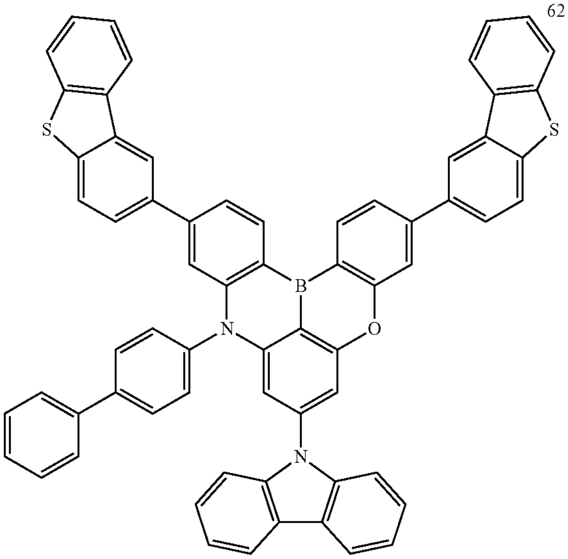

-continued
63
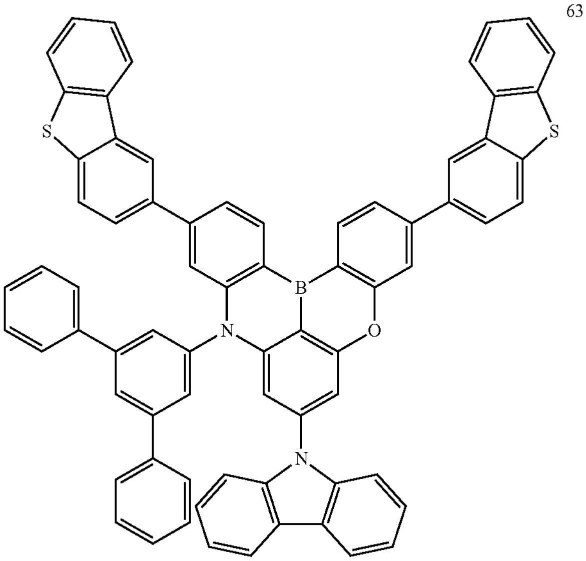
64
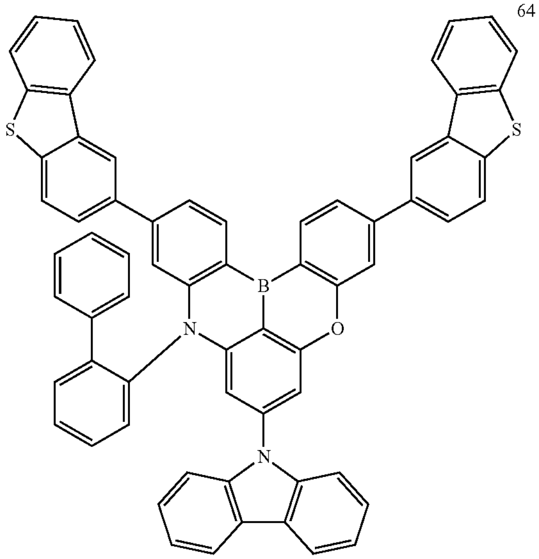
65
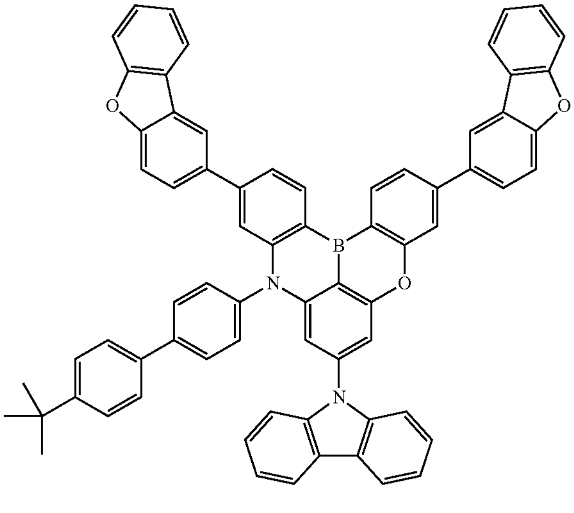
66
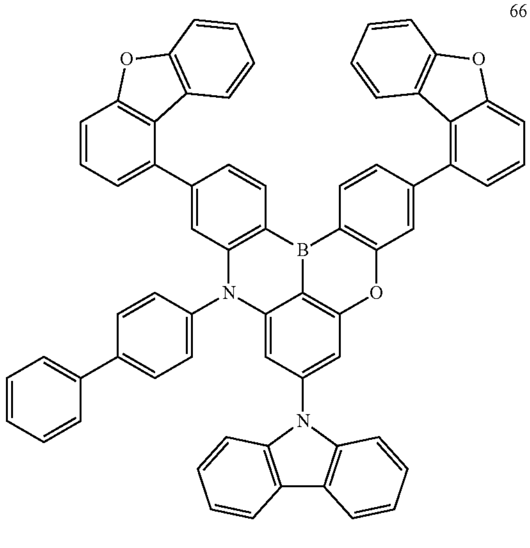
67
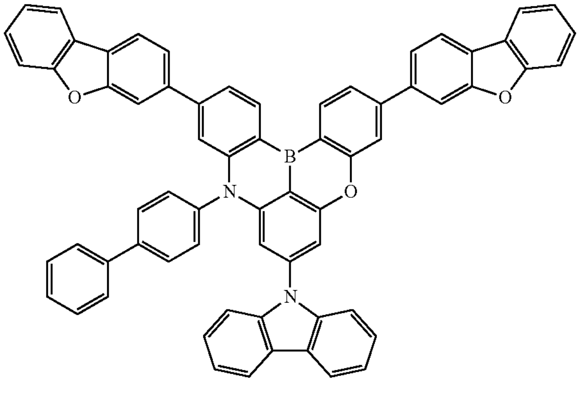
68
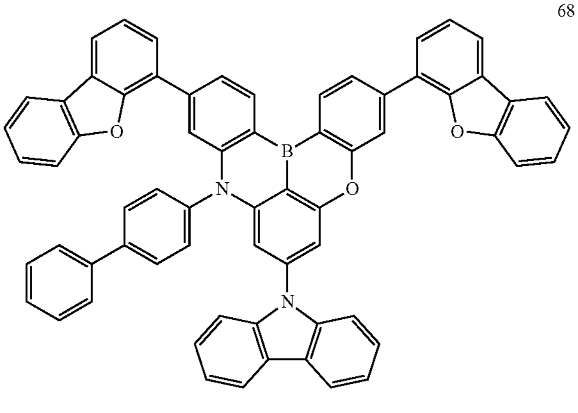

-continued
69
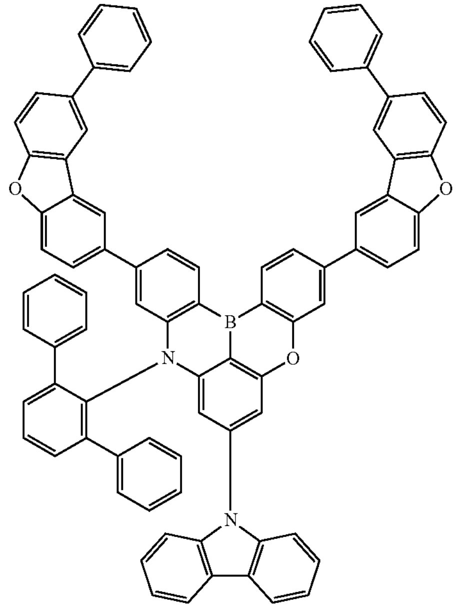
70
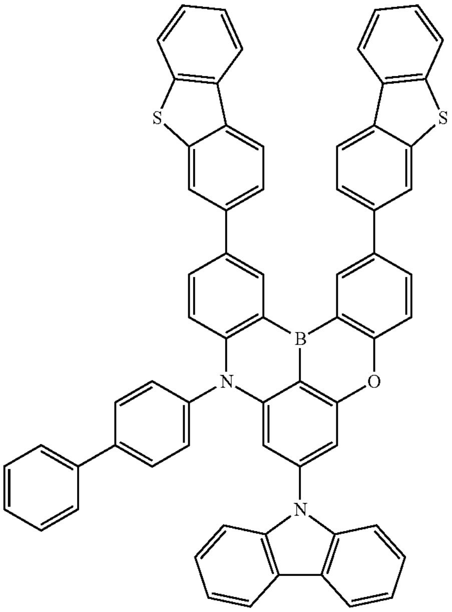
71
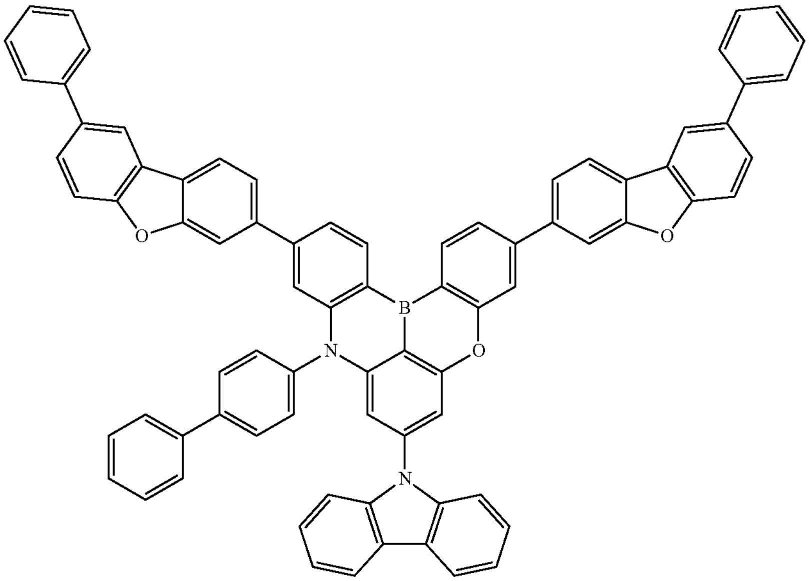

-continued
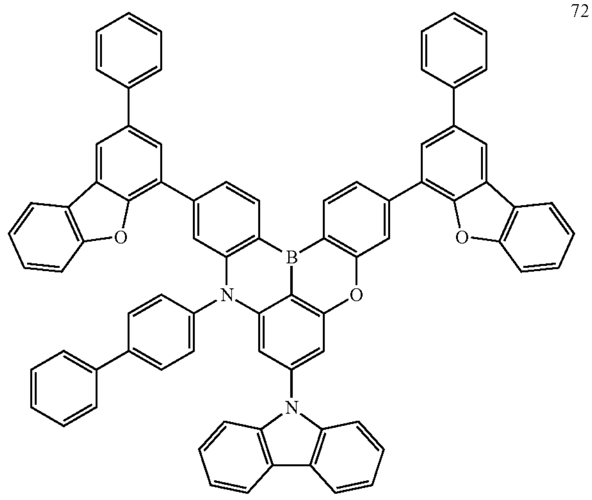
72
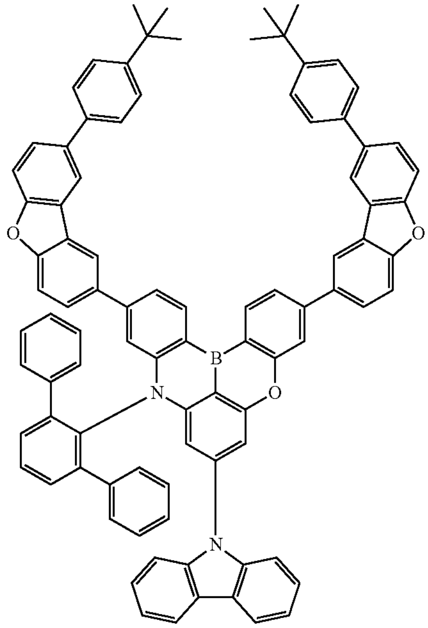
73
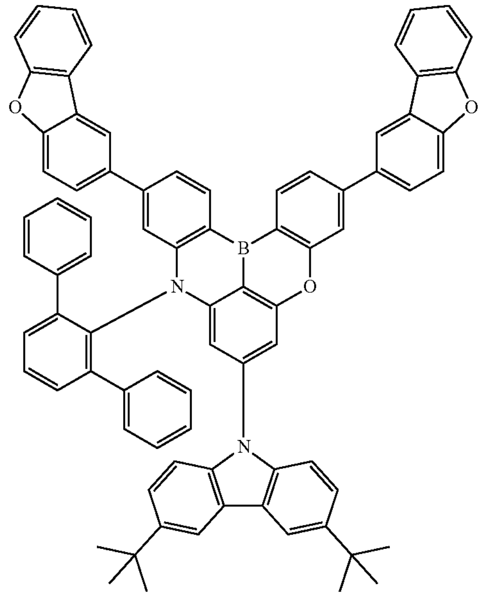
74
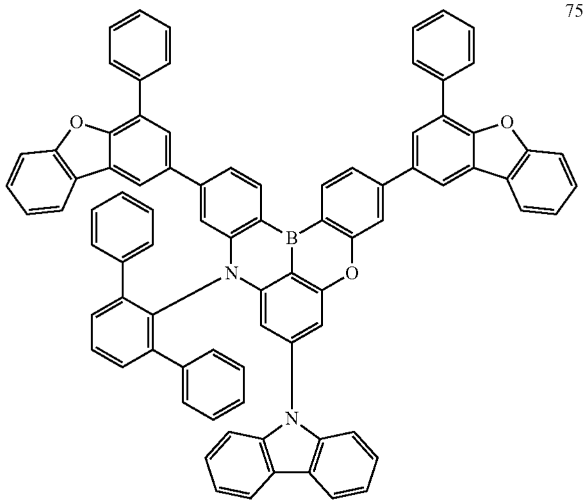
75

-continued
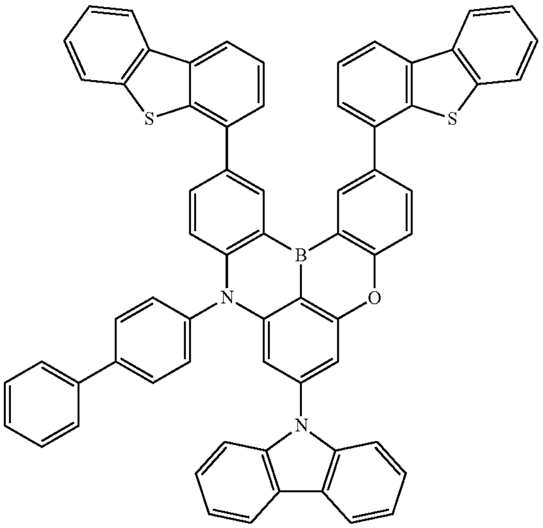
76
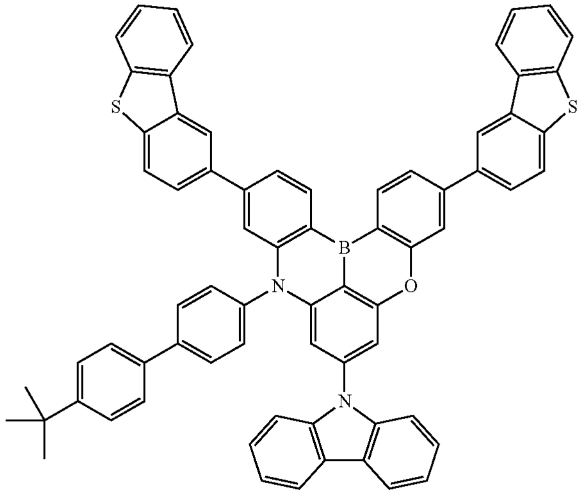
77
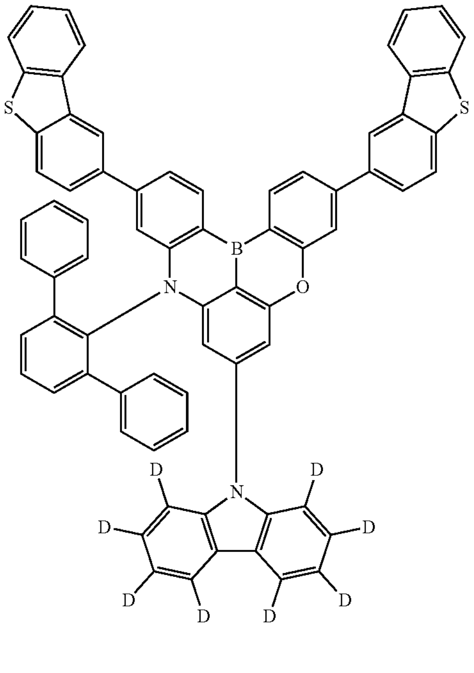
78

79
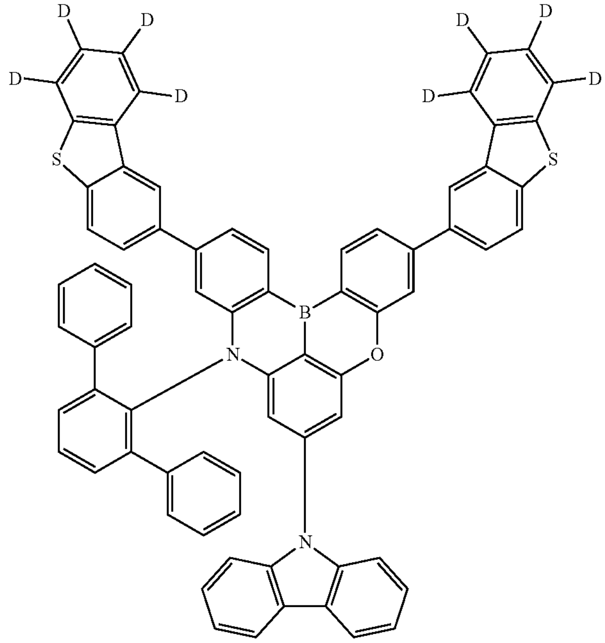
80
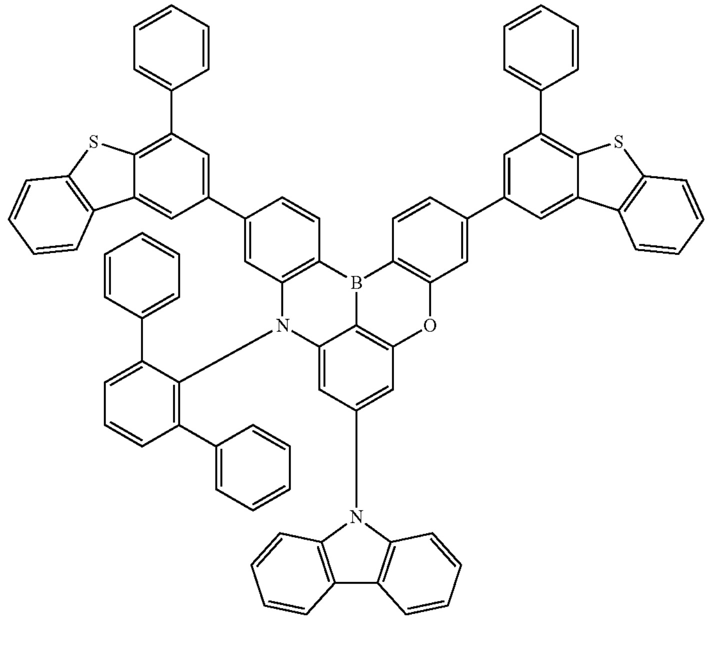

-continued
81
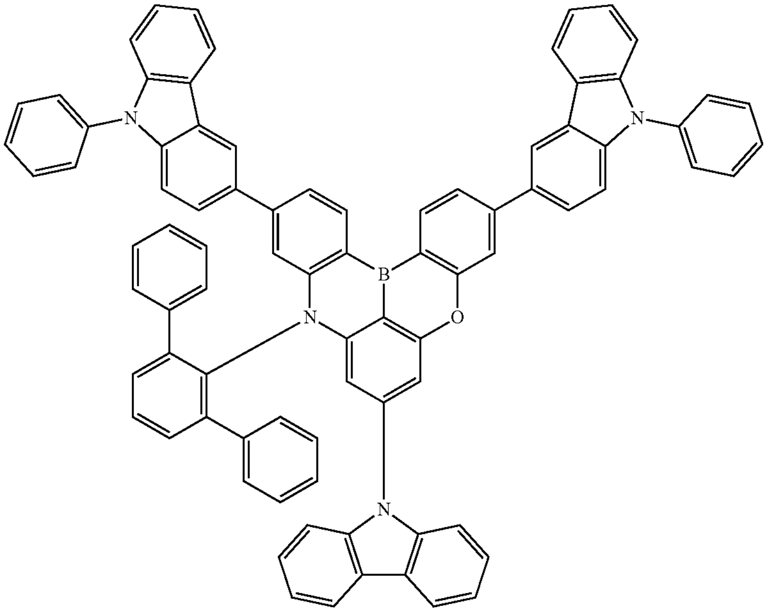
82
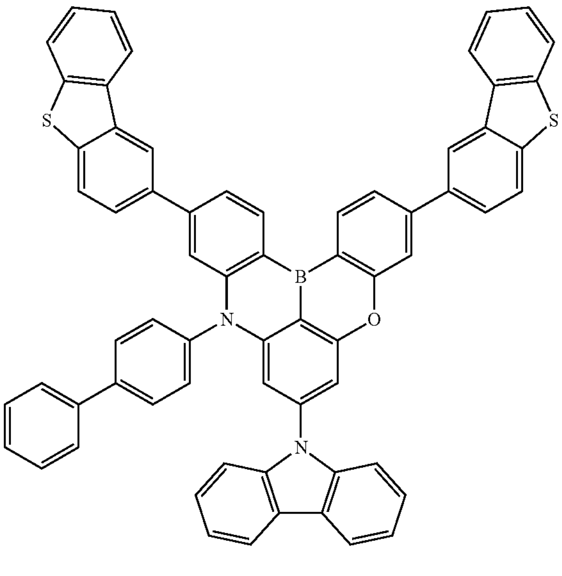

-continued
83
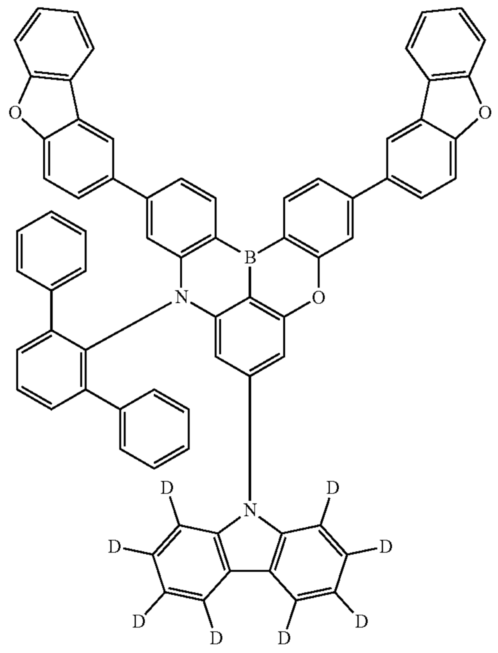
84
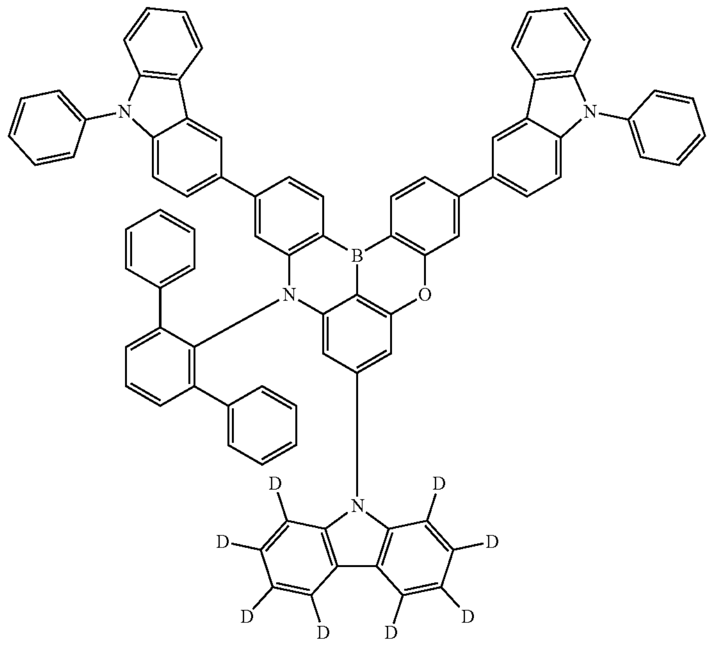

-continued
85
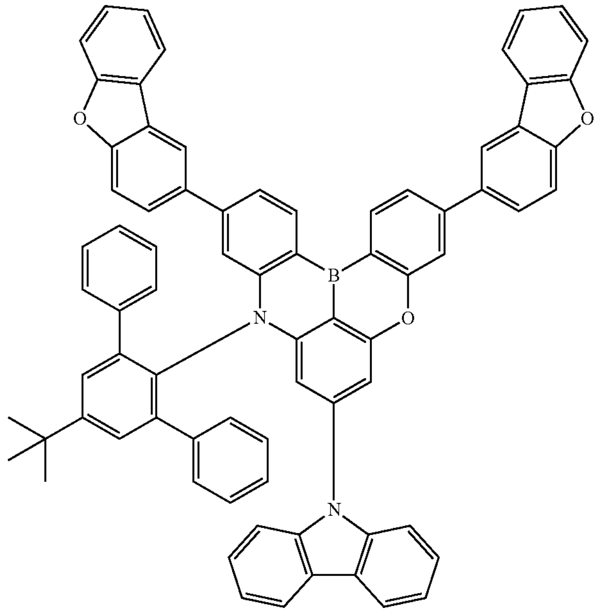
86
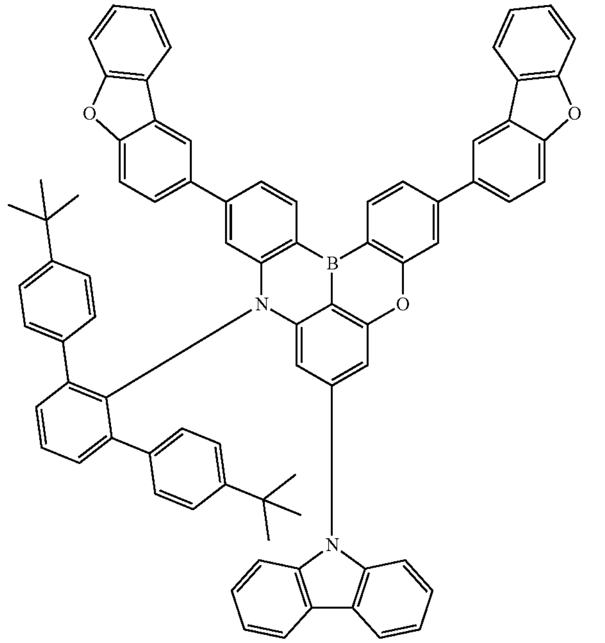

-continued
87
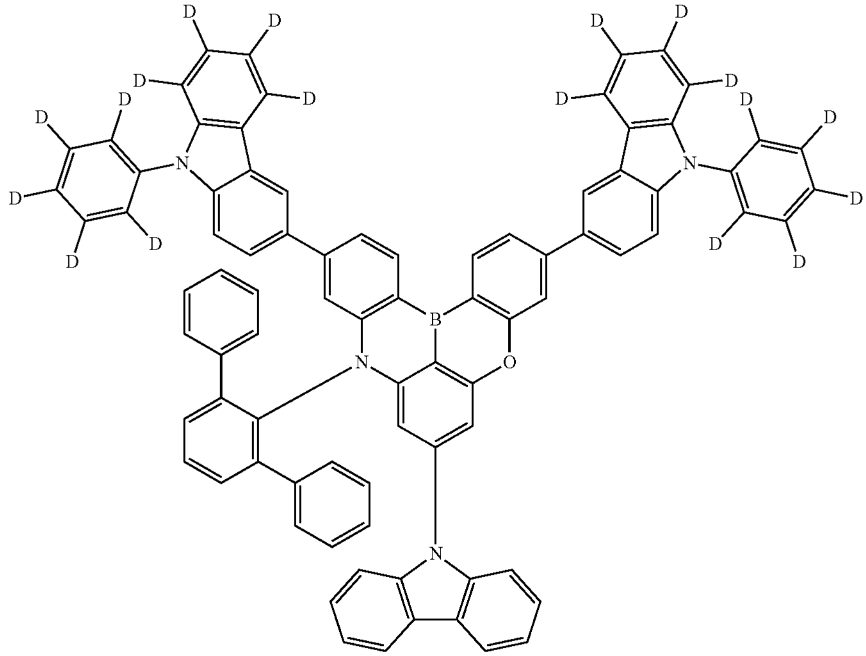
88
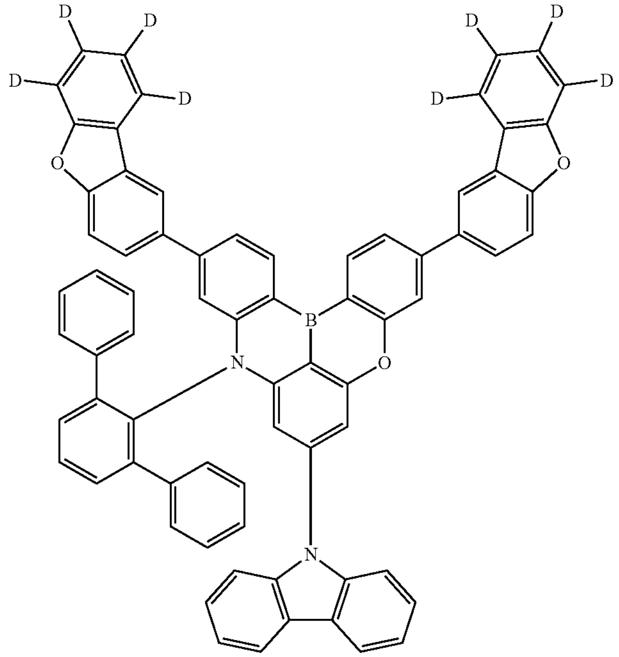

-continued
89
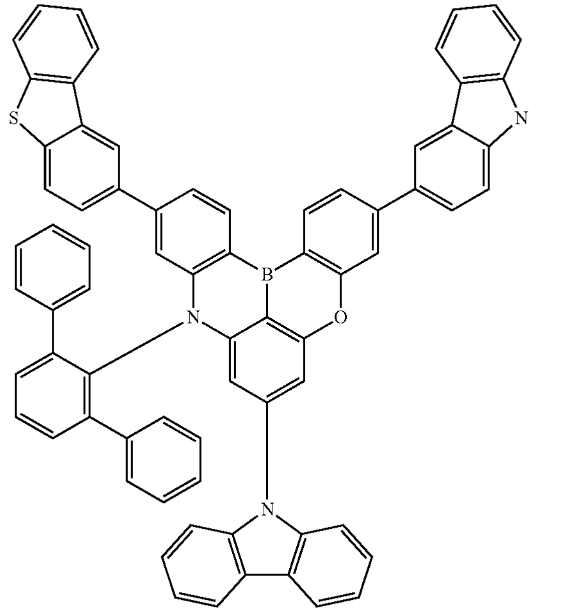
90
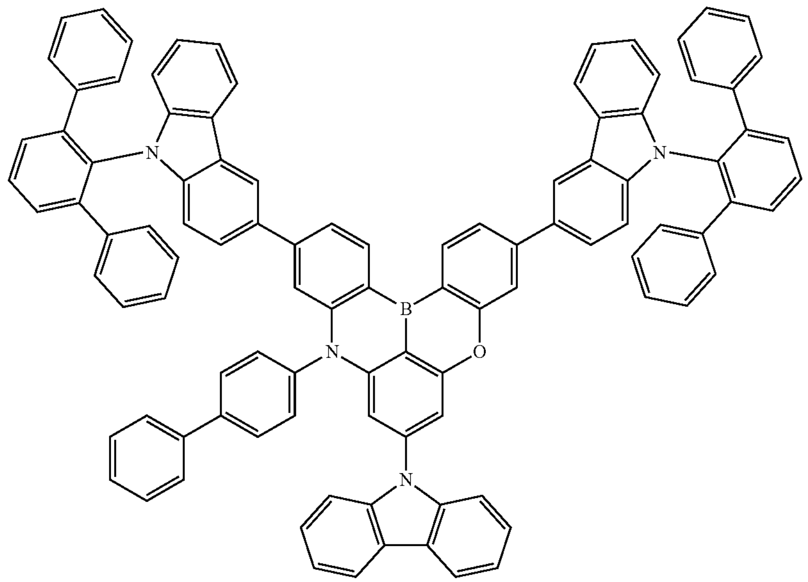

-continued
91
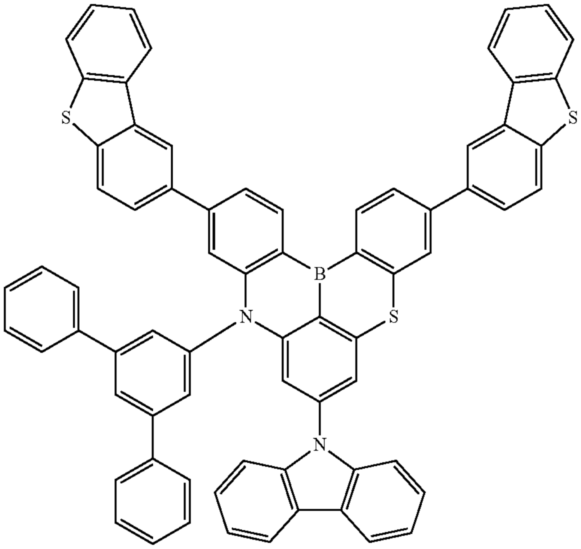
92
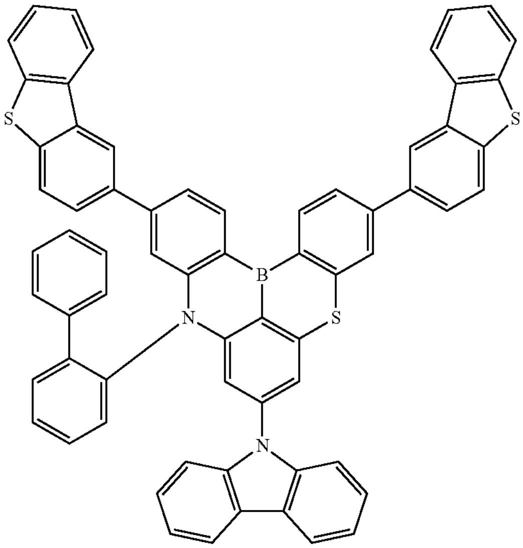
93
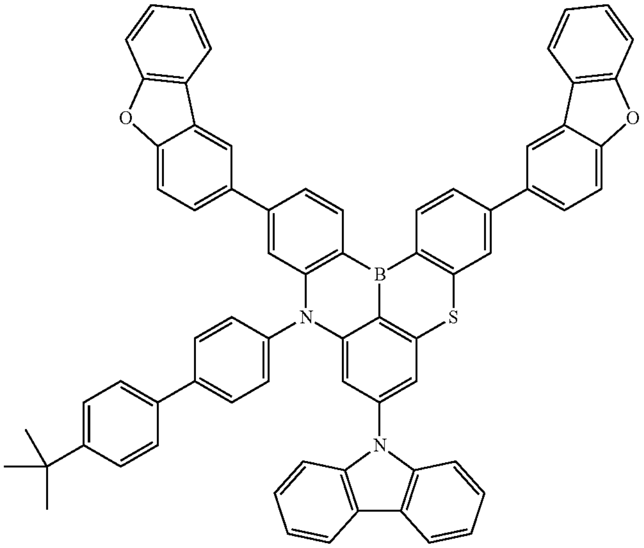

-continued
94
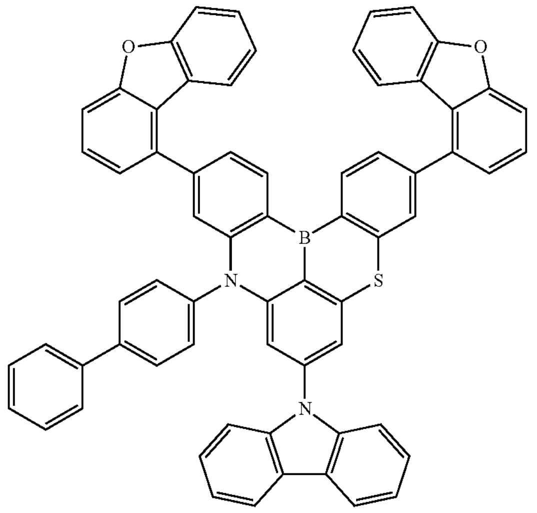
95
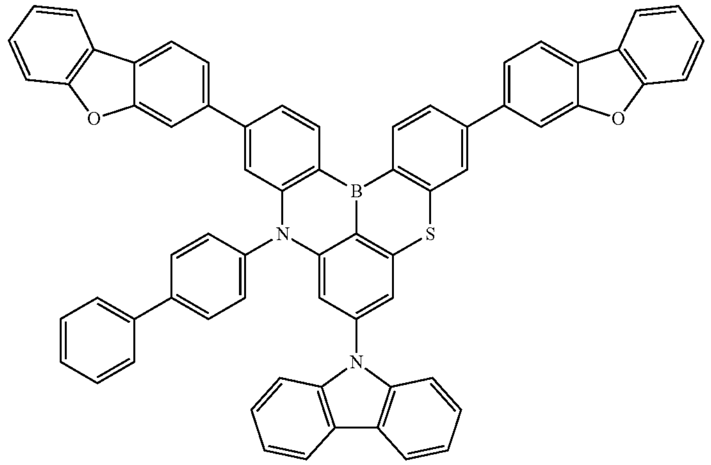
96
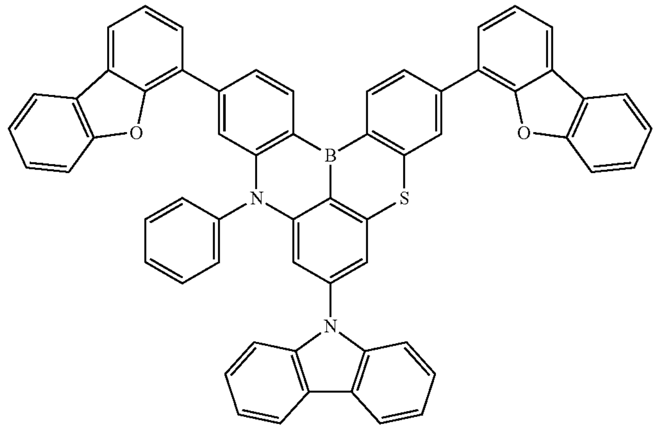

97
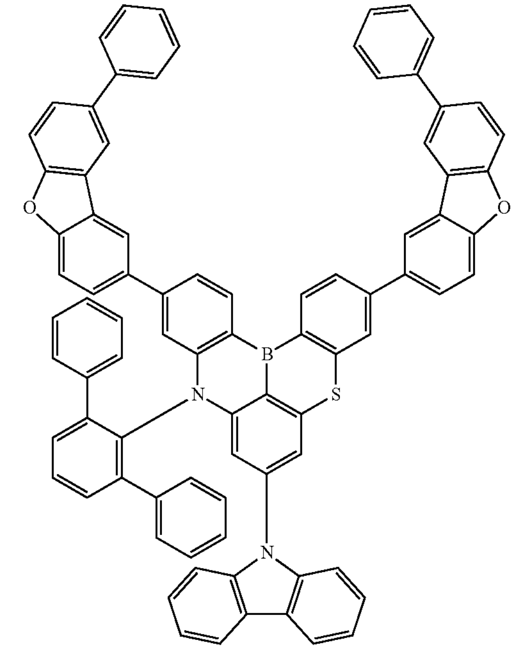
98
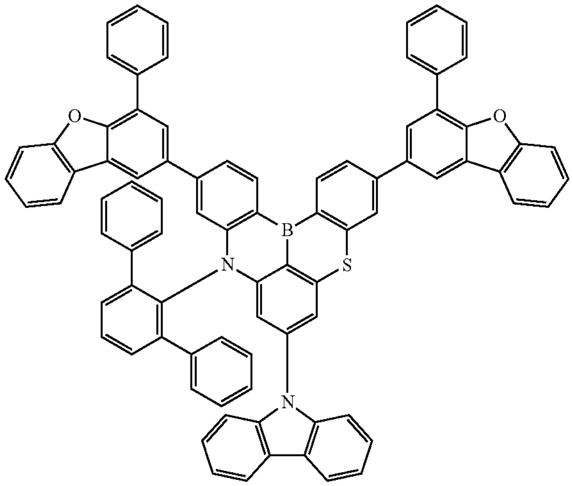
99
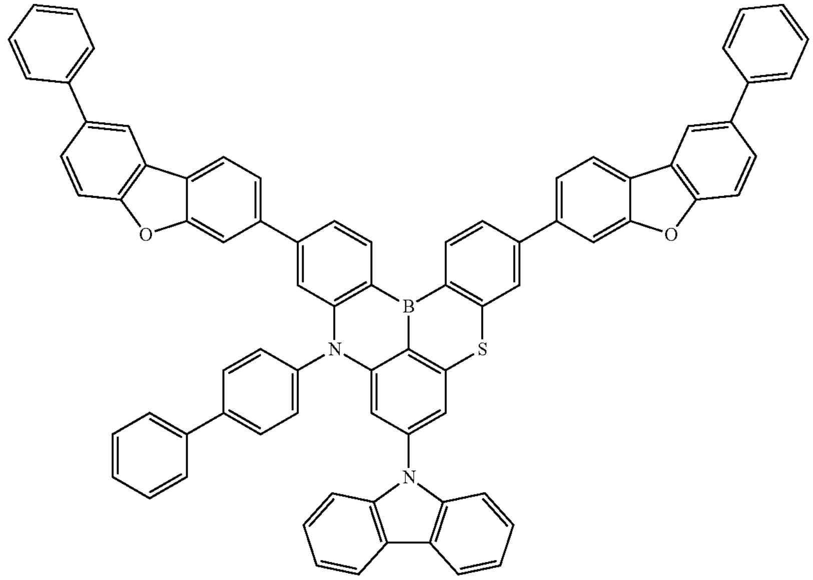

-continued
100
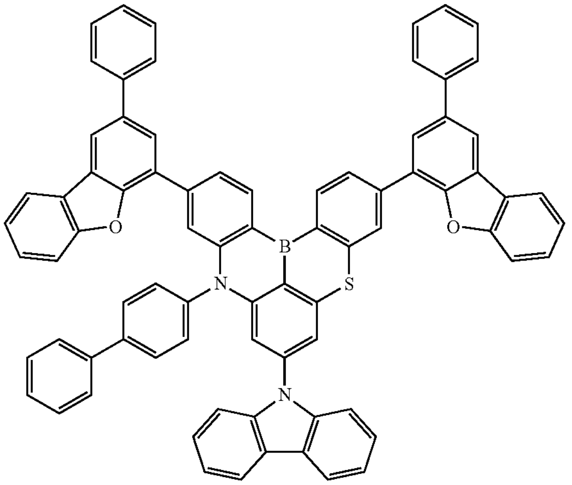
101
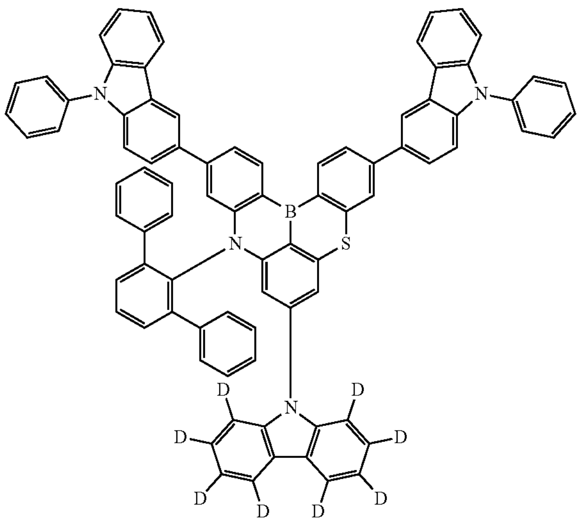
102
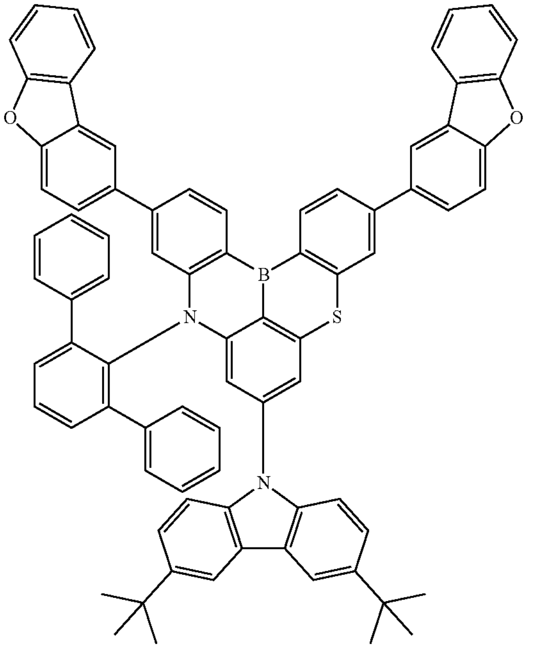
103
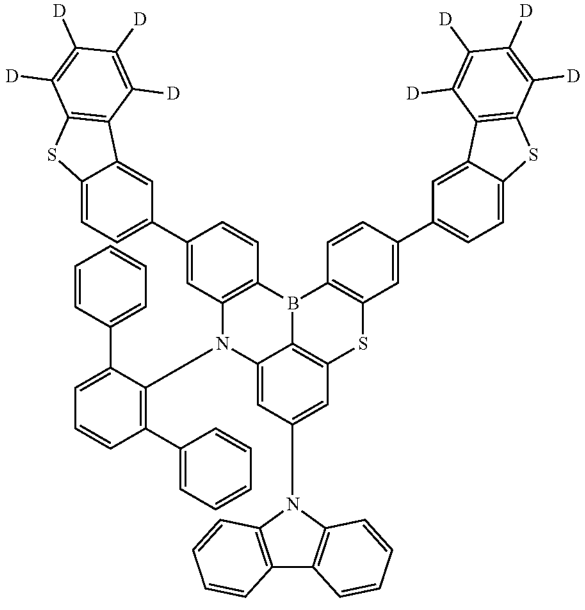

-continued
104
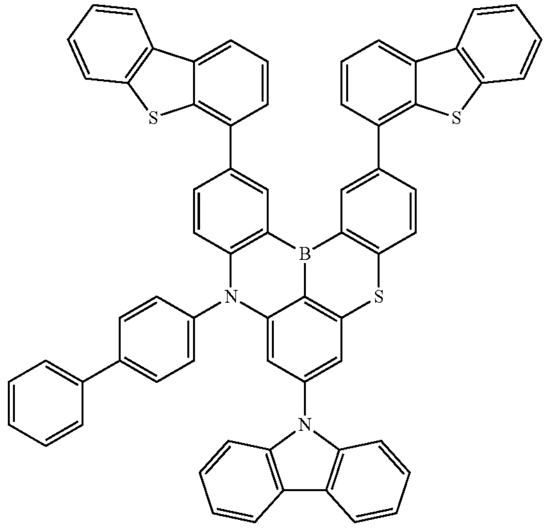
105
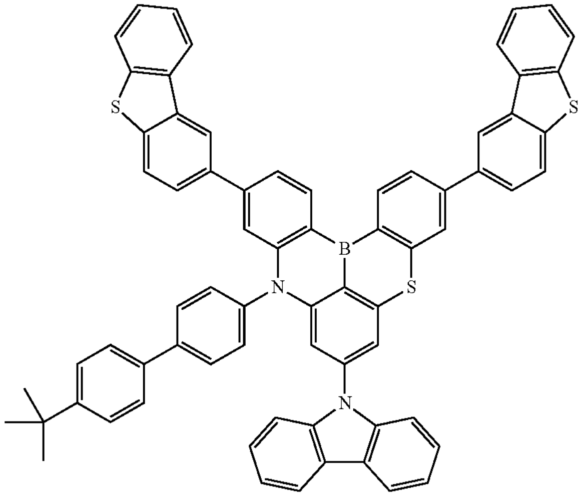
106
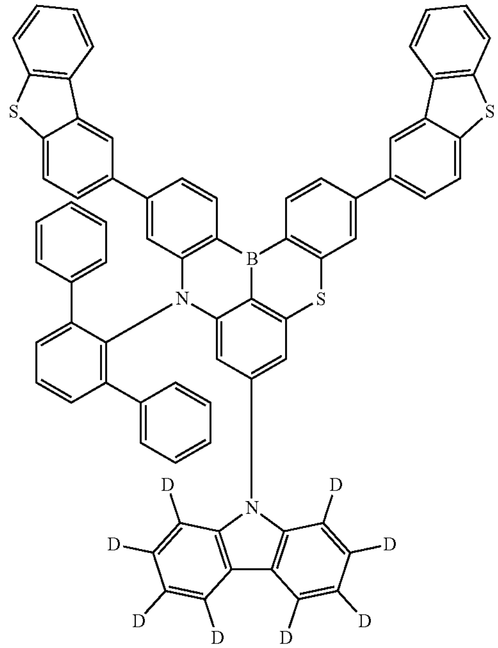
107
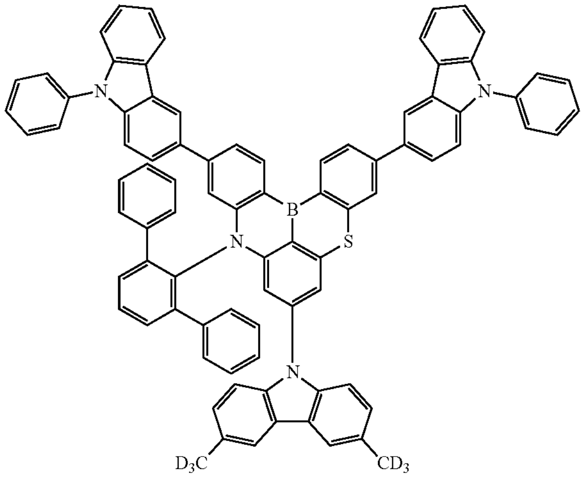

-continued
108
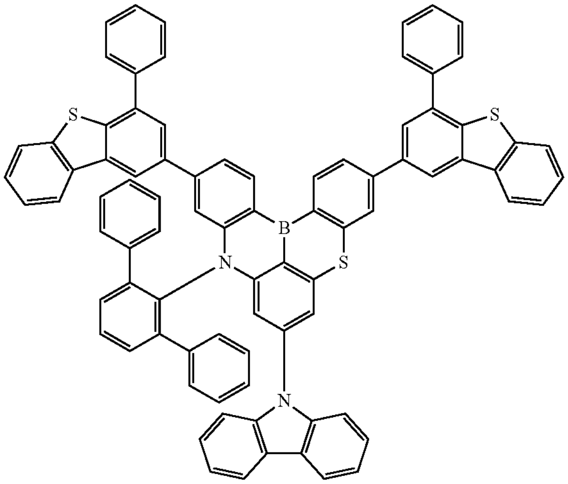
109
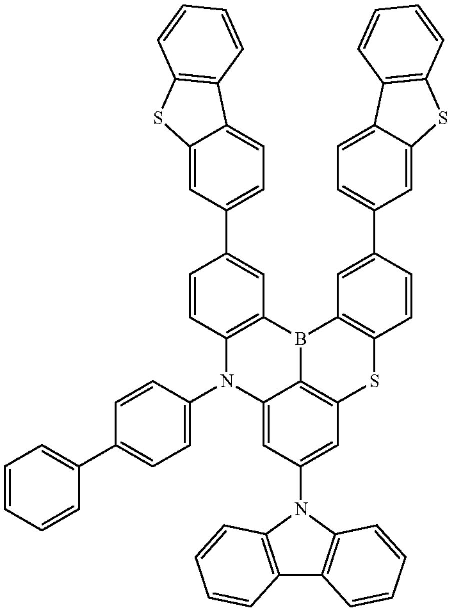
110
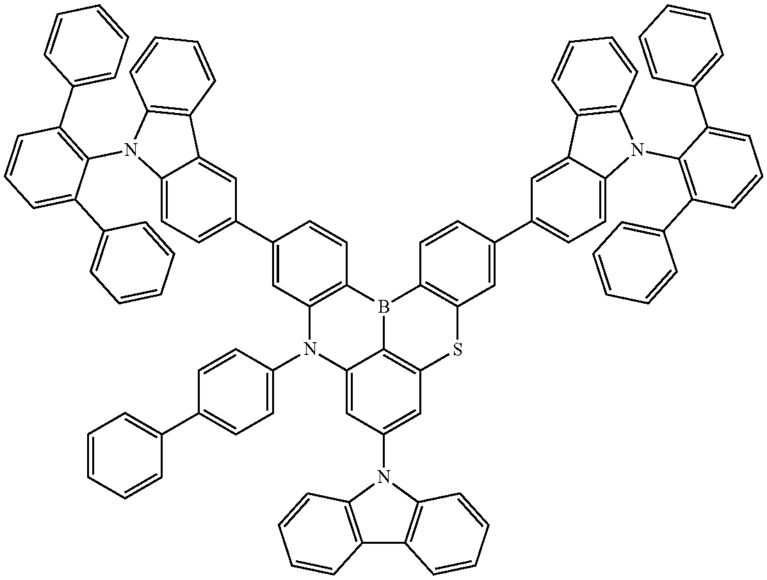

-continued
111
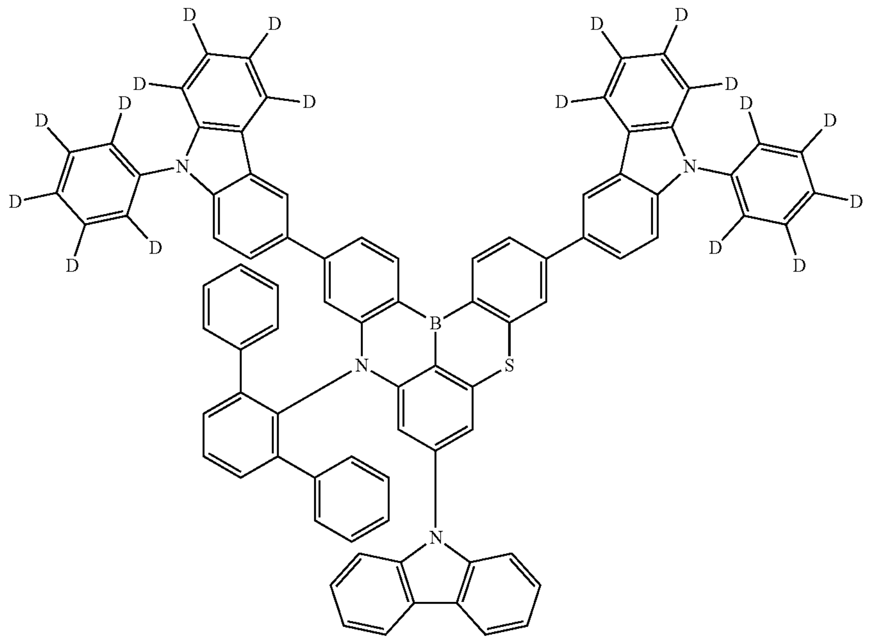
112
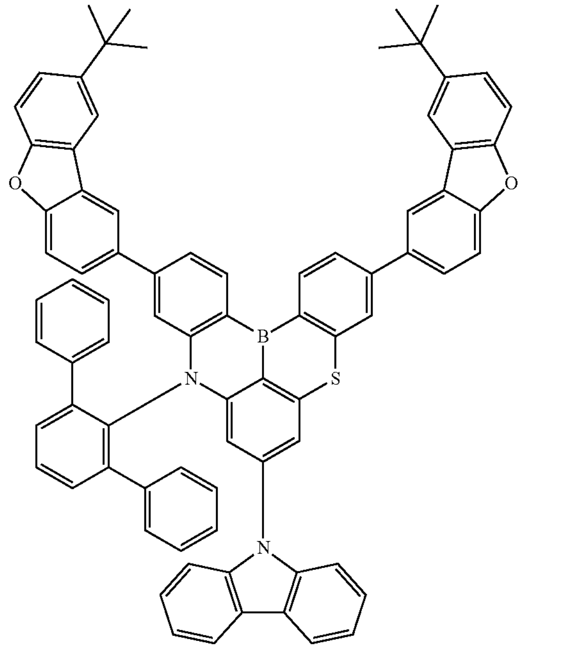
113
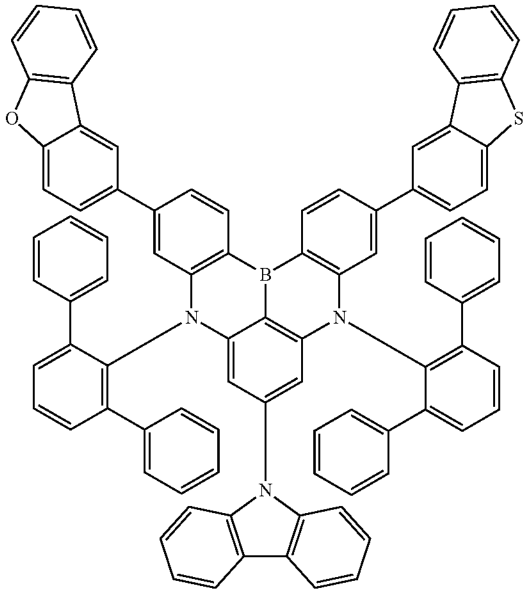

-continued
114
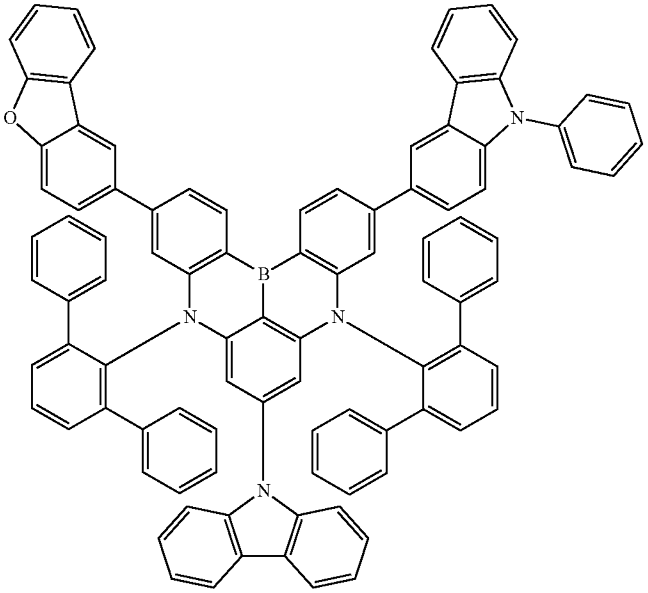
115
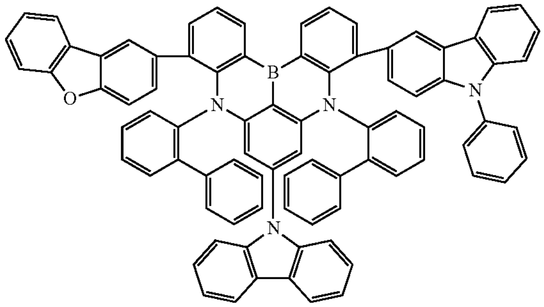
116
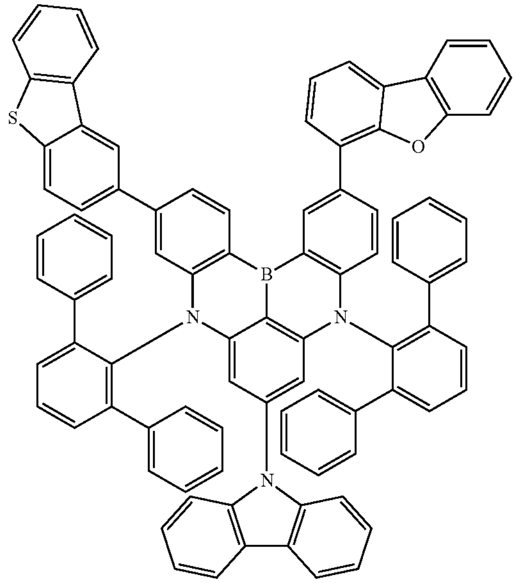
-continued
117
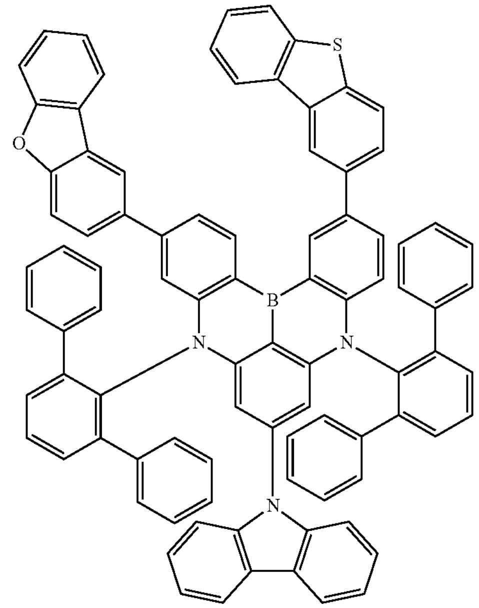

-continued
118
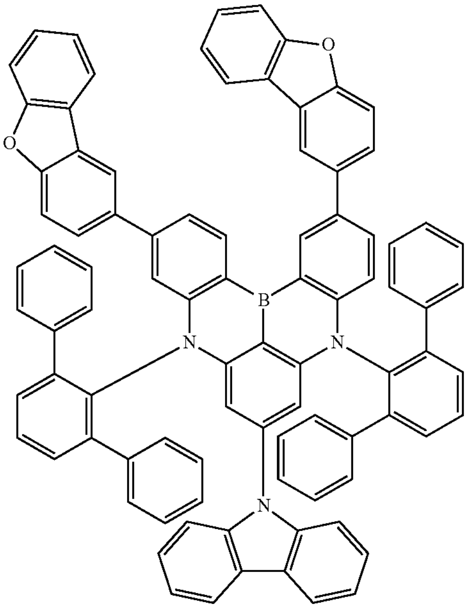
119
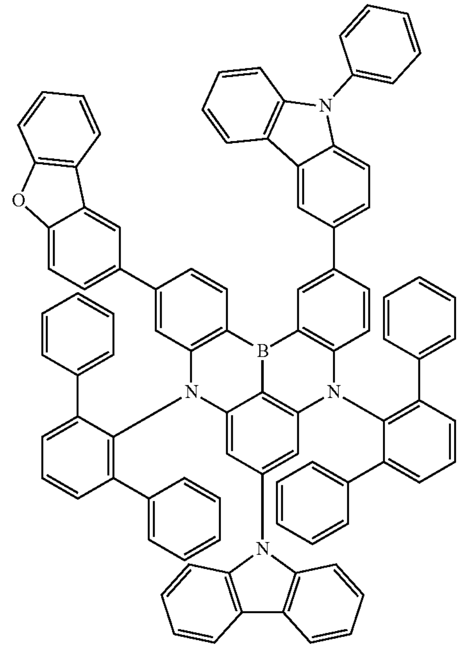
120
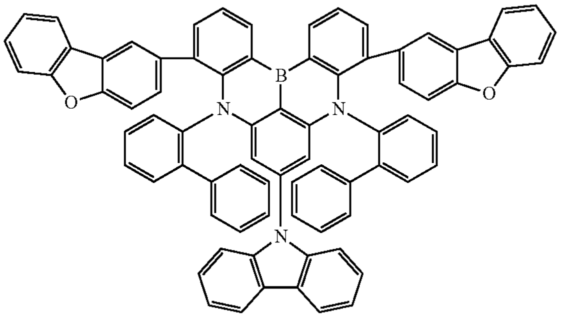
-continued
121
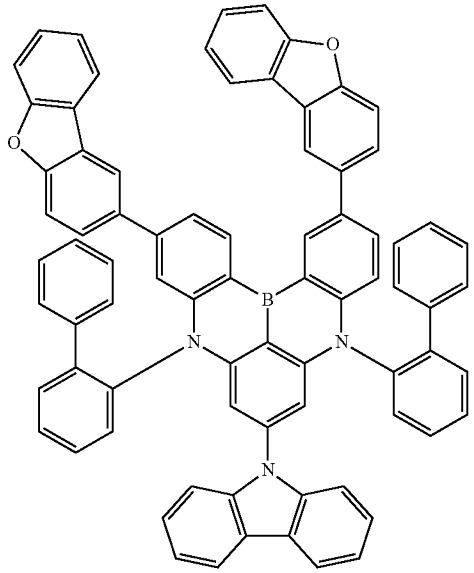
122
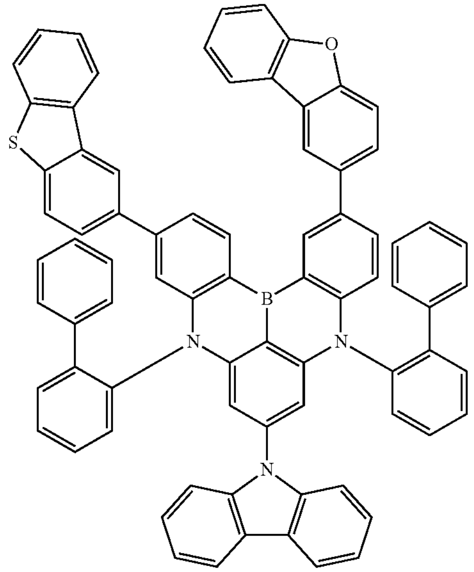

-continued
123
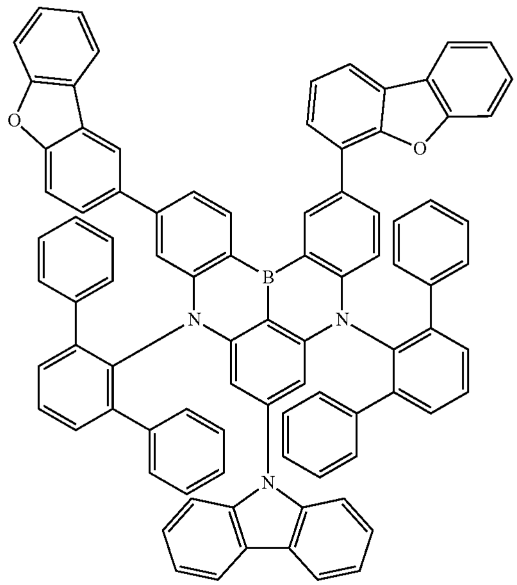
124
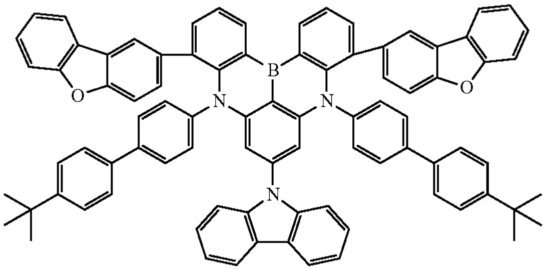
125
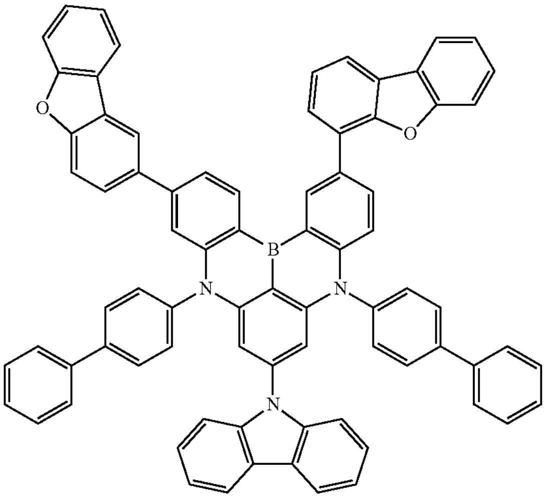
-continued
126
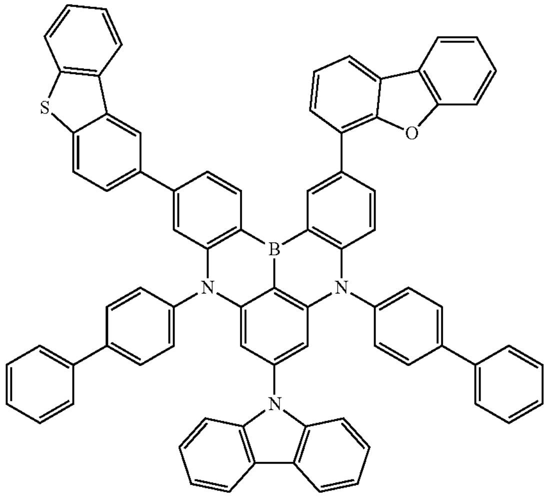
127
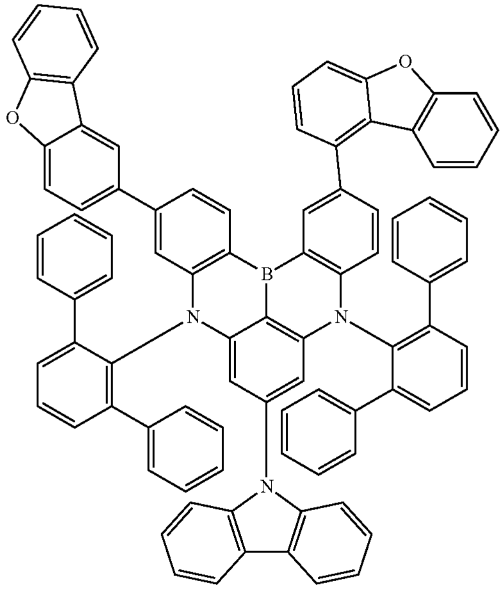

-continued

128

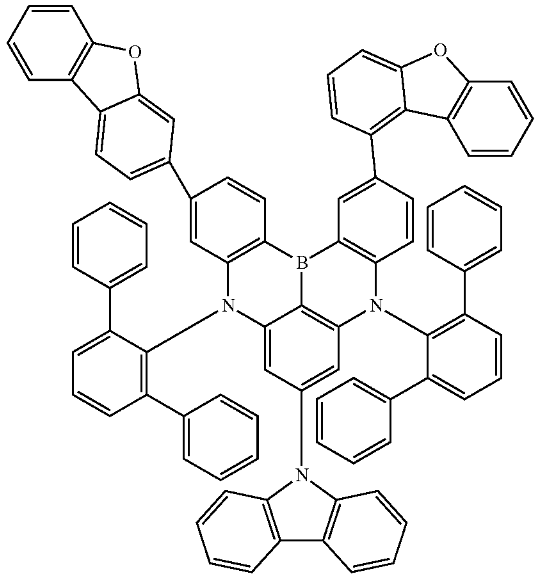

129

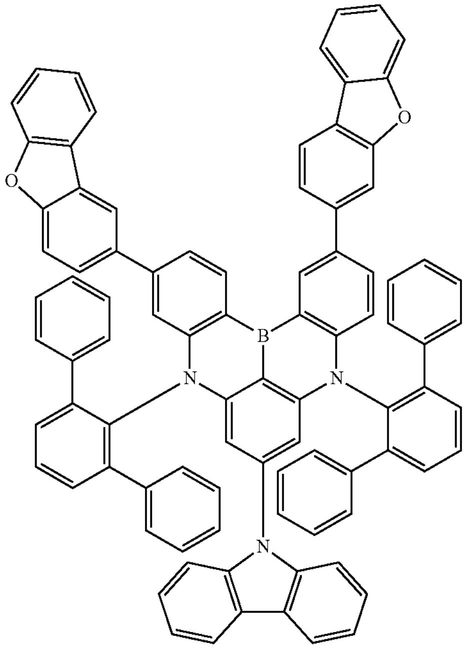

130

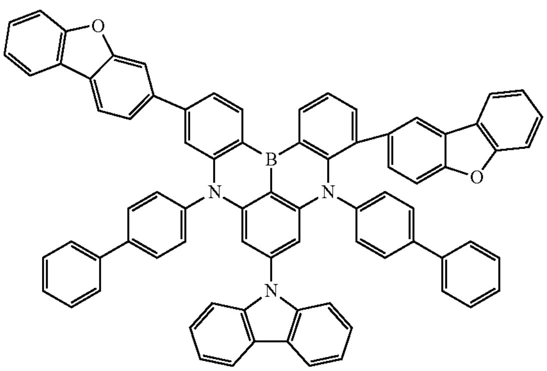

-continued

131

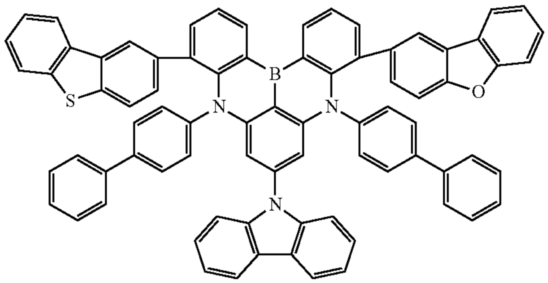

132

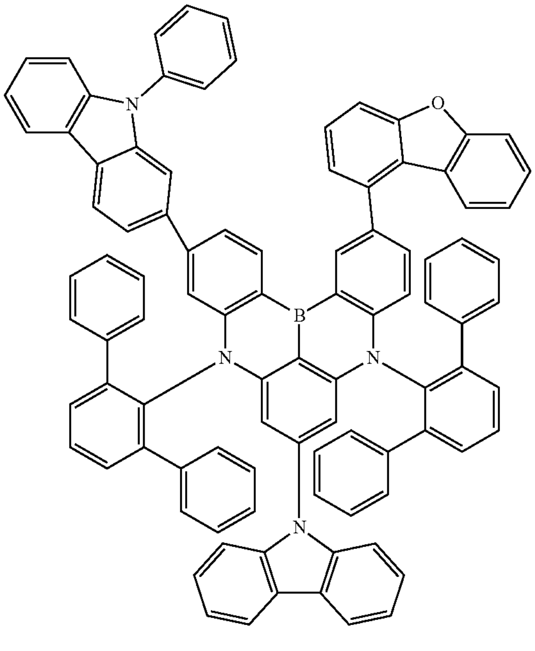

D in the structures of the compounds in Compound Group 1 refers to a deuterium atom.

The emission spectrum of the first compound represented by Formula 1 of an embodiment has a full width of half maximum (FWHM) of about 10 nm to about 50 nm, or a FWHM of about 20 nm to about 40 nm. The emission spectrum of the first compound represented by Formula 1 of an embodiment satisfies the above ranges of FWHM, thereby improving luminous efficiency when applied to an element. In some embodiments, when the first compound of an embodiment is utilized as a blue light emitting device material for the light emitting device, the device service life may be improved.

The first compound represented by Formula 1 of an embodiment may be a thermally activated delayed fluorescence emitting material. In some embodiments, the first compound represented by Formula 1 may be a thermally activated delayed fluorescence dopant having the difference ($\Delta E_{ST}$) between the lowest triplet exciton energy level (T1 level) and the lowest singlet exciton energy level (S1 level) of about 0.3 eV or less. For example, $\Delta E_{ST}$ of the first compound represented by Formula 1 of an embodiment may be about 0.1 eV or less.

The first compound represented by Formula 1 of an embodiment may be a luminescent material having a luminescence center wavelength in a wavelength region of about 430 nm to about 490 nm. For example, the first compound represented by Formula 1 of an embodiment may be a blue thermally activated delayed fluorescence (TADF) dopant. However, the embodiment of the present disclosure is not limited thereto. When the first compound of an embodiment is utilized as a luminescent material, the first compound may be utilized as a dopant material that emits light in one or more suitable wavelength regions, such as a red emitting dopant and a green emitting dopant.

The emission layer EML in the light emitting device ED of an embodiment may emit delayed fluorescence. For example, the emission layer EML may emit thermally activated delayed fluorescence (TADF).

In some embodiments, the emission layer EML of the light emitting device ED may emit blue light. For example, the emission layer EML of the light emitting device ED of an embodiment may emit blue light in the region of about 490 nm or more. However, the embodiment of the present disclosure is not limited thereto, and the emission layer EML may emit green light or red light.

The emission layer EML in the light emitting device ED of an embodiment may include a host for emitting delayed fluorescence and a dopant for emitting delayed fluorescence, and may include the above-described first compound as a dopant for emitting delayed fluorescence. The emission layer EML may include at least one selected from among the fused polycyclic compounds represented by Compound Group 1 as described above as a thermally activated delayed fluorescence dopant.

The emission layer EML in the light emitting device ED of an embodiment may include a host. The host may serve to deliver energy to the dopant without emitting light in the light emitting device ED. The emission layer EML may include at least one kind of host. For example, the emission layer EML may include two kinds of different hosts. When the emission layer EML includes two kinds of hosts, the two kinds of hosts may include a hole transporting host and an electron transporting host. However, the embodiment of the present disclosure is not limited thereto, and the emission layer EML may include one kind of host, or a mixture of two kinds of different hosts.

In an embodiment, the emission layer EML may include two different hosts. The host may include the second compound, and the third compound different from the second compound. The host may include the second compound having a hole transporting moiety and the third compound having an electron transporting moiety. In the light emitting device ED of an embodiment, for the host, the second compound and the third compound may form an exciplex.

In the light emitting device ED of an embodiment, an exciplex may be formed by the hole transporting host and the electron transporting host in the emission layer. In this embodiment, a triplet energy of the exciplex formed by the hole transporting host and the electron transporting host may correspond to the difference between a lowest unoccupied molecular orbital (LUMO) energy level of the electron transporting host and a highest occupied molecular orbital (HOMO) energy level of the hole transporting host.

For example, the absolute value of the triplet energy (T1) of the exciplex formed by the hole transporting host and the electron transporting host may be about 2.4 eV to about 3.0 eV. In some embodiments, the triplet energy of the exciplex may be a value smaller than an energy gap of each host material. The exciplex may have a triplet energy of about 3.0 eV or less that is an energy gap between the hole transporting host and the electron transporting host.

In an embodiment, the host may include the second compound represented by Formula H-1 and the third compound represented by Formula H-2. The second compound may be a hole transporting host, and the third compound may be an electron transporting host.

The emission layer EML according to an embodiment may include the second compound including a carbazole group derivative moiety. The second compound may be represented by Formula H-1:

Formula H-1

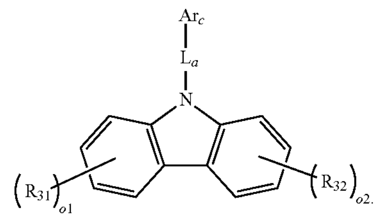

In Formula H-1, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, $Ar_c$ may be a substituted or unsubstituted aryl group having 6 to 30 ring-forming carbon atoms, or a substituted or unsubstituted heteroaryl group having 2 to 30 ring-forming carbon atoms.

In Formula H-1, $R_{31}$ and $R_{32}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{31}$ and $R_{32}$ may each independently be a hydrogen atom or a deuterium atom.

In Formula H-1, 01 and 02 may each independently be an integer from 0 to 4. When each of o1 and o2 is 0, the second compound of an embodiment may not be substituted with each of $R_{31}$ and $R_{32}$. In Formula H-1, the embodiment in which each of o1 and o2 is 4 and $R_{31}$s and $R_{32}$s are each hydrogen atoms may be the same as the embodiment in which each of o1 and o2 in Formula H-1 is 0. When each of o1 and o2 is an integer of 2 or more, a plurality of $R_{31}$s and $R_{32}$s may each be the same or at least one among the plurality of $R_{31}$s and $R_{32}$s may be different from the others. For example, in Formula H-1, both (e.g., simultaneously) 01 and 02 may be 0. In this embodiment, the carbazole group in Formula H-1 corresponds to an unsubstituted one (i.e., unsubstituted carbazole group).

In Formula H-1, $L_a$ may be a direct linkage, a phenylene group, a divalent biphenyl group, a divalent carbazole group, etc., but the embodiment of the present disclosure is not limited thereto. For example, $Ar_c$ may be a substituted or unsubstituted carbazole group, a substituted or unsubstituted dibenzofuran group, a substituted or unsubstituted dibenzothiophene group, a substituted or unsubstituted biphenyl group, etc., but the embodiment of the present disclosure is not limited thereto.

The emission layer EML in the light emitting device ED of an embodiment may include a compound represented by Formula H-2 as the third compound:

Formula H-2

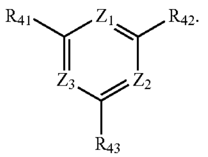

In Formula H-2, any one selected from among $Z_1$ to $Z_3$ may be N. The rest (that are not N) among $Z_1$ to $Z_3$ may be $CR_{44}$. For example, the third compound represented by Formula H-2 may include a pyridine moiety, a pyrimidine moiety, or a triazine moiety.

In Formula H-2, $R_{41}$ to $R_{44}$ may each independently be a hydrogen atom, a deuterium atom, a cyano group, a substituted or unsubstituted silyl group, a substituted or unsubstituted aryl group having 6 to 30 ring-forming carbon atoms, or a substituted or unsubstituted heteroaryl group having 2 to 30 ring-forming carbon atoms. In an embodiment, $R_{41}$ to $R_{44}$ may each independently be a substituted or unsubstituted phenyl group, a substituted or unsubstituted carbazole group, etc., but the embodiment of the present disclosure is not limited thereto.

When the emission layer EML of the light emitting device ED of an embodiment includes the second compound represented by Formula H-1 and the third compound represented by Formula H-2 in the emission layer EML at the same time (concurrently), the light emitting device ED may exhibit excellent or suitable luminous efficiency and long service life characteristics. For example, in the emission layer EML of the light emitting device ED of an embodiment, for the host, the second compound represented by Formula H-1 and the third compound represented by Formula H-2 may form an exciplex.

The second compound among the two host materials concurrently (e.g., simultaneously) included in the emission layer EML may be a hole transporting host, and the third compound may be an electron transporting host. The light emitting device ED of an embodiment may include, in the emission layer EML, both (e.g., simultaneously) the second compound which has excellent or suitable hole transport characteristics and the third compound which has excellent or suitable electron transport characteristics, thereby efficiently delivering energy to the first compound which will be described.

The emission layer EML in the light emitting device ED of an embodiment may further include the fourth compound in addition to the first compound represented by Formula 1 as described above. The emission layer EML may include, as the fourth compound, an organometallic complex containing platinum (Pt) as a central metal atom and ligands linked to the central metal atom. The emission layer EML in the light emitting device ED of an embodiment may include a compound represented by Formula D-2 as the fourth compound:

Formula D-2

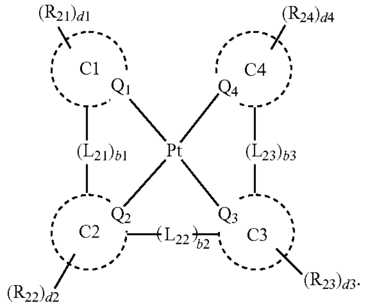

In Formula D-2, $Q_1$ to $Q_4$ may each independently be C or N.

In Formula D-2, C1 to C4 may each independently be a substituted or unsubstituted hydrocarbon ring having 5 to 30 ring-forming carbon atoms, or a substituted or unsubstituted heterocycle having 2 to 30 ring-forming carbon atoms.

In Formula D-2, $L_{21}$ to $L_{23}$ may each independently be a direct linkage,

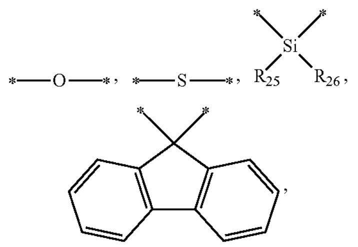

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms. In $L_{21}$ to $L_{23}$, —* * refers to a part linked to C1 to C4.

In Formula D-2, b1 to b3 may each independently be 0 or 1. When b1 is 0, C1 and C2 may not be linked to each other. When b2 is 0, C2 and C3 may not be linked to each other. When b3 is 0, C3 and C4 may not be linked to each other.

In Formula D-2, $R_{21}$ to $R_{26}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 1 to 30 ring-forming carbon atoms, and/or be bonded to an adjacent group to form a ring, For example, $R_{21}$ to $R_{26}$ may each independently be a methyl group or a t-butyl group.

In Formula D-2, d1 to d4 may each independently be an integer from 0 to 4. In some embodiments, when each of d1 to d4 is an integer of 2 or more, a plurality of $R_{21}$s to $R_{24}$s may each be the same or at least one may be different.

In Formula D-2, C1 to C4 may each independently be a substituted or unsubstituted hydrocarbon ring or a substituted or unsubstituted heterocycle represented by any one selected from among C-1 to C-3:

C-1

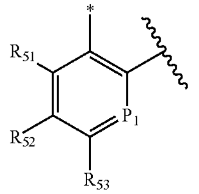

C-2

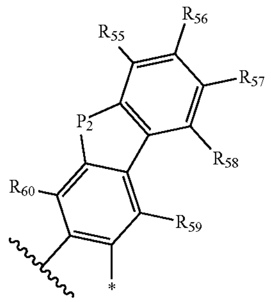

C-3

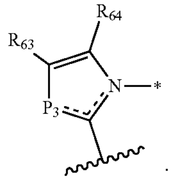

In C-1 to C-3, $P_1$ may be C—* * or $CR_{54}$, $P_2$ may be N—* * or $NR_{61}$, and $P_3$ may be N—* * or $NR_{62}$. $R_{51}$ to $R_{64}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 6 to 30 ring-forming carbon atoms, and/or be bonded to an adjacent group to form a ring.

In some embodiments, in C-1 to C-3,

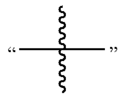

corresponds to a part linked to Pt that is a central metal atom, and "—* *" corresponds to a part linked to a neighboring cyclic group (C1 to C4) or a linker ($L_{21}$ to $L_{24}$).

The fourth compound represented by Formula D-2 as described above may be a phosphorescent dopant.

In an embodiment, the first compound may be a luminescent dopant which emits blue light, and the emission layer EML may be to emit a fluorescence. In some embodiments, for example, the emission layer EML may emit blue light through the thermally activated delayed fluorescence.

In an embodiment, the fourth compound included in the emission layer EML may be a sensitizer. The fourth compound included in the emission layer EML in the light emitting device ED of an embodiment may serve as a sensitizer to deliver energy from the host to the first compound that is a light emitting dopant. For example, the fourth compound serving as an auxiliary dopant accelerates energy delivery to the first compound that is a light emitting dopant, thereby increasing the emission ratio of the first compound. Therefore, the emission layer EML of an embodiment may improve luminous efficiency. In some embodiments, when the energy delivery to the first compound is increased, an exciton formed in the emission layer EML is not accumulated inside the emission layer EML and emits light rapidly, and thus deterioration of the element may be reduced. Therefore, the service life of the light emitting device ED of an embodiment may increase.

When the emission layer EML in the light emitting device ED of an embodiment includes all of the first compound, the second compound, the third compound, and the fourth compound, with respect to the total weight of the first compound, the second compound, the third compound, and the fourth compound, the content (e.g., amount) of the first compound may be about 1 wt % to about 5 wt %, and the content (e.g., amount) of the fourth compound may be about 10 wt % to about 15 wt %.

When the contents of the first compound and the fourth compound satisfy the above-described proportion, the first compound may efficiently deliver energy to the fourth compound, and thus the luminous efficiency and device service life may increase.

The contents of the second compound and the third compound in the emission layer EML may be the rest excluding the weights of the first compound and the fourth compound described above. For example, the contents of the second compound and the third compound in the emission layer EML may be about 80 wt % to about 89 wt % with respect to the total weight of the first compound, the second compound, the third compound, and the fourth compound. In the total weight of the second compound and the third compound, the weight ratio of the second compound and the third compound may be about 3:7 to about 7:3. For example, in the total weight of the second compound and the third compound, the weight ratio of the second compound and the third compound may be about 5:5.

When the contents of the second compound and the third compound satisfy the above-described ratio, a charge balance characteristic in the emission layer EML is improved, and thus the luminous efficiency and device service life may increase. When the contents of the second compound and the third compound deviate from the above-described ratio range, a charge balance in the emission layer EML is broken, and thus the luminous efficiency may be reduced and the device may be easily deteriorated.

When each of the first compound, the second compound, the third compound, and the fourth compound included in the emission layer EML satisfies the above-described ratio range, excellent or suitable luminous efficiency and long service life may be achieved.

The light emitting device ED of an embodiment may include all of the first compound, the second compound, the third compound, and the fourth compound, and the emission layer EML may include the combination of two host materials and two dopant materials. In the light emitting device ED of an embodiment, the emission layer EML may concurrently (e.g., simultaneously) include two different hosts, the first compound that emits a delayed fluorescence, and the fourth compound including an organonetallic complex, thereby exhibiting excellent or suitable luminous efficiency characteristics.

In an embodiment, the second compound represented by Formula H-1 may be represented by any one selected from among the compounds represented by Compound Group 2. The emission layer EML may include one or more selected from among the compounds represented by Compound Group 2 as a hole transporting host material.

Compound Group 2
HTH1
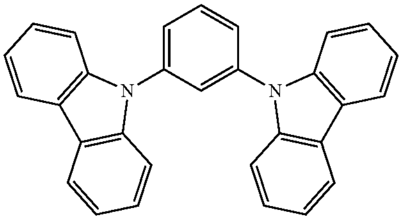
HTH2
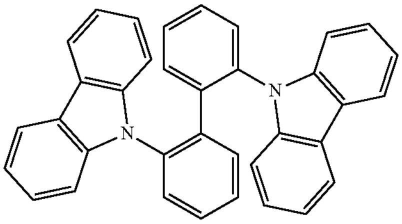
HTH3
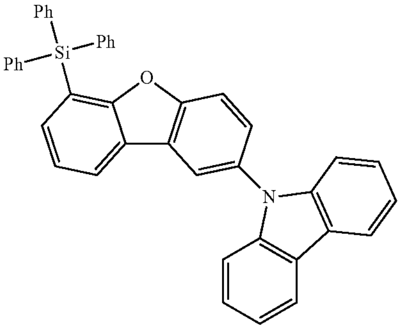
HTH4
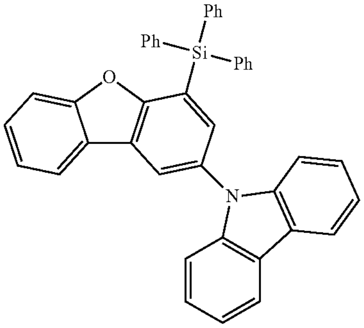
HTH5
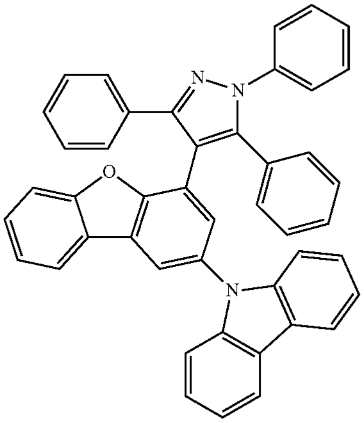
-continued
HTH6
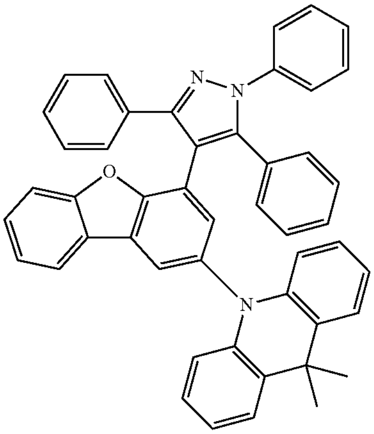
HTH7
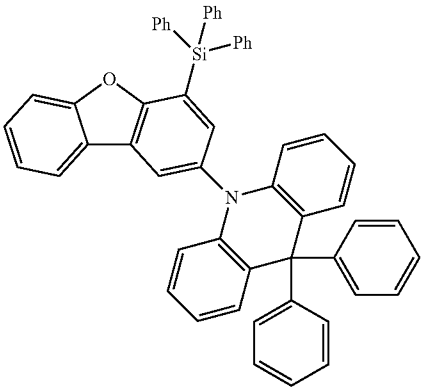
HTH8
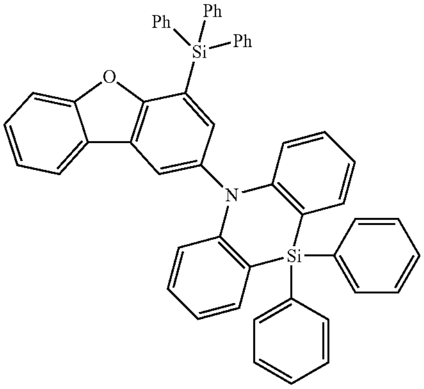
HTH9
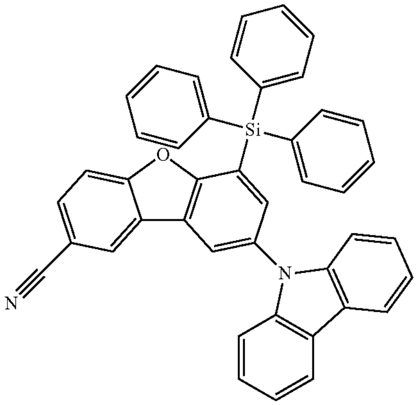

-continued
HTH10
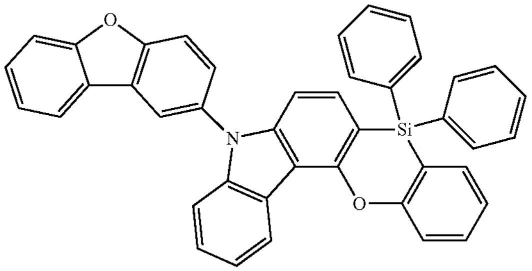
HTH11
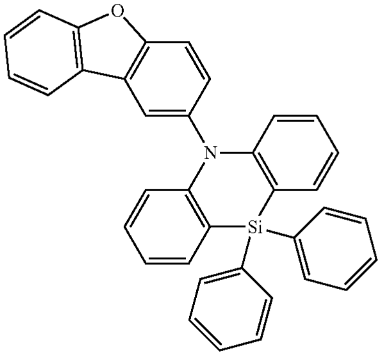
HTH12
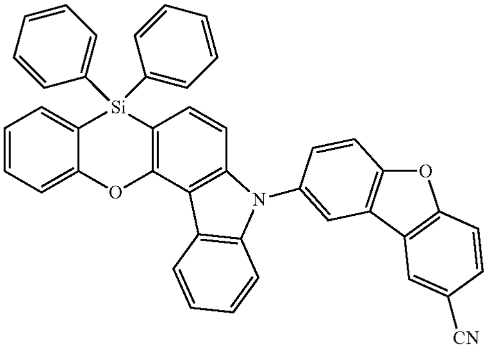
HTH13
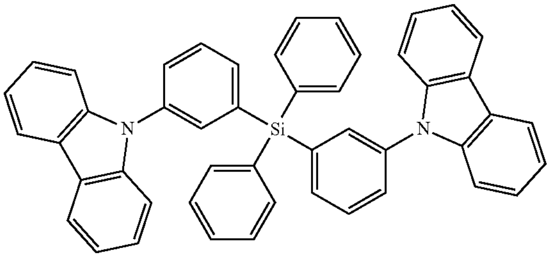
-continued
HTH14
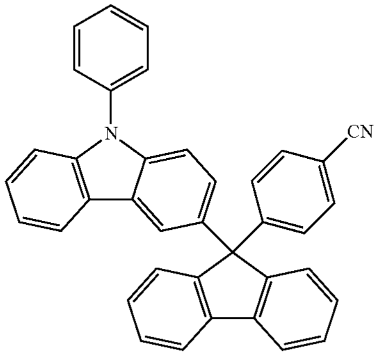
HTH15
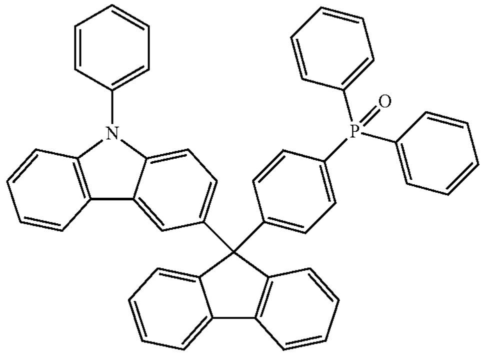
HTH16
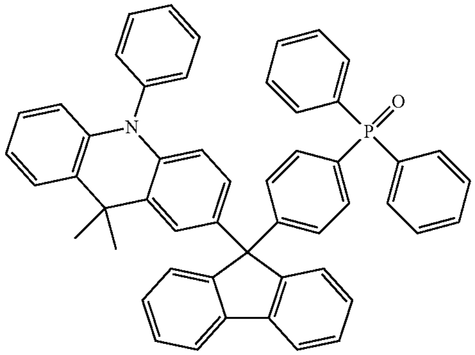
HTH17
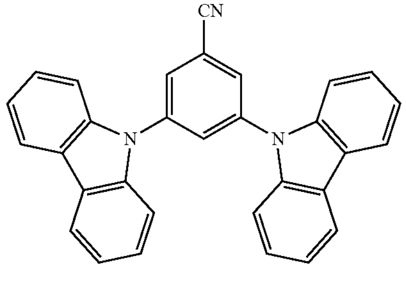
HTH18
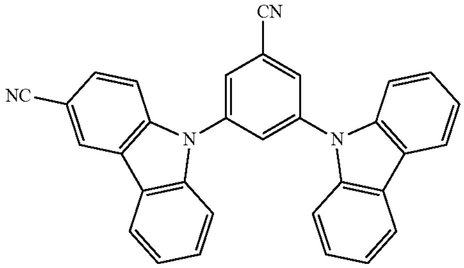

HTH19
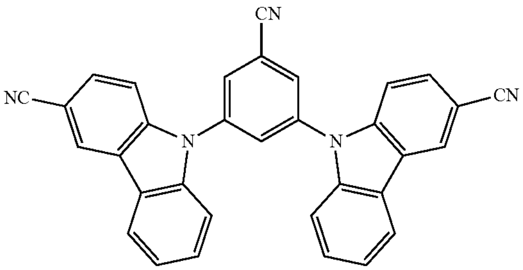
HTH20
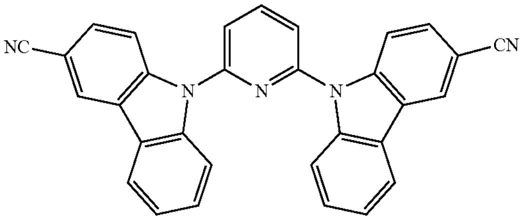
HTH21
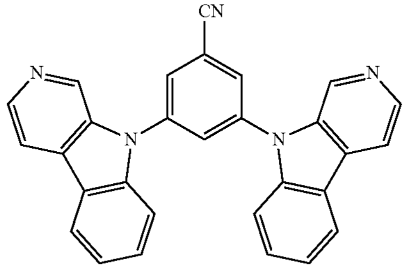
HTH22
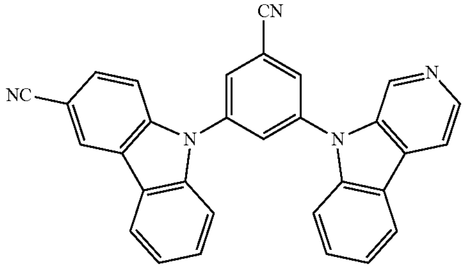
HTH23
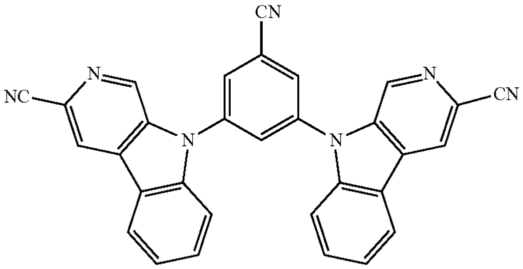
HTH24
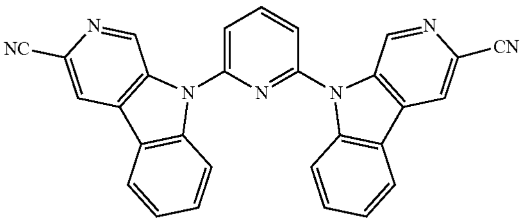
HTH25
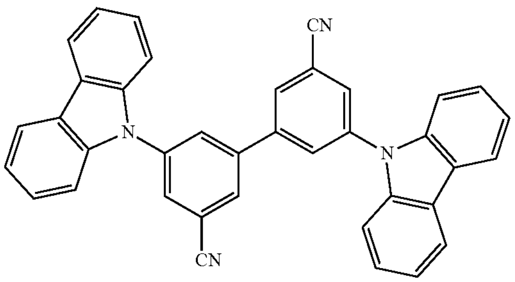
HTH26
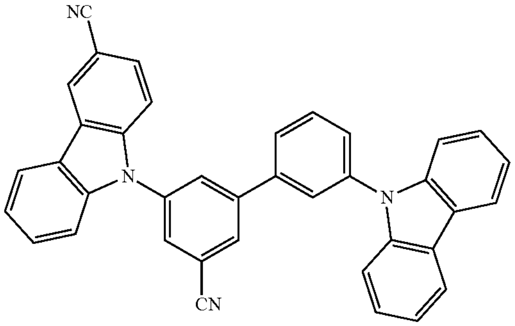
HTH27
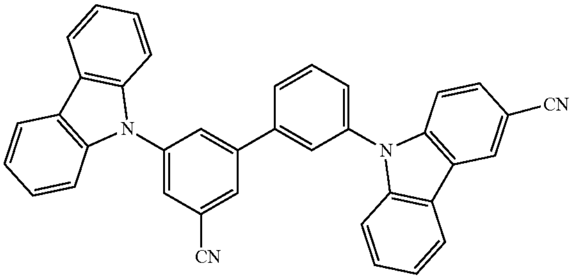
HTH28
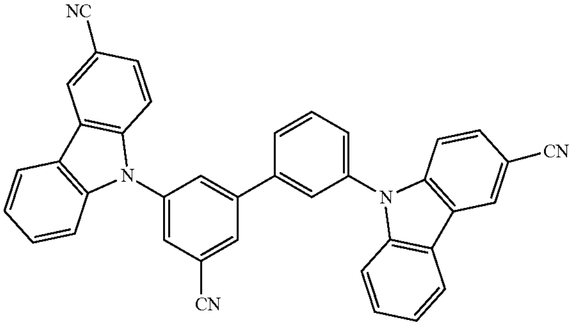
HTH29
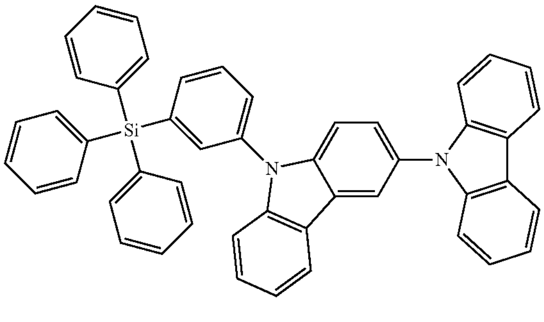

-continued
HTH30
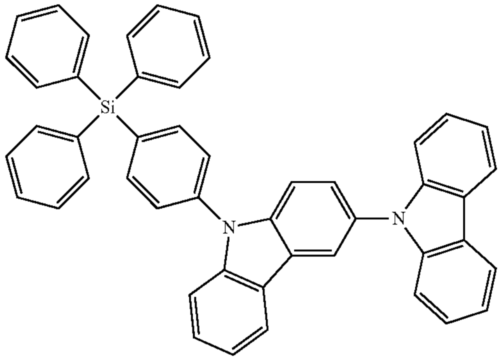
HTH31
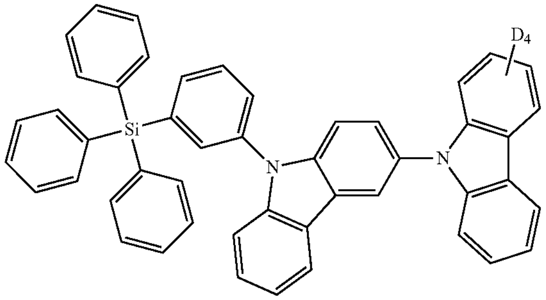
HTH32
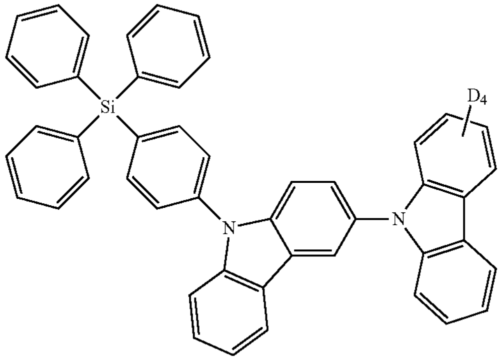
HTH33
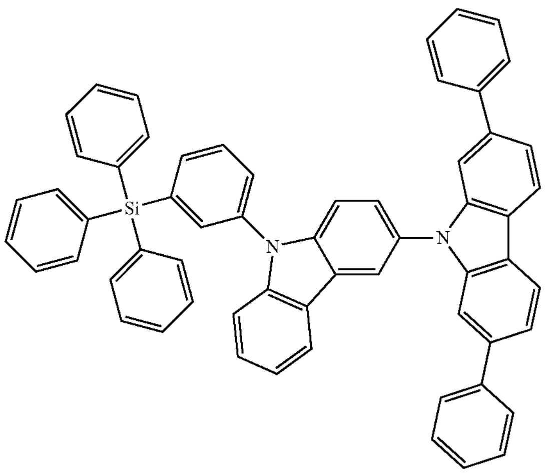
-continued
HTH34
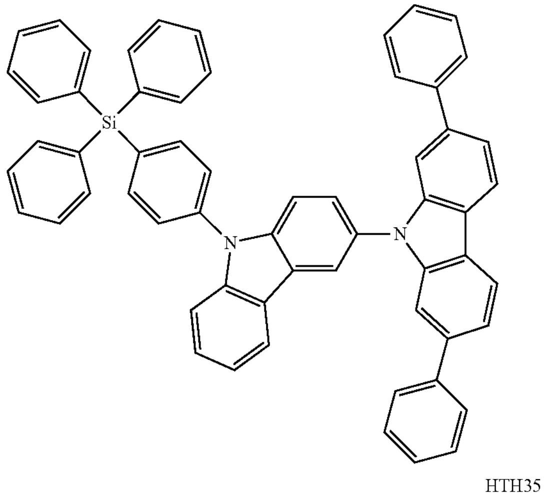
HTH35
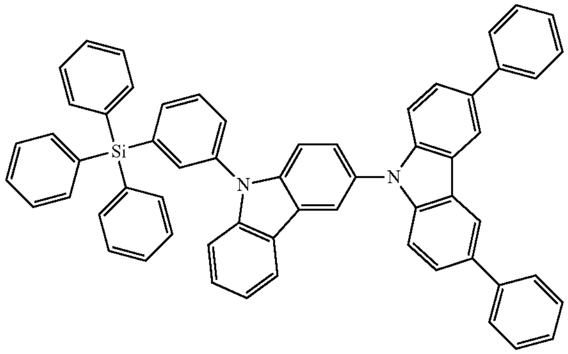
HTH36
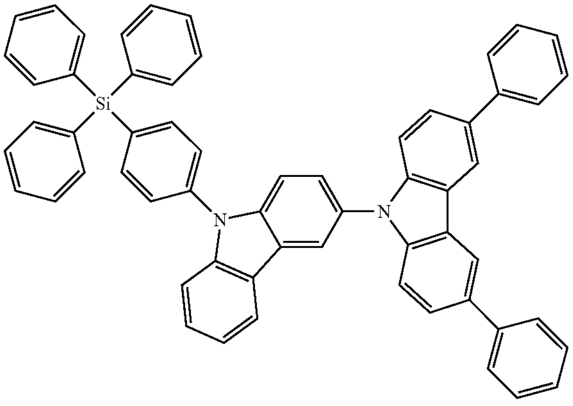
HTH37
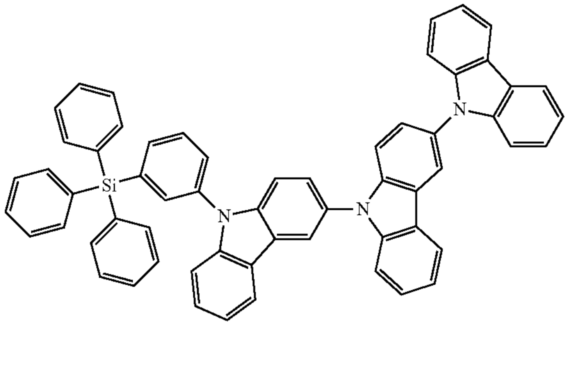

-continued
HTH38
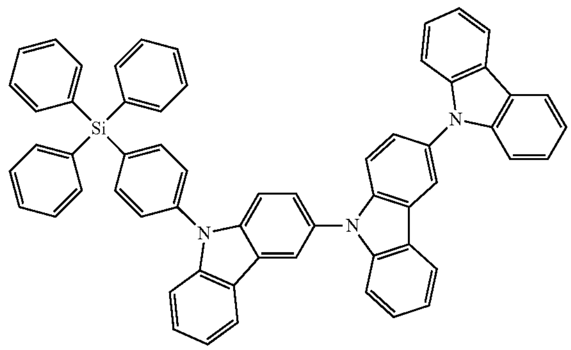
HTH39
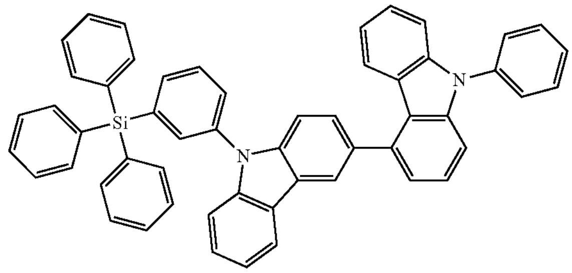
HTH40
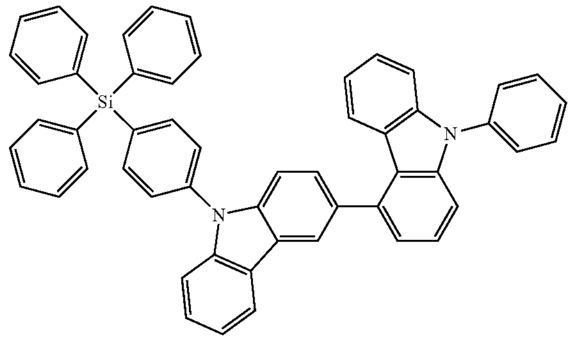
HTH41
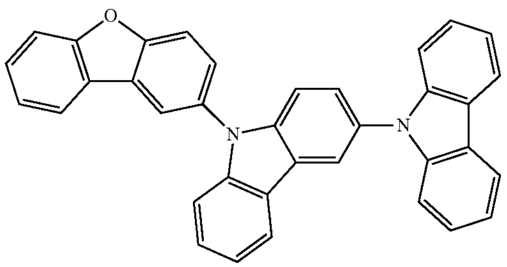
HTH42
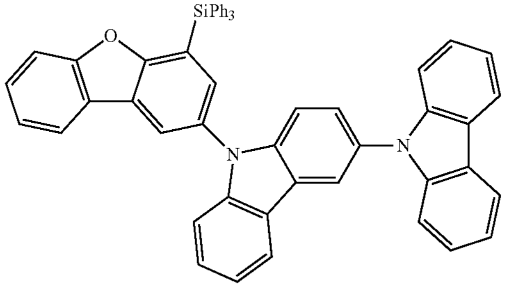
-continued
HTH43
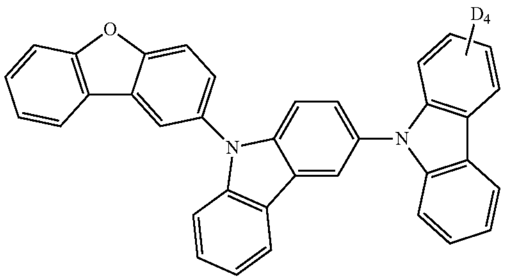
HTH44
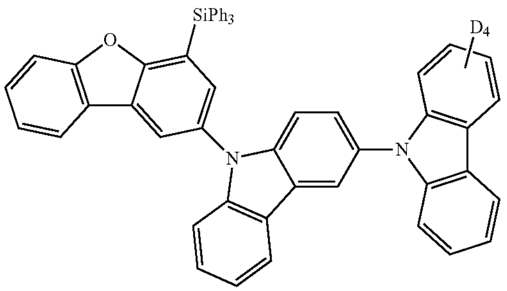
HTH45
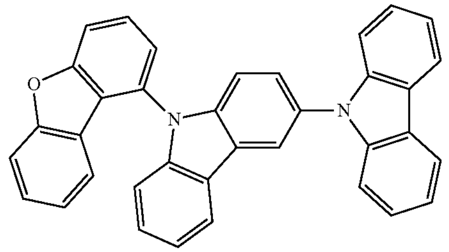
HTH46
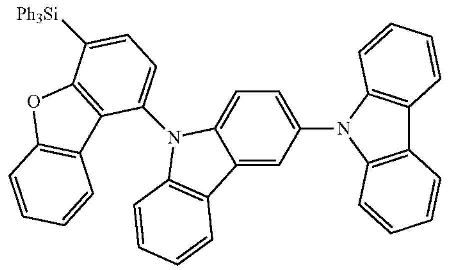
HTH47
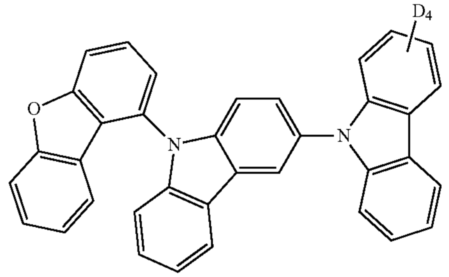

-continued

HTH48

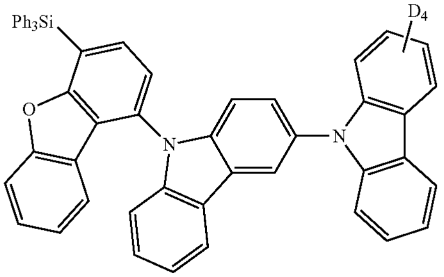

HTH49

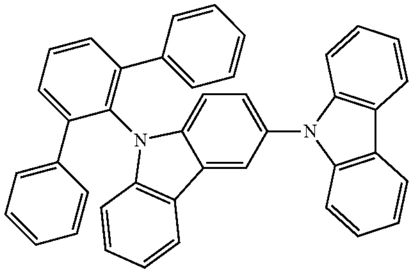

HTH50

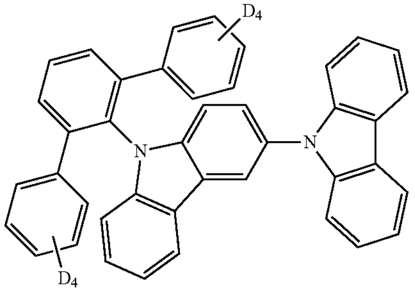

HTH51

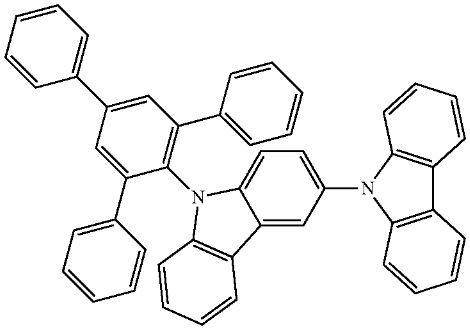

HTH52

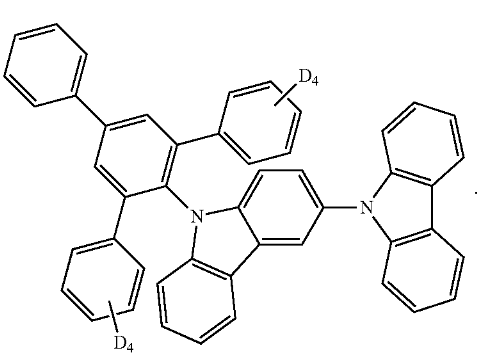

In an embodiment, the third compound represented by Formula H-2 may be represented by any one selected from among the compounds represented by Compound Group 3.

The emission layer EML may include one or more selected from among the compounds represented by Compound Group 3 as an electron transporting host material.

Compound Group 3

ETH1

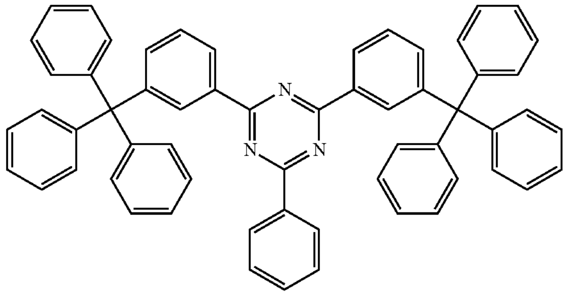

ETH2

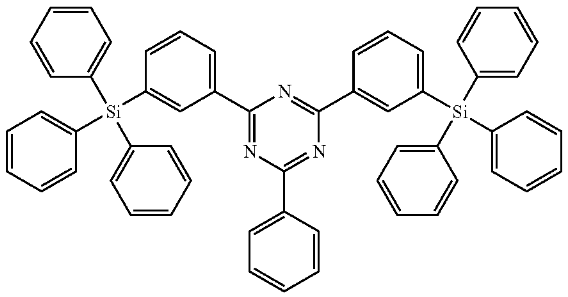

ETH3

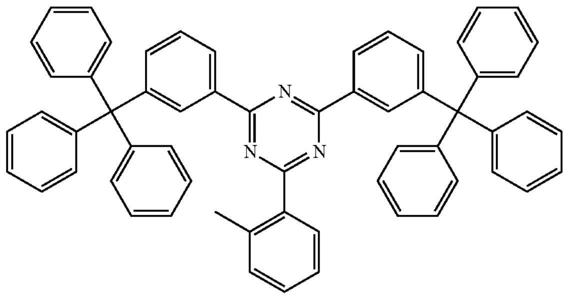

ETH4

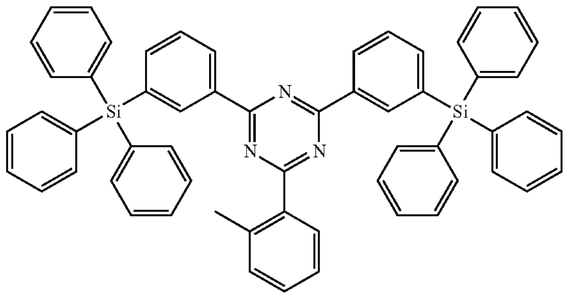

-continued
ETH5
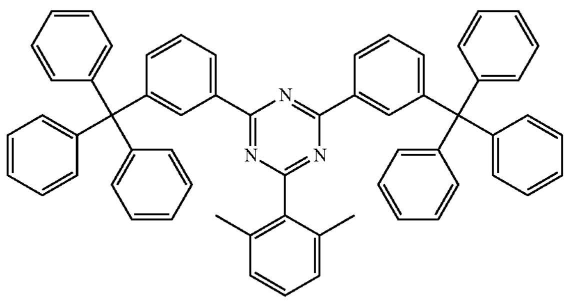
ETH6
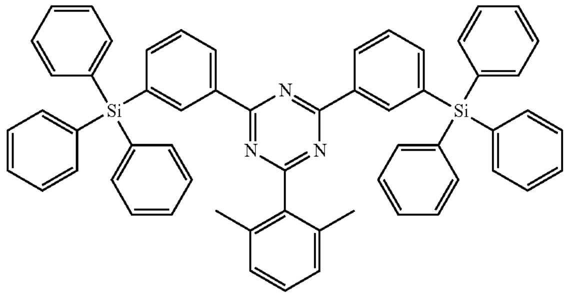
ETH7
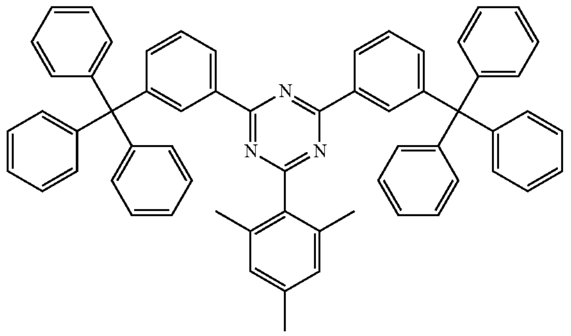
ETH8
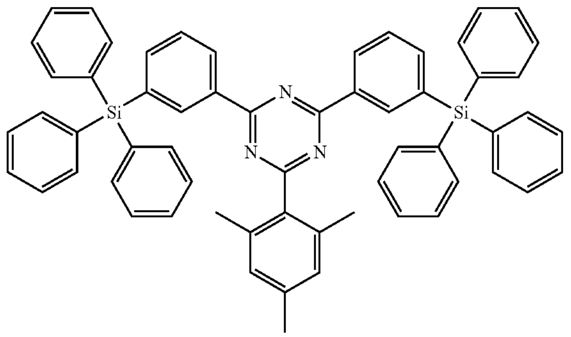
-continued
ETH9
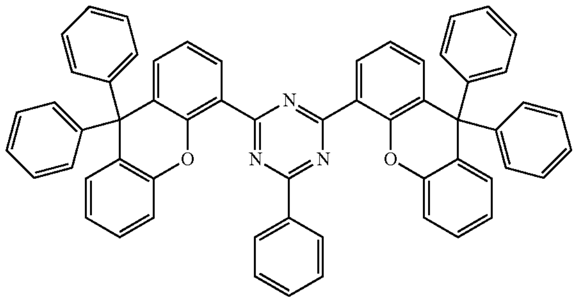
ETH10
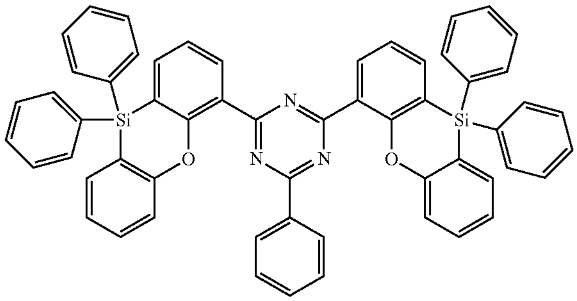
ETH11
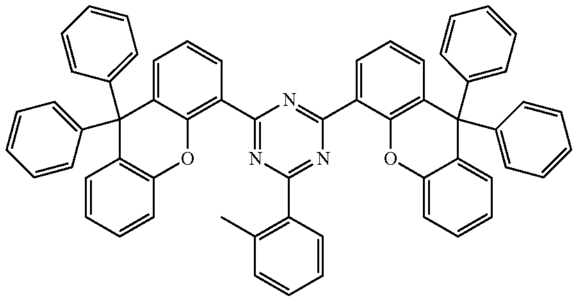
ETH12
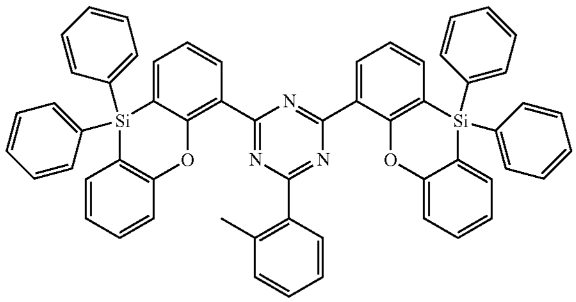
ETH13
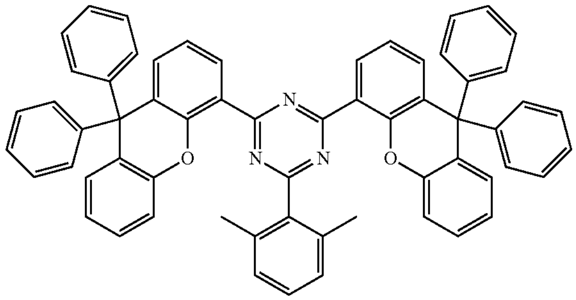

ETH14
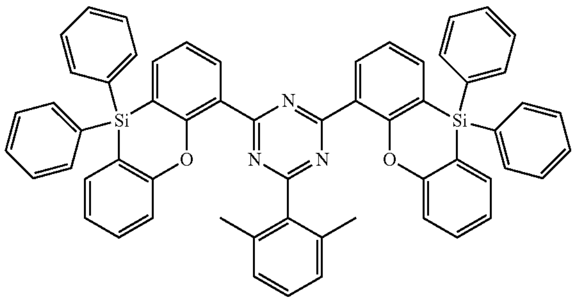
ETH15
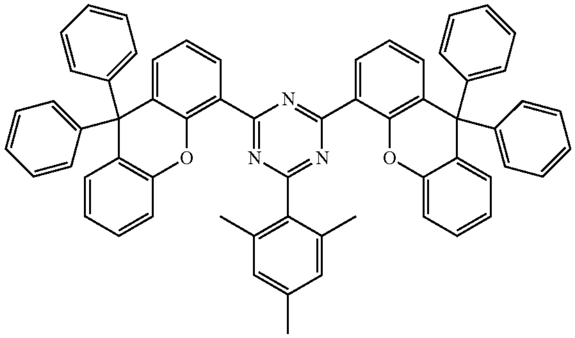
ETH16
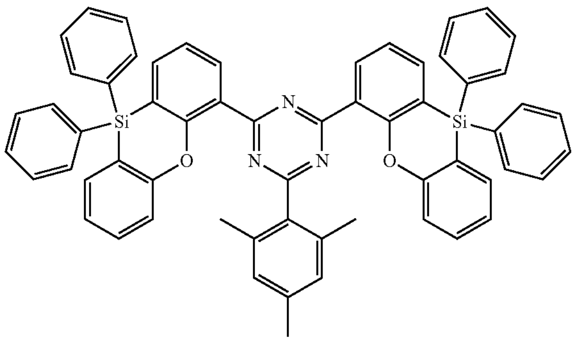
ETH17
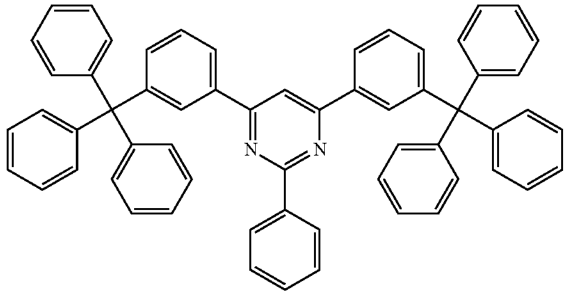
ETH18
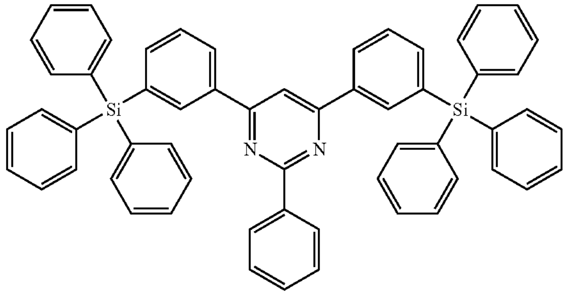
ETH19
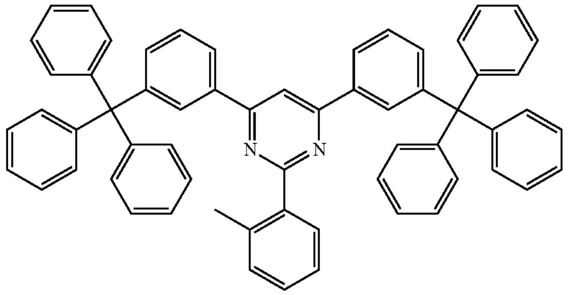
ETH20
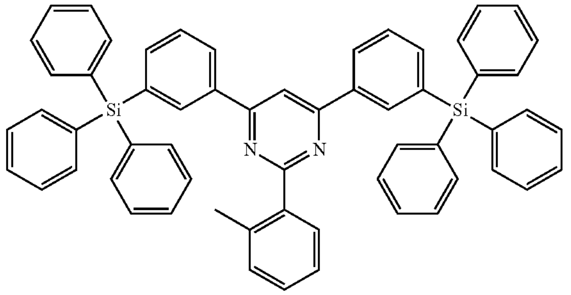
ETH21
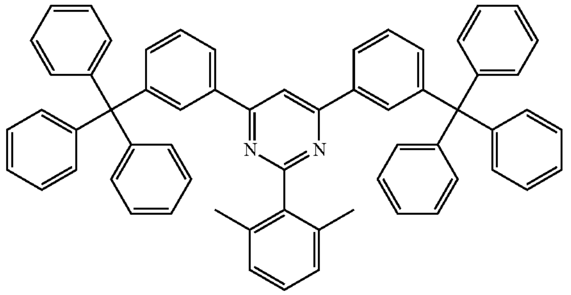
ETH22
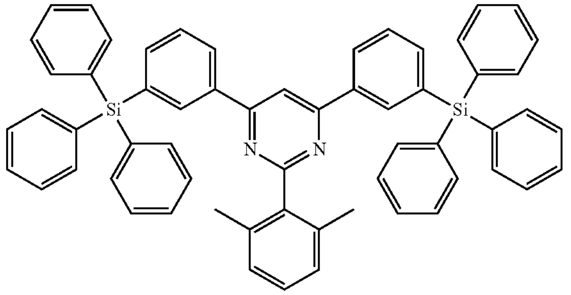

-continued
ETH23
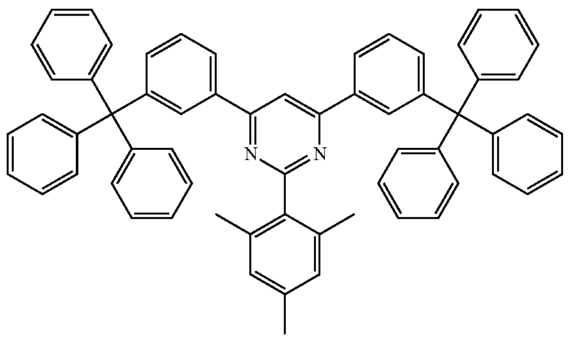
ETH24
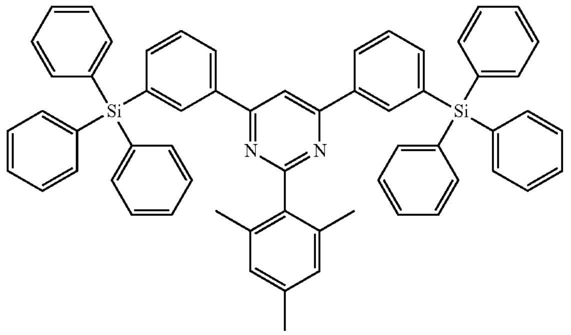
ETH25
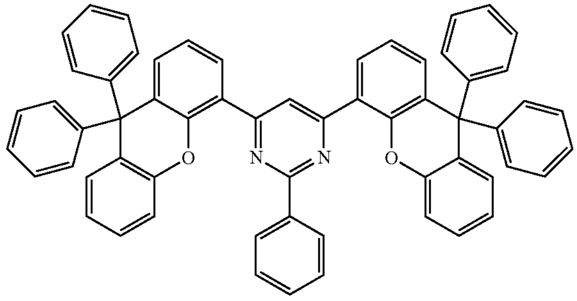
ETH26
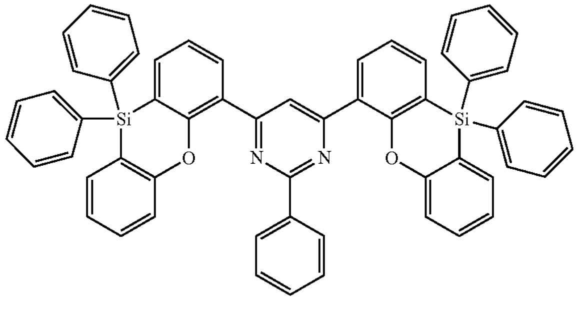
-continued
ETH27
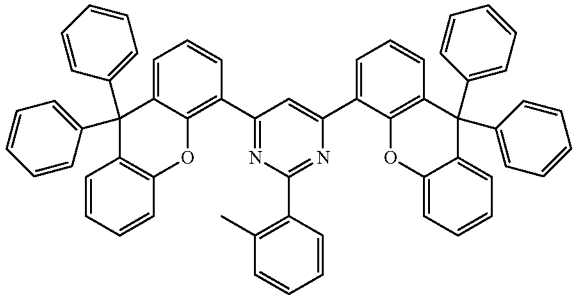
ETH28
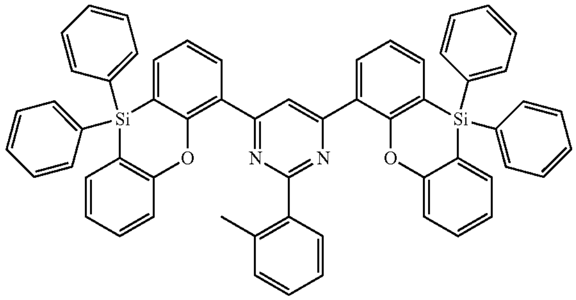
ETH29
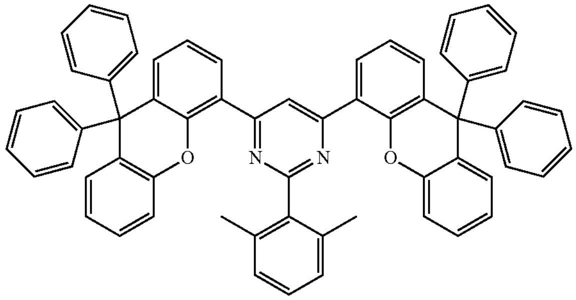
ETH30
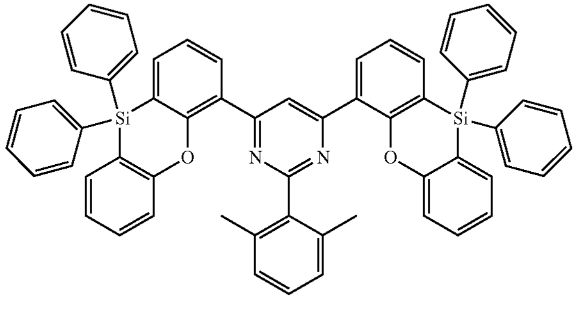

-continued
ETH31
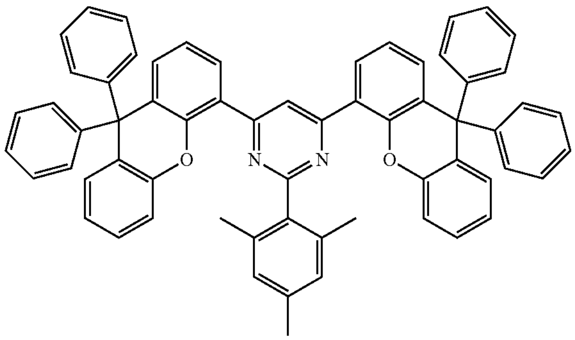
ETH32
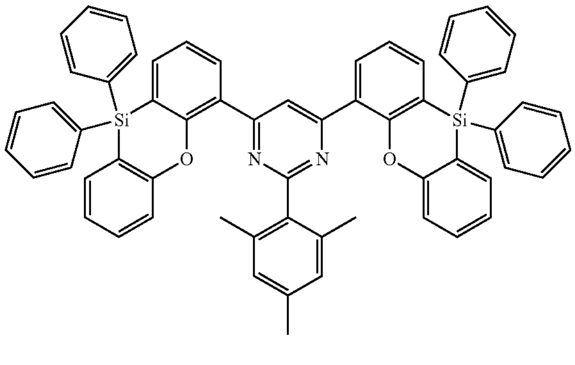
ETH33
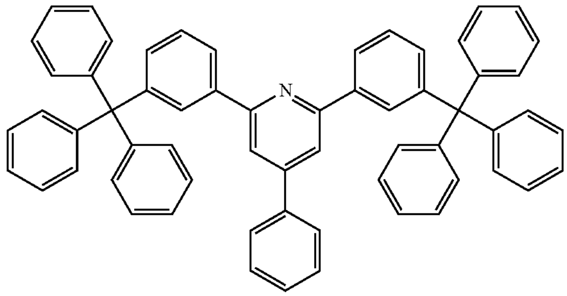
ETH34
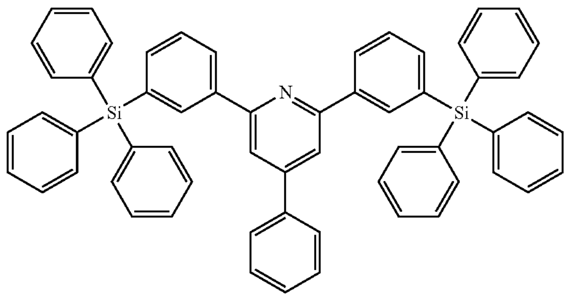
-continued
ETH35
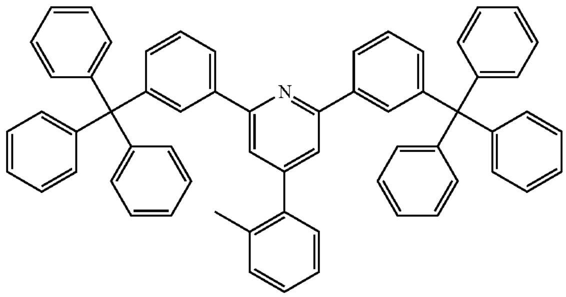
ETH36
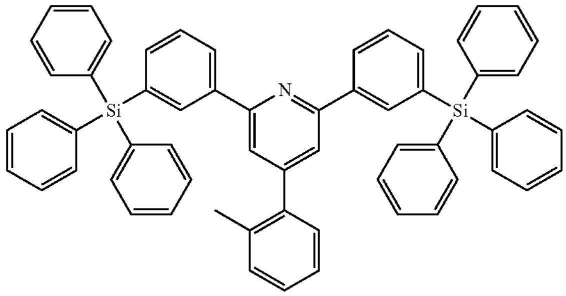
ETH37
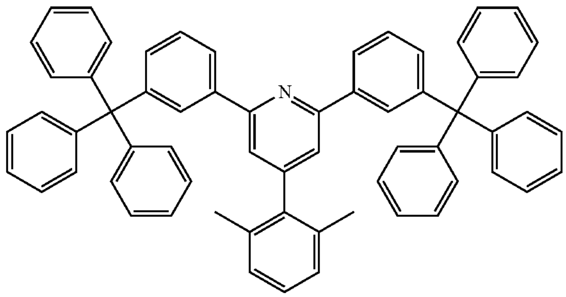
ETH38
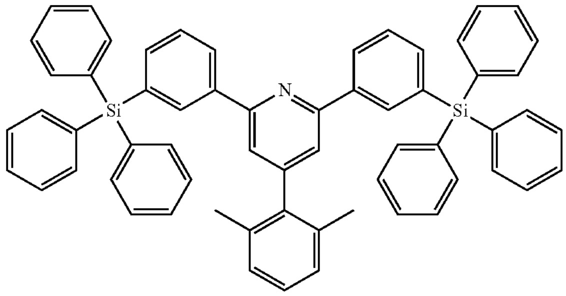
ETH39
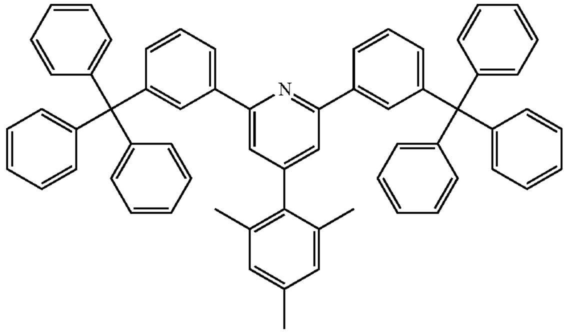

-continued
ETH40
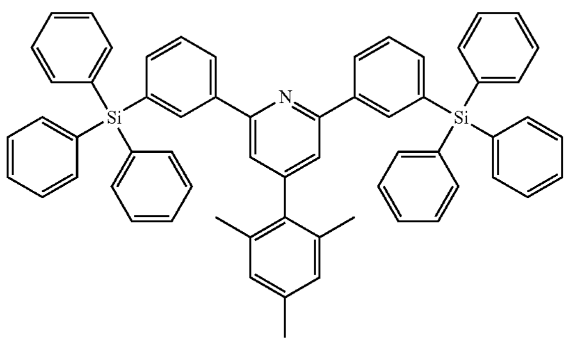
ETH41
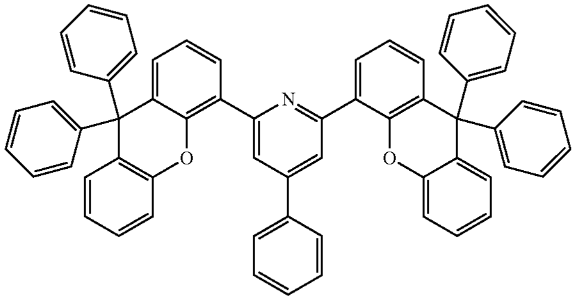
ETH42
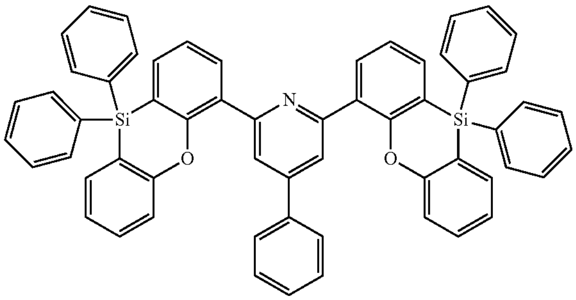
ETH43
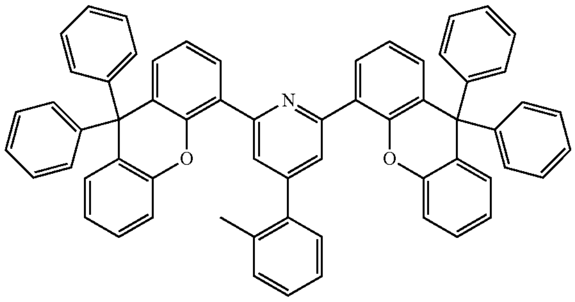
-continued
ETH44
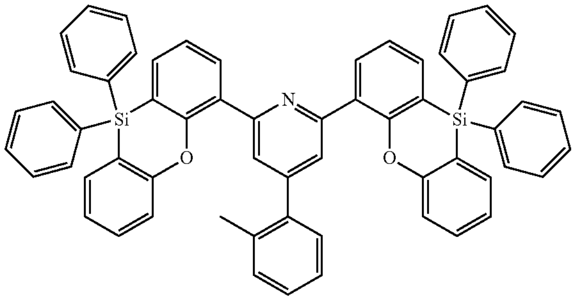
ETH45
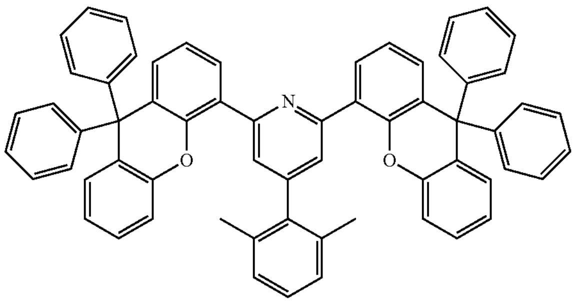
ETH46
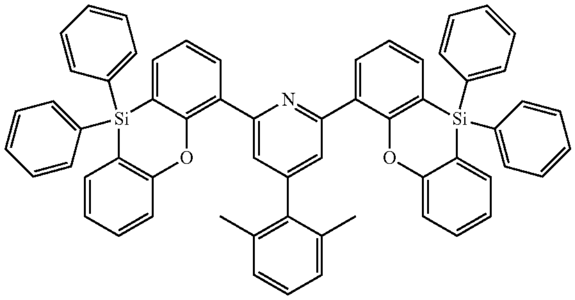
ETH47
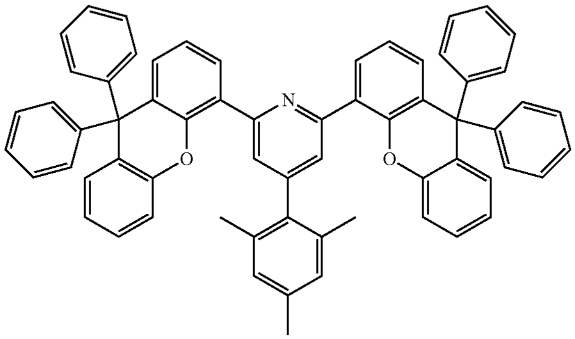

ETH48
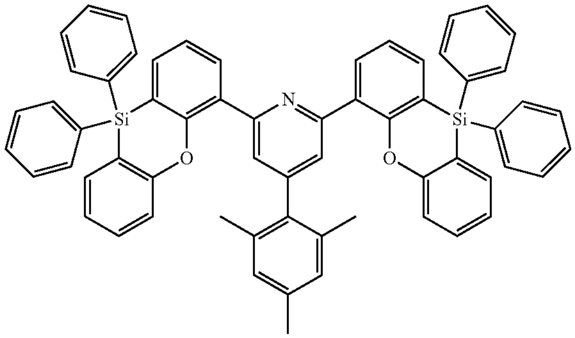
ETH49
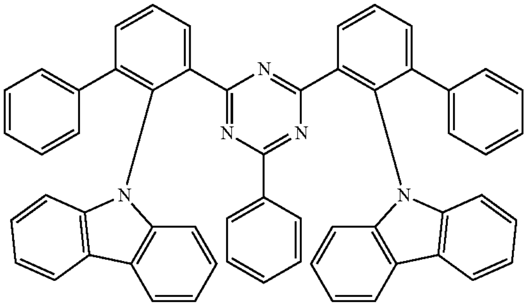
ETH50
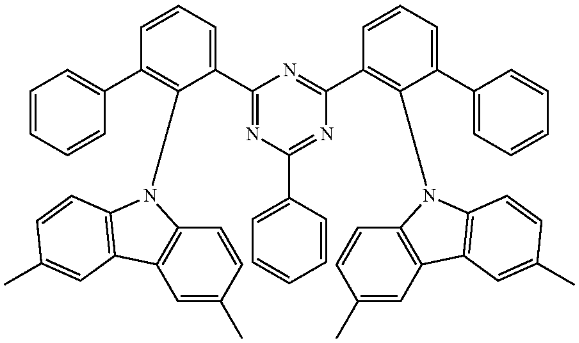
ETH51
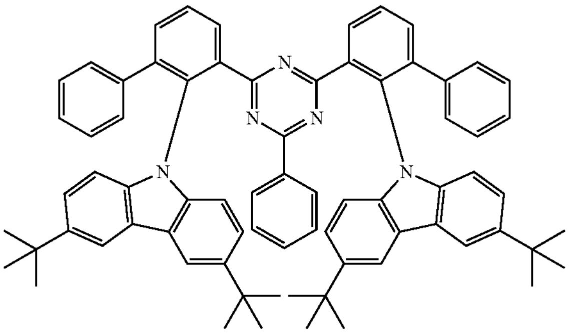
ETH52
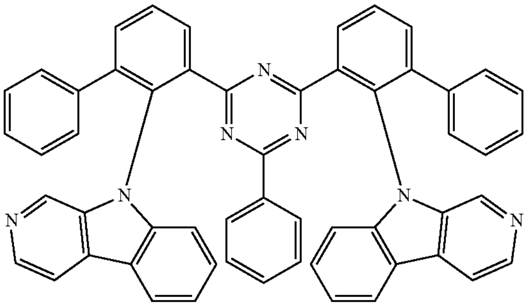
ETH53
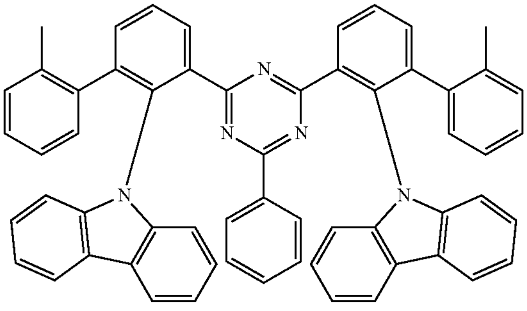
ETH54
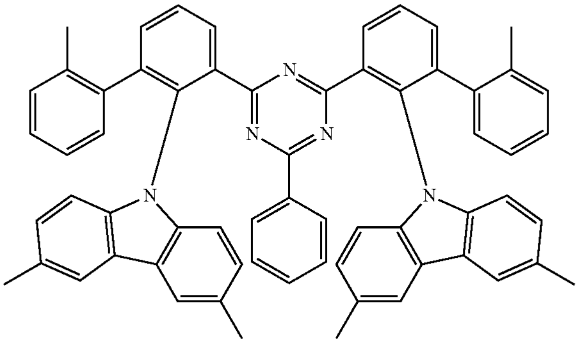
ETH55
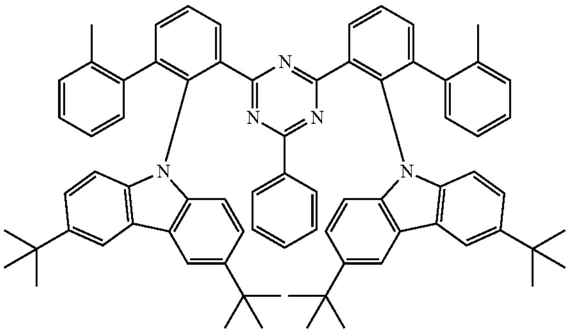

-continued
ETH56
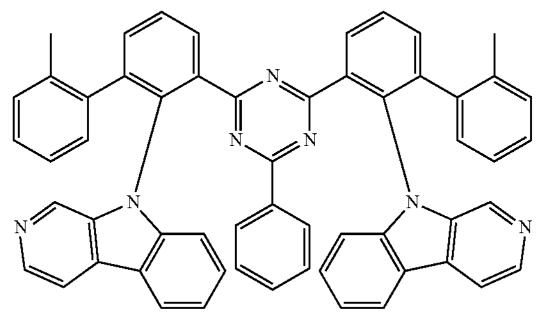
ETH57
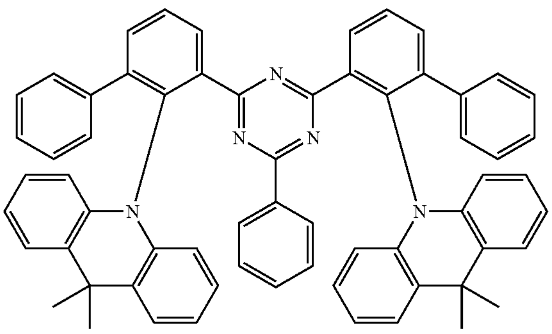
ETH58
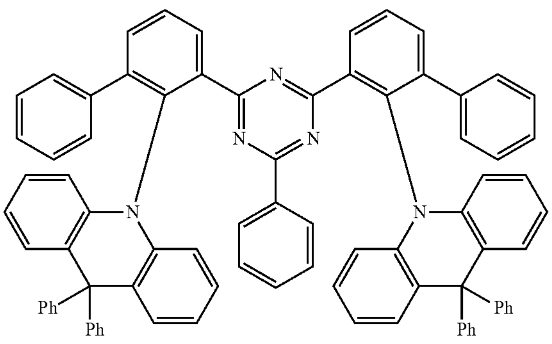
ETH59
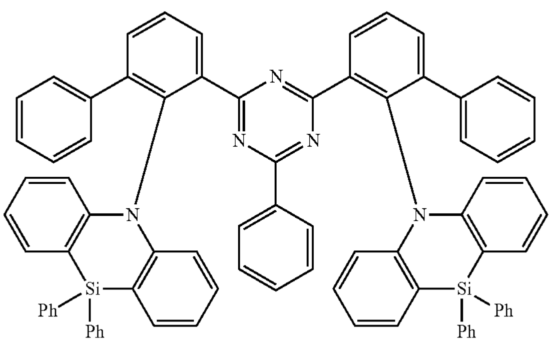
-continued
ETH60
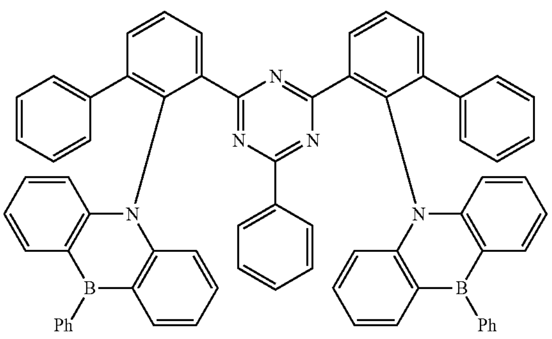
ETH61
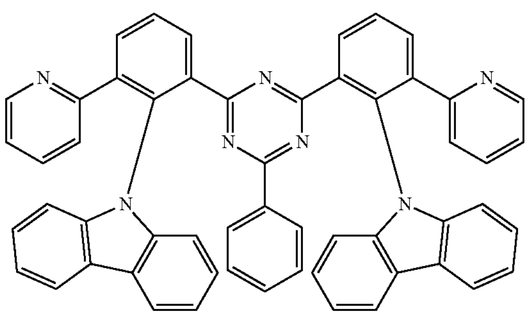
ETH62
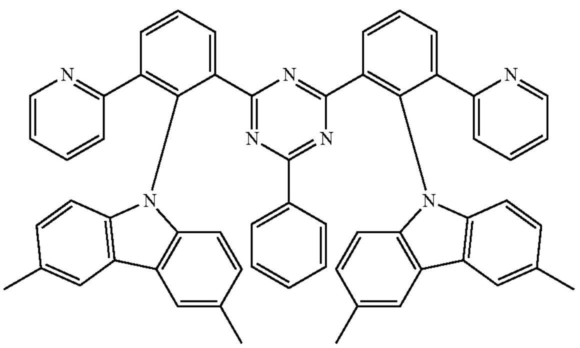
ETH63
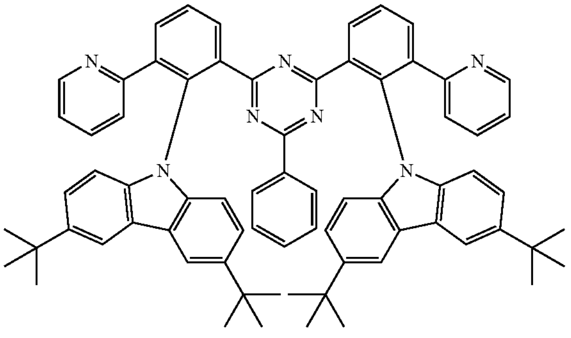

-continued
ETH64
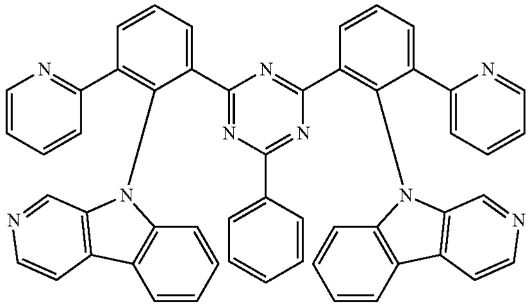
ETH65
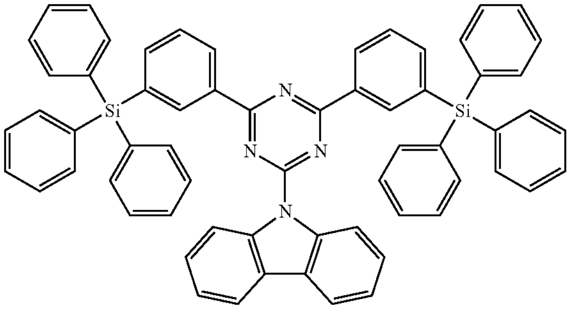
ETH66
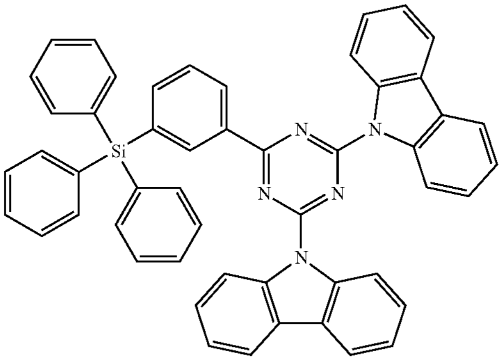
ETH67
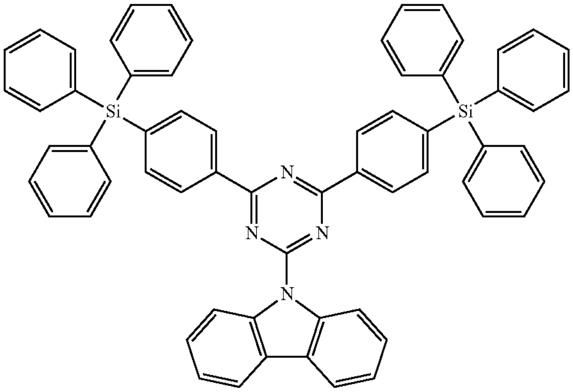
-continued
ETH68
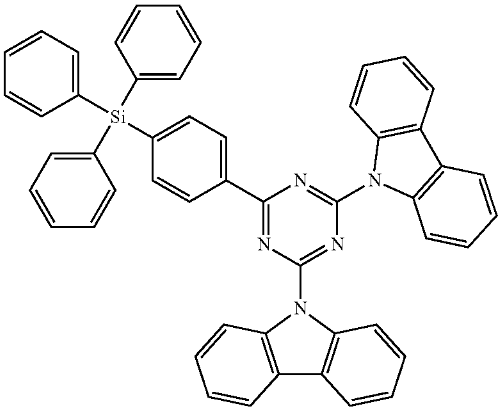
ETH69
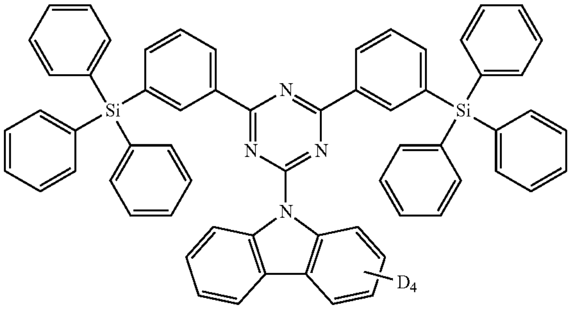
ETH70
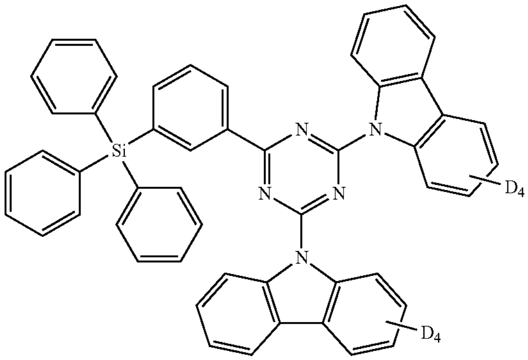
ETH71
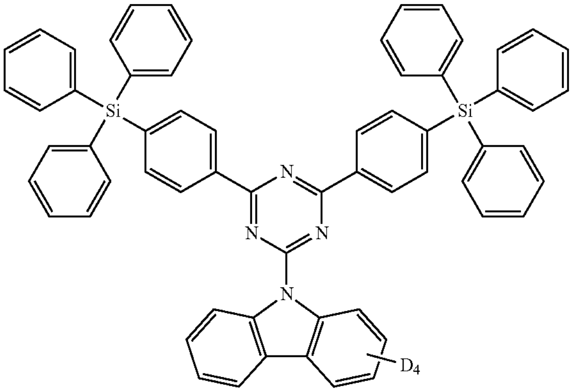

-continued
ETH72
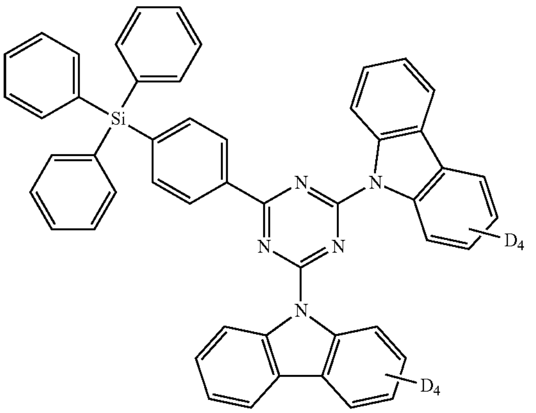
ETH73
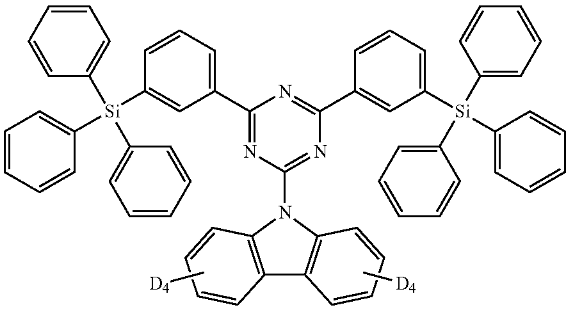
ETH74
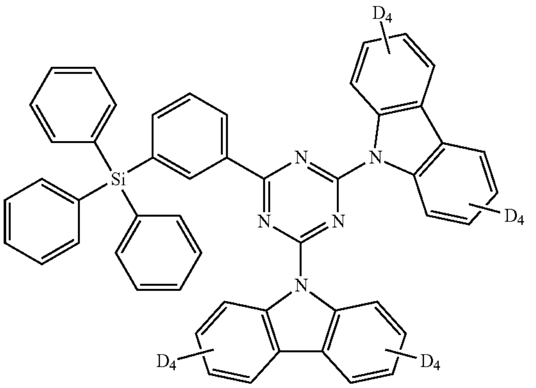
ETH75
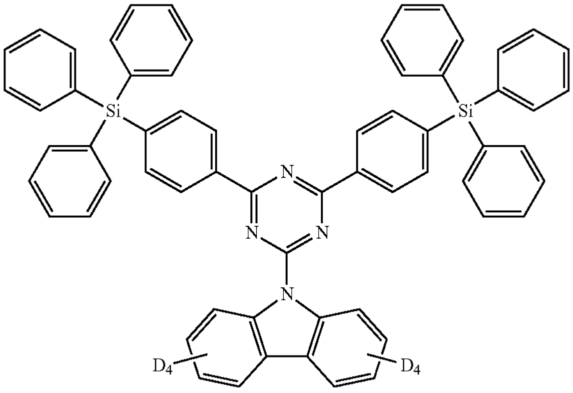
-continued
ETH76
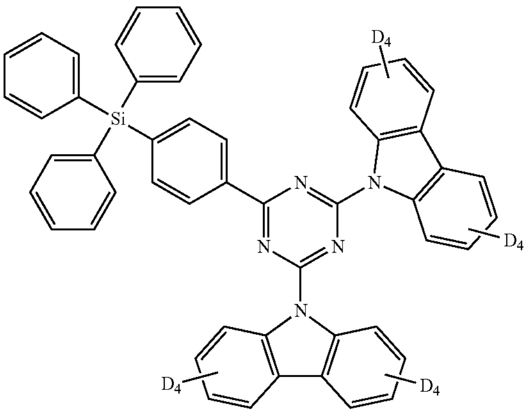
ETH77
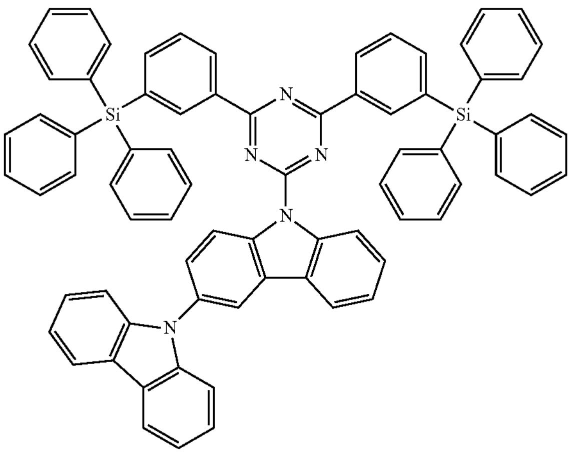
ETH78
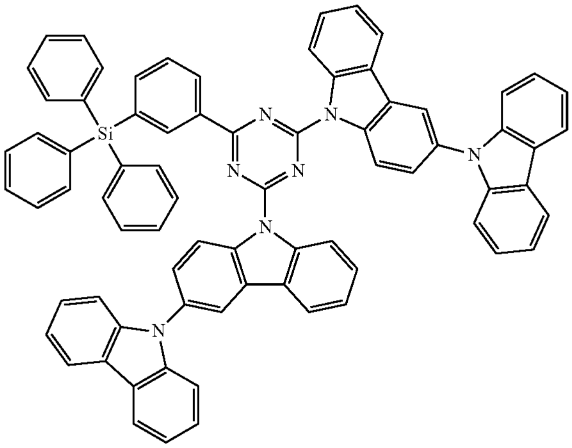

-continued

ETH79

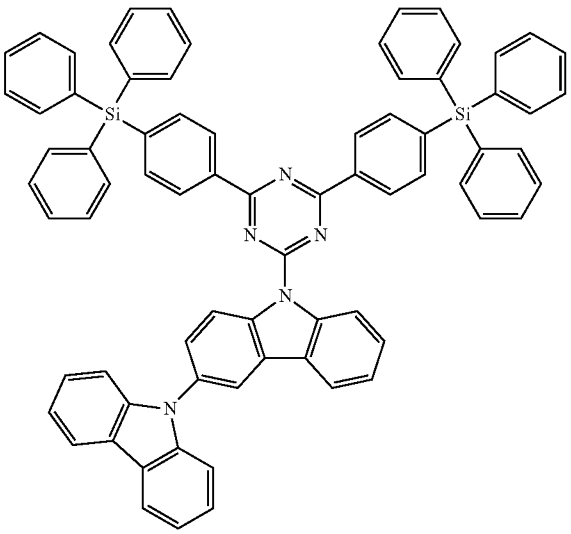

ETH80

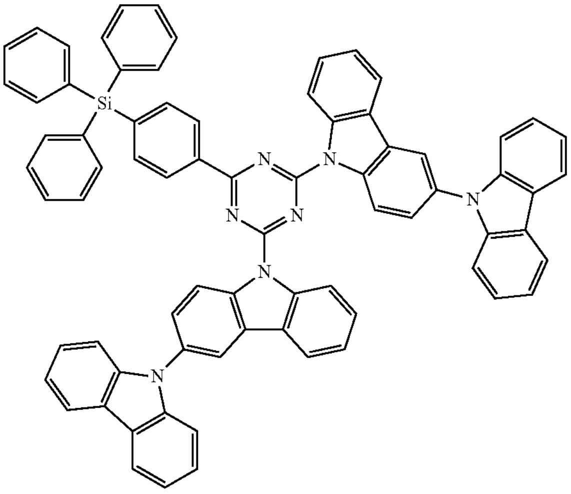

ETH81

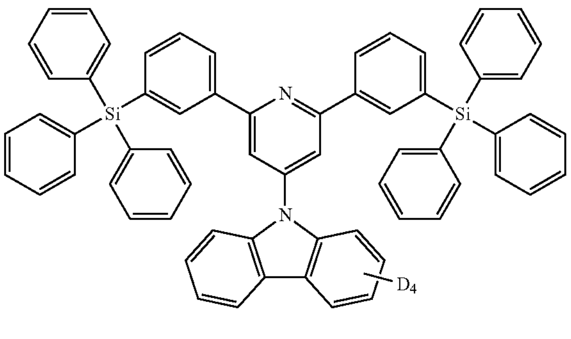

-continued

ETH82

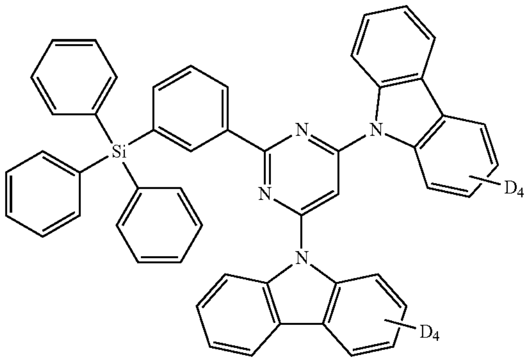

ETH83

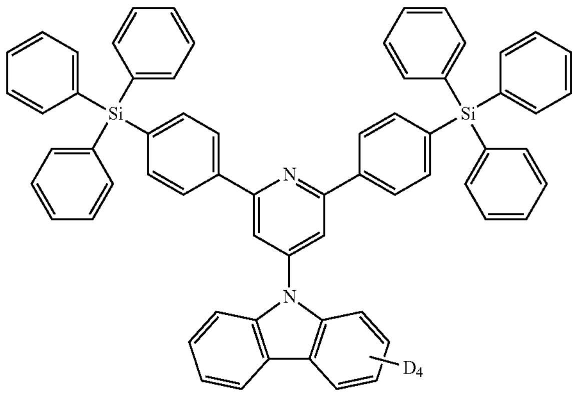

ETH84

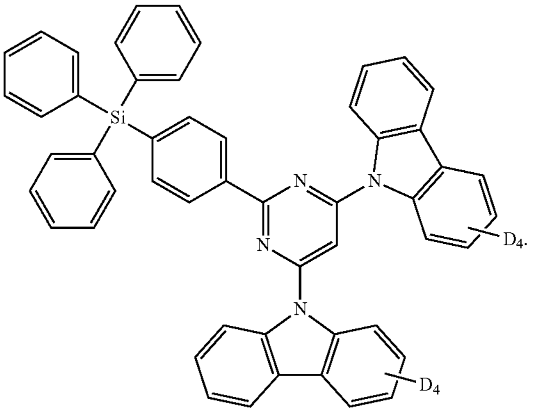

In some embodiments, D in the structures of the compounds in Compound Groups 2 and 3 refers to a deuterium atom.

In an embodiment, the emission layer EML may include one or more selected from among the compounds represented by Compound Group 4 as the fourth compound material. The emission layer EML may include at least one among the compounds represented by Compound Group 4 as a sensitizer material.

Compound Group 4
AD-01
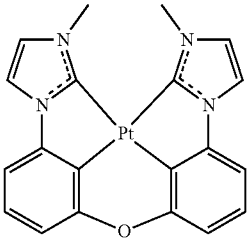
AD-02
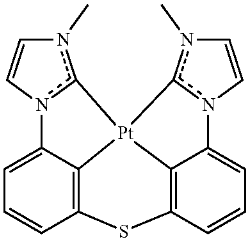
AD-03
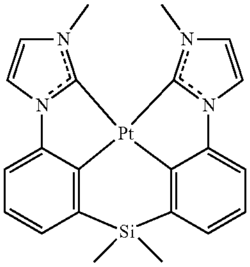
AD-04
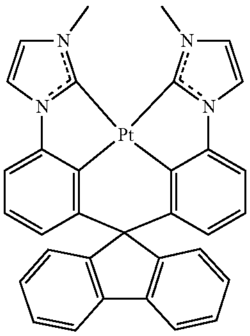
AD-05
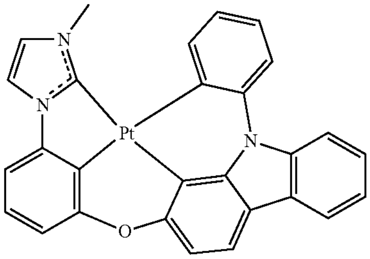
-continued
AD-06
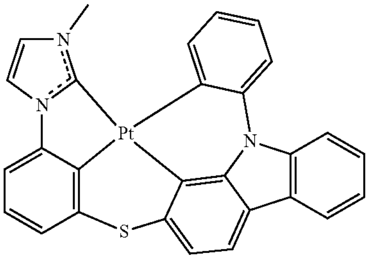
AD-07
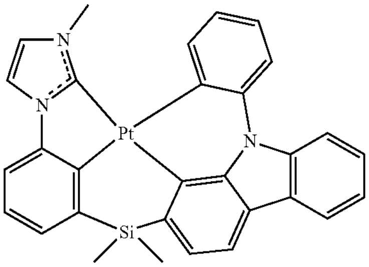
AD-08
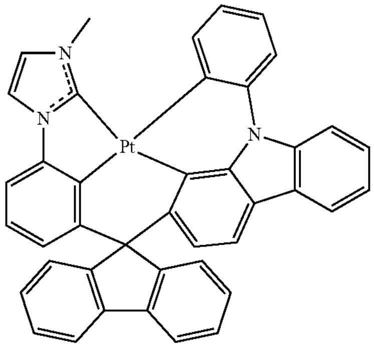
AD-09
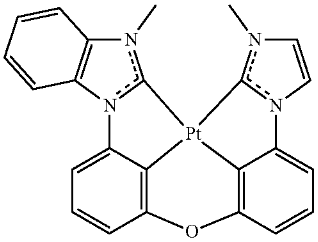
AD-10
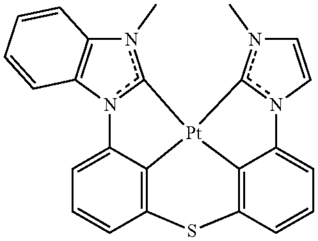

-continued
AD-11
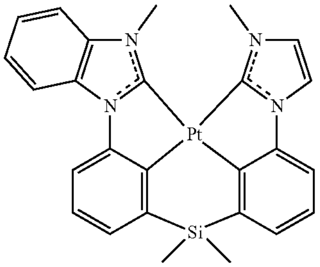
AD-12
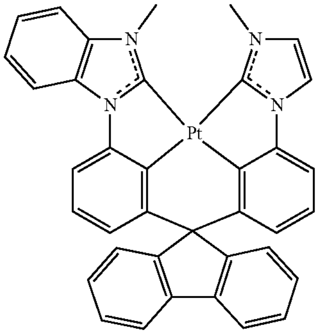
AD-13
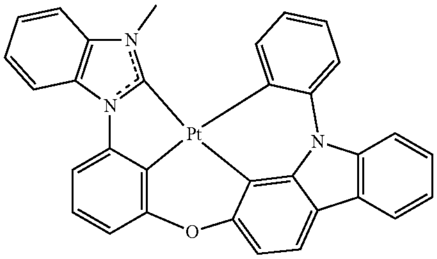
AD-14
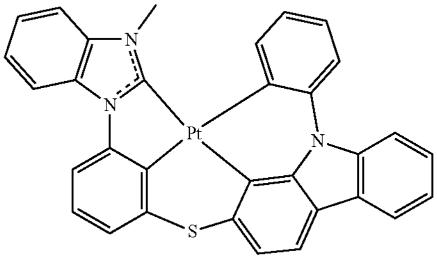
AD-15
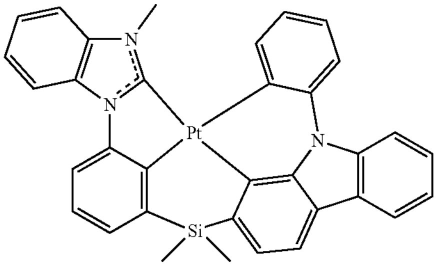
-continued
AD-16
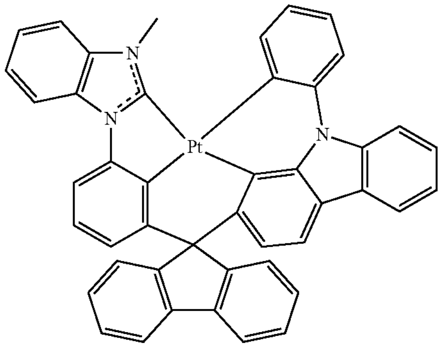
AD-17
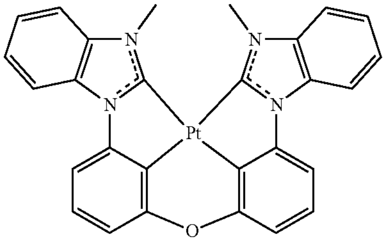
AD-18
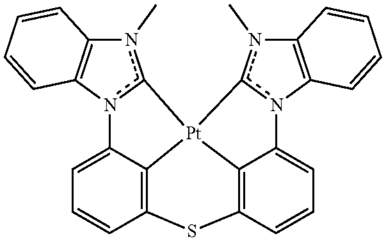
AD-19
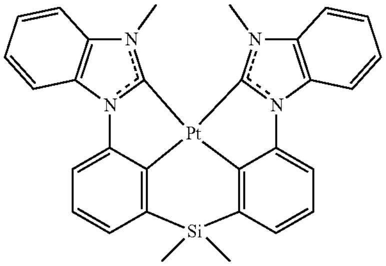
AD-20
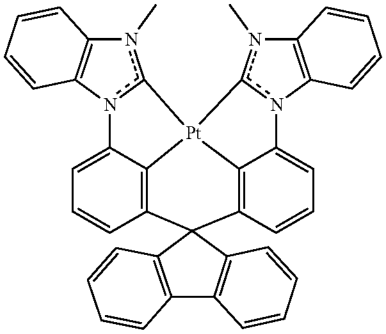

AD-21
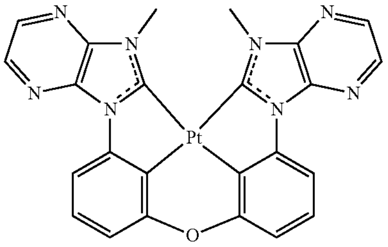
AD-22
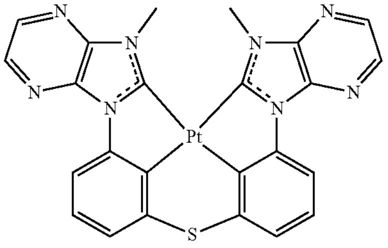
AD-23
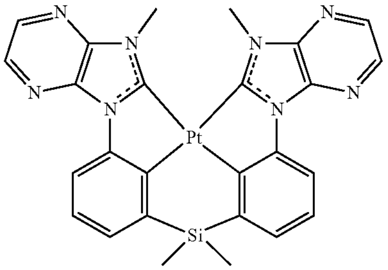
AD-24
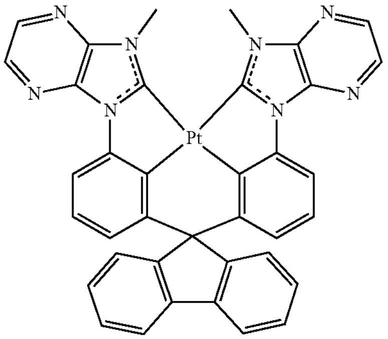
AD-25
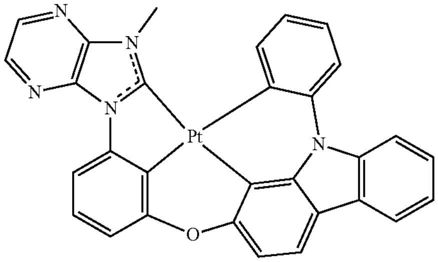
AD-26
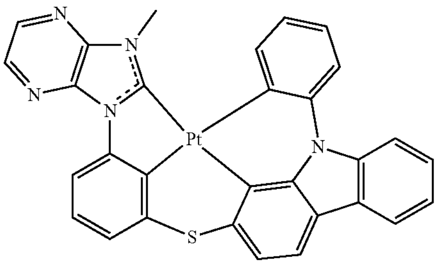
AD-27
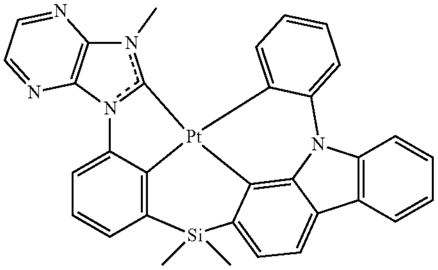
AD-28
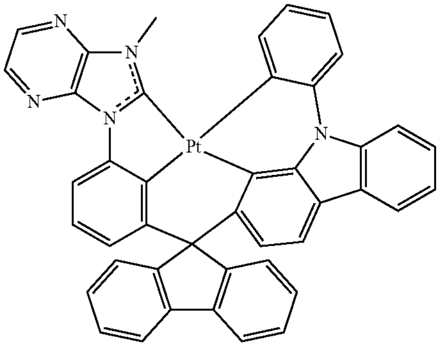
AD-29
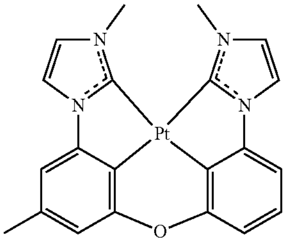
AD-30
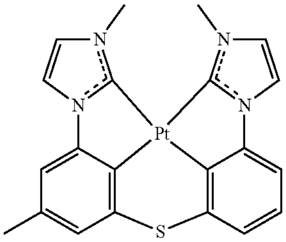

-continued

AD-31

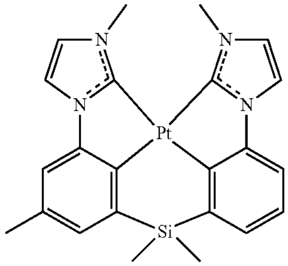

AD-32

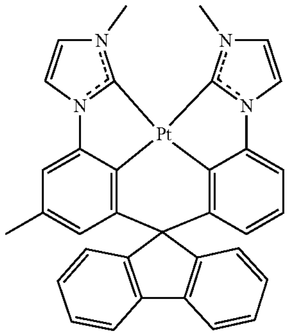

AD-33

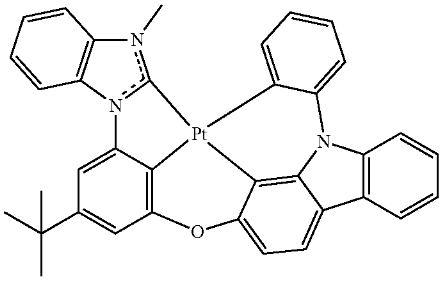

AD-34

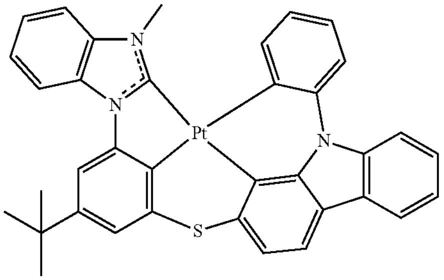

AD-35

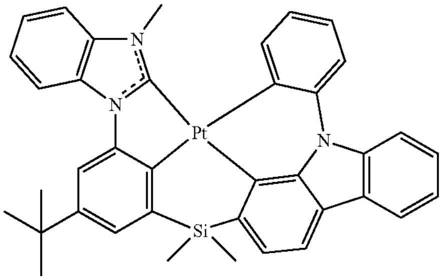

-continued

AD-36

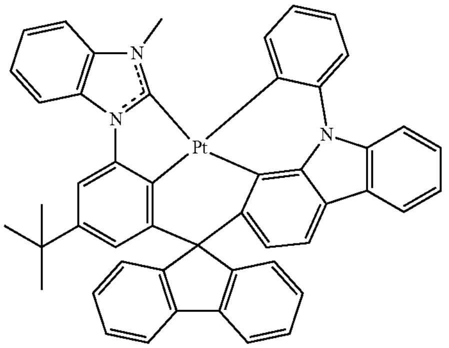

AD-37

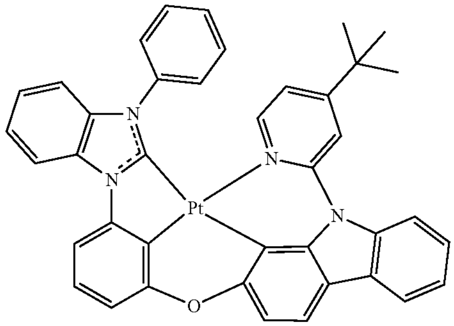

AD-38

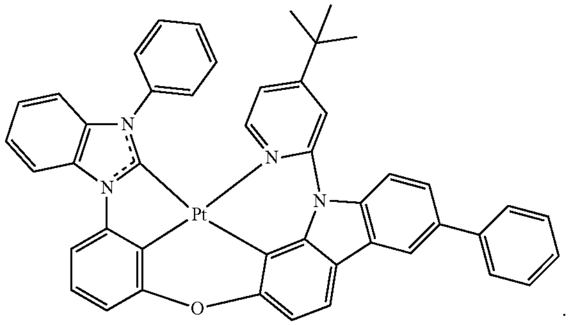

In some embodiments, the light emitting device ED of an embodiment may include a plurality of emission layers. The plurality of emission layers may be sequentially stacked and provided, and for example, the light emitting device ED including the plurality of emission layers may emit white light. The light emitting device including the plurality of emission layers may be a light emitting device having a tandem structure. When the light emitting device ED includes the plurality of emission layers, at least one emission layer EML may include all of the first compound, the second compound, the third compound, and the fourth compound as described above.

In the light emitting device ED of an embodiment, the emission layer EML may further include an anthracene derivative, a pyrene derivative, a fluoranthene derivative, a chrysene derivative, a dehydrobenzanthracene derivative, or a triphenylene derivative. For example, the emission layer EML may include the anthracene derivative or the pyrene derivative.

In each light emitting device ED of embodiments illustrated in FIGS. 3 to 6, the emission layer EML may further include a generally utilized/generally available host and dopant in addition to the above-described host and dopant, and the emission layer EML may include a compound represented by Formula E-1. The compound represented by Formula E-1 may be utilized as a fluorescent host material.

Formula E-1

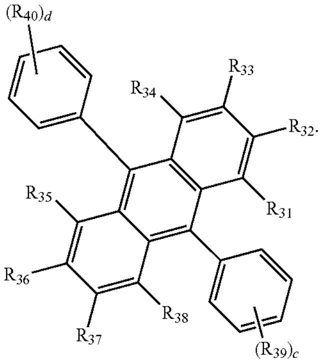

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring. In some embodiments, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may each independently be an integer from 0 to 5.

Formula E-1 may be represented by any one selected from among Compound E1 to Compound E19:

E1

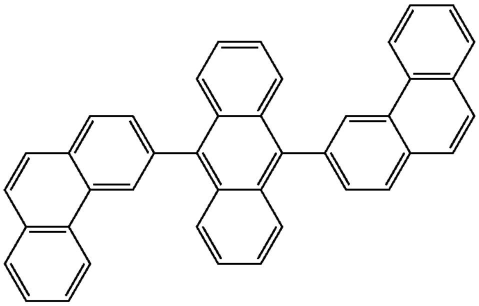

E2

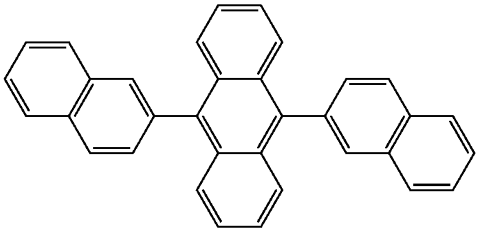

-continued

E3

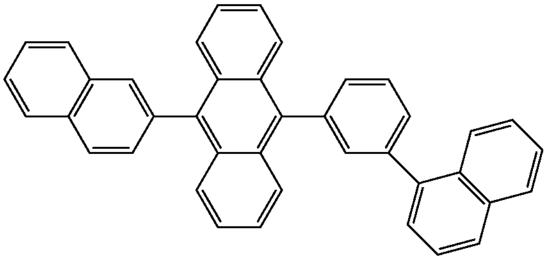

E4

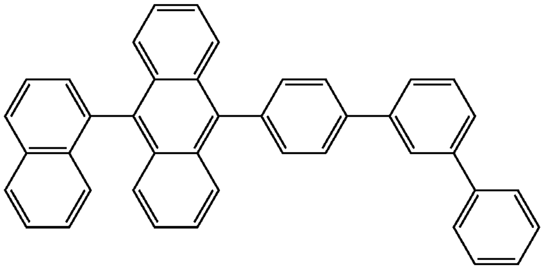

E5

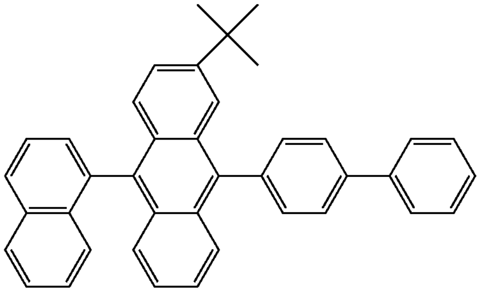

E6

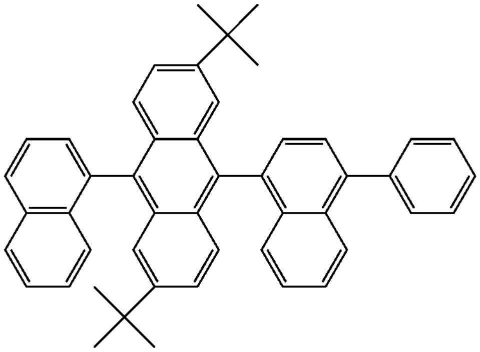

E7

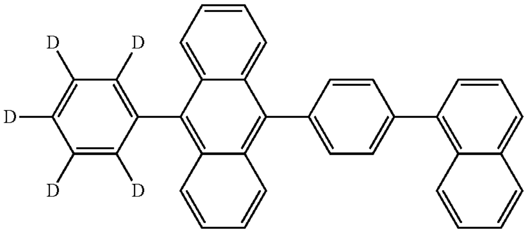

E8
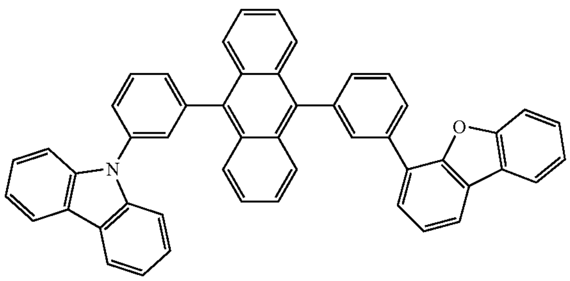
E9
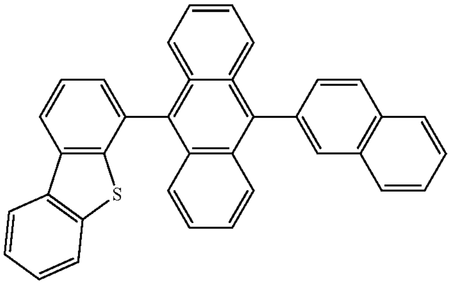
E10
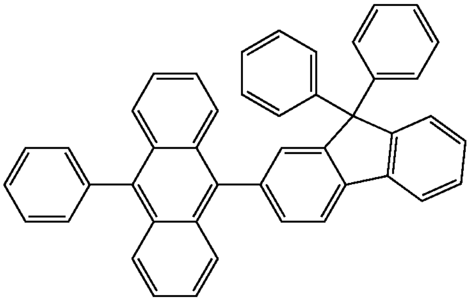
E11
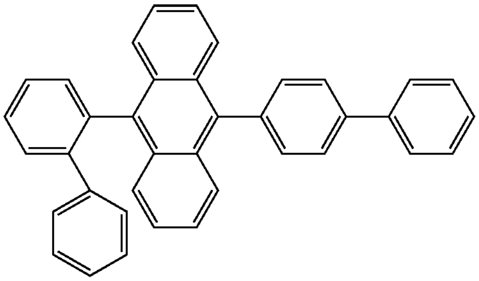
E12
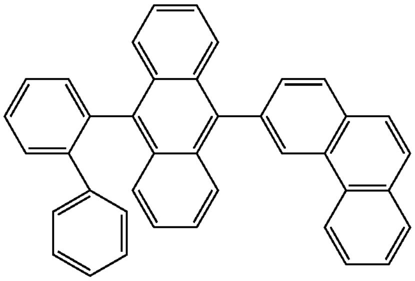
E13
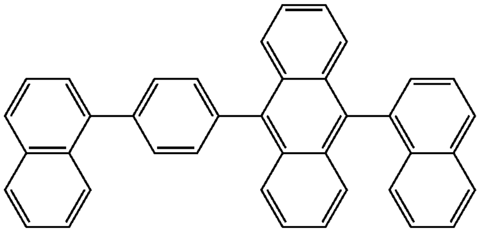
E14
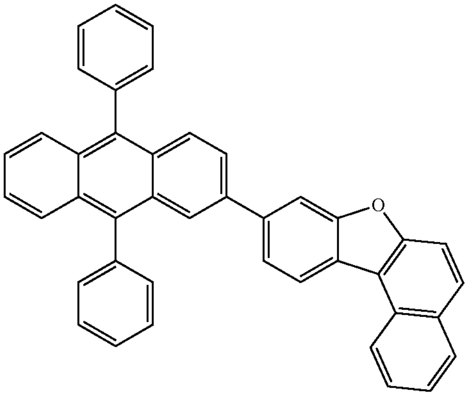
E15
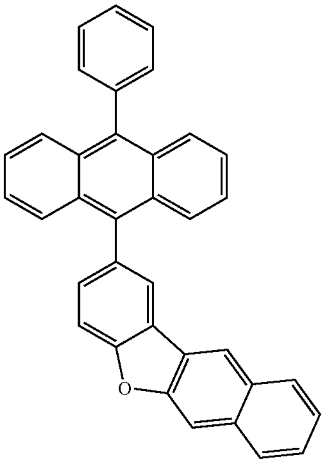
E16
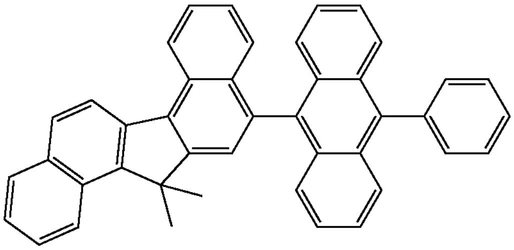

-continued

E17

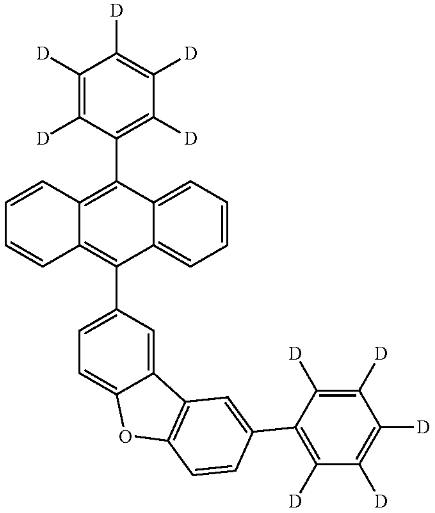

E18

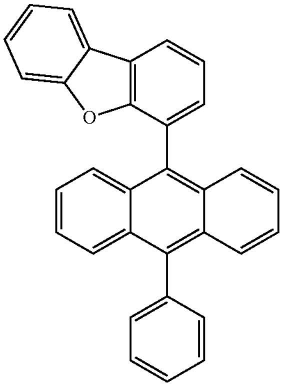

E19

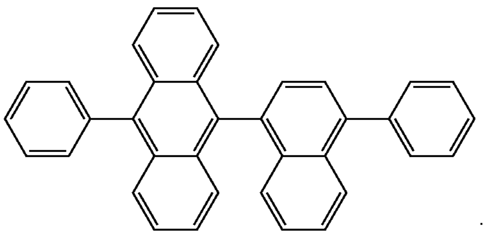

In an embodiment, the emission layer EML may include a compound represented by Formula E-2a or Formula E-2b. The compound represented by Formula E-2a or Formula E-2b may be utilized as a phosphorescent host material.

Formula E-2a

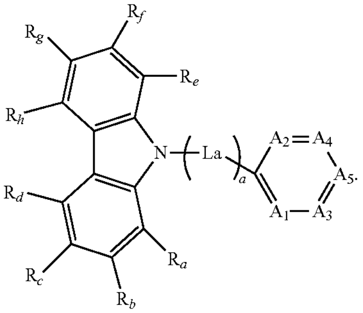

In Formula E-2a, a may be an integer from 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a is an integer of 2 or more, a plurality of Las may each independently be a substituted or unsubstituted arylene group having 6 to 30 ring-forming carbon atoms, or a substituted or unsubstituted heteroarylene group having 2 to 30 ring-forming carbon atoms.

In some embodiments, in Formula E-2a, $A_1$ to $A_5$ may each independently be N or $CR_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring. $R_a$ to $R_i$ may be bonded to an adjacent group to form a hydrocarbon ring or a heterocycle containing N, O, S, etc. as a ring-forming atom.

In some embodiments, in Formula E-2a, two or three selected from among $A_1$ to $A_5$ may be N, and the rest (i.e., the substituents that are not N) may be $CR_i$.

Formula E-2b

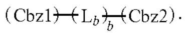

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, b is an integer from 0 to 10, and when b is an integer of 2 or more, a plurality of $L_b$s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among the compounds of Compound Group E-2. However, the compounds listed in Compound Group E-2 are merely examples, and the compound represented by Formula E-2a or Formula E-2b is not limited to those represented in Compound Group E-2.
Compound Group E-2
E-2-1
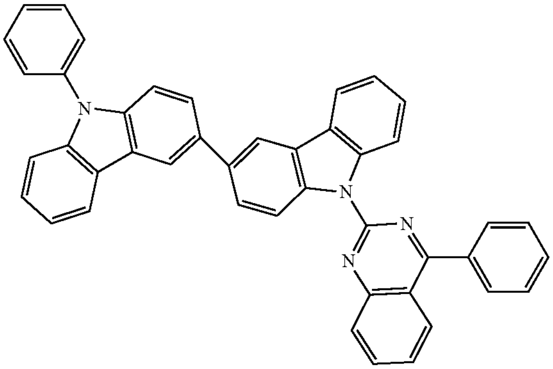
E-2-2
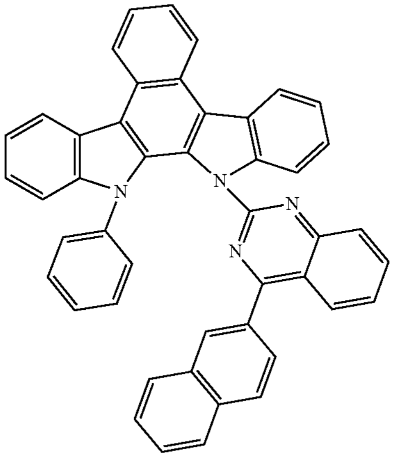
E-2-3
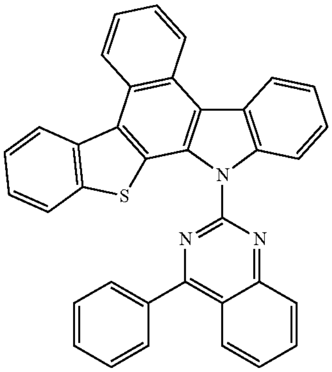
-continued
E-2-4
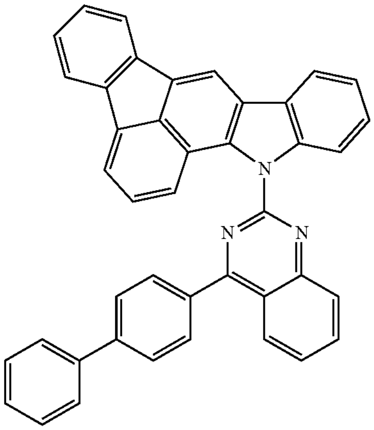
E-2-5
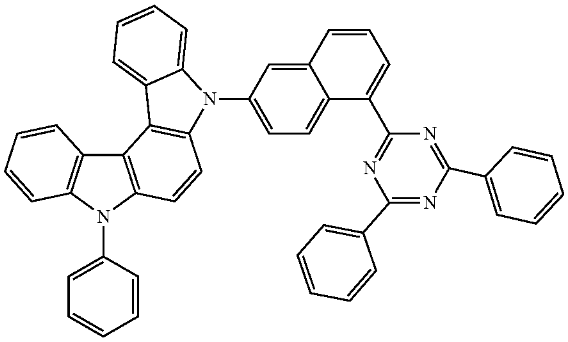
E-2-6
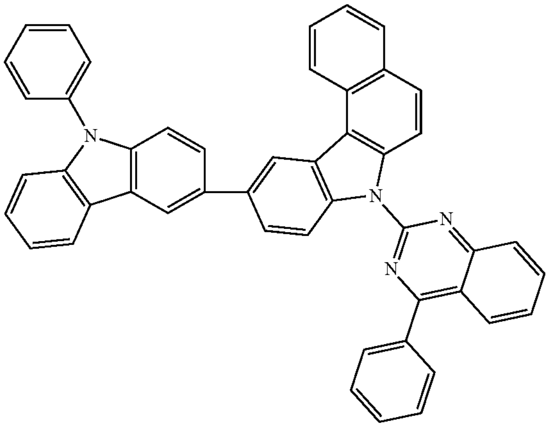

-continued
E-2-7
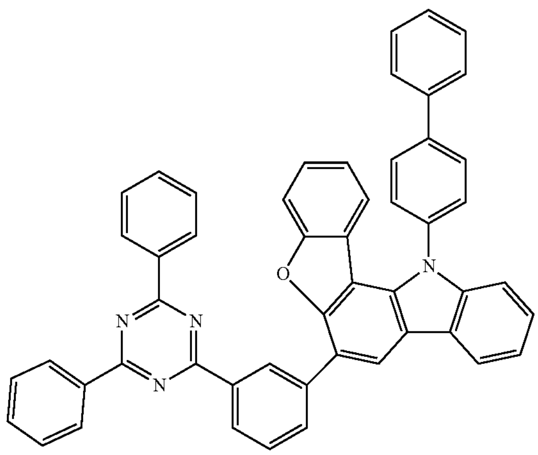
E-2-8
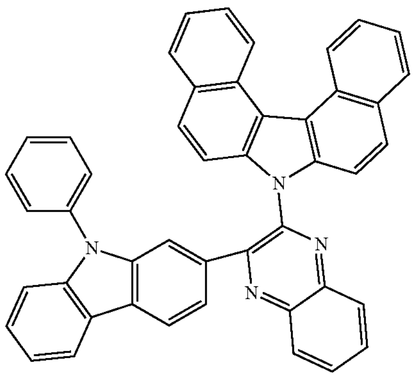
E-2-9
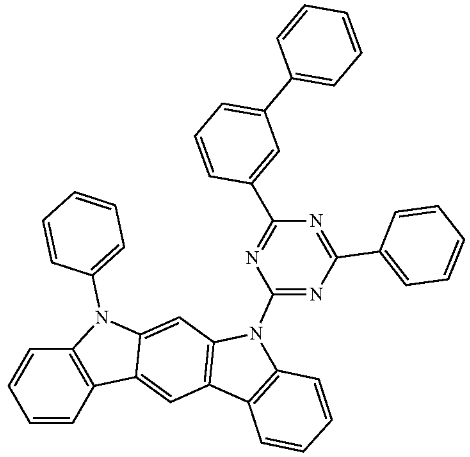
-continued
E-2-10
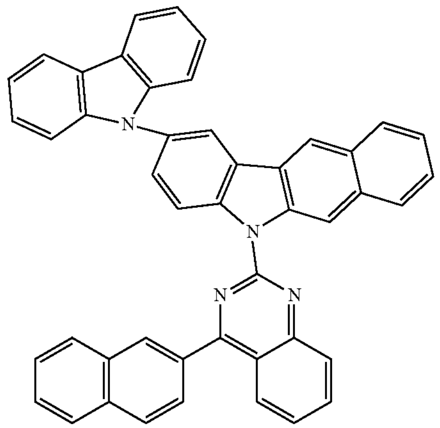
E-2-11
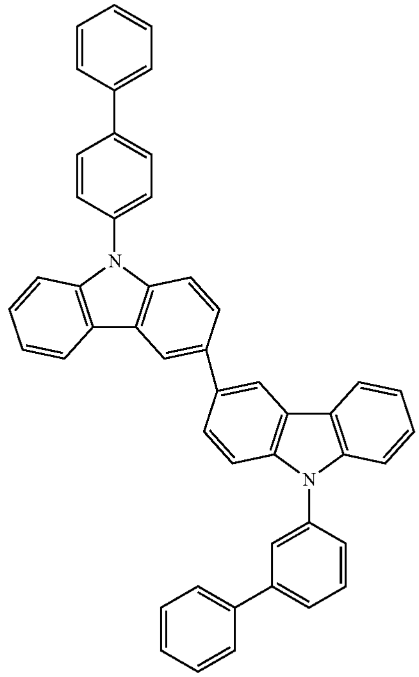
E-2-12
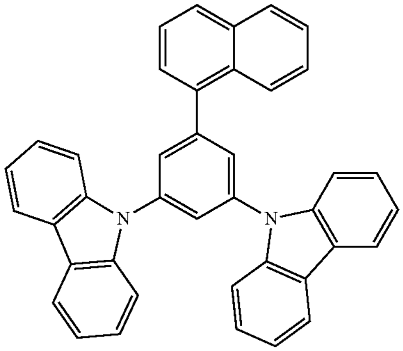

-continued
E-2-13
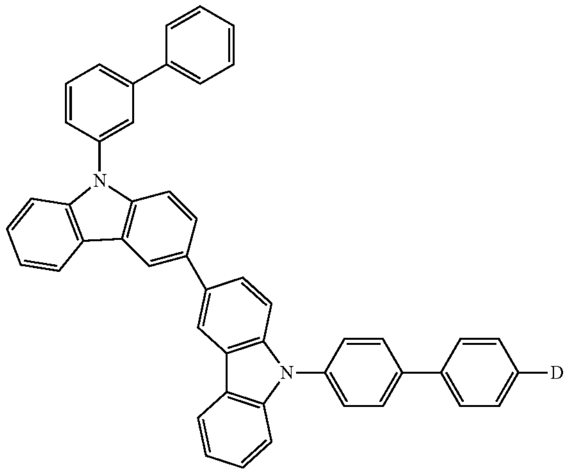
E-2-14
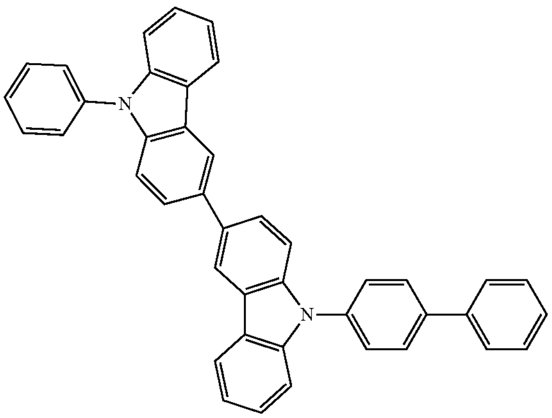
E-2-15
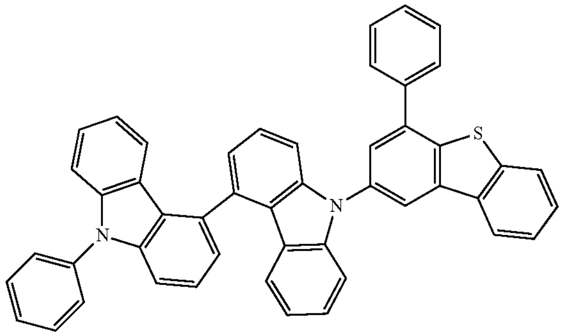
-continued
E-2-16
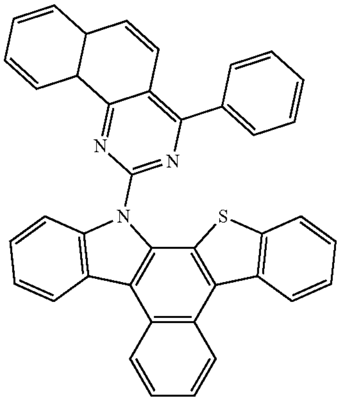
E-2-17
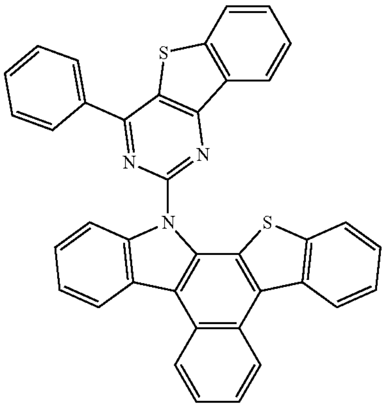
E-2-18
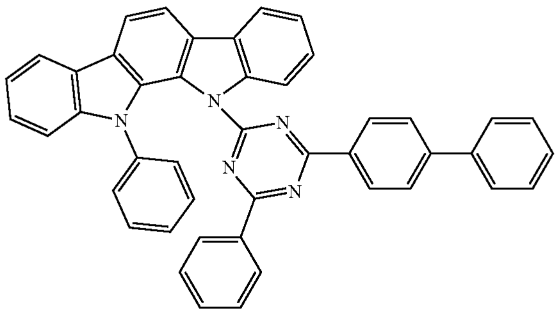
E-2-19
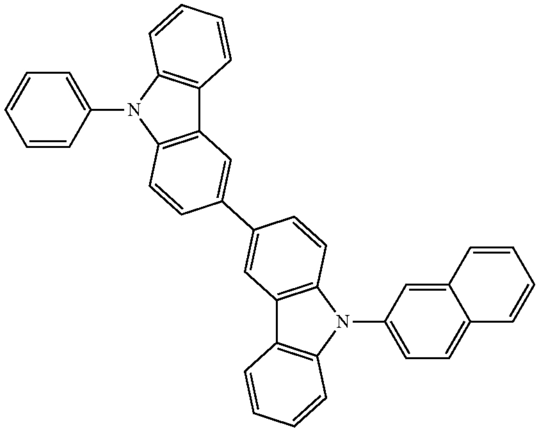

-continued

E-2-20

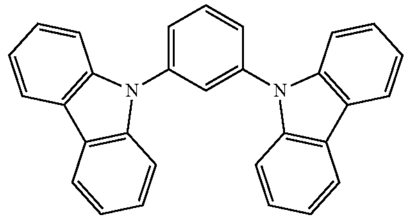

E-2=21

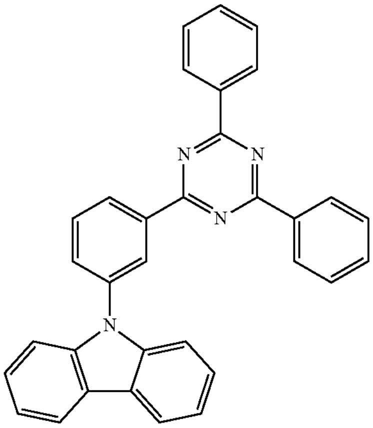

E-2-22

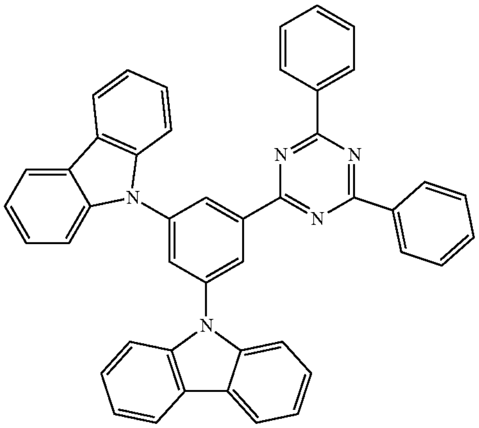

E-2-23

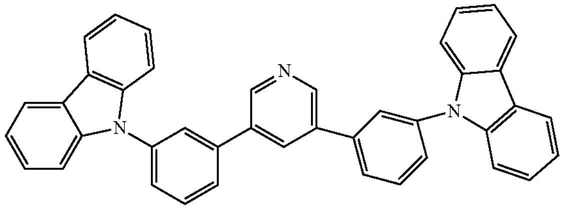

-continued

E-2-24

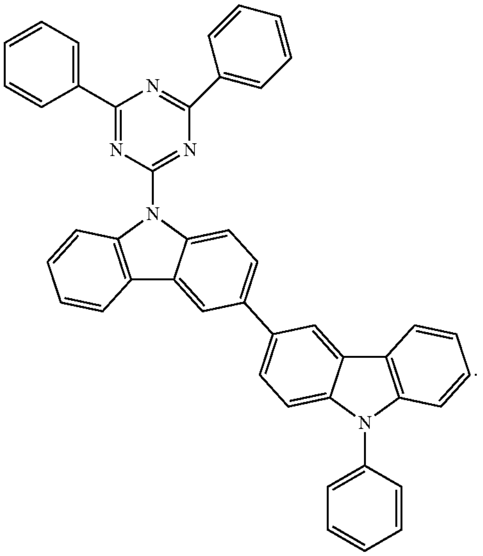

The emission layer EML may further include a general material generally utilized/generally available in the art as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl] ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, the embodiment of the present disclosure is not limited thereto, for example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be utilized as a host material.

The emission layer EML may further include a compound represented by Formula M-a. The compound represented by Formula M-a may be utilized as a phosphorescent dopant material.

Formula M-a

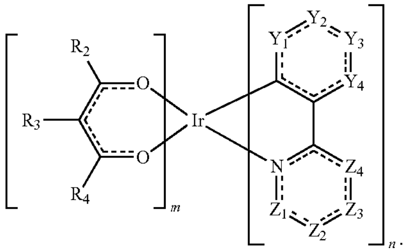

In Formula M-a, $Y_1$ to $Y_4$ and $Z_1$ to $Z_4$ may each independently be $CR_1$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring. In Formula M-a, m may be 0 or 1, and n may be 2 or 3. In Formula M-a, when m is 0, n is 3, and when m is 1, n is 2.

The compound represented by Formula M-a may be utilized as a phosphorescent dopant.

The compound represented by Formula M-a may be represented by any one selected from among Compound M-a1 to Compound M-a25. However, Compounds M-a1 to M-a25 are merely examples, and the compound represented by Formula M-a is not limited to those represented by Compounds M-a1 to M-a25.

M-a1

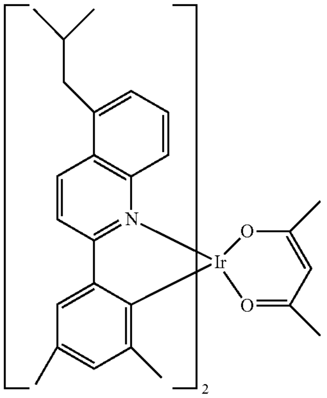

M-a2

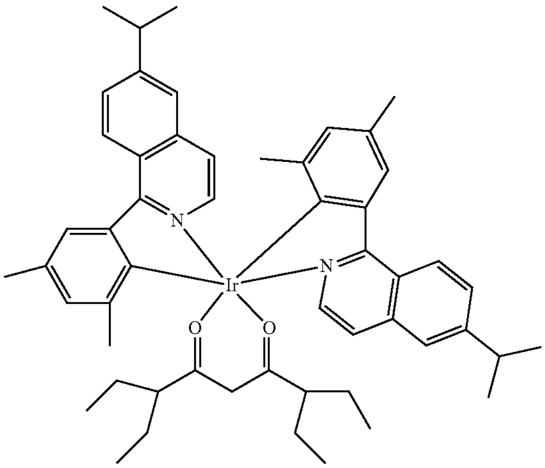

-continued

M-a3

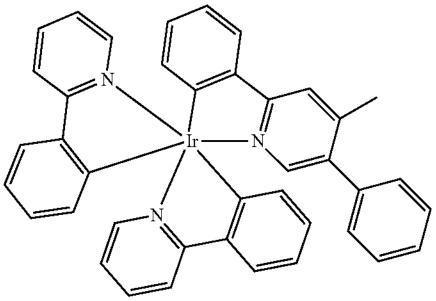

M-a4

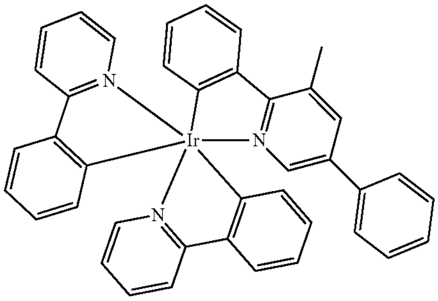

M-a5

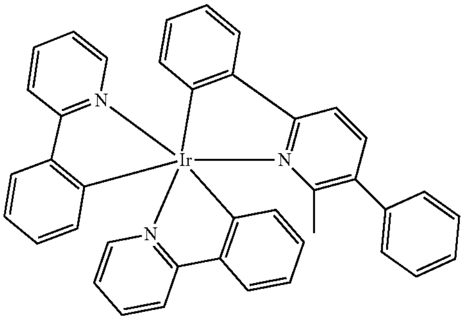

M-a6

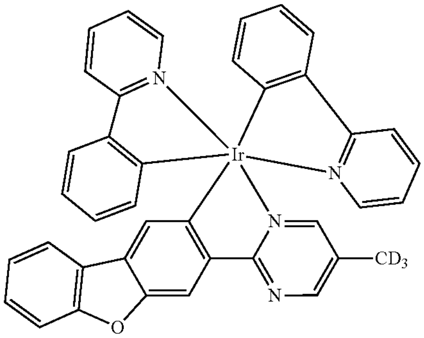

-continued
M-a7
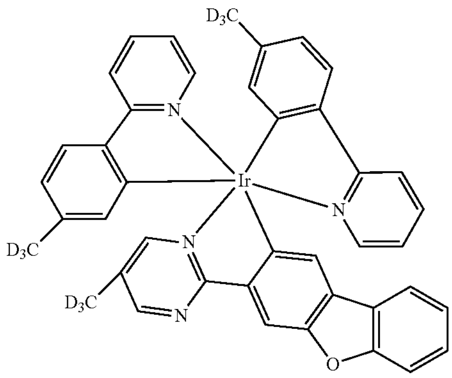
M-a8
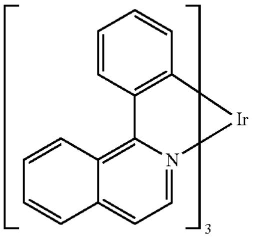
M-a9
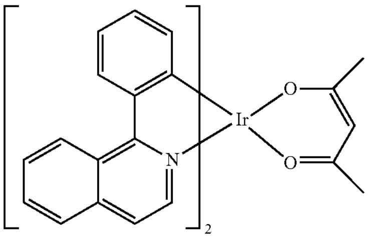
M-a10
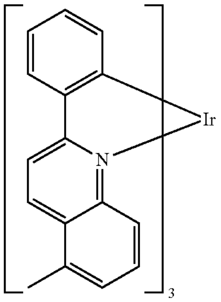
M-a11
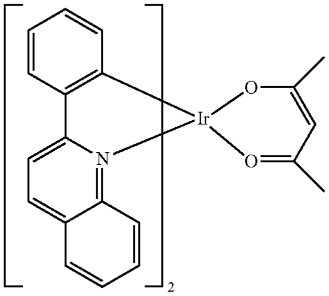
-continued
M-a12
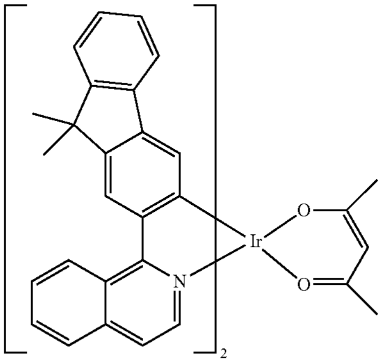
M-a13
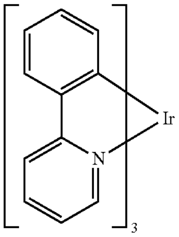
M-a14
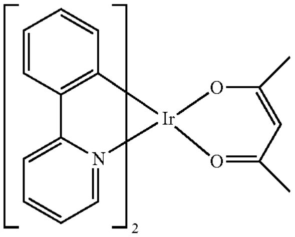
M-a15
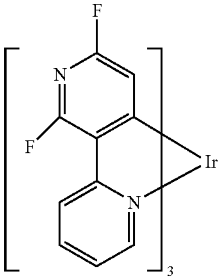
M-a16
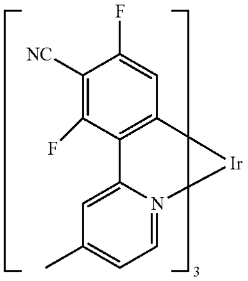

-continued
M-a17
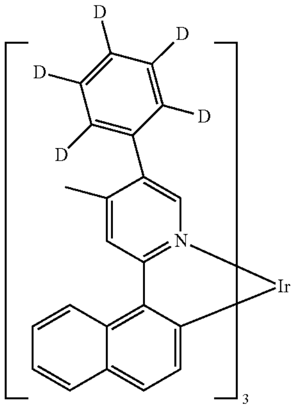
Ma-18
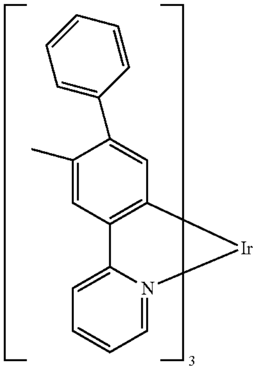
M-a19
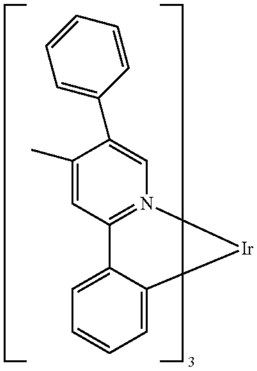
M-a20
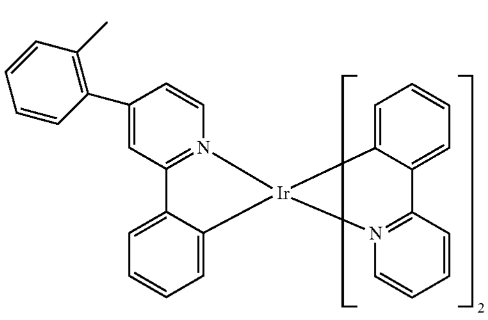
-continued
M-a21
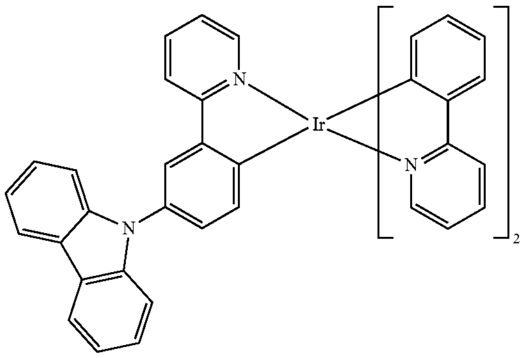
Ma-22
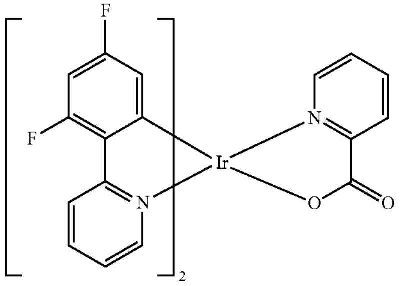
M-a23
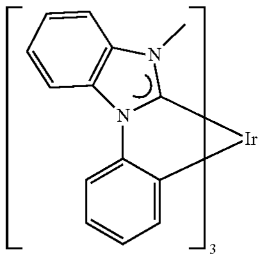
M-a24
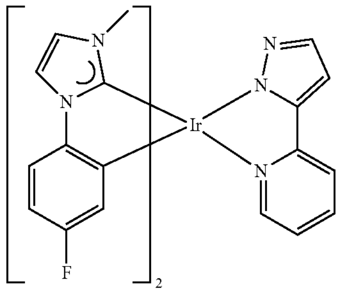
M-a25
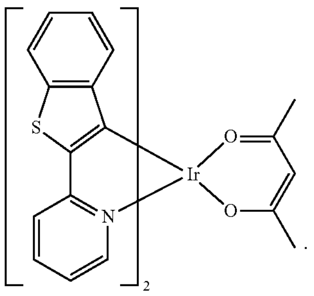
The emission layer EML may further include a compound represented by any one selected from among Formula F-a to Formula F-c. The compound represented by Formula F-a or Formula F-c may be utilized as a fluorescence dopant material.

Formula F-a

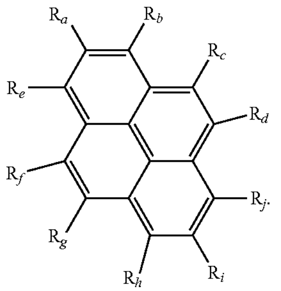

In Formula F-a, two selected from among $R_a$ to $R_j$ may each independently be substituted with $*\text{—}NAr_1Ar_2$. The others, which are not substituted with $*\text{—}NAr_1Ar_2$, among $R_a$ to $R_j$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In $*\text{—}NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

Formula F-b

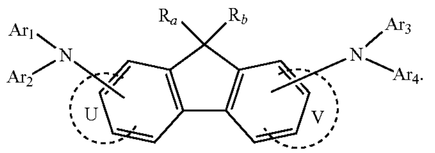

In Formula F-b, $Ar_1$ to $Ar_4$ may be a substituted or unsubstituted aryl group having 6 to 30 ring-forming carbon atoms, or a substituted or unsubstituted heteroaryl group having 2 to 30 ring-forming carbon atoms.

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, it refers to when the number of U or V is 1, one ring constitutes a fused ring at a portion indicated by U or V, and when the number of U or V is 0, a ring indicated by U or V does not exist. For example, when the number of U is 0 and the number of V is 1, or when the number of U is 1 and the number of V is 0, the fused ring having a fluorene core in Formula F-b may be a cyclic compound having four rings. In some embodiments, when each number of U and V is 0, the fused ring in Formula F-b may be a cyclic compound having three rings. In some embodiments, when each number of U and V is 1, the fused ring having a fluorene core in Formula F-b may be a cyclic compound having five rings.

Formula F-c

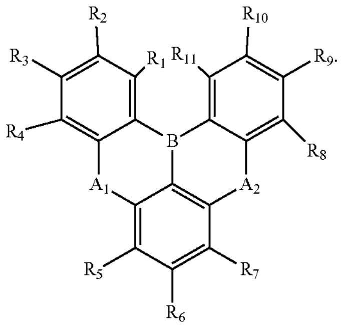

In Formula F-c, $A_1$ and $A_2$ may each independently be O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

In Formula F-c, $A_1$ and $A_2$ may each independently be bonded to substituents of an adjacent ring to form a condensed ring. For example, when $A_1$ and $A_2$ may each independently be $NR_m$, $A_1$ may be bonded to $R_4$ or $R_5$ to form a ring. In some embodiments, $A_2$ may be bonded to $R_7$ or $R_8$ to form a ring.

In an embodiment, the emission layer EML may further include, as a generally utilized/generally available dopant material, styryl derivatives (e.g., 1,4-bis[2-(3-N-ethylcarbazoryl) vinyl]benzene (BCzVB), 4-(di-p-tolylamino)-4'-[(di-p-tolylamino) styryl]stilbene (DPAVB), and N-(4-((E)-2-(6-((E)-4-(diphenylamino) styryl) naphthalen-2-yl) vinyl) phenyl)-N-phenylbenzenamine (N-BDAVBi), 4,4'-bis[2-(4-(N,N-diphenylamino)phenyl) vinyl]biphenyl (DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N,N-diphenylamino)pyrene), etc.

The emission layer EML may further include a generally utilized/generally available phosphorescence dopant material. For example, a metal complex containing iridium (Ir), platinum (Pt), osmium (Os), aurum (Au), titanium (Ti), zirconium (Zr), hafnium (Hf), europium (Eu), terbium (Tb), or thulium (Tm) may be utilized as a phosphorescent dopant. For example, iridium (III) bis(4,6-difluorophenylpyridinato- N,C2') (Flrpic), bis(2,4-difluorophenylpyridinato)-tetrakis (1-pyrazolyl) borate iridium (III) (Fir6), or platinum octaethyl porphyrin (PtOEP) may be utilized as a phosphorescent dopant. However, the embodiment of the present disclosure is not limited thereto.

The emission layer EML may include a quantum dot material. The core of the quantum dot may be selected from among a Group II-VI compound, a Group III-VI compound, a Group I-III-IV compound, a Group III-V compound, a Group III-II-V compound, a Group IV-VI compound, a Group IV element, a Group IV compound, and one or more combinations thereof.

The Group II-VI compound may be selected from the group including (e.g., consisting of) a binary compound selected from the group including (e.g., consisting of) CdSe, CdTe, CdS, ZnS, ZnSe, ZnTe, ZnO, HgS, HgSe, HgTe, MgSe, MgS, and one or more compounds or mixtures thereof, a ternary compound selected from the group including (e.g., consisting of) CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and one or more compounds or mixtures thereof, and a quaternary compound selected from the group including (e.g., consisting of) HgZnTeS, CdZnSeS, CdZnSeTe, CdZnSTe, CdHgSeS, CdHgSeTe, CdHgSTe, HgZnSeS, HgZnSeTe, HgZnSTe, and one or more compounds or mixtures thereof.

The Group III-VI compound may include a binary compound such as $In_2S_3$ or $In_2Se_3$, a ternary compound such as $InGaS_3$ or $InGaSe_3$, or one or more combinations thereof.

The Group I-III-VI compound may be selected from a ternary compound selected from the group including (e.g., consisting of) AglnS, $AgInS_2$, CulnS, $CulnS_2$, $AgGaS_2$, $CuGaS_2$ $CuGaO_2$, $AgGaO_2$, $AgAlO_2$, and one or more compounds or mixtures thereof, or a quaternary compound such as $AgInGaS_2$ or $CulnGaS_2$.

The Group III-V compound may be selected from the group including (e.g., consisting of) a binary compound selected from the group including (e.g., consisting of) GaN, GaP, GaAs, GaSb, AlN, AlP, AlAs, AlSb, InN, InP, InAs, InSb, and one or more compounds or mixtures thereof, a ternary compound selected from the group including (e.g., consisting of) GaNP, GaNAs, GaNSb, GaPAs, GaPSb, AlNP, AlNAs, AlNSb, AIPAs, AIPSb, InGaP, InAIP, InNP, InNAs, InNSb, InPAs, InPSb, and one or more compounds or mixtures thereof, and/or a quaternary compound selected from the group including (e.g., consisting of) GaAINP, GaAINAs, GaAINSb, GaAIPAs, GaAIPSb, GalnNP, GalnNAs, GalnNSb, GalnPAs, GalnPSb, InAINP, InAINAs, InAINSb, InAIPAs, InAIPSb, and one or more compounds or mixtures thereof. In some embodiments, the Group III-V compound may further include a Group II metal. For example, InZnP, etc. may be selected as a Group III-II-V compound.

The Group IV-VI compound may be selected from the group including (e.g., consisting of) a binary compound selected from the group including (e.g., consisting of) SnS, SnSe, SnTe, PbS, PbSe, PbTe, and one or more compounds or mixtures thereof, a ternary compound selected from the group including (e.g., consisting of) SnSeS, SnSeTe, SnSTe, PbSeS, PbSeTe, PbSTe, SnPbS, SnPbSe, SnPbTe, and one or more compounds or mixtures thereof, and a quaternary compound selected from the group including (e.g., consisting of) SnPbSSe, SnPbSeTe, SnPbSTe, and one or more compounds or mixtures thereof. The Group IV element may be selected from the group including (e.g., consisting of) Si, Ge, and one or more compounds or mixtures thereof. The Group IV compound may be a binary compound selected from the group including (e.g., consisting of) SiC, SiGe, and one or more compounds or mixtures thereof.

In this case, a binary compound, a ternary compound, or a quaternary compound may be present in a particle form with a substantially uniform concentration distribution, or may be present in substantially the same particle with a partially different concentration distribution. In some embodiments, a core/shell structure in which one quantum dot surrounds another quantum dot may also be possible. The core/shell structure may have a concentration gradient in which the concentration of elements present in the shell decreases toward the core.

In some embodiments, the quantum dot may have the above-described core/shell structure including a core containing nanocrystals and a shell around (e.g., surrounding) the core. The shell of the quantum dot may serve as a protection layer to prevent or reduce the chemical deformation of the core to maintain semiconductor properties, and/or a charging layer to impart electrophoresis properties to the quantum dot. The shell may be a single layer or a multilayer. An example of the shell of the quantum dot may include a metal or non-metal oxide, a semiconductor compound, or one or more combinations thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$, but the embodiment of the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

The quantum dot may have a full width of half maximum (FWHM) of a light emitting wavelength spectrum of about 45 nm or less, about 40 nm or less, or about 30 nm or less, and color purity or color reproducibility may be improved in the above ranges. In some embodiments, light emitted through such a quantum dot is emitted in all directions, and thus a wide viewing angle may be improved (increased).

In some embodiments, although the form of the quantum dot is not limited as long as it is a form commonly utilized in the art, for example, the quantum dot in the form of substantially spherical, pyramidal, multi-arm, or cubic nanoparticles, nanotubes, nanowires, nanofibers, nanoplate particles, etc. may be utilized.

A quantum dot may control the color of emitted light according to the particle size thereof and thus the quantum dot may have one or more suitable light emission colors such as green, red, etc.

In each light emitting device ED of embodiments illustrated in FIGS. 3 to 6, the electron transport region ETR is provided on the emission layer EML. The electron transport region ETR may include at least one of the hole blocking layer HBL, the electron transport layer ETL, or the electron injection layer EIL, but the embodiment of the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL are stacked in order (in the stated order) from the emission layer EML, but the embodiment of the present disclosure is not limited thereto. The electron transport region ETR may have a thickness, for example, from about 1,000 Å to about 1,500 Å.

The electron transport region ETR may be formed by utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1:

Formula ET-1

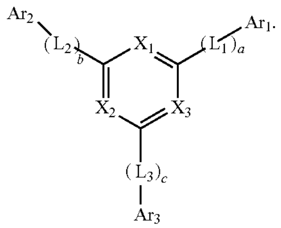

In Formula ET-1, at least one selected from among $X_1$ to $X_3$ is N, and the rest (the substituents that are not N) are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a to c are each an integer of 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl) biphenyl-3-yl)-1,3,5-triazine, 2-(4-(N-phenylbenzoimidazol-1-yl) phenyl)-9, 10-dinaphthylanthracene, 1,3,5-tri (1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-$N^{1,O8}$)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-Bis[3,5-di(pyridin-3-yl)phenyl]benzene (BmPyPhB), or one or more compounds or mixtures thereof.

The electron transport region ETR may include at least one selected from among Compound ET1 to Compound ET36:

ET1

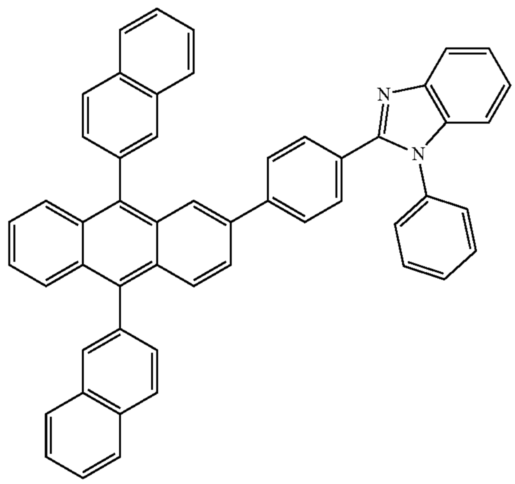

ET2

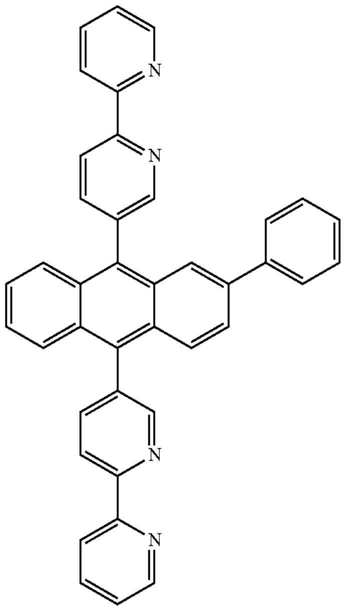

-continued
ET3
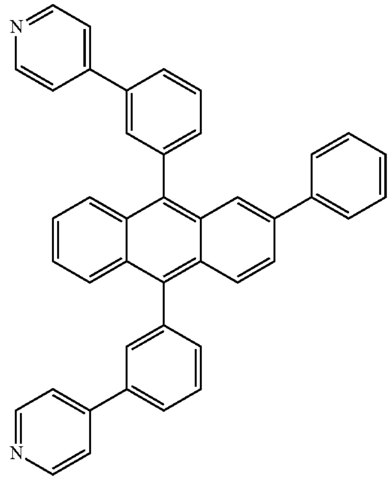
ET4
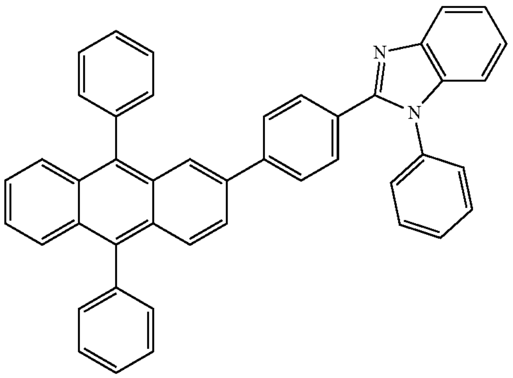
ET5
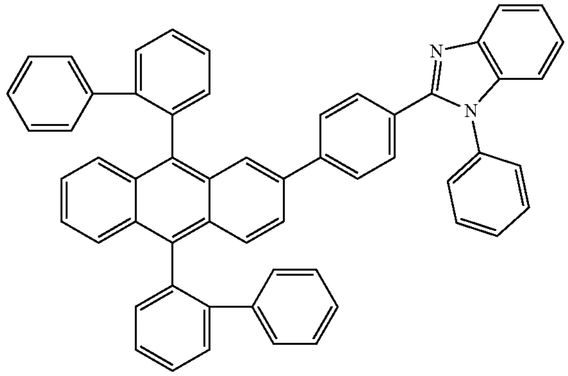
-continued
ET6
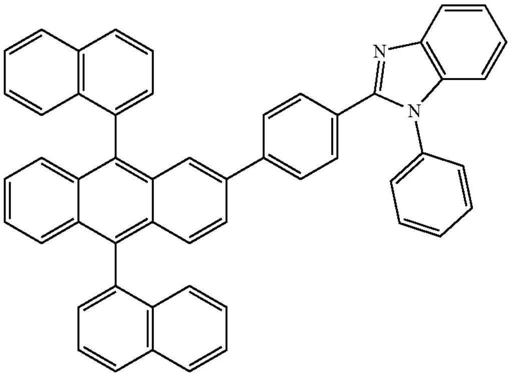
ET7
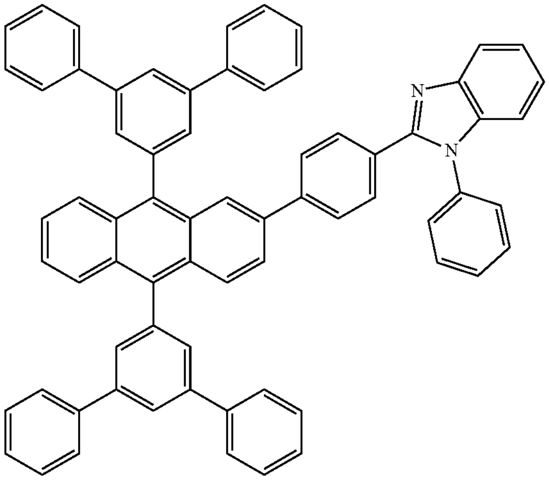
ET8
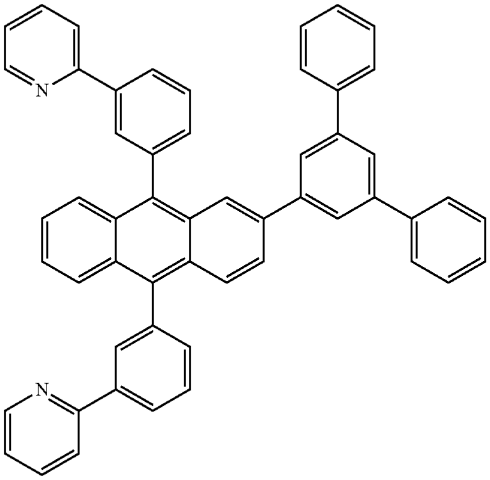

-continued
ET9
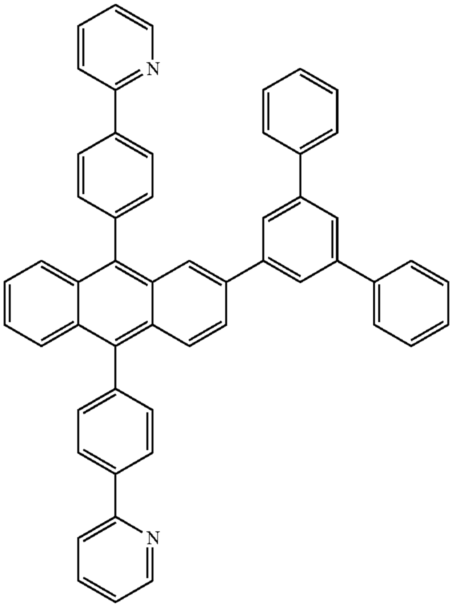
ET10
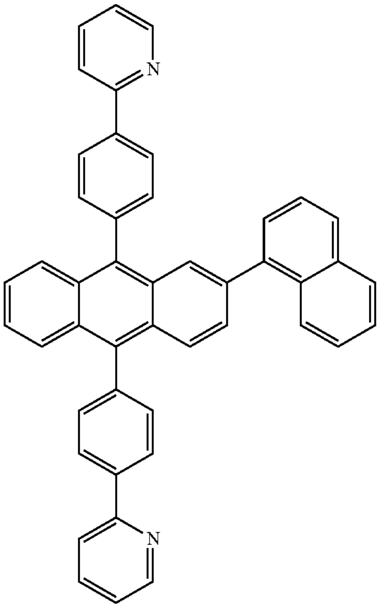
-continued
ET11
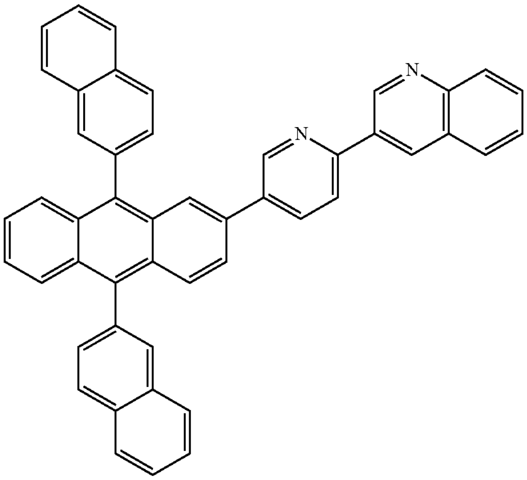
ET12
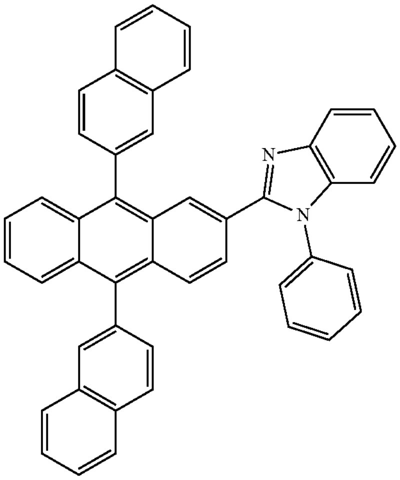
ET13
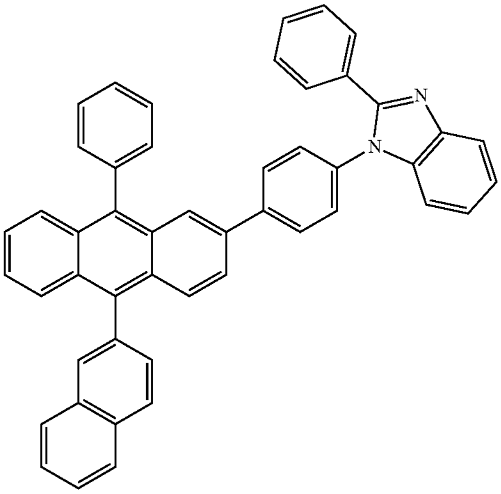

-continued
ET14
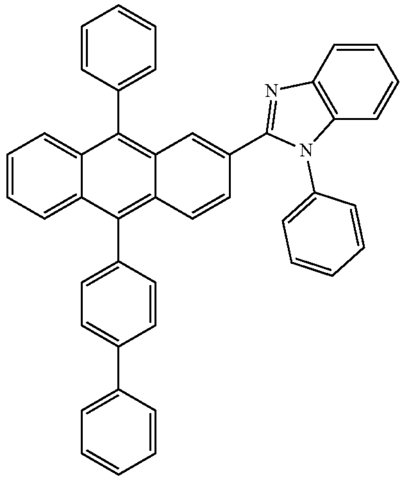
ET15
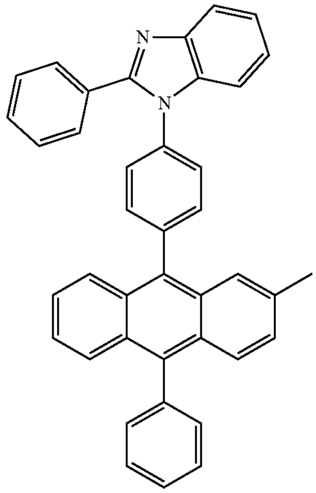
ET16
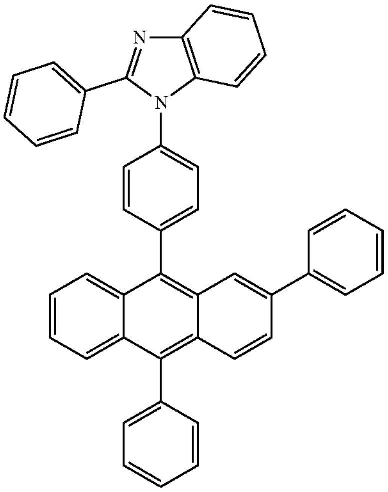
-continued
ET17
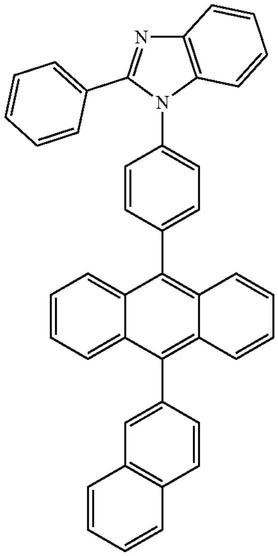
ET18
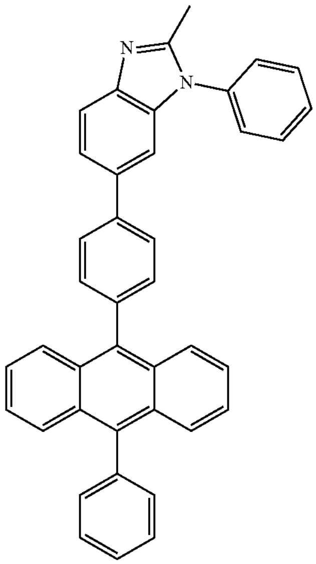
ET19
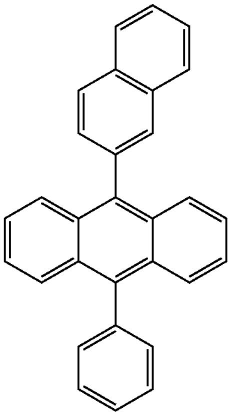

-continued
ET20
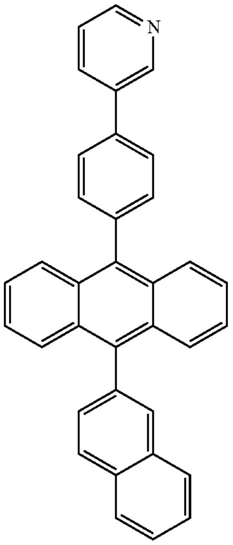
ET21
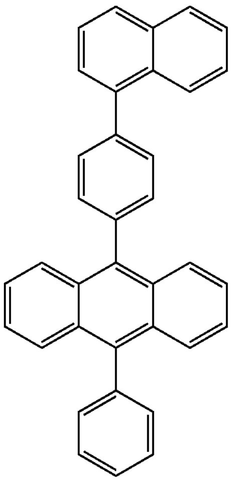
ET22
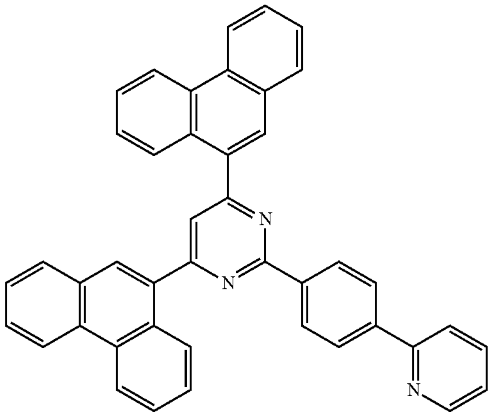
-continued
ET23
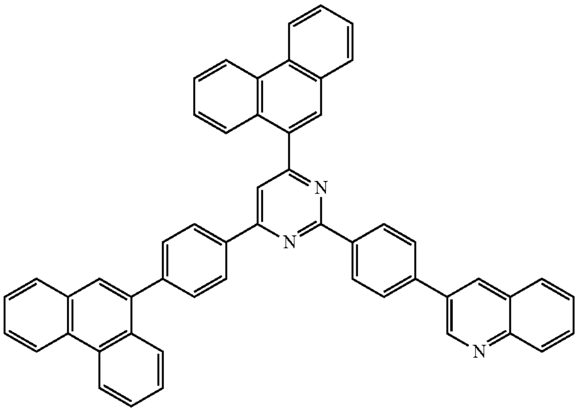
ET24
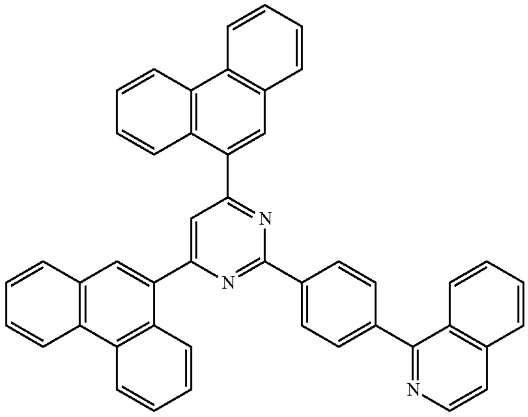
ET25
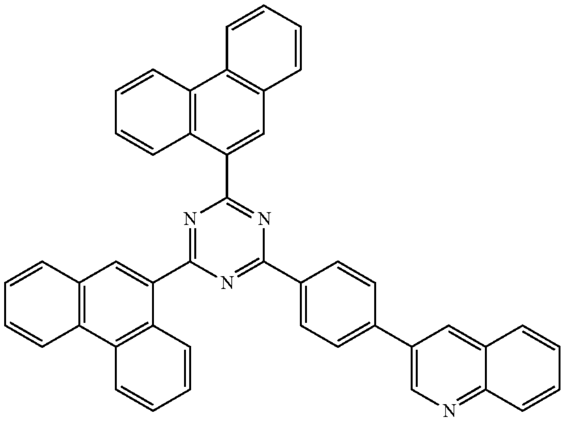

-continued
ET26
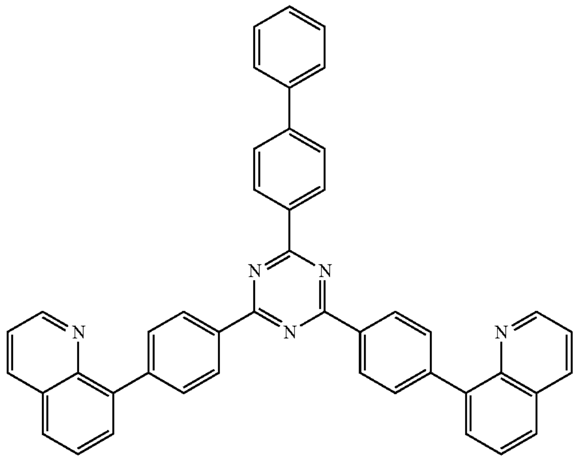
ET27
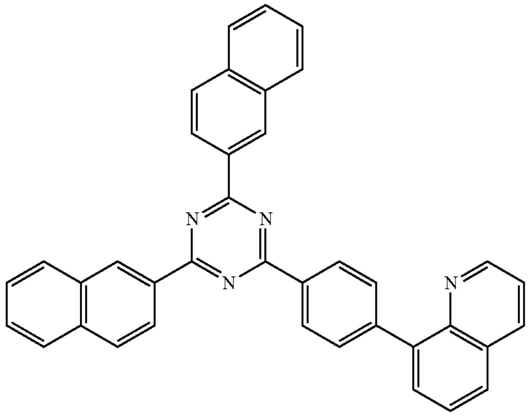
ET28
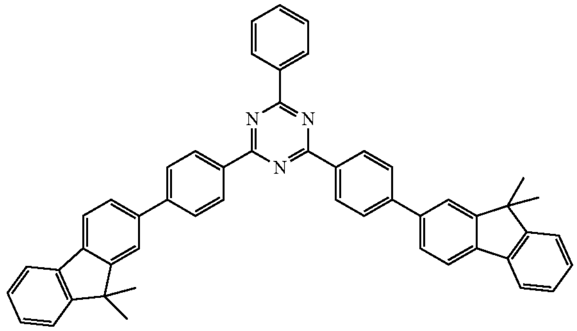
-continued
ET29
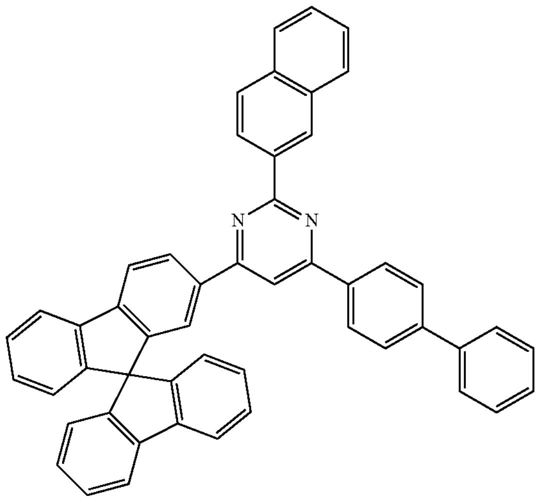
ET30
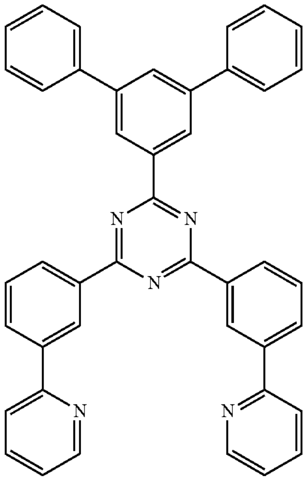
ET31
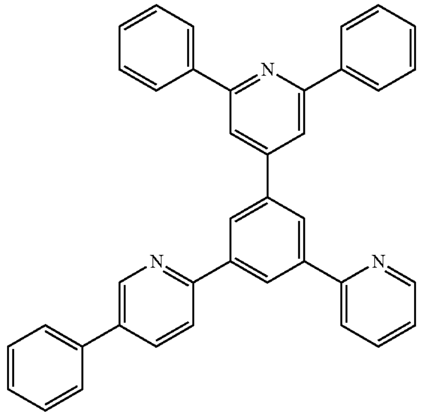

-continued

ET32

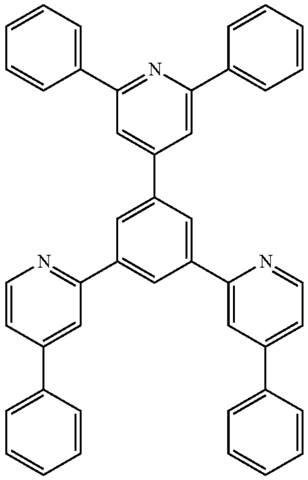

ET33

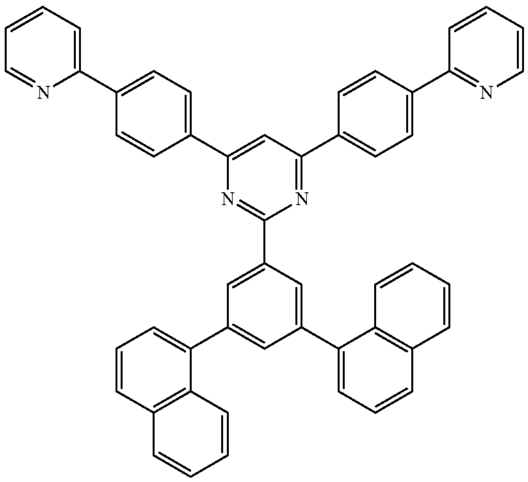

ET33

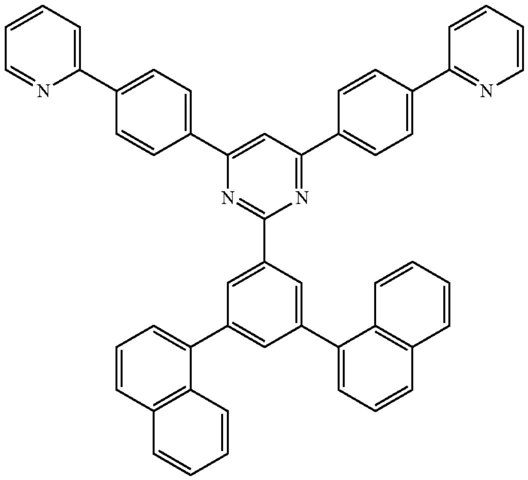

-continued

ET34

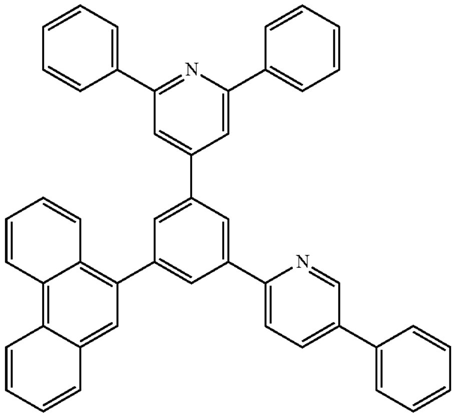

ET35

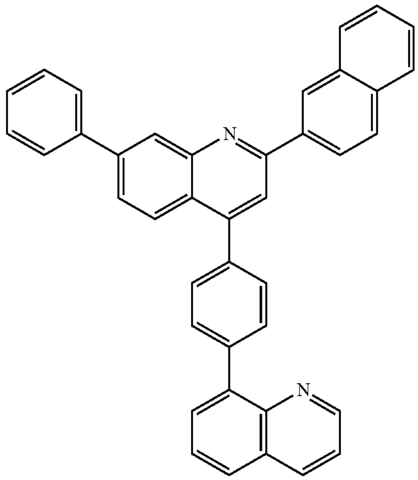

ET36

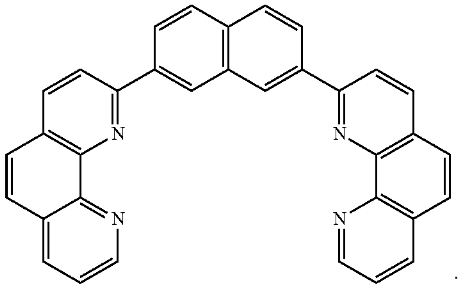

.

In some embodiments, the electron transport regions ETR may include a metal halide such as LiF, NaCl, CsF, RbCI, Rbl, Cul, or Kl, a lanthanide metal such as $Y_b$, and/or a co-deposited material of the metal halide and the lanthanide metal. For example, the electron transport region ETR may include Kl:Yb, Rbl:Yb, LiF:Yb, etc. as a co-deposited material. In some embodiments, the electron transport region ETR may be formed utilizing a metal oxide such as $Li_2O$ or BaO, or 8-hydroxyl-lithium quinolate (Liq), etc., but the embodiment of the present disclosure is not limited thereto. The electron transport region ETR may also be formed of a mixture material of an electron transport material and an insulating organometallic salt. The organometallic salt may be a material having an energy band gap of about 4 eV or more. For example, the organometallic salt may include, for example, a metal acetate, a metal benzoate, a metal acetoacetate, a metal acetylacetonate, or a metal stearate.

The electron transport region ETR may further include at least one of 2,9-dimethyl-4,7-diphenyl-1,10-phenanthroline (BCP), diphenyl(4-(triphenylsilyl)phenyl)phosphine oxide (TSPO1), or 4,7-diphenyl-1,10-phenanthroline (Bphen) in addition to the above-described materials, but the embodiment of the present disclosure is not limited thereto.

The electron transport region ETR may include the above-described compounds of the hole transport region in at least one of the electron injection layer EIL, the electron transport layer ETL, or the hole blocking layer HBL.

When the electron transport region ETR includes the electron transport layer ETL, the electron transport layer ETL may have a thickness of about 100 Å to about 1,000 Å, for example, about 150 Å to about 500 Å. When the thickness of the electron transport layer ETL satisfies the aforementioned range, satisfactory (suitable) electron transport characteristics may be obtained without a substantial increase in a driving voltage. When the electron transport region ETR includes the electron injection layer EIL, the electron injection layer EIL may have a thickness of about 1 Å to about 100 Å, for example, about 3 Å to about 90 Å. When the thickness of the electron injection layer EIL satisfies the above-described ranges, satisfactory (suitable) electron injection characteristics may be obtained without a substantial increase in driving voltage.

The second electrode EL2 is provided on the electron transport region ETR. The second electrode EL2 may be a common electrode. The second electrode EL2 may be a cathode or an anode, but the embodiment of the present disclosure is not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/AI, Mo, Ti, Yb, W, or one or more compounds or mixtures thereof (e.g., AgMg, AgYb, or MgAg). In some embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

The second electrode EL2 may be connected with an auxiliary electrode. When the second electrode EL2 is connected with the auxiliary electrode, the resistance of the second electrode EL2 may decrease.

In some embodiments, a capping layer CPL may further be disposed on the second electrode EL2 of the light emitting device ED of an embodiment. The capping layer CPL may include a multilayer or a single layer.

In an embodiment, the capping layer CPL may be an organic layer or an inorganic layer. For example, when the capping layer CPL contains an inorganic material, the inorganic material may include an alkaline metal compound (for example, LiF), an alkaline earth metal compound (for example, $MgF_2$), SiON, $SiN_x$, $SiO_y$, etc.

For example, when the capping layer CPL contains an organic material, the organic material may include a-NPD, NPB, TPD, m-MTDATA, $Alq_3$, CuPc, N4, N4, N4', N4'-tetra(biphenyl-4-yl) biphenyl-4,4'-diamine (TPD15), 4,4', 4"-tris(carbazol-9-yl)triphenylamine (TCTA), etc., or may include an epoxy resin, or an acrylate such as a methacrylate. However, the embodiment of the present disclosure is not limited thereto, and the capping layer CPL may include at least one selected from among Compounds P1 to P5:

P1

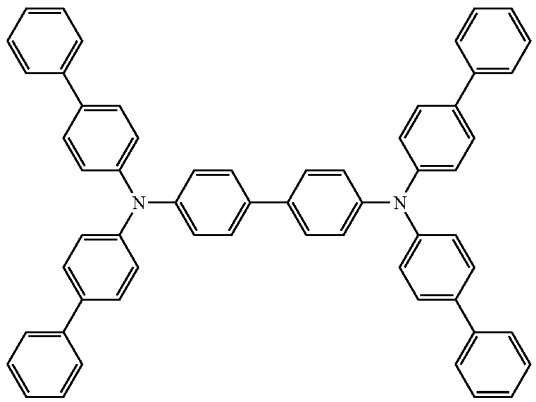

P2

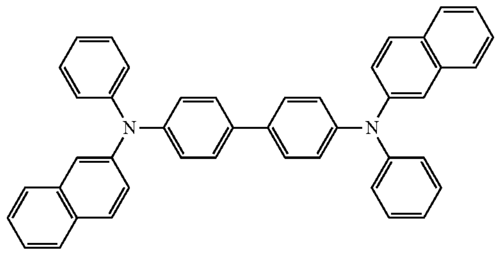

P3

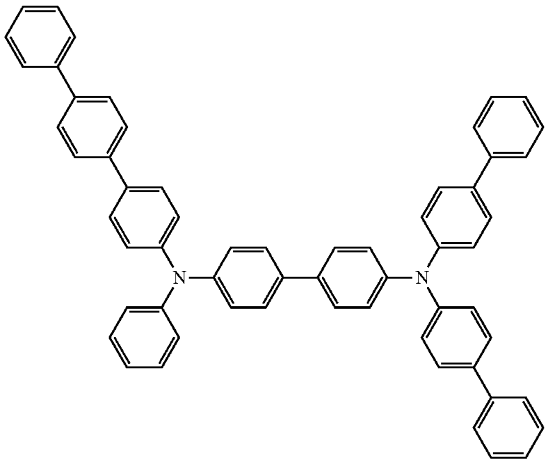

-continued

P4

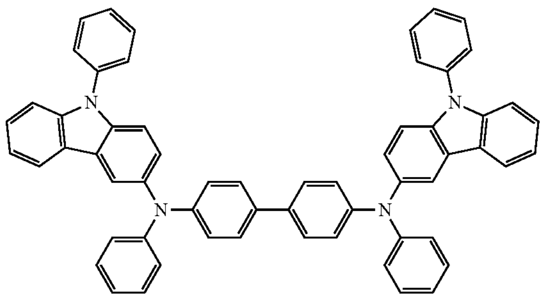

P5

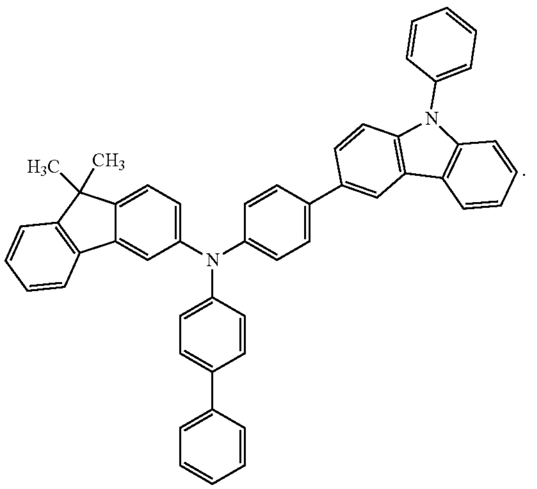

In some embodiments, the refractive index of the capping layer CPL may be about 1.6 or more. For example, the refractive index of the capping layer CPL may be about 1.6 or more with respect to light in a wavelength range of about 550 nm to about 660 nm.

FIGS. 7 and 8 each are a cross-sectional view of a display apparatus according to an embodiment. Hereinafter, in describing the display apparatuses of embodiments with reference to FIGS. 7 and 8, the duplicated features which have been described in FIGS. 1 to 6 may not be described again, but their differences will be primarily described.

Referring to FIG. 7, the display apparatus DD according to an embodiment may include a display panel DP including a display device layer DP-ED, a light control layer CCL on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. In some embodiments, the structures of the light emitting devices of FIGS. 3 to 6 as described above may be equally applied to the structure of the light emitting device ED illustrated in FIG. 7.

The emission layer EML of the light emitting device ED included in the display apparatus DD-a according to an embodiment may include the above-described first compound of an embodiment. The emission layer EML may include all of the first compound, the second compound, the third compound, and the fourth compound.

Referring to FIG. 7, the emission layer EML may be disposed in an opening OH defined in a pixel defining film PDL. For example, the emission layer EML which is divided by the pixel defining film PDL and provided corresponding to each light emitting regions PXA-R, PXA-G, and PXA-B may emit light in substantially the same wavelength range. In the display apparatus DD of an embodiment, the emission layer EML may emit blue light. In some embodiments, the emission layer EML may be provided as a common layer in the entire light emitting regions PXA-R, PXA-G, and PXA-B.

The light control layer CCL may be on the display panel DP. The light control layer CCL may include a light conversion body. The light conversion body may be a quantum dot, a phosphor, and/or the like. The light conversion body may emit provided light by converting the wavelength thereof. For example, the light control layer CCL may a layer containing the quantum dot or a layer containing the phosphor.

The light control layer CCL may include a plurality of light control parts CCP1, CCP2, and CCP3. The light control parts CCP1, CCP2, and CCP3 may be spaced apart from (separated from) each other.

Referring to FIG. 7, divided patterns BMP may be between the light control parts CCP1, CCP2, and CCP3 which are spaced apart from each other, but the embodiment of the present disclosure is not limited thereto. FIG. 7 illustrates that the divided patterns BMP do not overlap the light control parts CCP1, CCP2, and CCP3, but at least a portion of the edges of the light control parts CCP1, CCP2, and CCP3 may overlap the divided patterns BMP.

The light control layer CCL may include a first light control part CCP1 containing a first quantum dot QD1 which converts first color light provided from the light emitting device ED into second color light, a second light control part CCP2 containing a second quantum dot QD2 which converts the first color light into third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light emitting device ED. For example, the first quantum dot QD1 may be a red quantum dot, and the second quantum dot QD2 may be a green quantum dot. The same as described above may be applied with respect to the quantum dots QD1 and QD2.

In some embodiments, the light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include (e.g., may exclude) any quantum dot but may still include the scatterer SP.

The scatterer SP may be inorganic particles. For example, the scatterer SP may include at least one of $TiO_2$, ZnO, $Al_2O_3$, $SiO_2$, or hollow sphere silica. The scatterer SP may include any one selected from among $TiO_2$, ZnO, $Al_2O_3$, $SiO_2$, and hollow sphere silica, or may be a mixture of at least two materials selected from among $TiO_2$, ZnO, $Al_2O_3$, $SiO_2$, and hollow sphere silica.

The first light control part CCP1, the second light control part CCP2, and the third light control part CCP3 may include (e.g., each may include a corresponing one of) base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of one or more suitable resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be disposed on the light control parts CCP1, CCP2, and CCP3 to block or reduce the light control parts CCP1, CCP2, and CCP3 from being exposed to moisture/oxygen. In some embodiments, the barrier layer BFL1 may cover the light control parts CCP1, CCP2, and CCP3. In some embodiments, the barrier layer BFL2 may be provided between the light control parts CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In some embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be on the light control layer CCL. For example, the color filter layer CFL may be directly on the light control layer CCL. In this embodiment, the barrier layer BFL2 may not be provided.

The color filter layer CFL may include a light shielding part BM and color filters CF1, CF2, and $CF_3$. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment or dye, the second filter CF2 may include a green pigment or dye, and the third filter CF3 may include a blue pigment or dye. In some embodiments, the embodiment of the present disclosure is not limited thereto, and the third filter CF3 may not include (e.g., may exclude) any pigment or dye. The third filter CF3 may include a polymeric photosensitive resin and may not include (e.g., may exclude) any pigment or dye. The third filter CF3 may be transparent. The third filter CF3 may be formed of a transparent photosensitive resin.

In an embodiment, the first filter CF1 and the second filter CF2 may be a yellow filter. The first filter CF1 and the second filter CF2 may not be separated and may be provided as one filter.

The light shielding part BM may be a black matrix. The light shielding part BM may include an organic light shielding material or an inorganic light shielding material containing a black pigment or dye. The light shielding part BM may prevent or reduce light leakage, and may separate boundaries between the adjacent filters CF1, CF2, and $CF_3$. In some embodiments, the light shielding part BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be on the color filter layer CFL. The base substrate BL may be a member which provides a base surface in which the color filter layer CFL, the light control layer CCL, and/or the like are disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer. In some embodiments, the base substrate BL may not be provided.

FIG. 8 is a cross-sectional view illustrating a portion of a display apparatus according to an embodiment of the present disclosure. In the display apparatus DD-TD of an embodiment, the light emitting device ED-BT may include a plurality of light emitting structures OL-B1, OL-B2, and OL-B3. The light emitting device ED-BT may include a first electrode EL1 and a second electrode EL2 which face each other, and the plurality of light emitting structures OL-B1, OL-B2, and OL-B3 may be sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure and including a plurality of emission layers.

In an embodiment illustrated in FIG. 8, all light beams respectively emitted from the light emitting structures OL-B1, OL-B2, and OL-B3 may be blue light. However, the embodiment of the present disclosure is not limited thereto, and the light beams respectively emitted from the light emitting structures OL-B1, OL-B2, and OL-B3 may have wavelength ranges different from each other. For example, the light emitting device ED-BT including the plurality of light emitting structures OL-B1, OL-B2, and OL-B3 which emit light beams having wavelength ranges different from each other may emit white light.

Charge generation layers CGL1 and CGL2 may be respectively disposed between two of the neighboring light emitting structures OL-B1, OL-B2, and OL-B3. The charge generation layers CGL1 and CGL2 may include a p-type or kind charge generation layer (e.g., P-charge generation layer) and/or an n-type or kind charge generation layer (e.g., N-charge generation layer).

FIG. 9 is a cross-sectional view illustrating a display apparatus according to an embodiment of the present disclosure. FIG. 10 is a cross-sectional view illustrating a display apparatus according to an embodiment of the present disclosure.

Referring to FIG. 9, the display device DD-b according to an embodiment may include light emitting devices ED-1, ED-2, and ED-3 in which two emission layers are stacked. Compared with the display apparatus DD of an embodiment illustrated in FIG. 2, an embodiment illustrated in FIG. 9 has a difference in that the first to third light emitting devices ED-1, ED-2, and ED-3 each include two emission layers stacked in the thickness direction. In each of the first to third light emitting devices ED-1, ED-2, and ED-3, the two emission layers may emit light in substantially the same wavelength region.

The first light emitting device ED-1 may include a first red emission layer EML-R1 and a second red emission layer EML-R2. The second light emitting device ED-2 may include a first green emission layer EML-G1 and a second green emission layer EML-G2. In some embodiments, the third light emitting device ED-3 may include a first blue emission layer EML-B1 and a second blue emission layer EML-B2. An emission auxiliary part OG may be between the first red emission layer EML-R1 and the second red emission layer EML-R2, between the first green emission layer EML-G1 and the second green emission layer EML-G2, and between the first blue emission layer EML-B1 and the second blue emission layer EML-B2.

The emission auxiliary part OG may include a single layer or a multilayer. The emission auxiliary part OG may include a charge generation layer. For example, the emission auxiliary part OG may include an electron transport region, a charge generation layer, and a hole transport region that are sequentially stacked. The emission auxiliary part OG may be provided as a common layer in the whole of the first to third light emitting devices ED-1, ED-2, and ED-3. However, the embodiment of the present disclosure is not limited thereto, and the emission auxiliary part OG may be provided by being patterned within the openings OH defined in the pixel defining film PDL.

The first red emission layer EML-R1, the first green emission layer EML-G1, and the first blue emission layer EML-B1 may be between the hole transport region HTR and the emission auxiliary part OG. The second red emission layer EML-R2, the second green emission layer EML-G2, and the second blue emission layer EML-B2 may be between the emission auxiliary part OG and the electron transport region ETR.

For example, the first light emitting device ED-1 may include the first electrode EL1, the hole transport region HTR, the second red emission layer EML-R2, the emission auxiliary part OG, the first red emission layer EML-R1, the electron transport region ETR, and the second electrode EL2 that are sequentially stacked. The second light emitting device ED-2 may include the first electrode EL1, the hole transport region HTR, the second green emission layer EML-G2, the emission auxiliary part OG, the first green emission layer EML-G1, the electron transport region ETR, and the second electrode EL2 that are sequentially stacked. The third light emitting device ED-3 may include the first electrode EL1, the hole transport region HTR, the second blue emission layer EML-B2, the emission auxiliary part OG, the first blue emission layer EML-B1, the electron transport region ETR, and the second electrode EL2 that are sequentially stacked.

In some embodiments, an optical auxiliary layer PL may be on the display device layer DP-ED. The optical auxiliary layer PL may include a polarizing layer. The optical auxiliary layer PL may be on the display panel DP and control reflected light in the display panel DP due to external light. The optical auxiliary layer PL in the display apparatus according to an embodiment may not be provided.

At least one emission layer included in the display device DD-b of an embodiment illustrated in FIG. 9 may include the above-described fused polycyclic compound of an embodiment. For example, in an embodiment, at least one of the first blue emission layer EML-B1 or the second blue emission layer may include the fused polycyclic compound, that is, the first compound of an embodiment.

Unlike FIGS. 8 and 9, FIG. 10 illustrates that a display apparatus DD-c includes four light emitting structures OL-B1, OL-B2, OL-B3, and OL-C1. A light emitting device ED-CT may include a first electrode EL1 and a second electrode EL2 which face each other, and first to fourth light emitting structures OL-B1, OL-B2, OL-B3, and OL-C1 that are sequentially stacked in the thickness direction between the first electrode EL1 and the second electrode EL2. Charge generation layers CGL1, CGL2, and CGL3 may be disposed between the first to fourth light emitting structures OL-B1, OL-B2, OL-B3, and OL-C1. Among the four light emitting structures, the first to third light emitting structures OL-B1, OL-B2, and OL-B3 may emit blue light, and the fourth light emitting structure OL-C1 may emit green light. However, the embodiment of the present disclosure is not limited thereto, and the first to fourth light emitting structures OL-B1, OL-B2, OL-B3, and OL-C1 may emit light beams in different wavelength regions.

The charge generation layers CGL1, CGL2, and CGL3 disposed between adjacent light emitting structures OL-B1, OL-B2, OL-B3, and OL-C1 may include a p-type or kind charge generation layer (e.g., P-charge generation layer) and/or an n-type or kind charge generation layer (e.g., N-charge generation layer).

At least one among the light emitting structures OL-B1, OL-B2, OL-B3, and OL-C1 included in the display apparatus DD-c of an embodiment may contain the above-described fused polycyclic compound of an embodiment. For example, in an embodiment, at least one among the first to third light emitting structures OL-B1, OL-B2, and OL-B3 may include the described-above fused polycyclic compound, for example, the first compound of an embodiment.

Hereinafter, with reference to Examples and Comparative Examples, a fused polycyclic compound utilized as the first compound according to an embodiment of the present disclosure and a light emitting device of an embodiment of the present disclosure will be described in more detail. In some embodiments, Examples described below are merely illustrations to assist the understanding of the present disclosure, and the scope of the present disclosure is not limited thereto.

EXAMPLES

1. Synthesis of Fused Polycyclic Compound

First, a synthetic method (a synthesis method) of a fused polycyclic compound according to the current embodiment will be described in more detail by illustrating synthetic methods of Compounds 1, 14, 23, 31, and 37. In some embodiments, the synthetic methods of the fused polycyclic compounds as described are merely examples, and the synthetic method of the fused polycyclic compound according to an embodiment of the present disclosure is not limited to the following examples.

(1) Synthesis of Compound 1

Compound 1 according to an example may be synthesized by, for example, the reaction below:

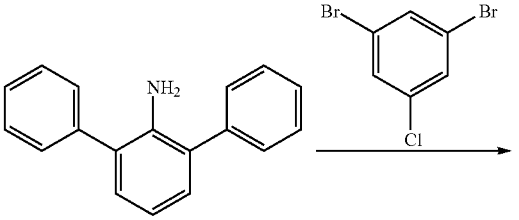

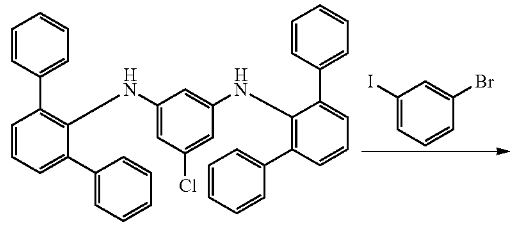

1-a

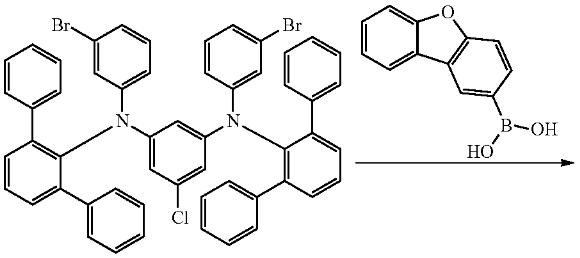

1-b

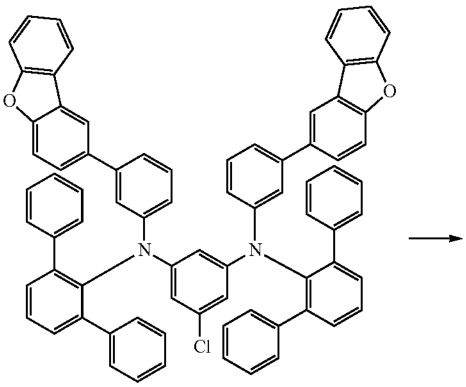

1-c

-continued

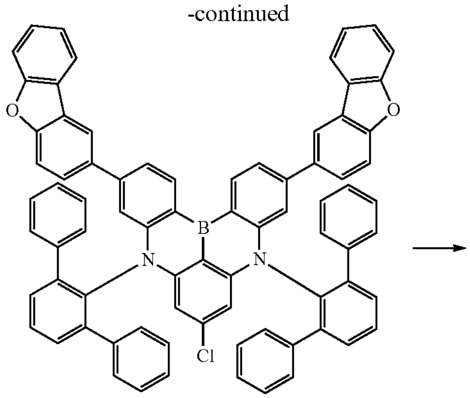

1-d

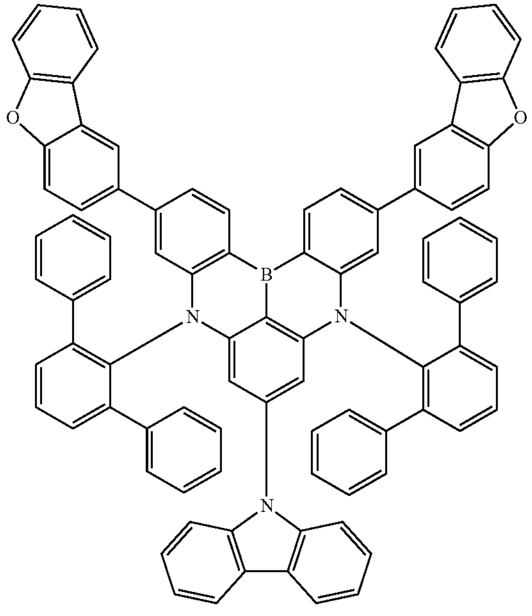

1

Synthesis of Intermediate 1-a

In an argon atmosphere, to a 2 L-flask, [1,1': 3',1"-terphenyl]-2'-amine (18 g, 74 mmol), 1,3-dibromo-5-chlorobenzene (10 g, 37 mmol), Pdzdbas (1.7 g, 1.9 mmol), tris-tert-butyl phosphine (1.7 mL, 3.7 mmol), and sodium tert-butoxide (10.7 g, 111 mmol) were added and dissolved in 700 mL of o-xylene, and then the reaction solution was stirred at about 140° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 1-a (white solid, 15 g, 70%). The obtained compound was identified as Intermediate 1-a through ESI-LCMS.

ESI-LCMS: $[M]^+$: $C_{42}H_{31}ClN_2$. 598.2212.

Synthesis of Intermediate 1-b

In an argon atmosphere, to a 1 L-flask, Intermediate 1-a (15 g, 25 mmol), 3-bromoiodobenzene (35 g, 125 mmol), $Pd_2dba_3$ (1.1 g, 1.3 mmol), tris-tert-butyl phosphine (1.2 mL, 2.5 mmol), and sodium tert-butoxide (7.5 g, 75 mmol) were added and dissolved in 300 mL of o-xylene, and then the reaction solution was stirred at about 140° C. for about 72 hours. After cooling, the reaction solution was extracted by adding water (600 mL) and ethyl acetate (400 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 1-b (white solid, 12 g, 56%). The obtained compound was identified as Intermediate 1-b through ESI-LCMS.

ESI-LCMS: $[M]^+$: $C_{54}H_{37}Br_2ClN_2$. 906.10.

Synthesis of Intermediate 1-c

In an argon atmosphere, to a 1 L-flask, Intermediate 1-b (12 g, 13 mmol), dibenzofuran-2-boronic acid (5.5 g, 26 mmol), $Pd(PPh_3)_4$ (0.8 g, 0.7 mmol), and potassium carbonate (5.4 g, 39 mmol) were added and dissolved in 150 mL of toluene and 50 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 1-c (white solid, 11 g, 78%). The obtained compound was identified as Intermediate 1-c through ESI-LCMS.

ESI-LCMS: $[M]^+$: $C_{78}H_{51}ClN2O_2$. 1082.36

Synthesis of Intermediate 1-d

In an argon atmosphere, to a 500 mL-flask, Intermediate 1-c (11 g, 10.2 mmol) was added and dissolved in 200 mL of o-dichlorobenzene, then cooled utilizing water and ice, and $BBr_3$ (5 equiv.) was slowly added dropwise thereto, and the reaction solution was stirred at about 180° C. for about 12 hours. After cooling, the reaction was terminated by adding triethylamine (5 equiv.), the resulting product was extracted with water/$CH_2Cl_2$ to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 1-d (yellow solid, 4.1 g, 37%). The obtained compound was identified as Intermediate 1-d through ESI-LCMS.

ESI-LCMS: $[M]^+$: $C_{78}H_{48}BClN_2O_2$. 1090.35.

Synthesis of Compound 1

In an argon atmosphere, to a 250 mL-flask, Intermediate 1-d (4.1 g, 3.8 mmol), 9H-carbazole (770 mg, 4.6 mmol), $Pd_2dba_3$ (0.17 g, 0.2 mmol), tris-tert-butyl phosphine (0.18 mL, 0.4 mmol), and sodium tert-butoxide (0.7 g, 7.6 mmol) were added and dissolved in 50 mL of o-xylene, and then the reaction solution was stirred at about 140° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 1 (yellow solid, 3.3 g, yield: 72%). The obtained compound was identified as Compound 1 through $^1$H-NMR and ESI-LCMS.

$^1$H-NMR (400 MHZ, $CDCl_3$): d=9.01 (d, 2H), 8.12 (d, 2H), 8.07-8.02 (m, 6H), 7.74-7.70 (m, 4H), 7.65-7.61 (m, 6H), 7.54-7.49 (m, 2H), 7.44-7.40 (m, 8H), 7.24 (dd, 2H), 7.14-7.12 (m, 2H), 7.07-7.02 (m, 12H), 6.99-6.93 (m, 8H), 6.64 (s, 2H)

ESI-LCMS: $[M]^+$: $C_{90}H_{56}BN_3O_2$. 1221.45.

(2) Synthesis of Compound 14

Compound 14 according to an example may be synthesized by, for example, the reaction below:

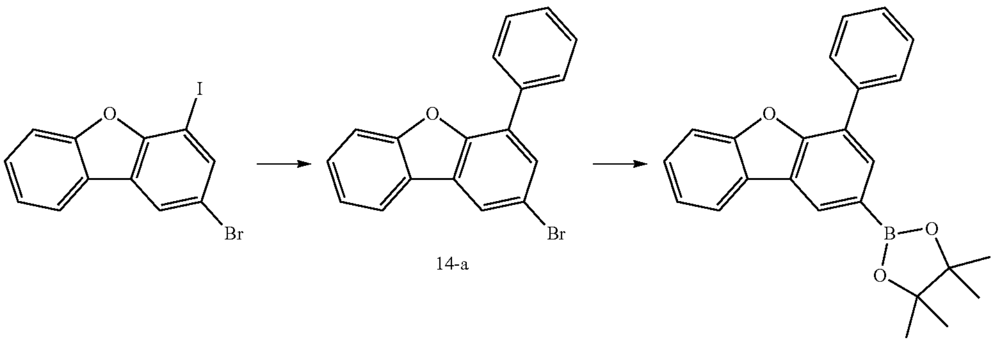
14-a
14-b

-continued

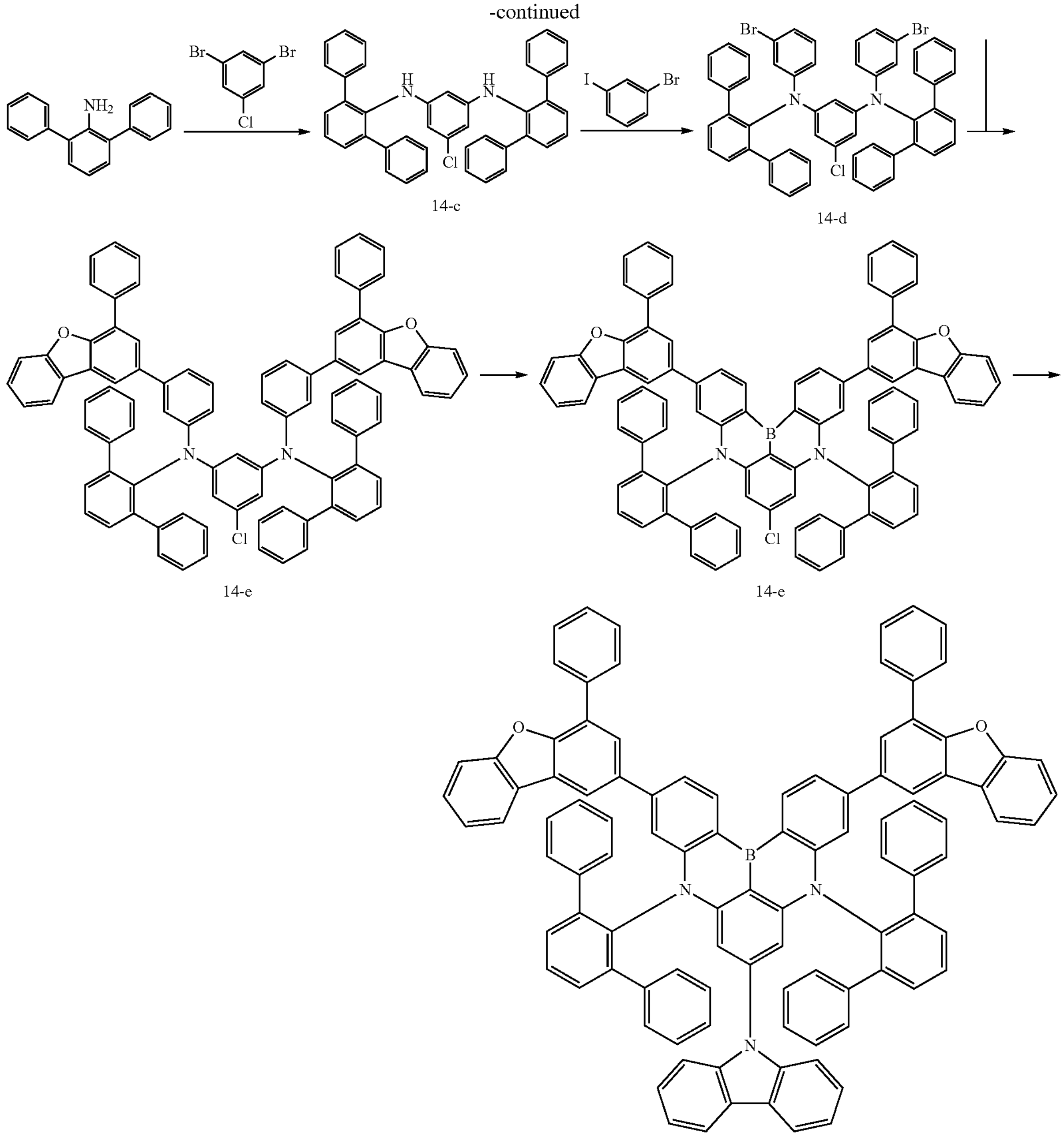

14-c 14-d 14-e 14-e

14

Synthesis of Intermediate 14-a

In an argon atmosphere, to a 2 L-flask, 2-bromo-4-iododibenzo[b,d]furan (15 g, 40 mmol), phenylboronic acid (7.3 g, 40 mmol), $Pd(PPh_3)_4$ (1.4 g, 1.2 mmol), and potassium carbonate (4.9 g, 120 mmol) were added and dissolved in 300 mL of toluene and 100 mL of $H_2O$, and then the reaction solution was stirred at about 100° C. for about 12 hours. After cooling, the reaction solution was extracted by adding water (300 mL) and ethyl acetate (200 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain hollow Intermediate 14-a (white solid, 9.8 g, 76%). The obtained compound was identified as Intermediate 14-a through ESI-LCMS.

ESI-LCMS: $[M]^+$: $C_{18}H_{11}BrO$. 322.00

Synthesis of Intermediate 14-b

In an argon atmosphere, to a 1 L-flask, Intermediate 14-a (9.8 g, 30 mmol), bis(pinacolato)diboron (11.4 g, 45 mmol), potassium acetate (5.9 g, 60 mmol), and bis(triphenylphosphine) palladium (II) dichloride (1.1 g, 1.5 mmol) were added and dissolved in 300 mL of dioxane, and then the reaction solution was stirred at about 100° C. for about 12 hours. After cooling, the reaction solution was extracted by adding water (300 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 14-b (white solid, 9.2 g, 83%). The obtained compound was identified as Intermediate 14-b through ESI-LCMS.

ESI-LCMS: $[M]^+$: $C_{24}H_{23}BO_3$. 370.17

Synthesis of Intermediate 14-c

In an argon atmosphere, to a 2 L-flask, [1,1': 3',1"-terphenyl]-2'-amine (18 g, 74 mmol), 1,3-dibromo-5-chlorobenzene (10 g, 37 mmol), $Pd_2dba_3$ (1.7 g, 1.9 mmol), tris-tert-butyl phosphine (1.7 mL, 3.7 mmol), and sodium tert-butoxide (10.7 g, 111 mmol) were added and dissolved in 700 mL of o-xylene, and then the reaction solution was stirred at about 140.° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 14-c (white solid, 15 g, 70%). The obtained compound was identified as Intermediate 14-c through ESI-LCMS.

ESI-LCMS: $[M]^+$: $C_{42}H_{31}ClN_2$. 598.2212.

Synthesis of Intermediate 14-d

In an argon atmosphere, to a 1 L-flask, Intermediate 14-c (15 g, 25 mmol), 3-bromoiodobenzene (35 g, 125 mmol), $Pd_2dba_3$ (1.1 g, 1.3 mmol), tris-tert-butyl phosphine (1.2 mL, 2.5 mmol), and sodium tert-butoxide (7.5 g, 75 mmol) were added and dissolved in 300 mL of o-xylene, and then the reaction solution was stirred at about 140° C. for about 72 hours. After cooling, the reaction solution was extracted by adding water (600 mL) and ethyl acetate (400 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 14-d (white solid, 12 g, 56%). The obtained compound was identified as Intermediate 14-d through ESI-LCMS.

ESI-LCMS: $[M]^+$: $C_{54}H_{37}Br_2ClN_2$. 906.10.

Synthesis of Intermediate 14-e

In an argon atmosphere, to a 1 L-flask, Intermediate 1-d (12 g, 13 mmol), Intermediate 14-b (9.2 g, 25 mmol), $Pd(PPh_3)_4$ (0.8 g, 0.65 mmol), and potassium carbonate (5.4 g, 39 mmol) were added and dissolved in 150 mL of toluene and 50 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 14-e (white solid, 8.8 g, 55%). The obtained compound was identified as Intermediate 14-e through ESI-LCMS.

ESI-LCMS: $[M]^+$: $C_{90}H_{59}ClN_2O_2$. 1234.43

Synthesis of Intermediate 14-f

In an argon atmosphere, to a 500 mL-flask, Intermediate 14-e (8.8 g, 7.2 mmol) was added and dissolved in 160 mL of o-dichlorobenzene, then cooled utilizing water and ice, and $BBr_3$ (5 equiv.) was slowly added dropwise thereto, and the reaction solution was stirred at about 180° C. for about 12 hours. After cooling, the reaction was terminated by adding triethylamine (5 equiv.), the resulting product was extracted with water/$CH_2Cl_2$ to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 14-f (yellow solid, 2.7 g, 30%). The obtained compound was identified as Intermediate 14-f through ESI-LCMS.

ESI-LCMS: $[M]^+$: $C_{90}H_{56}BClN_2O_2$. 1243.42.

Synthesis of Compound 14

In an argon atmosphere, to a 250 mL-flask, Intermediate 14-f (2.7 g, 2.2 mmol), 9H-carbazole (435 mg, 2.6 mmol), $Pd_2dba_3$ (0.1 g, 0.11 mmol), tris-tert-butyl phosphine (0.10 mL, 0.22 mmol), and sodium tert-butoxide (0.42 g, 4.4 mmol) were added and dissolved in 20 mL of o-xylene, and then the reaction solution was stirred at about 140° C. for about 12 hours. After cooling, the reaction solution was extracted by adding water (100 mL) and ethyl acetate (100 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 14 (yellow solid, 2.3 g, yield: 79%). The obtained compound was identified as Compound 14 through $^1H$-NMR and ESI-LCMS.

$^1H$-NMR (400 MHZ, $CDCl_3$): d=9.02 (d, 2H), 8.13 (d, 2H), 8.07-8.01 (m, 6H), 7.76-7.70 (m, 4H), 7.67-7.62 (m, 6H), 7.55-7.49 (m, 4H), 7.46-7.40 (m, 14H), 7.30 (dd, 2H), 7.15-7.13 (m, 2H), 7.08-7.02 (m, 12H), 7.00-6.93 (m, 8H), 6.68 (s, 2H)

ESI-LCMS: $[M]^+$: $C_{102}H_{64}BN_3O_2$. 1374.51.

(3) Synthesis of Compound 23

Compound 23 according to an example may be synthesized by, for example, the reaction below:

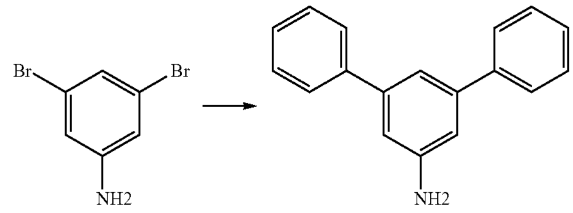
23-a
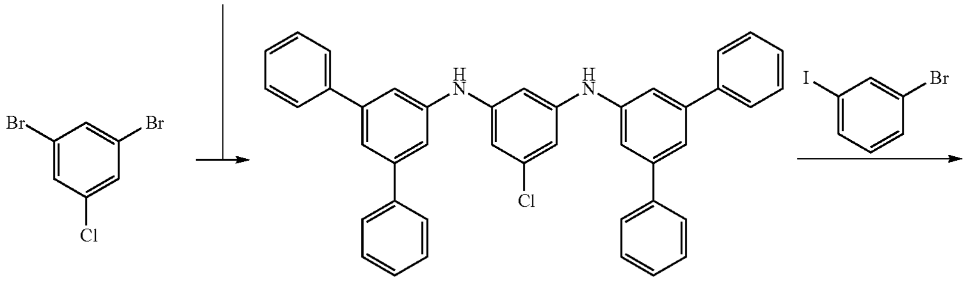
23-b
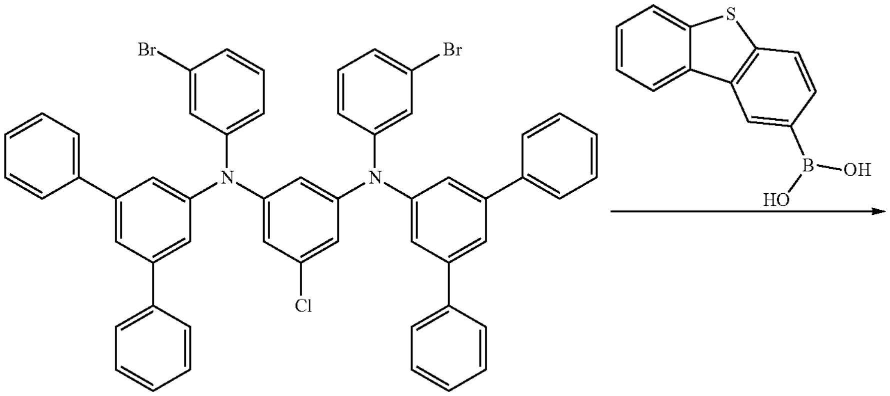
23-c
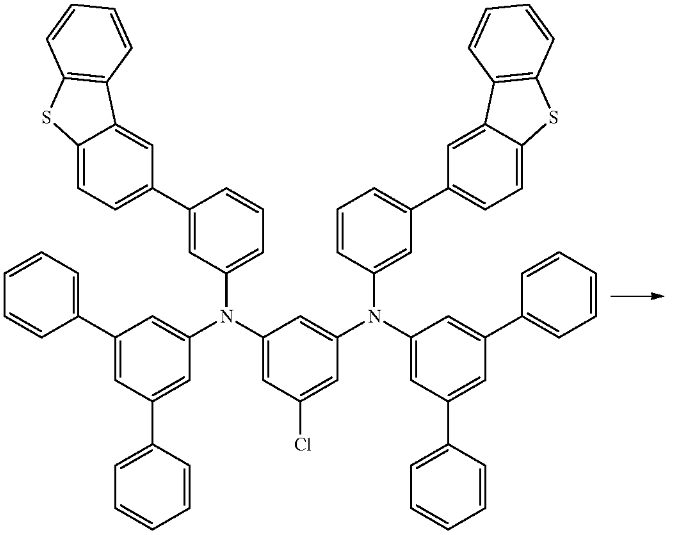
23-d

-continued

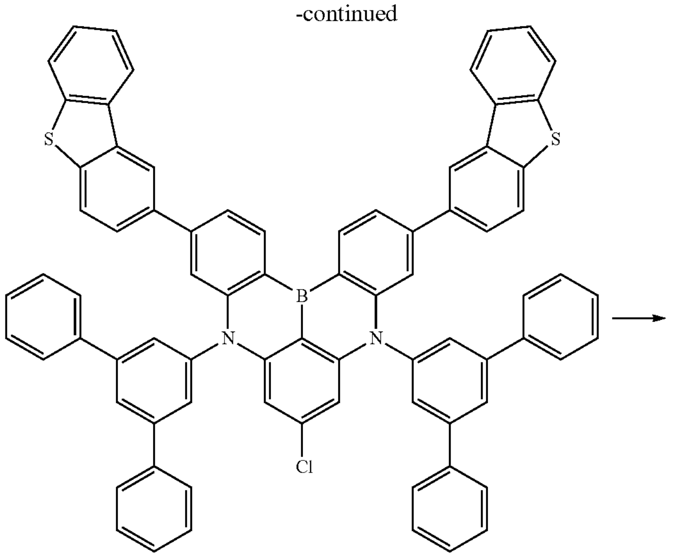

23-e

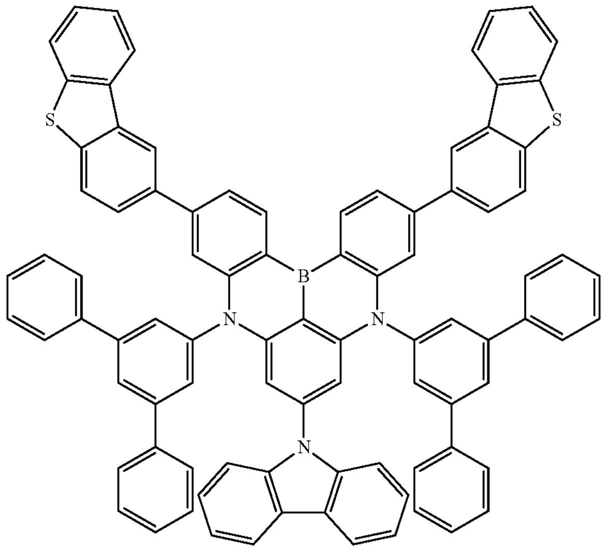

23

Synthesis of Intermediate 23-a

In an argon atmosphere, to a 2 L-flask, 3,5-dibromoaniline (20 g, 80 mmol), phenylboronic acid (24 g, 199 mmol), $Pd(PPh_3)_4$ (2.8 g, 2.4 mmol), and potassium carbonate (33 g, 240 mmol) were added and dissolved in 600 mL of toluene and 200 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 23-a (white solid, 16 g, 82%). The obtained compound was identified as Intermediate 23-a through ESI-LCMS.

ESI-LCMS: $[M]^+$: $C_{18}H_{15}N$. 245.12

Synthesis of Intermediate 23-b

In an argon atmosphere, to a 2 L-flask, Intermediate 23-a (16 g, 66 mmol), 1,3-dibromo-5-chlorobenzene (8.9 g, 33 mmol), $Pd_2dba_3$ (1.5 g, 1.7 mmol), tris-tert-butyl phosphine (1.5 mL, 3.3 mmol), and sodium tert-butoxide (9.5 g, 99 mmol) were added and dissolved in 700 mL of toluene, and then the reaction solution was stirred at about 100° C. for about 12 hours. After cooling, the reaction solution was extracted by adding water (600 mL) and ethyl acetate (400 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 23-b (white solid, 27 g, 69%). The obtained compound was identified as Intermediate 23-b through ESI-LCMS.

ESI-LCMS: $[M]^+$: $C_{42}H_{31}ClN_2$. 598.22.

Synthesis of Intermediate 23-c

In an argon atmosphere, to a 1 L-flask, Intermediate 23-b (27 g, 46 mmol), 3-bromoiodobenzene (65 g, 230 mmol), $Pd_2dba_3$ (2.1 g, 2.3 mmol), tris-tert-butyl phosphine (2.1 mL, 4.6 mmol), and sodium tert-butoxide (13.3 g, 138 mmol) were added and dissolved in 460 mL of o-xylene, and then the reaction solution was stirred at about 140° C. for about 72 hours. After cooling, the reaction solution was extracted by adding water (600 mL) and ethyl acetate (400 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 23-c (white solid, 17.6 g, 42%). The obtained compound was identified as Intermediate 23-c through ESI-LCMS.

ESI-LCMS: $[M]^+$: $C_{54}H_{37}Br_2ClN_2$. 908.10.

Synthesis of Intermediate 23-d

In an argon atmosphere, to a 1 L-flask, Intermediate 23-c (17.6 g, 19 mmol), dibenzothiano-2-boronic acid (8.7 g, 38 mmol), $Pd(PPh_3)_4$ (1.1 g, 1.0 mmol), and potassium carbonate (7.9 g, 57 mmol) were added and dissolved in 150 mL of toluene and 50 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 23-d (white solid, 16 g, 75%). The obtained compound was identified as Intermediate 23-d through ESI-LCMS.

ESI-LCMS: $[M]^+$: $C_{78}H_{51}ClN_2S_2$. 1114.32

Synthesis of Intermediate 23-e

In an argon atmosphere, to a 500 mL-flask, Intermediate 23-d (16 g, 14.3 mmol) was added and dissolved in 300 mL of o-dichlorobenzene, then cooled utilizing water and ice, and $BBr_3$ (5 equiv.) was slowly added dropwise thereto, and the reaction solution was stirred at about 180° C. for about 12 hours. After cooling, the reaction was terminated by adding triethylamine (5 equiv.), the resulting product was extracted with water/$CH_2Cl_2$ to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 23-e (yellow solid, 5.0 g, 31%). The obtained compound was identified as Intermediate 23-e through ESI-LCMS.

ESI-LCMS: $[M]^+$: $C_{78}H_{48}BClN_2S_2$. 1122.30.

Synthesis of Compound 23

In an argon atmosphere, to a 250 mL-flask, Intermediate 23-e (5.0 g, 4.4 mmol), 9H-carbazole (890 mg, 5.3 mmol), $Pd_2dba_3$ (0.2 g, 0.2 mmol), tris-tert-butyl phosphine (0.21 mL, 0.4 mmol), and sodium tert-butoxide (0.9 g, 8.8 mmol) were added and dissolved in 40 mL of o-xylene, and then the reaction solution was stirred at about 140° C. for about 12 hours. After cooling, the reaction solution was extracted by adding water (300 mL) and ethyl acetate (200 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 23 (yellow solid, 3.8 g, yield: 69%). The obtained compound was identified as Compound 23 through $^1H$-NMR and ESI-LCMS.

$^1H$-NMR (400 MHZ, $CDCl_3$): d=9.05 (d, 2H), 8.16 (d, 2H) 8.13 (d, 2H), 8.10 (s, 2H), 8.03-7.95 (m, 4H), 7.76-7.71 (m, 4H), 7.63-7.60 (m, 4H), 7.53-7.47 (m, 4H), 7.41-7.38 (m, 6H), 7.20 (dd, 2H), 7.13-7.11 (m, 2H), 7.09-7.02 (m, 12H), 7.00-6.94 (m, 8H), 6.70 (s, 2H)

ESI-LCMS: $[M]^+$: $C_{90}H_{56}BN_3S_2$. 1254.40.

(4) Synthesis of Compound 31

Compound 31 according to an example may be synthesized by, for example, the reaction.

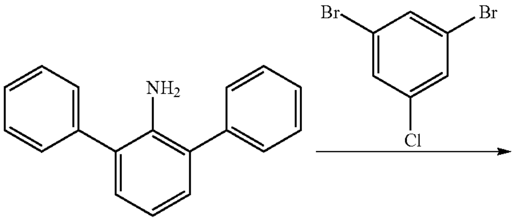

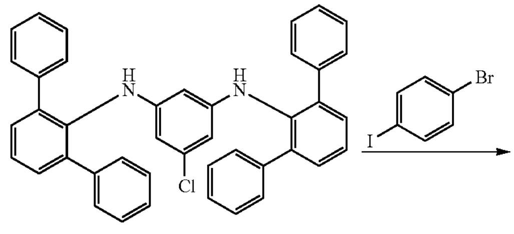

31-a

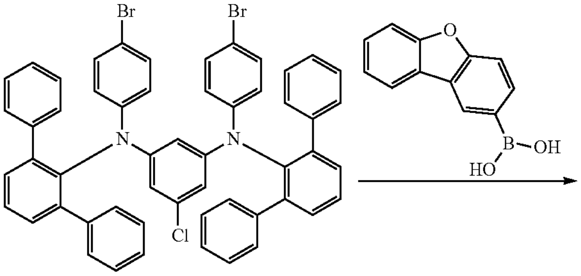

31-b

-continued

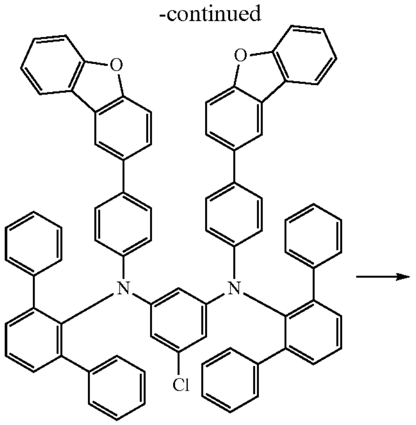

31-c

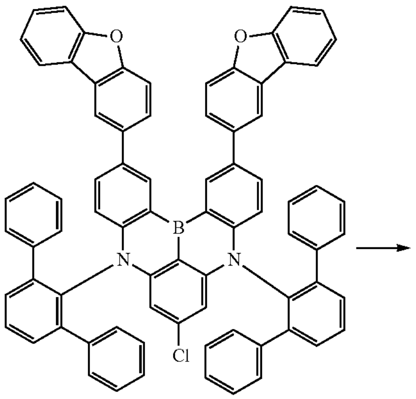

31-d

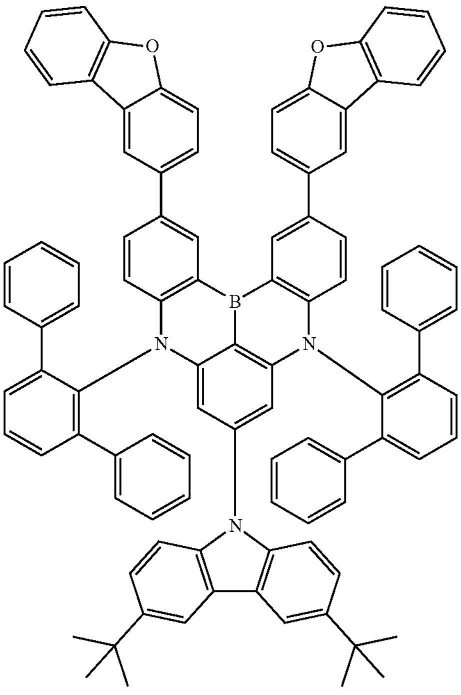

31

Synthesis of Intermediate 31-a

In an argon atmosphere, to a 2 L-flask, [1,1': 3', 1"-terphenyl]-2'-amine (18 g, 74 mmol), 1,3-dibromo-5-chlorobenzene (10 g, 37 mmol), $Pd_2dba_3$ (1.7 g, 1.9 mmol), tris-tert-butyl phosphine (1.7 mL, 3.7 mmol), and sodium tert-butoxide (11 g, 111 mmol) were added and dissolved in 700 mL of o-xylene, and then the reaction solution was stirred at about 140° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 31-a (white solid, 15 g, 70%). The obtained compound was identified as Intermediate 31-a through ESI-LCMS.

ESI-LCMS: $[M]^+$: $C_{42}H_{31}ClN_2$. 598.2212.

Synthesis of Intermediate 31-b

In an argon atmosphere, to a 1 L-flask, Intermediate 31-a (15 g, 26 mmol), 4-bromoiodobenzene (37 g, 130 mmol), $Pd_2dba_3$ (1.1 g, 1.3 mmol), tris-tert-butyl phosphine (1.1 mL, 2.6 mmol), and sodium tert-butoxide (7.5 g, 78 mmol) were added and dissolved in 300 mL of o-xylene, and then the reaction solution was stirred at about 140° C. for about 72 hours. After cooling, the reaction solution was extracted by adding water (600 mL) and ethyl acetate (400 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 31-b (white solid, 14 g, 58%). The obtained compound was identified as Intermediate 31-b through ESI-LCMS.

ESI-LCMS: $[M]^+$: $C_{54}H_{37}Br_2ClN_2$. 908.10.

Synthesis of Intermediate 31-c

In an argon atmosphere, to a 1 L-flask, Intermediate 31-b (14 g, 15 mmol), dibenzofuran-2-boronic acid (6.4 g, 30 mmol), $Pd(PPh_3)_4$ (0.9 g, 0.8 mmol), and potassium carbonate (6.2 g, 45 mmol) were added and dissolved in 150 mL of toluene and 50 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 31-c (white solid, 7.3 g, 45%). The obtained compound was identified as Intermediate 31-c through ESI-LCMS.

ESI-LCMS: $[M]^+$: $C_{78}H_{51}ClN_2O_2$. 1082.36

Synthesis of Intermediate 31-d

In an argon atmosphere, to a 500 mL-flask, Intermediate 31-c (7.3 g, 6.8 mmol) was added and dissolved in 200 mL of o-dichlorobenzene, then cooled utilizing water and ice, and $BBr_3$ (5 equiv.) was slowly added dropwise thereto, and the reaction solution was stirred at about 180° C. for about 12 hours. After cooling, the reaction was terminated by adding triethylamine (5 equiv.), the resulting product was extracted with water/$CH_2Cl_2$ to collect organic layers, and the organic layers were dried over $MgSO_4$ and then filtered.

In the filtrate, the solvent was removed under reduced pressure to obtain a solid. The solid thus obtained was purified and separated by silica gel column chromatography utilizing $CH_2Cl_2$ and hexane as eluent to obtain Intermediate 31-d (yellow solid, 1.8 g, 25%). The obtained compound was identified as Intermediate 31-d through ESI-LCMS.

ESI-LCMS: $[M]^+$: $C_{78}H_{48}BClN_2O_2$. 1090.35.

Synthesis of Compound 31

In an argon atmosphere, to a 250 mL-flask, Intermediate 31-d (1.8 g, 1.7 mmol), 3,6-di-tert-butyl-9H-carbazole (559 mg, 2.0 mmol), $Pd_2dba_3$ (0.08 g, 0.09 mmol), tris-tert-butyl phosphine (0.08 mL, 0.17 mmol), and sodium tert-butoxide (0.33 g, 3.4 mmol) were added and dissolved in 20 mL of o-xylene, and then the reaction solution was stirred at about 140° C. for about 12 hours. After cooling, the reaction solution was extracted by adding water (200 mL) and ethyl acetate (100 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 31 (yellow solid, 1.7 g, yield: 75%). The obtained compound was identified as Compound 31 through $^1H$-NMR and ESI-LCMS.

$^1H$-NMR (400 MHZ, $CDCl_3$): d=9.00 (s, 2H), 8.10 (s, 2H), 8.05-8.01 (m, 6H), 7.71-7.68 (m, 4H), 7.64-7.61 (m, 6H), 7.51-7.45 (m, 2H), 7.40-7.35 (m, 6H), 7.15 (m, 2H), 7.13-7.10 (m, 4H), 7.06-6.99 (m, 10H), 6.89-6.82 (m, 8H), 6.62 (s, 2H), 1.26 (s, 18H)

ESI-LCMS: $[M]^+$: $C_{98}H_{72}BN_3O_2$. 1334.57.

(5) Synthesis of Compound 37

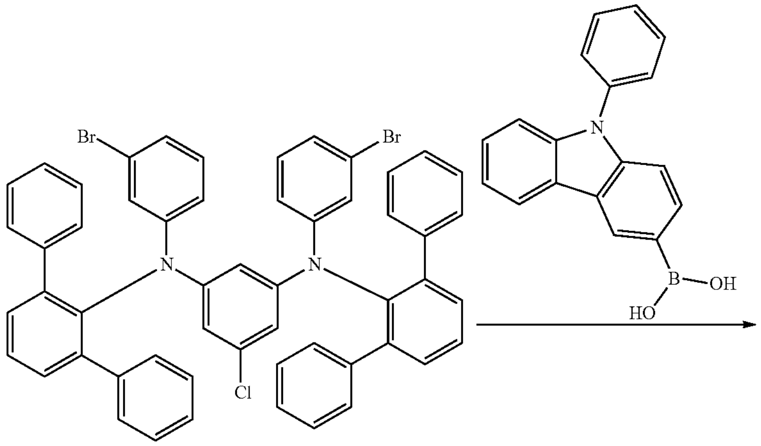

1-b

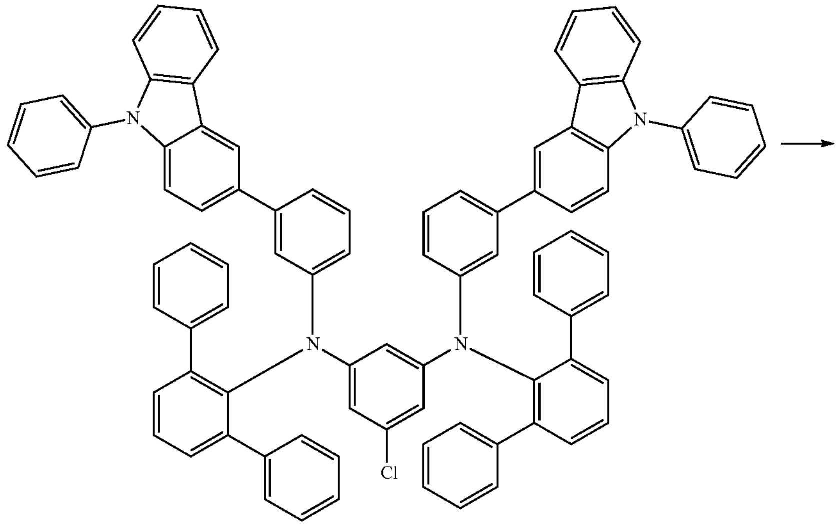

37-a

-continued

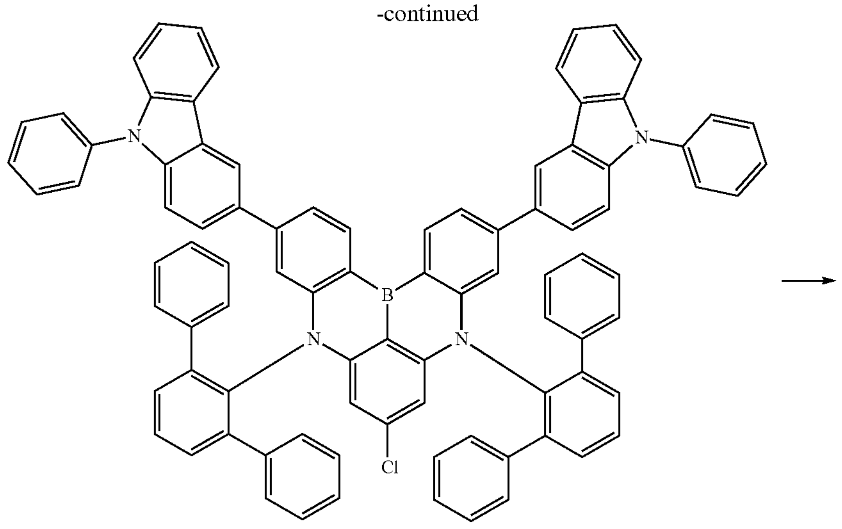

37-b

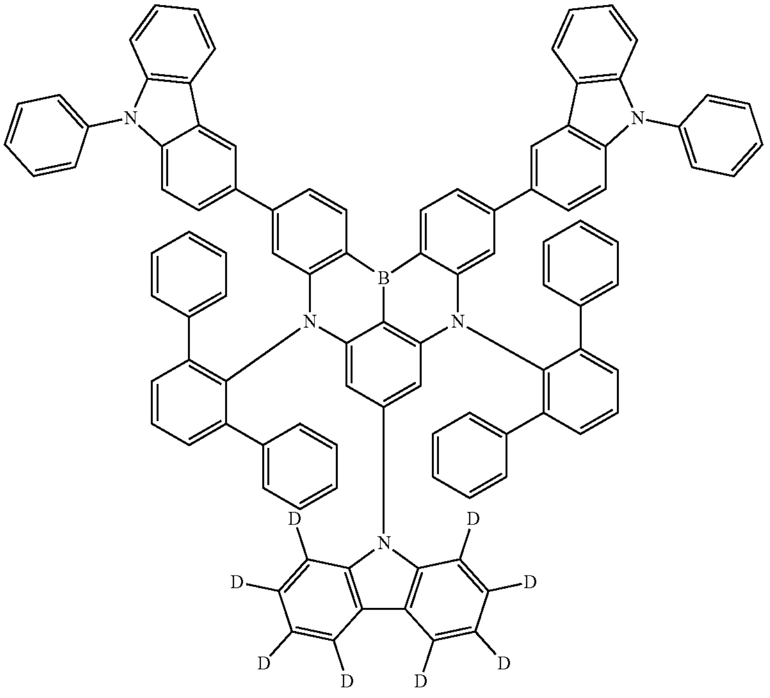

37

Synthesis of Intermediate 37-a

In an argon atmosphere, to a 1 L-flask, Intermediate 1-b (12 g, 13 mmol), (9-phenyl-9H-carbazol-3-yl) boronic acid (7.5 g, 26 mmol), $Pd(PPh_3)_4$ (0.8 g, 0.7 mmol), and potassium carbonate (5.4 g, 39 mmol) were added and dissolved in 150 mL of toluene and 50 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 37-a (white solid, 12 g, 75%). The obtained compound was identified as Intermediate 37-a through ESI-LCMS.

ESI-LCMS: $[M]^+$: $C_{90}H_{61}ClN_4$. 1232.46

Synthesis of Intermediate 37-b

In an argon atmosphere, to a 500 mL-flask, Intermediate 37-a (12 g, 9.8 mmol) was added and dissolved in 200 mL of o-dichlorobenzene, then cooled utilizing water and ice, and $BBr_3$ (5 equiv.) was slowly added dropwise thereto, and the reaction solution was stirred at about 180° C. for about 12 hours. After cooling, the reaction was terminated by adding triethylamine (5 equiv.), the resulting product was extracted with water/$CH_2Cl_2$ to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 37-b (yellow solid, 3.9 g, 32%). The obtained compound was identified as Intermediate 37-b through ESI-LCMS.

ESI-LCMS: $[M]^+$: $C_{90}H_{58}BClN_4$. 1241.45.

Synthesis of Compound 37

In an argon atmosphere, to a 250 mL-flask, Intermediate 37-d (3.9 g, 3.1 mmol), 9H-carbazole-1,2,3,4,5,6,7,8-d8 (700 mg, 4.0 mmol), $Pd_2dba_3$ (0.14 g, 0.16 mmol), tris-tert-butyl phosphine (0.15 mL, 0.31 mmol), and sodium tert-butoxide (0.6 g, 6.2 mmol) were added and dissolved in 50 mL of o-xylene, and then the reaction solution was stirred at about 150° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 37 (yellow solid, 3.4 g, yield: 80%). The obtained compound was identified as Compound 37 through $^1$H-NMR and ESI-LCMS.

$^1$H-NMR (400 MHZ, $CDCl_3$): d=9.01 (d, 2H), 8.21 (d, 2H), 8.09 (s, 2H) 8.07-8.01 (m, 6H), 7.79-7.70 (m, 4H), 7.64-7.60 (m, 6H), 7.56-7.50 (m, 4H), 7.44-7.40 (m, 6H), 7.28 (dd, 2H), 7.14-7.12 (m, 4H), 7.07-7.02 (m, 10H), 7.00-6.97 (m, 8H), 6.67 (s, 2H)

ESI-LCMS: $[M]^+$: $C_{102}H_{58}D8BN_5$. 1380.59.

(6) Synthesis of Compound 32

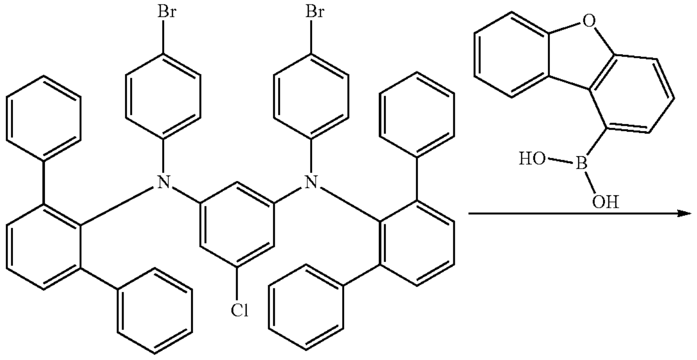

31-b

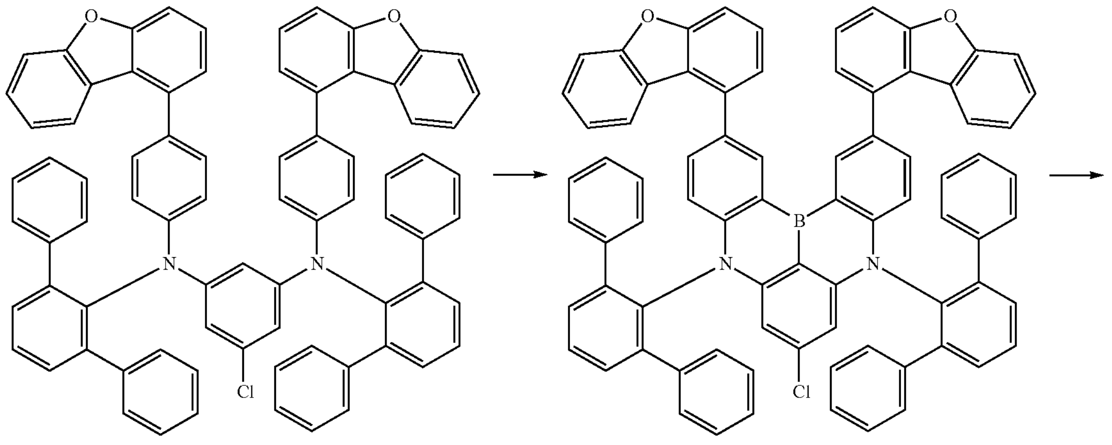

32-a 32-b

-continued

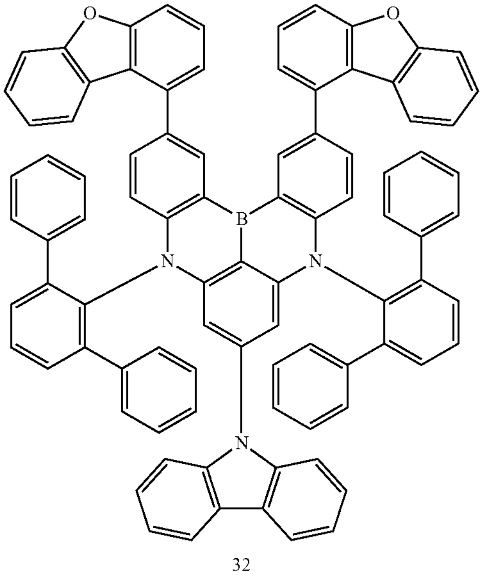

32

Synthesis of Intermediate 32-a

In an argon atmosphere, to a 1 L-flask, Intermediate 31-b (13.6 g, 15 mmol), dibenzo[b,d]furan-1-ylboronic acid (6.4 g, 30 mmol), $Pd(PPh_3)_4$ (0.87 g, 0.75 mmol), and potassium carbonate (6.2 g, 45 mmol) were added and dissolved in 150 mL of toluene and 50 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 32-a (white solid, 11.4 g, 70%). The obtained compound was identified as Intermediate 32-a through ESI-LCMS.

ESI-LCMS: $[M]^+$: $C_{78}H_{51}ClN_2O_2$. 1082.36

Synthesis of Intermediate 32-b

In an argon atmosphere, to a 500 mL-flask, Intermediate 32-a (11.4 g, 10.5 mmol) was added and dissolved in 200 mL of o-dichlorobenzene, then cooled utilizing water and ice, and $BBr_3$ (5 equiv.) was slowly added dropwise thereto, and the reaction solution was stirred at about 180° C. for about 12 hours. After cooling, the reaction was terminated by adding triethylamine (5 equiv.), the resulting product was extracted with water/$CH_2Cl_2$ to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 32-b (yellow solid, 3.3 g, 29%). The obtained compound was identified as Intermediate 32-b through ESI-LCMS.

ESI-LCMS: $[M]^+$: $C_{78}H_{48}BClN_2O_2$. 1090.35.

Synthesis of Compound 32

In an argon atmosphere, to a 250 mL-flask, Intermediate 32-b (3.3 g, 3.0 mmol), 9H-carbazole (652 mg, 3.9 mmol), $Pd_2dba_3$ (0.14 g, 0.15 mmol), tris-tert-butyl phosphine (0.14 mL, 0.3 mmol), and sodium tert-butoxide (0.58 g, 6 mmol) were added and dissolved in 50 mL of o-xylene, and then the reaction solution was stirred at about 150° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 32 (yellow solid, 2.6 g, yield: 71%). The obtained compound was identified as Compound 32 through $^1H$-NMR and ESI-LCMS.

$^1H$-NMR (400 MHZ, $CDCl_3$): d=9.01 (d, 2H), 8.12 (d, 2H), 8.06-8.01 (m, 4H), 7.77-7.70 (m, 6H), 7.66-7.61 (m, 6H), 7.55-7.50 (m, 2H), 7.45-7.39 (m, 8H), 7.27 (dd, 2H), 7.16-7.14 (m, 2H), 7.09-7.02 (m, 12H), 7.00-6.94 (m, 8H), 6.70 (s, 2H)

ESI-LCMS: $[M]^+$: $C_{90}H_{56}BN_3O_2$. 1221.45.

(7) Synthesis of Compound 40
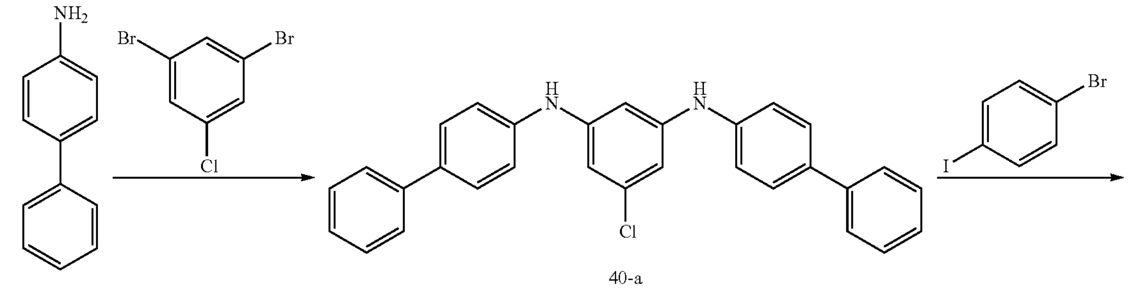
40-a
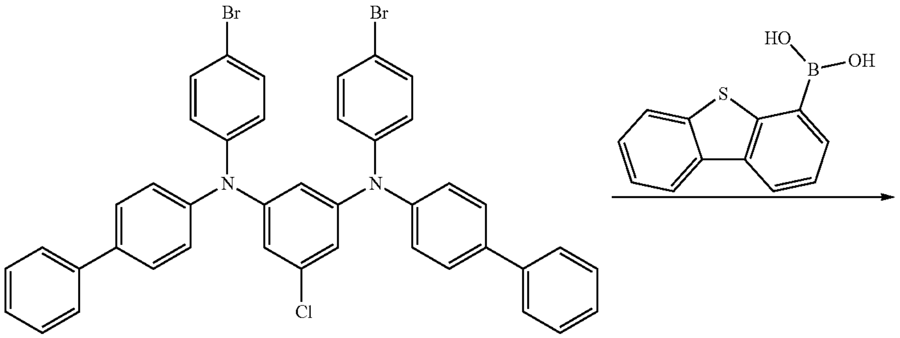
40-b
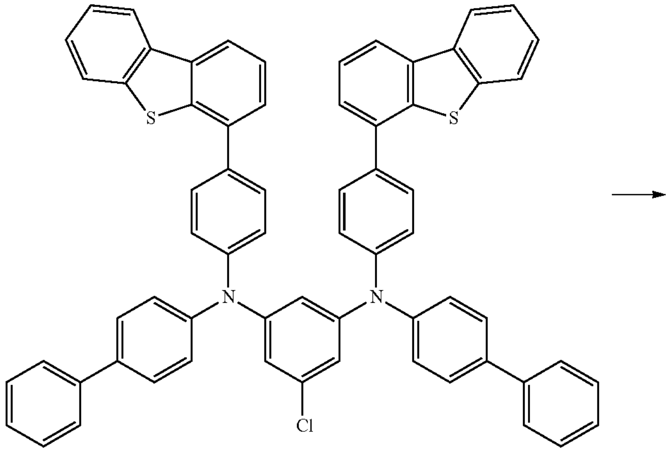
40-c
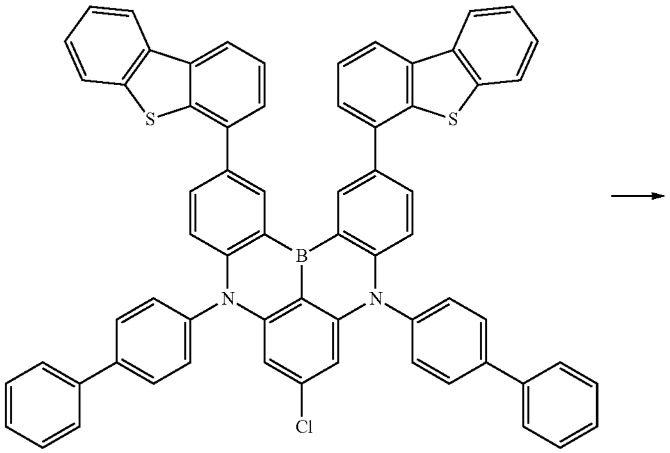
40-d -continued

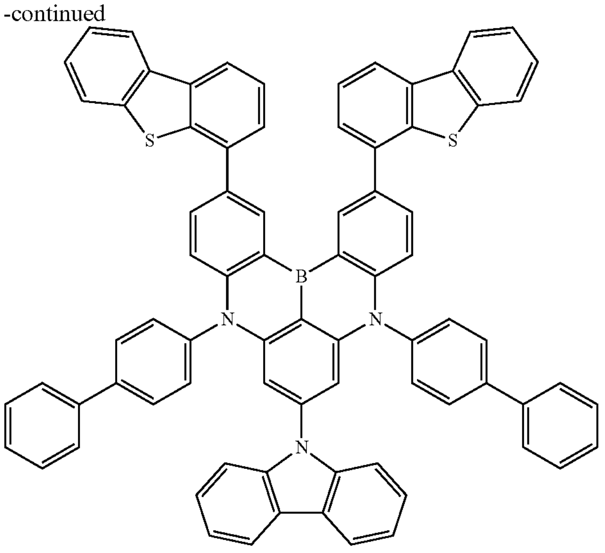

40

Synthesis of Intermediate 40-a

In an argon atmosphere, to a 2 L-flask, [1,1'-biphenyl]-4-amine (16.9 g, 100 mmol), 1,3-dibromo-5-chlorobenzene (13.5 g, 50 mmol), $Pd_2dba_3$ (2.3 g, 2.5 mmol), tris-tert-butyl phosphine (2.3 mL, 5 mmol), and sodium tert-butoxide (14.4 g, 150 mmol) were added and dissolved in 1000 mL of o-xylene, and then the reaction solution was stirred at about 140° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 40-a (white solid, 19 g, 85%). The obtained compound was identified as Intermediate 40-a through ESI-LCMS.

ESI-LCMS: $[M]^+$: $C_{30}H_{23}ClN_2$. 446.15.

Synthesis of Intermediate 40-b

In an argon atmosphere, to a 1 L-flask, Intermediate 40-a (19 g, 42.5 mmol), 4-bromoiodobenzene (36 g, 128 mmol), $Pd_2dba_3$ (1.9 g, 2.1 mmol), tris-tert-butyl phosphine (2.0 mL, 4.3 mmol), and sodium tert-butoxide (12.3 g, 127.5 mmol) were added and dissolved in 500 mL of o-xylene, and then the reaction solution was stirred at about 140° C. for about 12 hours. After cooling, the reaction solution was extracted by adding water (600 mL) and ethyl acetate (400 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 40-b (white solid, 25.4 g, 79%). The obtained compound was identified as Intermediate 40-b through ESI-LCMS.

ESI-LCMS: $[M]^+$: $C_{42}H_{29}Br_2ClN_2$. 756.04

Synthesis of Intermediate 40-c

In an argon atmosphere, to a 1 L-flask, Intermediate 40-b (25.4 g, 33.6 mmol), dibenzo[b,d]thiophen-4-ylboronic acid (30.7 g, 134.4 mmol), $Pd(PPh_3)_4$ (1.9 g, 1.7 mmol), and potassium carbonate (13.9 g, 100.8 mmol) were added and dissolved in 450 mL of toluene and 150 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 40-c (white solid, 18.5 g, 57%). The obtained compound was identified as Intermediate 40-c through ESI-LCMS.

ESI-LCMS: $[M]^+$: $C_{66}H_{43}ClN_2S_2$. 962.26

Synthesis of Intermediate 40-d

In an argon atmosphere, to a 500 mL-flask, Intermediate 40-c (18.5 g, 19.2 mmol) was added and dissolved in 200 mL of o-dichlorobenzene, then cooled utilizing water and ice, and $BBr_3$ (5 equiv.) was slowly added dropwise thereto, and the reaction solution was stirred at about 180° C. for about 12 hours. After cooling, the reaction was terminated by adding triethylamine (5 equiv.), the resulting product was extracted with water/$CH_2Cl_2$ to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 31-d (yellow solid, 3.4 g, 18%). The obtained compound was identified as Intermediate 40-d through ESI-LCMS.

ESI-LCMS: $[M]^+$: $C_{66}H_{40}BClN_2S_2$. 970.24.

Synthesis of Compound 40

In an argon atmosphere, to a 250 mL-flask, Intermediate 40-d (3.4 g, 3.5 mmol), 9H-carbazole (886 mg, 5.3 mmol), $Pd_2dba_3$ (0.16 g, 0.18 mmol), tris-tert-butyl phosphine (0.16 mL, 0.35 mmol), and sodium tert-butoxide (0.67 g, 7.0 mmol) were added and dissolved in 40 mL of o-xylene, and then the reaction solution was stirred at about 150° C. for about 12 hours. After cooling, the reaction solution was extracted by adding water (200 mL) and ethyl acetate (100 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 40 (yellow solid, 2.7 g, yield: 71%). The obtained compound was identified as Compound 40 through $^1$H-NMR and ESI-LCMS.

$^1$H-NMR (400 MHZ, $CDCl_3$): d=9.00 (s, 2H), 8.17 (d, 2H), 8.15 (d, 2H), 8.10 (d, 2H), 8.04-8.01 (m, 4H), 7.75-7.65 (m, 4H), 7.63-7.60 (m, 4H), 7.50-7.47 (m, 2H), 7.40-7.35 (m, 4H), 7.15 (m, 2H), 7.13-7.10 (m, 4H), 7.06-6.99 (m, 8H), 6.89-6.82 (m, 6H), 6.65 (s, 2H)

ESI-LCMS: $[M]^+$: $C_{78}H_{48}BN_3S_2$. 1101.34.

(8) Synthesis of Compound 42

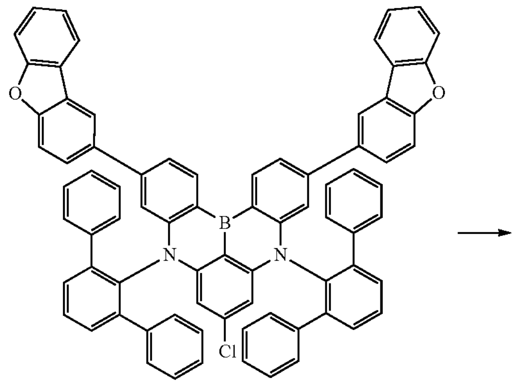

1-d

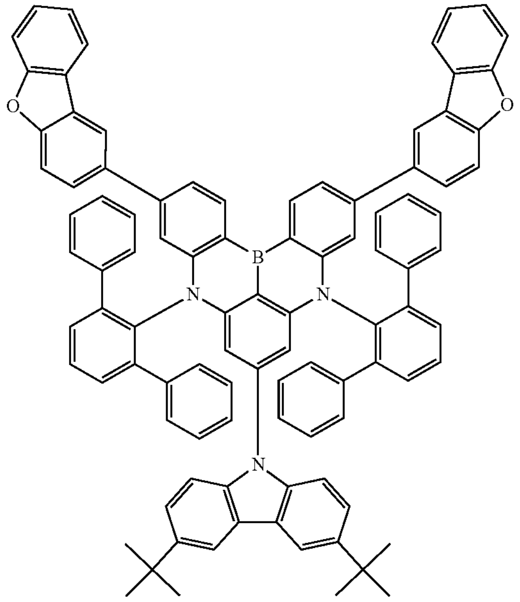

42

Synthesis of Compound 42

In an argon atmosphere, to a 250 mL-flask, Intermediate 1-d (3.1 g, 2.8 mmol), 3,6-di-tert-butyl-9H-carbazole (1.2 g, 4.2 mmol), $Pd_2dba_3$ (0.13 g, 0.14 mmol), tris-tert-butyl phosphine (0.13 mL, 0.28 mmol), and sodium tert-butoxide (0.54 g, 5.6 mmol) were added and dissolved in 40 mL of o-xylene, and then the reaction solution was stirred at about 150° C. for about 12 hours. After cooling, the reaction solution was extracted by adding water (200 mL) and ethyl acetate (100 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 42 (yellow solid, 2.8 g, yield: 76%). The obtained compound was identified as Compound 42 through $^1$H-NMR and ESI-LCMS.

$^1$H-NMR (400 MHZ, $CDCl_3$): d=9.03 (d, 2H), 8.10 (s, 2H), 8.07-8.02 (m, 6H), 7.74-7.70 (m, 4H), 7.65-7.61 (m, 6H), 7.54-7.49 (m, 2H), 7.44-7.40 (m, 8H), 7.14-7.12 (m, 2H), 7.07-7.02 (m, 12H), 6.99-6.93 (m, 8H), 6.64 (s, 2H), 1.25 (s, 18H)

ESI-LCMS: $[M]^+$: $C_{98}H_{72}BN_3O_2$. 1334.58.

(9) Synthesis of Compound 45

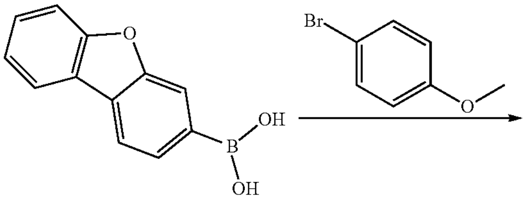

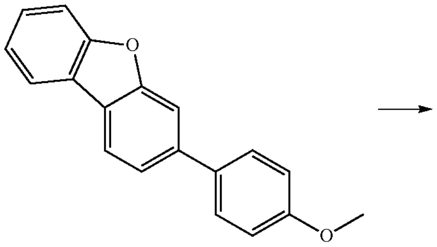

45-a

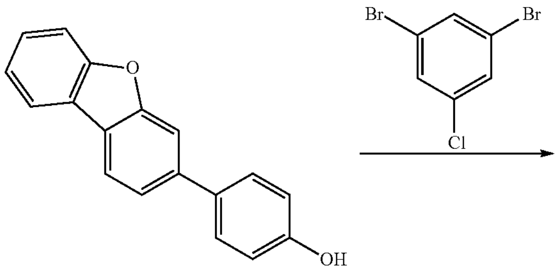

45-b

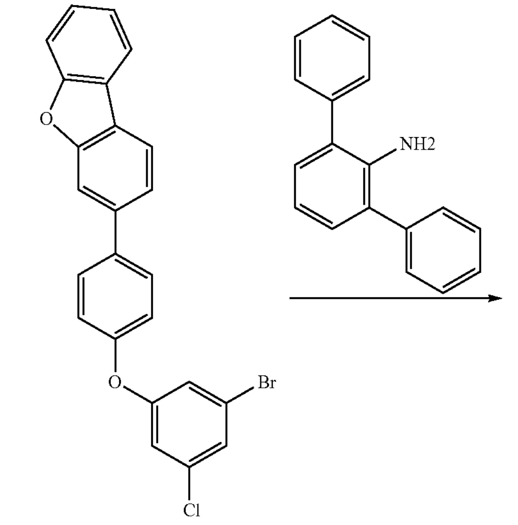
45-c
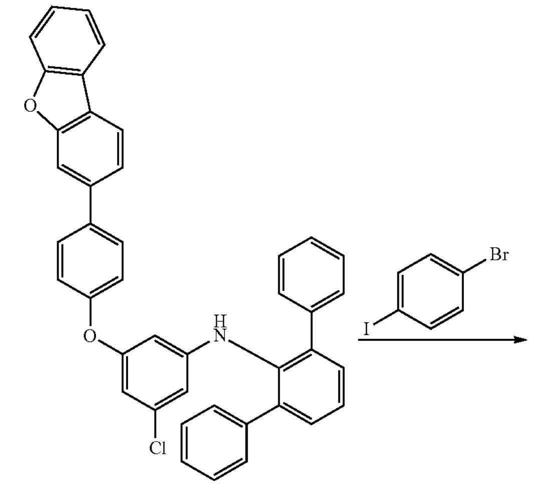
45-d
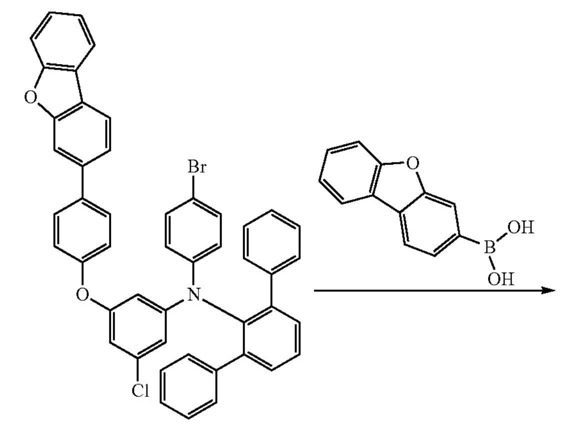
45-e
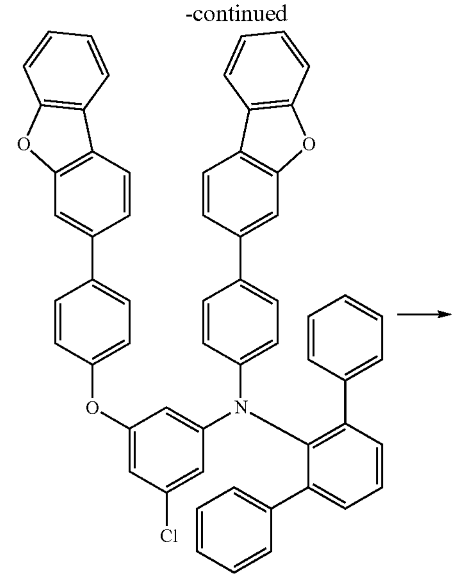
45-f
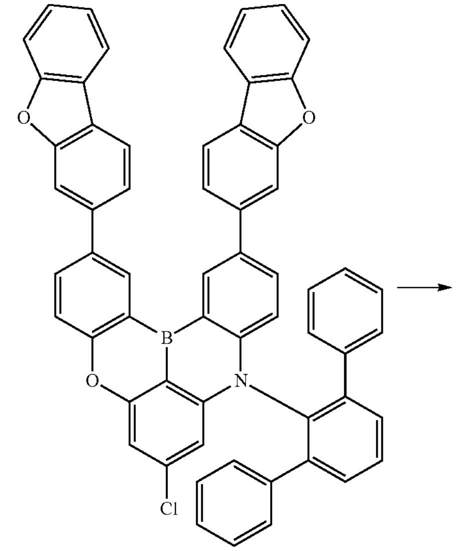
45-g -continued

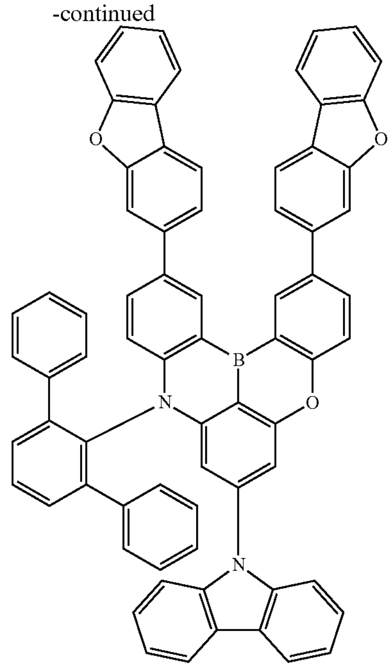

45

Synthesis of Intermediate 45-a

In an argon atmosphere, to a 2 L-flask, dibenzo[b,d]furan-3-ylboronic acid (23.3 g, 110 mmol), 1-bromo-4-methoxybenzene (18.7 g, 100 mmol), $Pd(PPh_3)_4$ (5.8 g, 5 mmol), and potassium carbonate (27.6 g, 200 mmol) were added and dissolved in 600 mL of toluene and 200 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 45-a (white solid, 22.5 g, 82%). The obtained compound was identified as Intermediate 45-a through ESI-LCMS.

ESI-LCMS: $[M]^+$: $C_{19}H_{14}O_2$. 274.10.

Synthesis of Intermediate 45-b

In an argon atmosphere, to a 1 L-flask, Intermediate 45-a (22.5 g, 82 mmol) was dissolved in 500 mL of $CH_2Cl_2$, then $BBr_3$ (123 mmol) was diluted in 40 mL of $CH_2Cl_2$, and the diluted solution was added dropwise thereto at about 0° C. Then, the reaction solution was heated to room temperature and stirred for about 12 hours. After the reaction was terminated, the reaction solution was slowly poured to water (500 mL) at about 0° C. to extract organic layers, and the extracted organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 45-b (white solid, 19.2 g, 90%). The obtained compound was identified as Intermediate 45-b through ESI-LCMS.

ESI-LCMS: $[M]^+$: $C_{18}H_{12}O_2$. 260.08.

Synthesis of Intermediate 45-c

In an argon atmosphere, to a 1 L-flask, Intermediate 45-b (19.2 g, 73.8 mmol), 1,3-dibromo-5-chlorobenzene (22.0 g, 81.2 mmol), CuI (14.1 g, 73.8 mmol), 2-picolinic acid (9.1 g, 73.8 mmol), and potassium carbonate (20.4 g, 147.6 mmol) were dissolved in DMF, and then the reaction solution was stirred at about 180° C. for about 12 hours. After the reaction solution was cooled, the solvent was removed under reduced pressure, and the reaction solution was extracted by adding water (500 mL) and ethyl acetate (500 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 45-c (white solid, 19.9 g, 60%). The obtained compound was identified as Intermediate 45-c through ESI-LCMS.

ESI-LCMS: $[M]^+$: $C_{24}H_{14}BrClO_2$. 449.98.

Synthesis of Intermediate 45-d

In an argon atmosphere, to a 1 L-flask, Intermediate 45-c (19.9 g, 44.3 mmol), [1,1': 3',1"-terphenyl]-2'-amine (11.9 g, 48.7 mmol), $Pd_2dbas$ (2.0 g, 2.2 mmol), tris-tert-butyl phosphine (2.1 mL, 4.3 mmol), and sodium tert-butoxide (8.5 g, 88.6 mmol) were dissolved in 500 mL of o-xylene, and then the reaction solution was stirred at about 140° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 45-d (white solid, 20.9 g, 77%). The obtained compound was identified as Intermediate 45-d through ESI-LCMS.

ESI-LCMS: $[M]^+$: $C_{42}H_{28}ClNO_2$. 613.18.

Synthesis of Intermediate 45-e

In an argon atmosphere, to a 1 L-flask, Intermediate 45-d (19 g, 34.1 mmol), 4-bromoiodobenzene (24 g, 85.3 mmol), $Pd_2dba_3$ (1.6 g, 1.7 mmol), tris-tert-butyl phosphine (1.6 mL, 3.4 mmol), and sodium tert-butoxide (6.6 g, 68.2 mmol) were added and dissolved in 300 mL of o-xylene, and then the reaction solution was stirred at about 140° C. for about 12 hours. After cooling, the reaction solution was extracted by adding water (600 mL) and ethyl acetate (400 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 45-e (white solid, 18.9 g, 72%). The obtained compound was identified as Intermediate 45-e through ESI-LCMS.

ESI-LCMS: $[M]^+$: $C_{48}H_{31}BrClNO_2$. 769.12.

Synthesis of Intermediate 45-f

In an argon atmosphere, to a 500 mL-flask, Intermediate 45-e (18.9 g, 24.6 mmol), dibenzo[b,d]furan-3-ylboronic acid (7.8 g, 36.9 mmol), $Pd(PPh_3)_4$ (1.4 g, 1.2 mmol), and potassium carbonate (6.8 g, 49.2 mmol) were added and dissolved in 300 mL of toluene and 100 mL of $H_2O$, and then the reaction solution was stirred at about 100° C. for about 12 hours. After cooling, the reaction solution was extracted by adding water (500 mL) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 45-f (white solid, 13.1 g, 62%). The obtained compound was identified as Intermediate 45-f through ESI-LCMS.

ESI-LCMS: $[M]^+$: $C_{60}H_{38}ClNO_3$. 855.25.

Synthesis of Intermediate 45-g

In an argon atmosphere, to a 500 mL-flask, Intermediate 45-f (13.1 g, 15.3 mmol) was added and dissolved in 200 mL of o-dichlorobenzene, then cooled to about 0° C., and $BBr_3$ (5 equiv.) was slowly added dropwise thereto, and the reaction solution was stirred at about 180° C. for about 12 hours. After cooling, the reaction was terminated by adding triethylamine (5 equiv.), the resulting product was extracted with water/$CH_2Cl_2$ to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate 45-g (yellow solid, 4.4 g, 33%). The obtained compound was identified as Intermediate 45-g through ESI-LCMS.

ESI-LCMS: $[M]^+$: $C_{60}H_{35}BClNO_3$. 863.24.

Synthesis of Compound 45

In an argon atmosphere, to a 250 mL-flask, Intermediate 45-g (4.4 g, 5.0 mmol), 9H-carbazole (886 mg, 5.3 mmol), $Pd_2dba_3$ (0.16 g, 0.18 mmol), tris-tert-butyl phosphine (0.16 mL, 0.35 mmol), and sodium tert-butoxide (0.67 g, 7.0 mmol) were added and dissolved in 40 mL of o-xylene, and then the reaction solution was stirred at about 150° C. for about 12 hours. After cooling, the reaction solution was extracted by adding water (200 mL) and ethyl acetate (100 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Compound 45 (yellow solid, 3.2 g, yield: 65%). The obtained compound was identified as Compound 45 through $^1$H-NMR and ESI-LCMS.

$^1$H-NMR (400 MHZ, $CDCl_3$): d=9.08 (s, 1H), 9.01 (s, 1H), 8.10 (d, 2H), 8.06-8.00 (m, 4H), 7.79-7.70 (m, 2H), 7.64-7.61 (m, 3H), 7.54-7.46 (m, 2H), 7.39-7.32 (m, 5H), 7.15 (m, 2H), 7.13-7.10 (m, 4H), 7.08-6.95 (m, 7H), 6.85-6.78 (m, 8H), 6.68 (s, 1H), 6.60 (s, 1H)

ESI-LCMS: $[M]^+$: $C_{72}H_{43}BN_2O_3$. 994.34.

2. Manufacture and Evaluation of Light Emitting Device Including Fused Polycyclic Compound Manufacture of Light Emitting Device Compounds 1, 14, 23, 31, 32, 37, 40, 42, and 45 as described above were each utilized as a dopant material for the emission layer to manufacture the light emitting devices of Examples 1 to 9, respectively.

Example Compounds

1

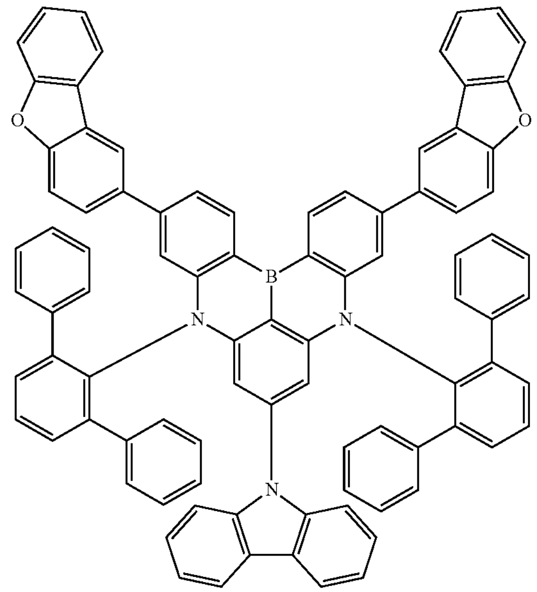

14

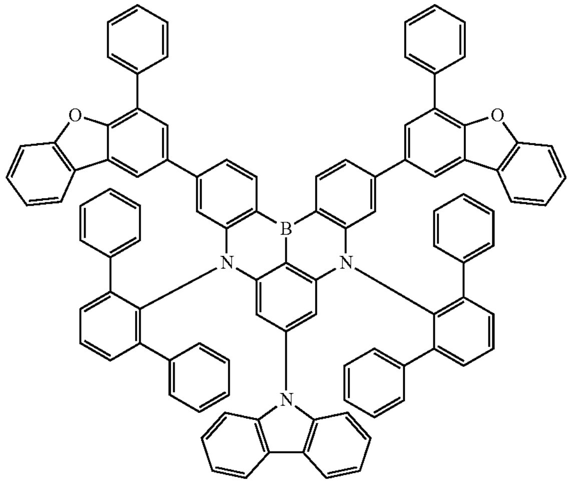

-continued
23
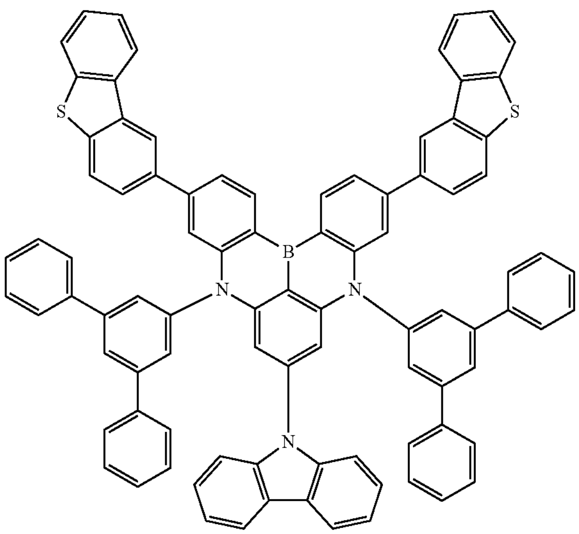
31
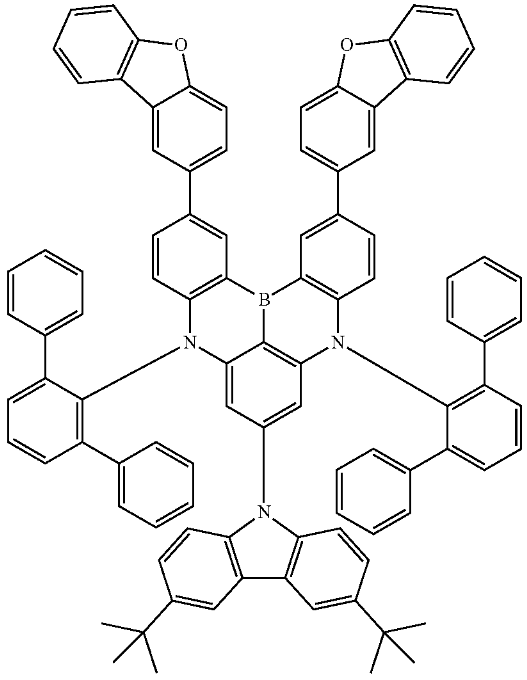
-continued
32
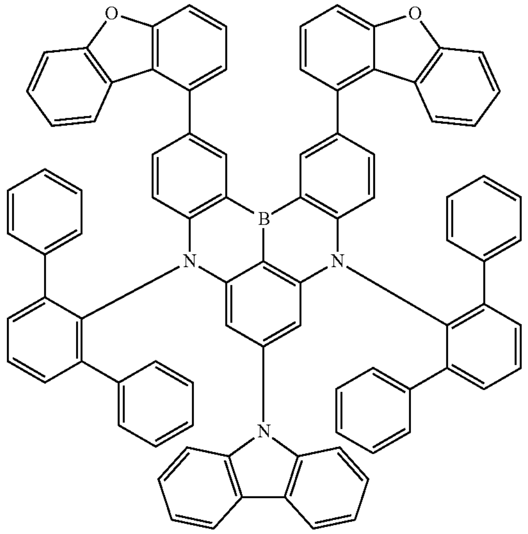
37
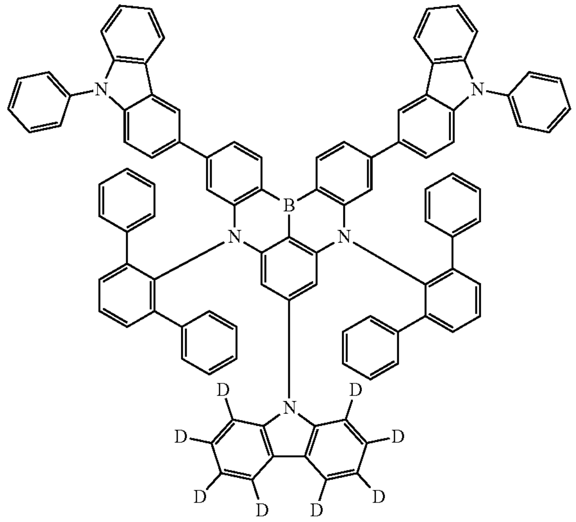
40
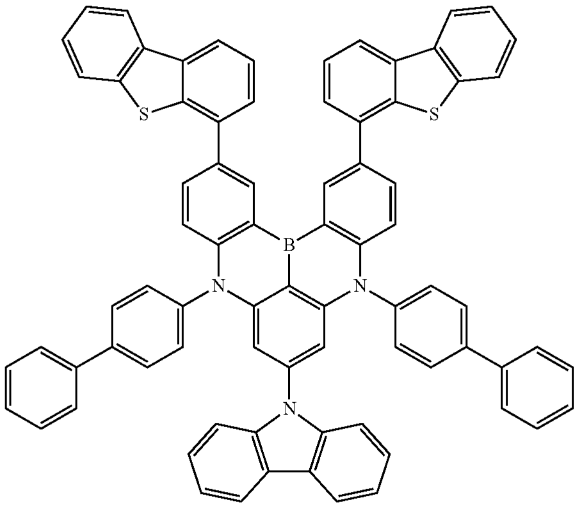

-continued
42
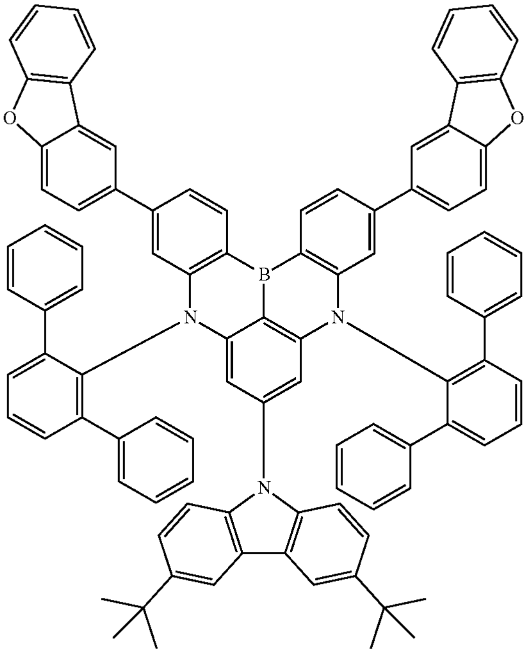
45
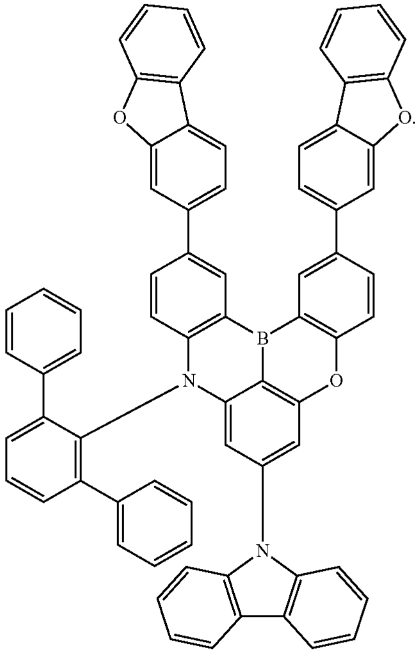
Comparative Example Compounds X-1 to X-8 were utilized to manufacture devices of Comparative Examples 1 to 8, respectively.
Comparative Example Compounds
X-1
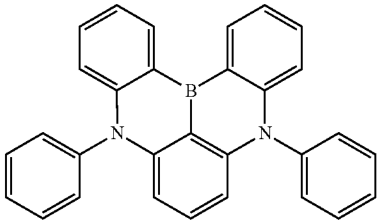
X-2
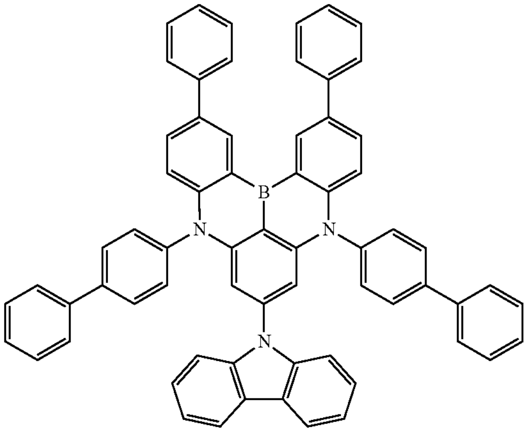
X-3
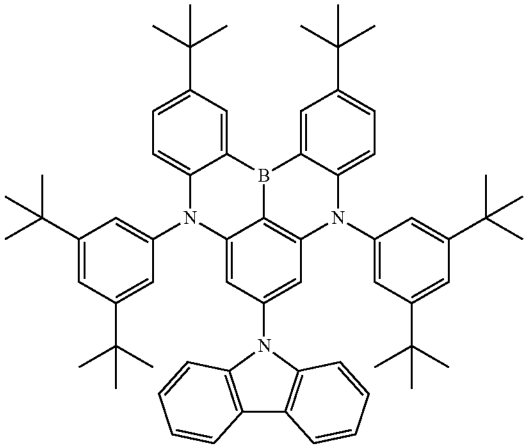

-continued

X-4

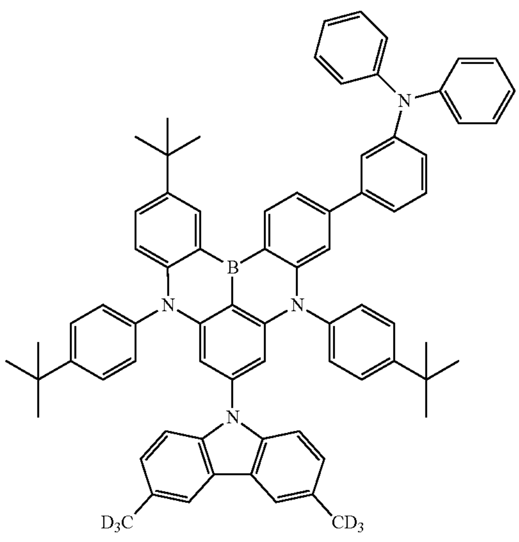

X-5

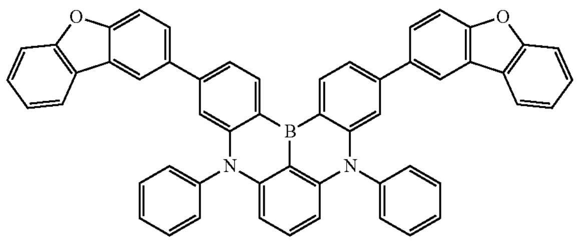

X-6

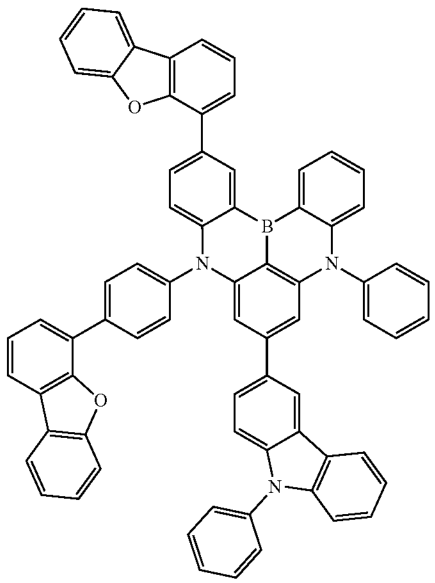

-continued

X-7

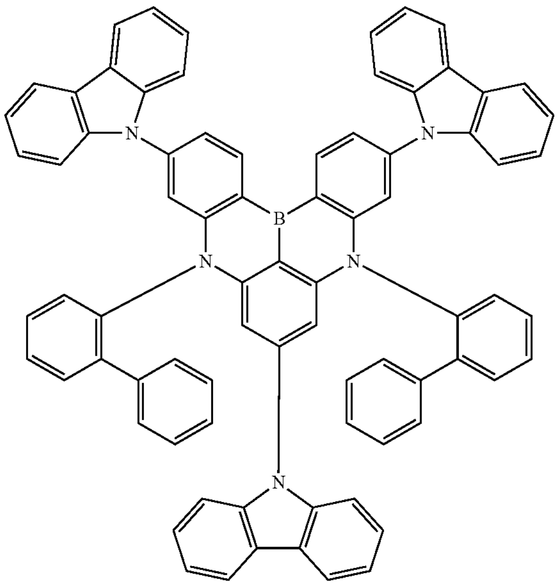

X-8

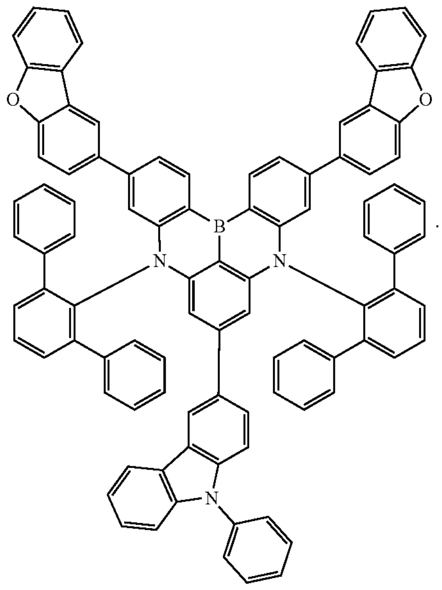

.

With respect to the light emitting devices of Examples and Comparative Examples, an ITO glass substrate was cut to a size of about 50 mm×50 mm×0.7 mm, washed by ultrasonic waves utilizing isopropyl alcohol and distilled water for about 5 minutes, respectively, and then irradiated with ultraviolet rays for about 30 minutes and cleansed by exposing to ozone, and then installed on a vacuum deposition apparatus. Then, NPD (N,N'-Di(1-naphthyl)-N,N'-diphenyl-(1,1'-biphenyl)-4,4'-diamine) was utilized to form a hole injection layer HIL having a thickness of about 300 Å, HT-1-19 was utilized to form a hole transport layer HTL having a thickness of about 200 Å, and then CzSi was utilized to form an emission auxiliary layer having about 100 Å. Then, a host compound in which the first host and the second host according to an embodiment were mixed in an amount of about 1:1, the second dopant, and Example Compound or Comparative Example Compound were co-deposited in a weight ratio of about 83:14:3 to form a 200

Å-thick emission layer EML, and TSPO1 was utilized to form a 200 Å-thick electron transport layer ETL. Next, TPBi (2,2',2"-(1,3,5-Benzinetriyl)-tris(1-phenyl-1-H-benzimidazole)), a buffer electron transporting compound, was utilized to form a 300 Å-thick buffer layer, and LiF was utilized to form 10 Å-thick electron injection layer EIL. Al was then utilized to form a 3,000 Å-thick second electrode EL2 to form a LiF/Al electrode. Then, on the upper portion of the second electrode, P4 was utilized to form a 700 Å-thick capping layer. Each layer was formed by a vacuum deposition method. In some embodiments, HTH29 among the compounds in Compound Group 2 as described above was utilized as the first host, ETH66 among the compounds in Compound Group 3 as described above was utilized as the second host, and AD-37 among the compounds in Compound Group 4 as described above was utilized as the second dopant (sensitizer).

Compounds utilized for manufacturing the light emitting devices of Examples and Comparative Examples are disclosed below. The materials below were utilized to manufacture the elements by subjecting commercial products to sublimation purification.

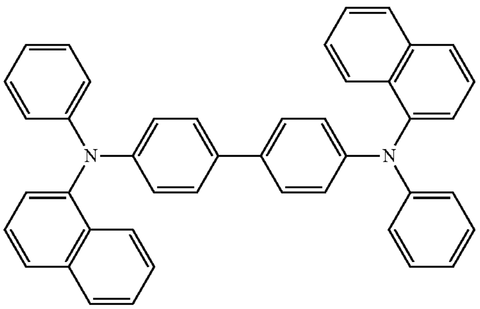

NPD

HT-1-19

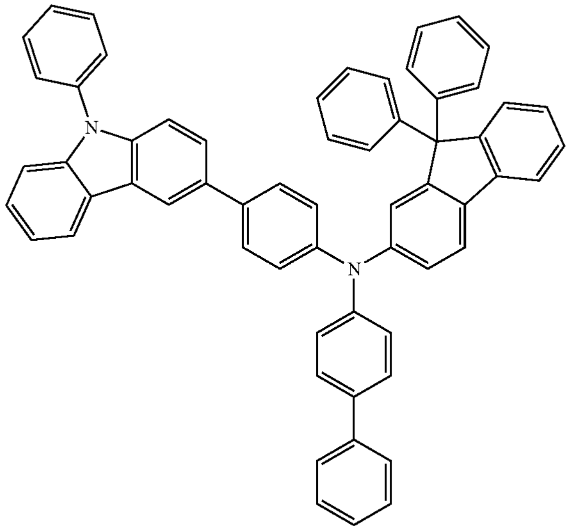

-continued

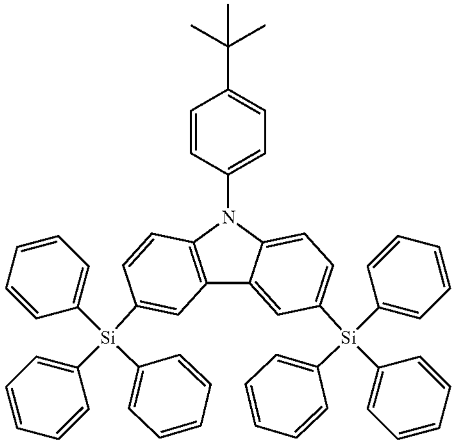

CzSi

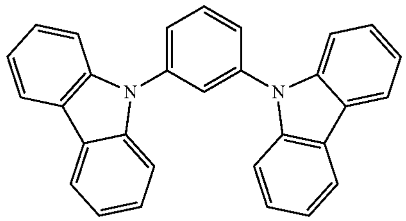

mCP

TSPO1

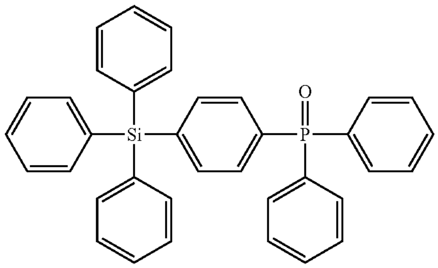

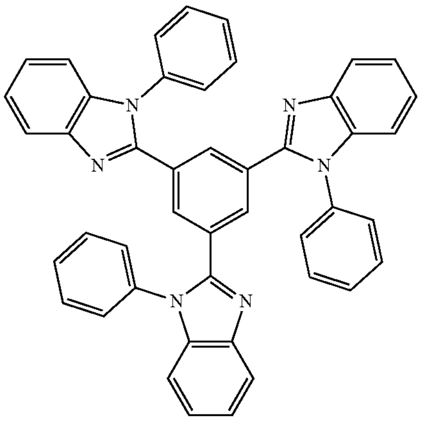

TPBi

-continued

P4

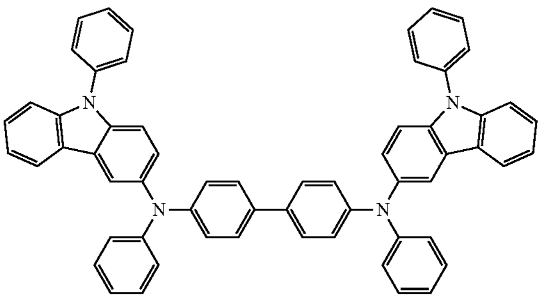

HTH29

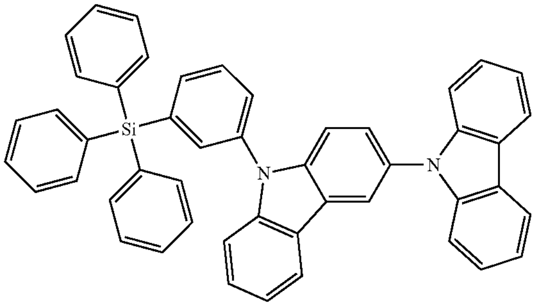

ETH66

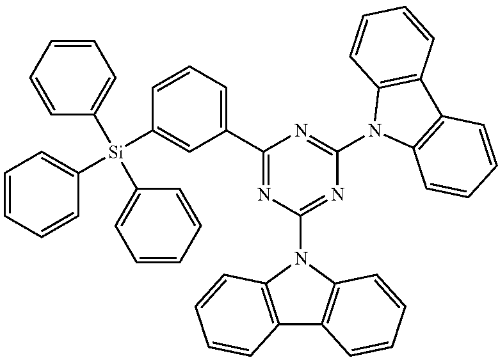

-continued

AD-37

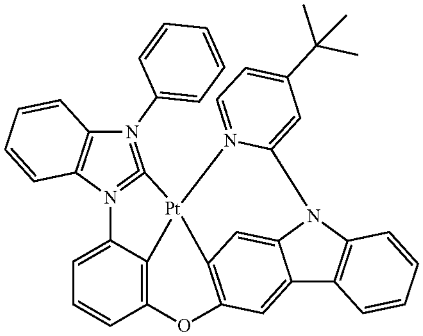

Evaluation of Light Emitting Device Characteristics

Characteristics of the manufactured light emitting devices were evaluated utilizing a brightness light distribution characteristics measurement device. To evaluate properties of the light emitting devices according to Examples and Comparative Examples, driving voltage, efficiency, and emission wavelength were measured. Table 1 shows luminous efficiencies (cd/A) at a current density of 10 mA/cm$^2$ and a brightness of 1,000 cd/m$^2$ with respect to the manufactured light emitting devices. The service life ratio was evaluated by calculating the relative device service life based on the numerical value in which the deterioration time from an initial value to 50% brightness when the device was continuously driven at 10 mA/cm$^2$ was compared to Comparative Example 1.

TABLE 1

| Device manufacturing examples | First host Second host | TADF dopant | Sensitizer | Driving voltage (V) | Luminous efficiency (Cd/A) | Luminous wavelength (nm) | Service life ratio ($T_{95}$) |
|---|---|---|---|---|---|---|---|
| Example 1 | HTH29/ETH66 | Compound 1 | AD-37 | 4.2 | 27.3 | 458 | 4.2 |
| Example 2 | HTH29/ETH66 | Compound 14 | AD-37 | 4.2 | 28.3 | 460 | 5.1 |
| Example 3 | HTH29/ETH66 | Compound 23 | AD-37 | 4.3 | 28.1 | 460 | 4.7 |
| Example 4 | HTH29/ETH66 | Compound 31 | AD-37 | 4.2 | 26.9 | 457 | 4.5 |
| Example 5 | HTH29/ETH66 | Compound 32 | AD-37 | 4.3 | 28.5 | 461 | 4.5 |
| Example 6 | HTH29/ETH66 | Compound 37 | AD-37 | 4.1 | 27.2 | 458 | 4.9 |
| Example 7 | HTH29/ETH66 | Compound 40 | AD-37 | 4.3 | 26.4 | 461 | 4.0 |
| Example 8 | HTH29/ETH66 | Compound 42 | AD-37 | 4.2 | 28.7 | 458 | 4.6 |
| Example 9 | HTH29/ETH66 | Compound 45 | AD-37 | 4.3 | 26.0 | 453 | 3.7 |
| Comparative Example 1 | HTH29/ETH66 | Comparative Example Compound X-1 | AD-37 | 4.8 | 19.2 | 462 | 1 |
| Comparative Example 2 | HTH29/ETH66 | Comparative Example Compound X-2 | AD-37 | 4.5 | 25.7 | 463 | 2.5 |
| Comparative Example 3 | HTH29/ETH66 | Comparative Example Compound X-3 | AD-37 | 4.5 | 20.1 | 458 | 1.2 |
| Comparative Example 4 | HTH29/ETH66 | Comparative Example Compound X-4 | AD-37 | 4.6 | 20.0 | 456 | 2.6 |

TABLE 1-continued

| Device manufacturing examples | First host Second host | TADF dopant | Sensitizer | Driving voltage (V) | Luminous efficiency (Cd/A) | Luminous wavelength (nm) | Service life ratio ($T_{95}$) |
|---|---|---|---|---|---|---|---|
| Comparative Example 5 | HTH29/ETH66 | Comparative Example Compound X-5 | AD-37 | 4.5 | 22.5 | 462 | 3.0 |
| Comparative Example 6 | HTH29/ETH66 | Comparative Example Compound X-6 | AD-37 | 4.7 | 19.5 | 464 | 3.4 |
| Comparative Example 7 | HTH29/ETH66 | Comparative Example Compound X-7 | AD-37 | 4.6 | 20.3 | 452 | 2.1 |
| Comparative Example 8 | HTH29/ETH66 | Comparative Example Compound X-8 | AD-37 | 4.7 | 21.5 | 468 | 2.3 |

Referring to the results of Table 1, it may be confirmed that Examples of the light emitting devices in which the first compounds according to examples of the present disclosure are utilized as a luminescent material have reduced driving voltages and improved luminous efficiencies and device service lives compared with Comparative Examples, while the Examples maintain the emission wavelength of blue light. The first compound according to an embodiment has a structure in which at least three electron donating substituents having a planar skeleton structure containing a boron atom at the center thereof are bonded, and in which three electron donating substituents are bonded to different benzene rings, and one among the electron donating substituents is a carbazole group, which is bonded to the fused cyclic core via a carbon-nitrogen bond, and the other two electron donating substituents are bonded to the fused cyclic core via a carbon-carbon bond. Accordingly, the first compound according to an embodiment may have increased multiple resonance effects due to the improvement in the electron donor property of the electron donating substituents, thus have a high oscillator strength value and a small $\Delta E_{ST}$ value, and thus may be expected to have improved delayed fluorescence characteristics. The first compound according to an embodiment of the present disclosure may have a robust bonding structure through a structure in which two electron donating substituents and the central core are bonded via carbon-carbon, thereby enhancing the chemical stability of the material in itself. The first compound according to an embodiment may have an increase in the light absorption rate of the compound in itself by including a plurality of electron donating substituents, and thus when the first compound of an embodiment is utilized as a thermally activated delayed fluorescence dopant, the energy transfer efficiency with a host material may be improved, thereby further increasing the luminous efficiency. The light emitting device of an example includes the first compound of an example as a light emitting dopant of a thermally activated delayed fluorescence (TADF) light emitting device, and thus may achieve high device efficiency in a blue wavelength region, particularly, a deep blue wavelength region.

It may be confirmed that Comparative Example Compound X-1 included in Comparative Example 1 has a planar skeleton containing one boron atom at the center thereof, but does not include an electron donating substituent, and thus the luminous efficiency and service device life are reduced when Comparative Example Compound X-1 is applied to the device compared with Example Compounds. Without wishing to be bound by theory, it is believed that Comparative Example Compound X-1 does not include the electron donating substituent in a skeleton structure, thus the electron donor property becomes weaker, and thus the multiple resonances become weaker, and the luminous efficiency and device service life are reduced compared to Example Compounds when Comparative Example Compound X-1 is applied to the light emitting device.

It may be confirmed that each of Comparative Example Compound X-2 to Comparative Example Compound X-5 included in Comparative Examples 2 to 5 has a planar skeleton structure containing one boron atom at the center thereof, and a structure including a plurality of electron donating substituents, but has two electron donating substituents without including three electron donating substituents as Example Compounds, and thus the luminous efficiency and device service life are reduced compared with Example Compounds when Comparative Example Compounds X-2 to X-5 are applied to the devices. It is believed that Comparative Example Compounds X-2 to Comparative Example Compound X-5 include electron donating substituents less than three in a skeleton structure, thus the electron donor property is reduced compared with Examples, accordingly the multiple resonances become weaker, and thus the luminous efficiency and device service life are reduced compared with Example Compounds when Comparative Example Compounds X-2 to X-5 are applied to the light emitting device.

Comparative Example Compound X-6 included in Comparative Example 6 has a planar skeleton structure containing one boron atom at the center thereof and a structure including three electron donating substituents, but has a structure in which one electron donating substituent is linked to the nitrogen atom via a linker rather than directly linked to the benzene ring of the core skeleton structure, and does not include an electron donating substituent bonded via carbon-nitrogen atoms. Accordingly, it may be confirmed that the luminous efficiency and device service life are reduced compared with Example Compounds when Comparative Example Compound X-6 is applied to the device. It is believed that Comparative Example Compound X-6 does not include an electron donating substituent which is bonded to the skeleton structure via carbon-nitrogen atoms, and thus the electron donor property is reduced compared with Examples while the electron donating substituent linked to the nitrogen atom via a linker has a decrease in the degree of contributing to the electron donor property of the whole molecule, thus the multiple resonances of the whole molecule becomes weaker, and thus the luminous efficiency and device service life are reduced compared with Example Compounds when Comparative Example Compound X-6 is applied to the light emitting device.

Comparative Example Compound X-7 included in Comparative Example 7 has a planar skeleton structure containing one boron atom at the center thereof, and a structure including three electron donating substituents, but has a structure in which all the three electron donating substituents are bonded via carbon-nitrogen atoms. Accordingly, it may be confirmed that the luminous efficiency and device service life are reduced compared with Example Compounds when Comparative Example Compound X-7 is applied to the device. It is believed that Comparative Example Compound X-7 has a decrease in the stability of the compound molecular structure by all the three electron donating substituents being bonded via carbon-nitrogen atoms, and thus the luminous efficiency and device service life are reduced compared with Example Compounds when Comparative Example Compound X-7 is applied to the light emitting device.

Comparative Example Compound X-8 included in Comparative Example 8 has a planar skeleton structure containing one boron atom at the center thereof, and a structure including three electron donating substituents, but has a structure in which all the three electron donating substituents are bonded via carbon-carbon atoms.

Accordingly, it may be confirmed that the luminous efficiency and device service life are reduced compared with Example Compounds when Comparative Example Compound X-8 is applied to the device. It is believed that Comparative Example Compound X-8 does not include, in a skeleton structure, the electron donating substituent that is bonded via carbon-nitrogen atoms, thus the electron donor property is reduced compared with Examples, and thus the multiple resonances of the whole molecule become weaker, therefore the luminous efficiency and device service life are reduced compared to Example Compounds when Comparative Example Compound X-8 is applied to the light emitting device.

The light emitting device of an embodiment may exhibit improved device characteristics with high efficiency and a long service life.

The fused polycyclic compound of an embodiment may be included in the emission layer of the light emitting device to contribute to high efficiency and a long service life of the light emitting device.

The use of “may” when describing embodiments of the present disclosure refers to “one or more embodiments of the present disclosure.”

As used herein, the term “substantially,” “about,” and similar terms are used as terms of approximation and not as terms of degree, and are intended to account for the inherent deviations in measured or calculated values that would be recognized by those of ordinary skill in the art. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Also, any numerical range recited herein is intended to include all subranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The light emitting device or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the embodiments of the present disclosure have been described, it is understood that the present disclosure should not be limited to these embodiments, but one or more suitable changes and modifications can be made by one ordinary skilled in the art within the spirit and scope of the present disclosure as defined by the following claims and equivalents thereof.

What is claimed is:

1. A light emitting device comprising:

a first electrode;

a second electrode facing the first electrode; and an emission layer between the first electrode and the second electrode, wherein the emission layer comprises:

a first compound represented by Formula 1; and at least one of a second compound represented by Formula H-1, a third compound represented by Formula H-2, or a fourth compound represented by Formula D-2:

Formula 1

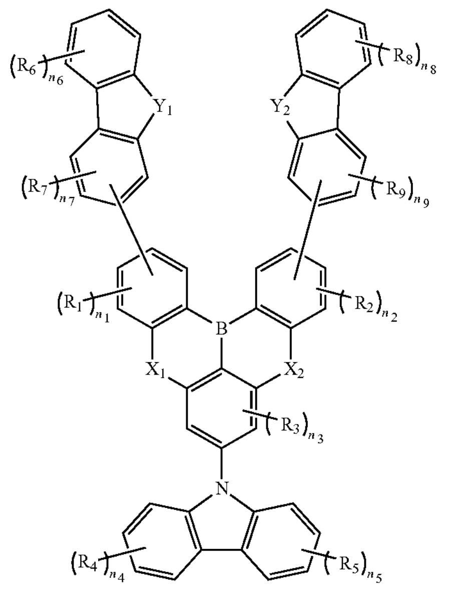

wherein, in Formula 1, $X_1$ and $X_2$ are each independently $NR_a$, O, or S, and at least one of $X_1$ or $X_2$ is $NR_a$, $Y_1$ and $Y_2$ are each independently $NR_b$, O, or S, $R_1$ to $R_9$ are each independently a hydrogen atom, a deuterium atom, a halogen atom, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $R_a$ and $R_b$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $n_1$, $n_2$, $n_7$, and ng are each independently an integer from 0 to 3, $n_3$ is an integer from 0 to 2, and $n_4$ to $n_6$, and $n_8$ are each independently an integer from 0 to 4, Formula H-1

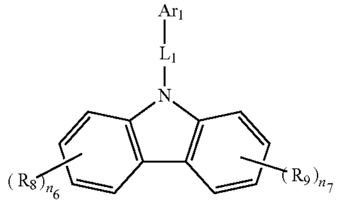

wherein, in Formula H-1, $L_1$ is a direct linkage, a substituted or unsubstituted arylene group having 6 to 30 ring-forming carbon atoms, or a substituted or unsubstituted heteroarylene group having 2 to 30 ring-forming carbon atoms, $Ar_1$ is a substituted or unsubstituted aryl group having 6 to 30 ring-forming carbon atoms, or a substituted or unsubstituted heteroaryl group having 2 to 30 ring-forming carbon atoms, $R_8$ and $R_9$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $n_6$ and $n_7$ are each independently an integer from 0 to 4, Formula H-2

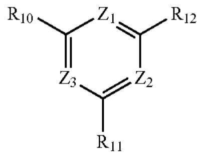

wherein, in Formula H-2, at least one among $Z_1$ to $Z_3$ is N, and the $Z_1$ to $Z_3$ that are not N are $CR_{13}$, and $R_{10}$ to $R_{13}$ are each independently a hydrogen atom, a deuterium atom, a cyano group, a substituted or unsubstituted silyl group, a substituted or unsubstituted aryl group having 6 to 30 ring-forming carbon atoms, or a substituted or unsubstituted heteroaryl group having 2 to 30 ring-forming carbon atoms, and Formula D-2

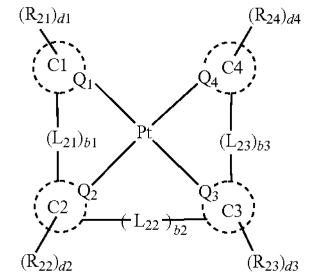

wherein, in Formula D-2, $Q_1$ to $Q_4$ are each independently C or N,

C1 to C4 are each independently a substituted or unsubstituted hydrocarbon ring having 5 to 30 ring-forming carbon atoms, or a substituted or unsubstituted heterocycle having 2 to 30 ring-forming carbon atoms, $L_{21}$ to $L_{23}$ are each independently a direct linkage,

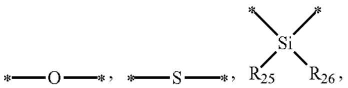

-continued

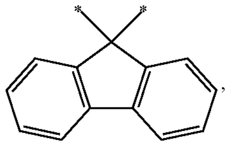

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, b1 to b3 are each independently 0 or 1, $R_{21}$ to $R_{26}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 1 to 30 ring-forming carbon atoms, and/or bonded to an adjacent group to form a ring, and d1 to d4 are each independently an integer from 0 to 4.

2. The light emitting device of claim 1, wherein the emission layer is configured to emit delayed fluorescence.

3. The light emitting device of claim 1, wherein the emission layer comprises the first compound, the second compound, and the third compound.

4. The light emitting device of claim 1, wherein the emission layer comprises the first compound, the second compound, the third compound, and the fourth compound.

5. The light emitting device of claim 1, wherein the emission layer is configured to emit light having a luminescence center wavelength of about 430 nm to about 490 nm.

6. The light emitting device of claim 1, wherein the first compound represented by Formula 1 is represented by Formula 2-1 or Formula 2-2:

Formula 2-1

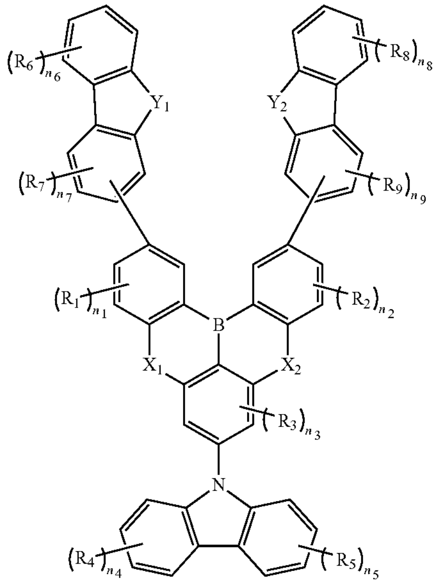

-continued

Formula 2-2

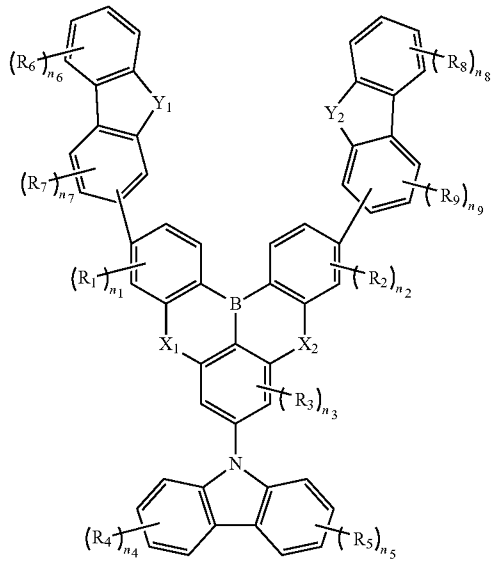

wherein, in Formula 2-1 and Formula 2-2, $X_1$, $X_2$, $Y_1$, $Y_2$, $R_a$, $R_b$, $R_1$ to $R_9$, and $n_1$ to ng are the same as defined in Formula 1.

7. The light emitting device of claim 1, wherein the first compound represented by Formula 1 is represented by any one selected from among Formula 3-1 to Formula 3-4:

Formula 3-1

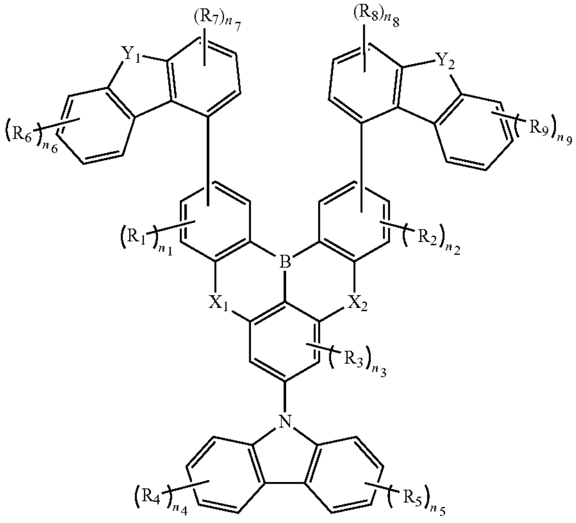

-continued
Formula 3-2
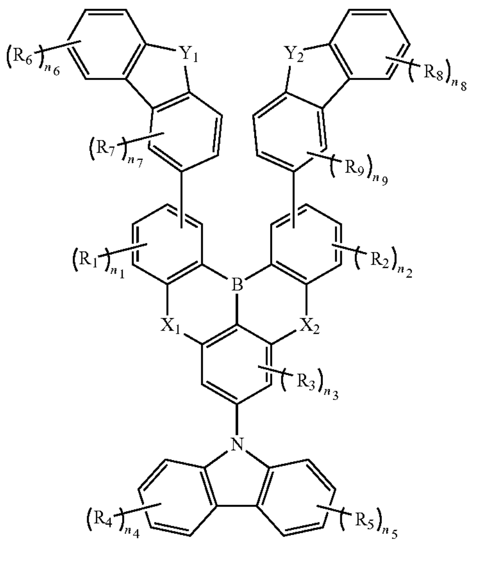
-continued
Formula 3-4
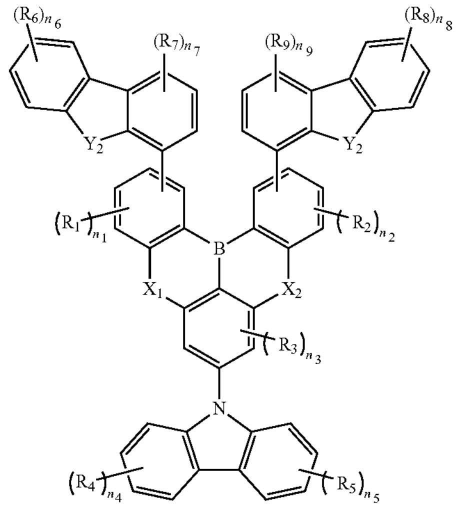
Formula 3-3
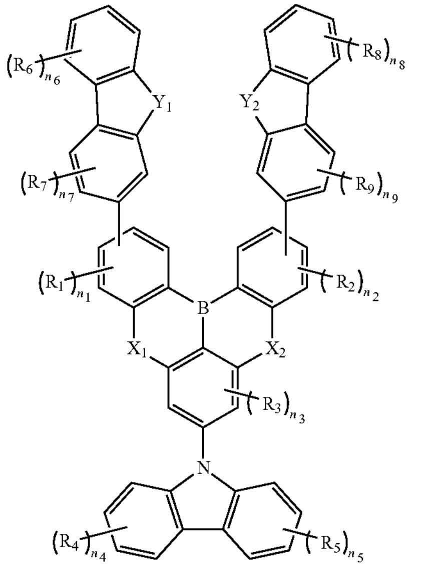
wherein, in Formula 3-1 to Formula 3-4,
$X_1$, $X_2$, $Y_1$, $Y_2$, $R_a$, $R_b$, $R_1$ to $R_9$, and $n_1$ to $n_9$ are the same as defined in Formula 1.
8. The light emitting device of claim 1, wherein the first compound represented by Formula 1 is represented by any one selected from among Formula 4-1 to Formula 4-3:
Formula 4-1
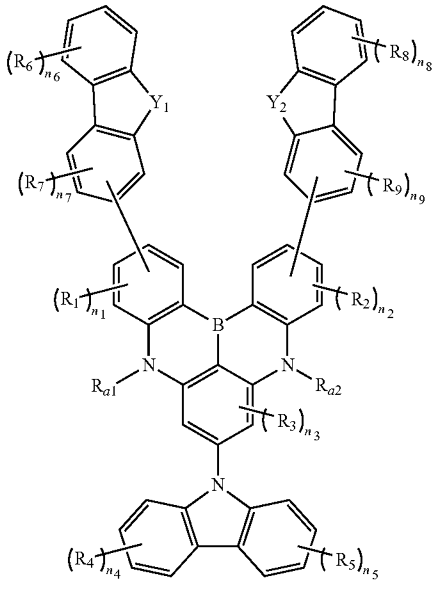

-continued

Formula 4-2

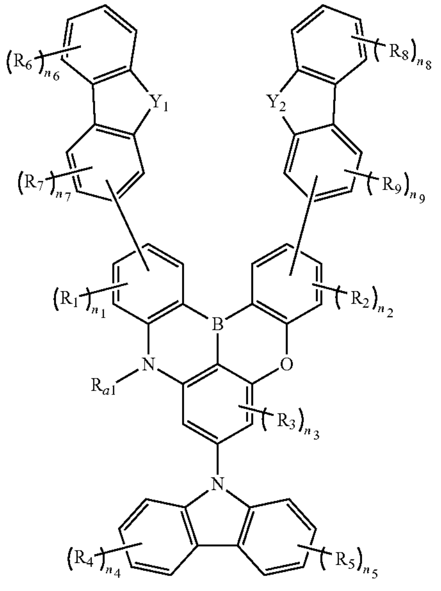

Formula 4-3

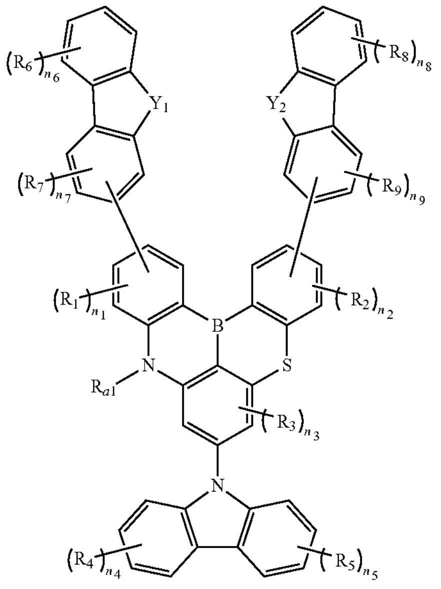

wherein, in Formula 4-1 to Formula 4-3, $R_{a1}$ to $R_{a2}$ are each independently a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Y_1$, $Y_2$, $R_a$, $R_b$, $R_1$ to $R_9$, and $n_1$ to $n_9$ are the same as defined in Formula 1.

9. The light emitting device of claim 1, wherein the first compound represented by Formula 1 is represented by any one selected from among Formula 5-1 to Formula 5-3:

Formula 5-1

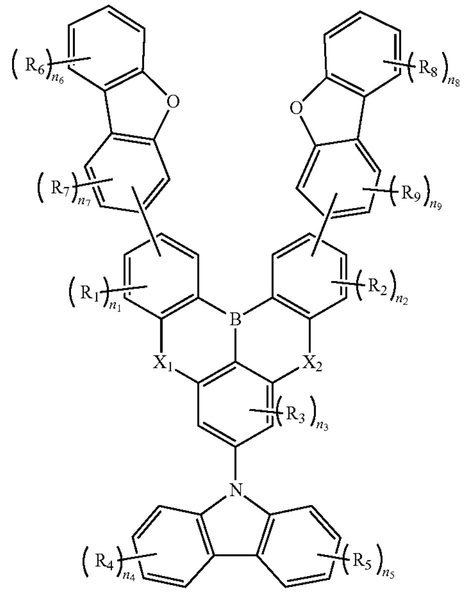

Formula 5-2

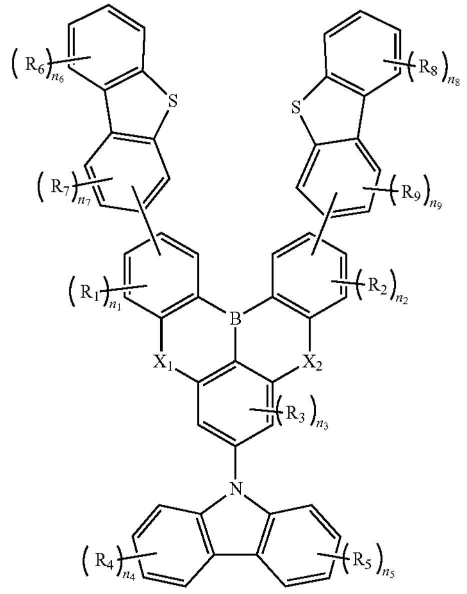

-continued

Formula 5-3

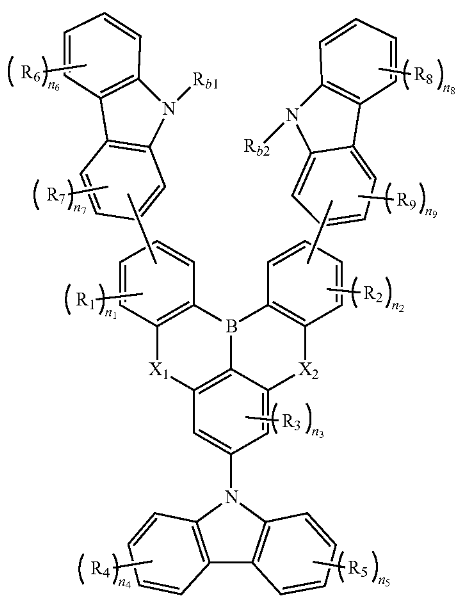

wherein, in Formulae 5-1 to 5-3, $R_{b1}$ to $R_{b2}$ are each independently a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $X_1$, $X_2$, $R_a$, $R_b$, $R_1$ to $R_9$, and $n_1$ to ng are the same as defined in Formula 1.

10. The light emitting device of claim 1, wherein, in Formula 1, when each of $X_1$ and $X_2$ is $NR_a$, $R_a$ is represented by any one selected from among Formulae 6-1 to 6-4:

Formula 6-1

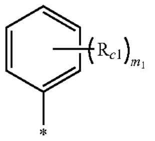

Formula 6-2

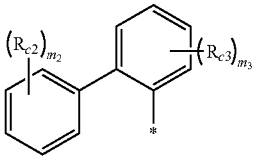

Formula 6-3

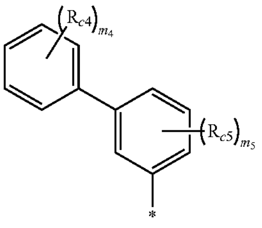

-continued

Formula 6-4

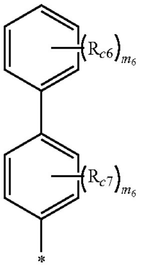

wherein, in Formula 6-1 to Formula 6-4, $R_{c1}$ to $R_{c7}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $m_1$, $m_2$, $m_4$, and $m_6$ are each independently an integer from 0 to 5, $m_3$, $m_5$, and $m_7$ are each independently an integer from 0 to 4, and "—— * *" is a position linked to the nitrogen atom.

11. The light emitting device of claim 1, wherein $R_1$ to $R_9$ are each independently a hydrogen atom, a deuterium atom, a substituted or unsubstituted t-butyl group, or a substituted or unsubstituted phenyl group.

12. The light emitting device of claim 1, further comprising a capping layer on the second electrode, wherein the capping layer has a refractive index of 1.6 or more.

13. The light emitting device of claim 1, wherein the first compound comprises at least one selected from among compounds represented by Compound Group 1:

Compound Group 1

1

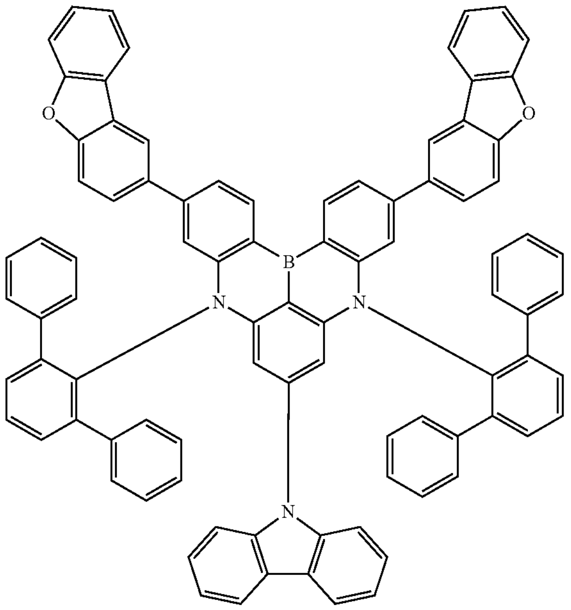

-continued
2
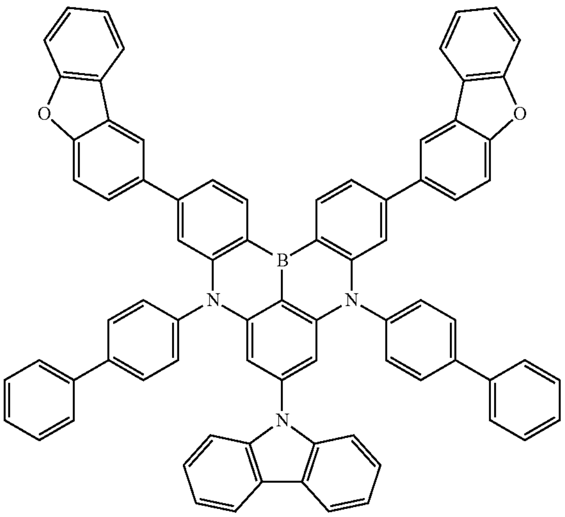
3
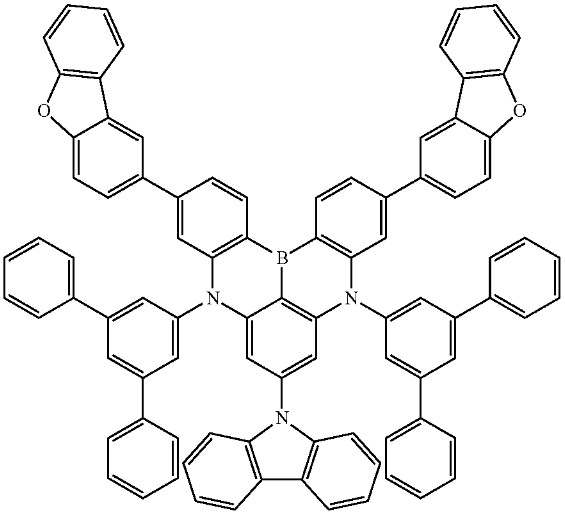
4
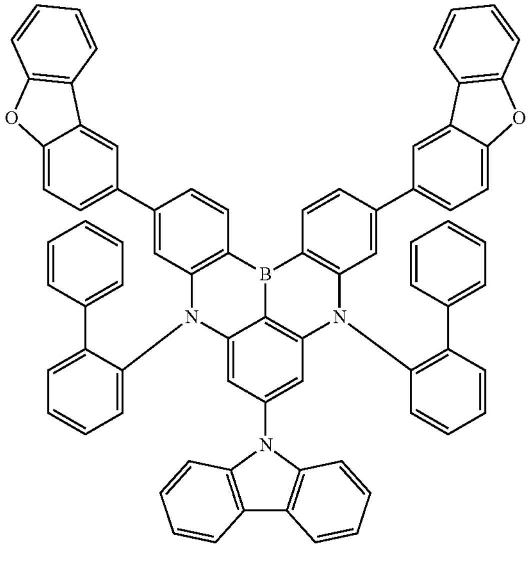
-continued
5
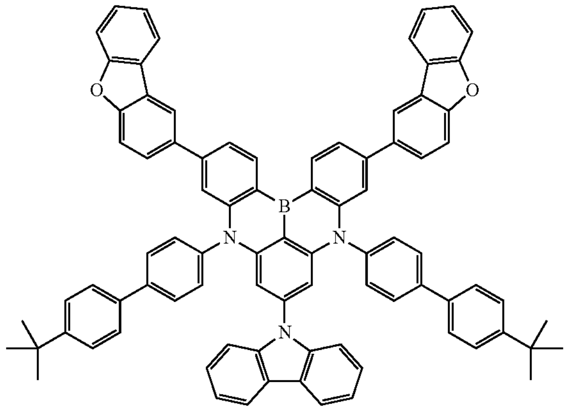
6
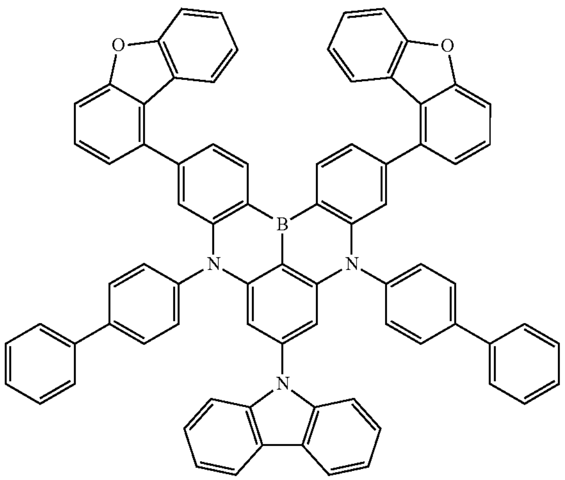
7
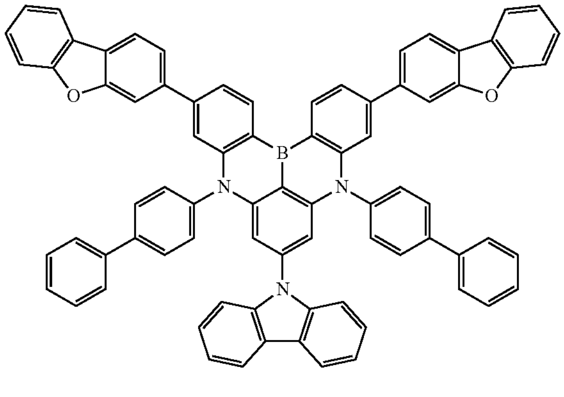

-continued
8
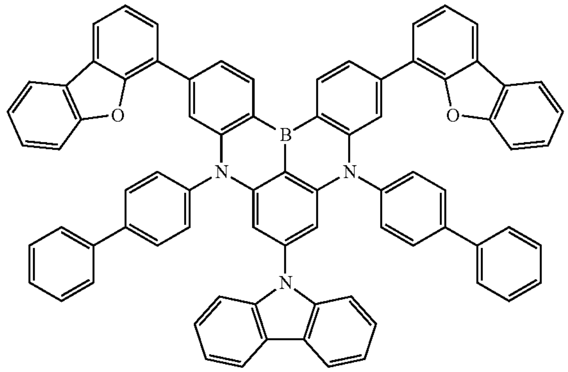
9
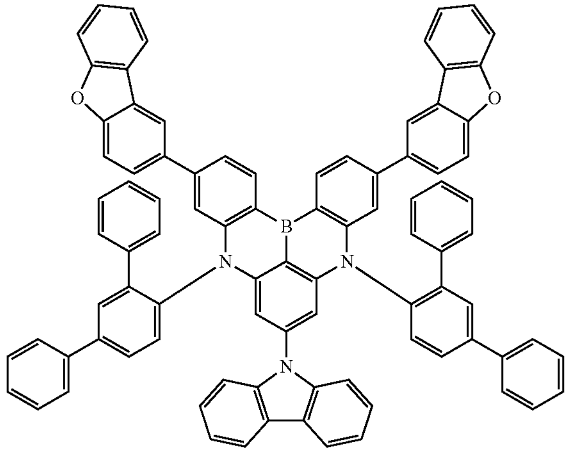
10
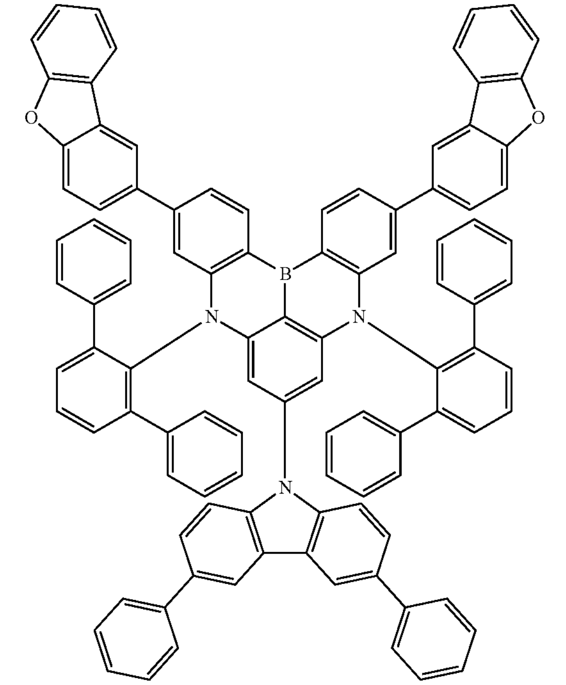
-continued
11
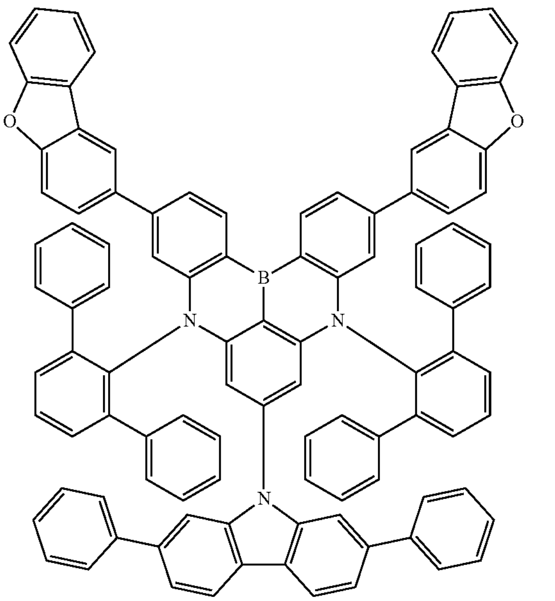
12
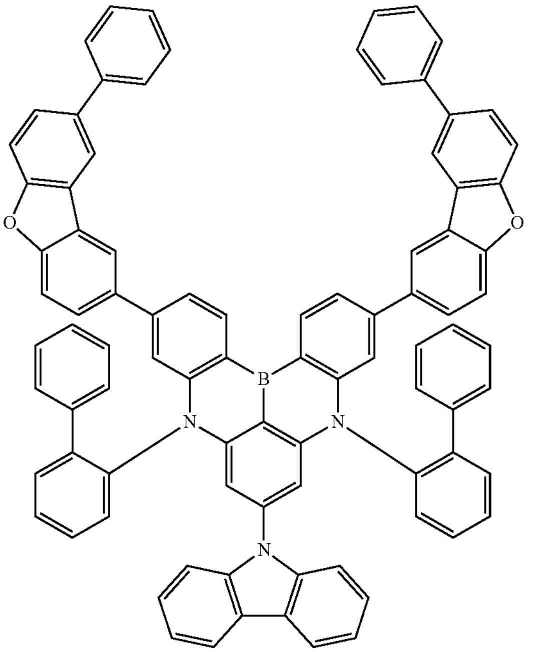

-continued
13
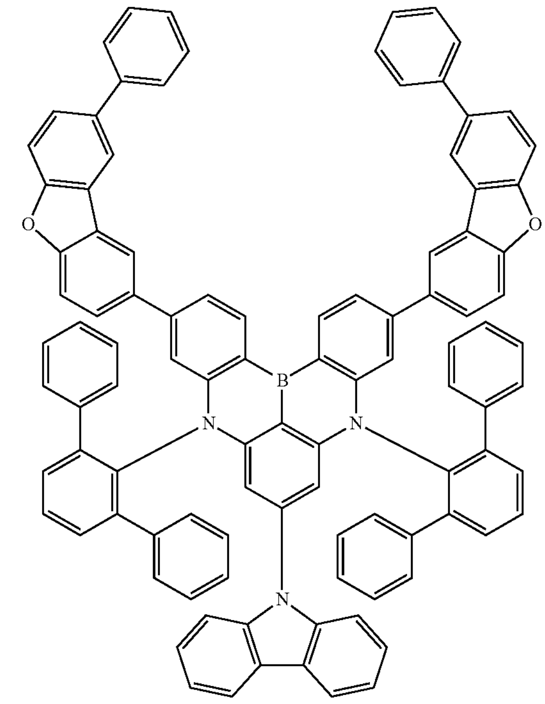
14
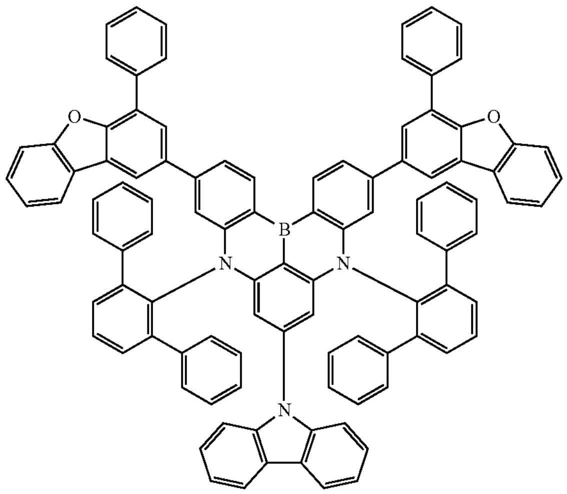
15
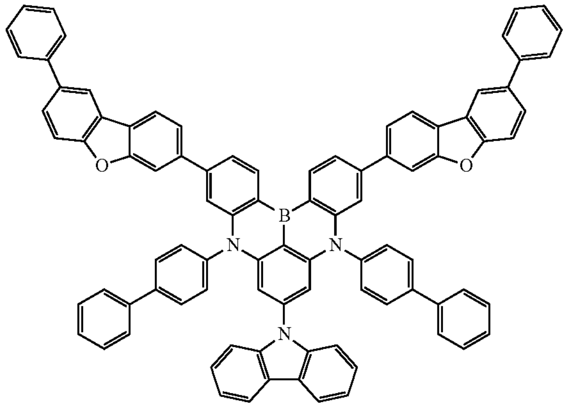
-continued
16
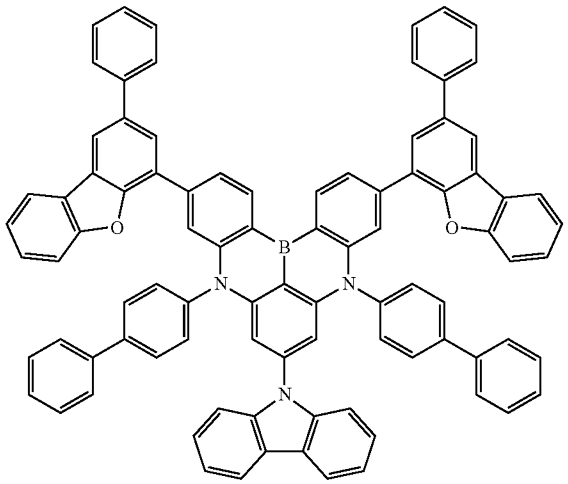
17
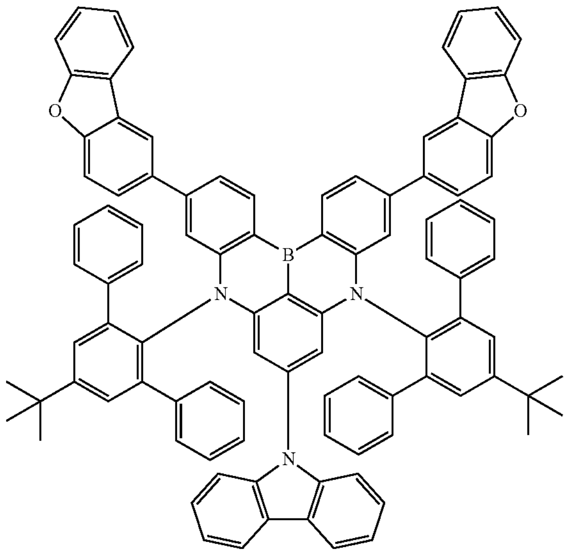
18
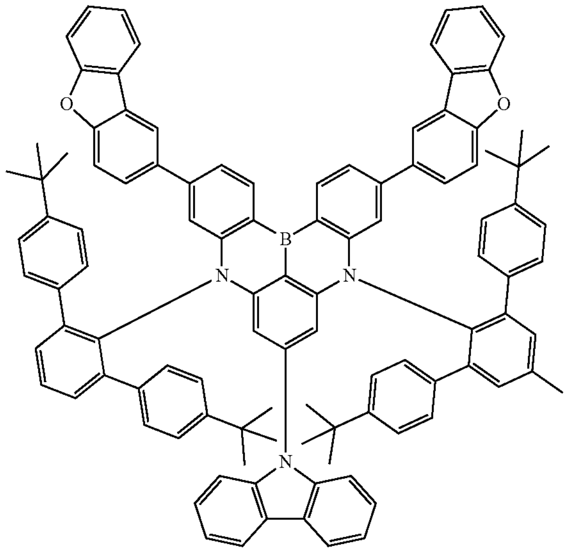

-continued
19
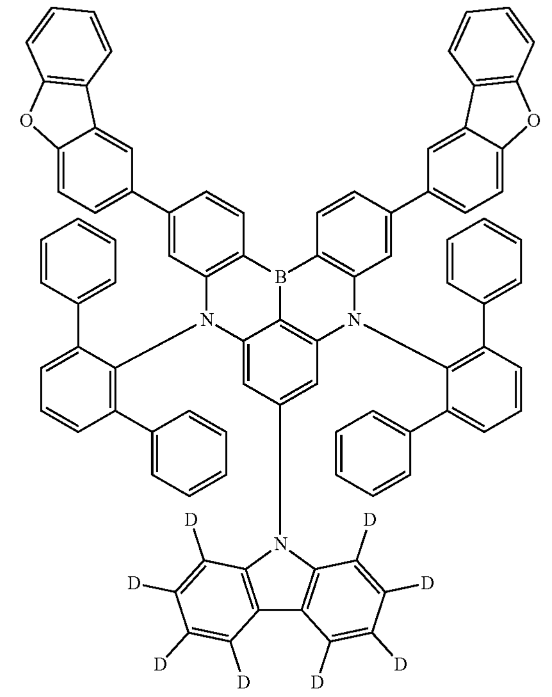
20
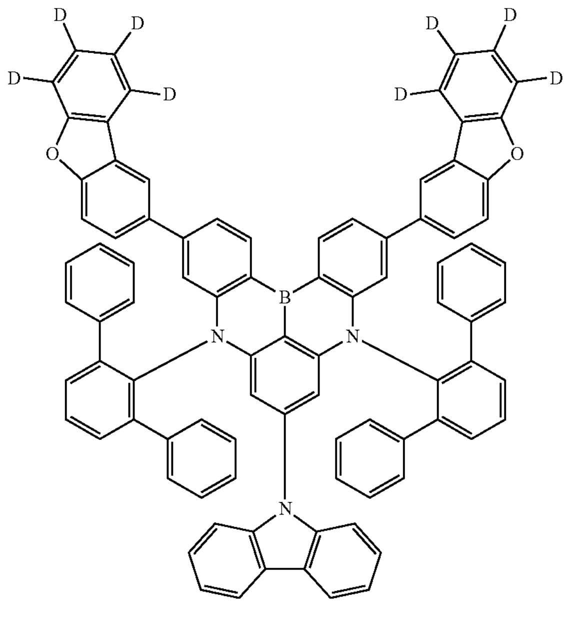
-continued
21
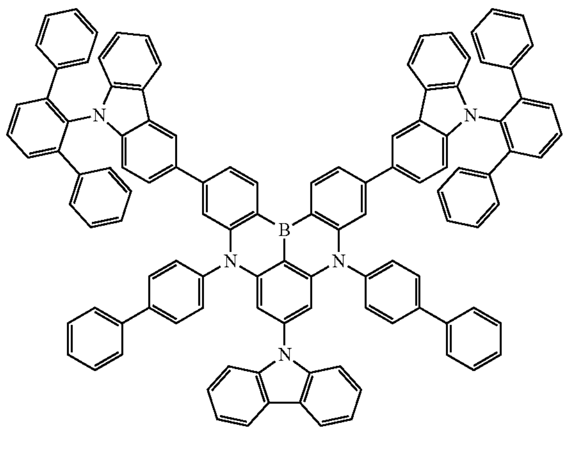
22
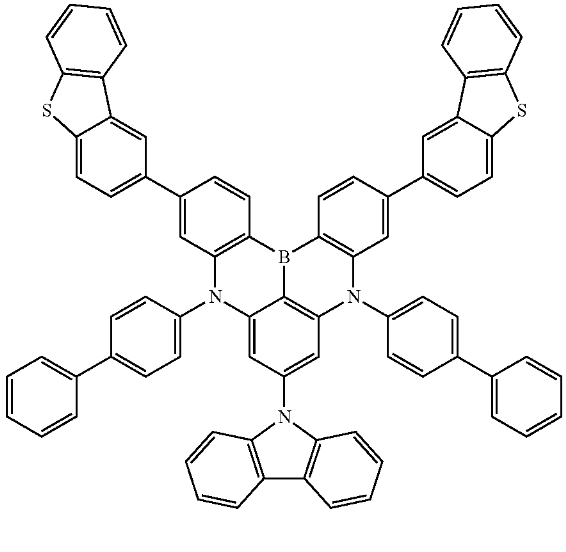

-continued
23
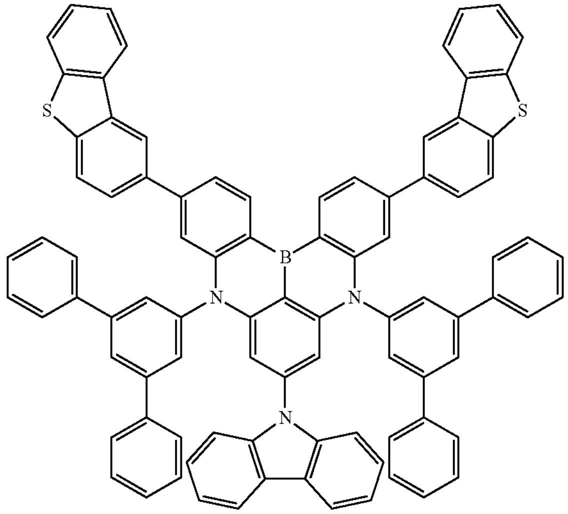
25
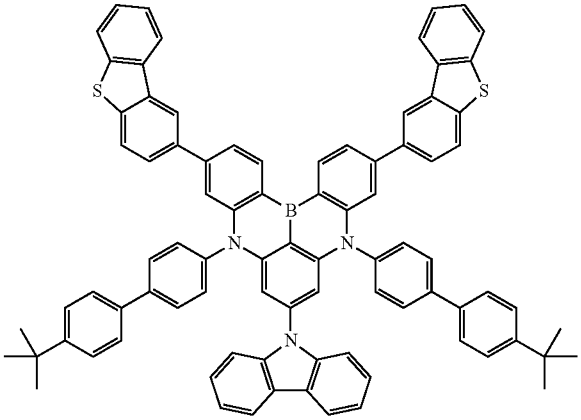
-continued
24
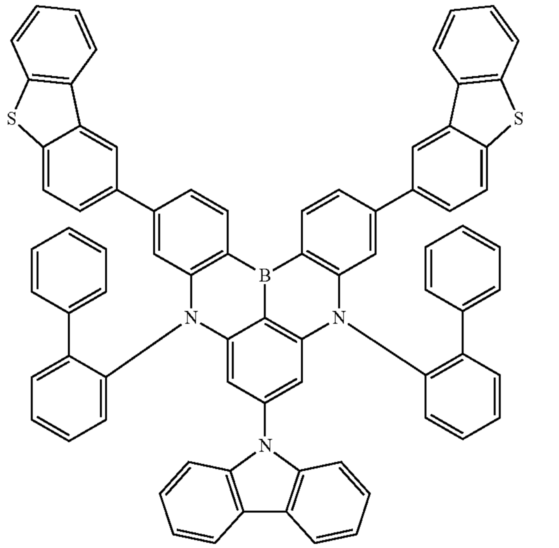
26
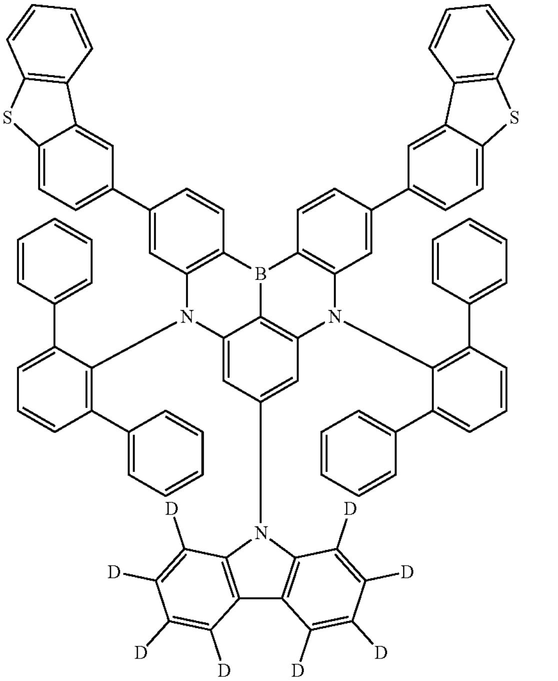

-continued
27
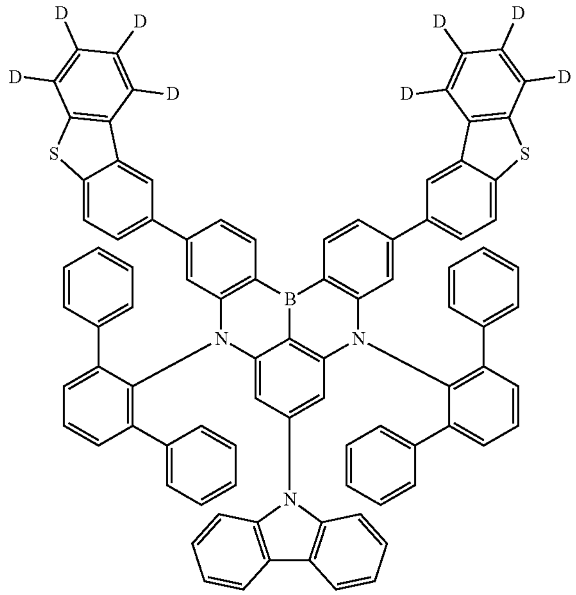
28
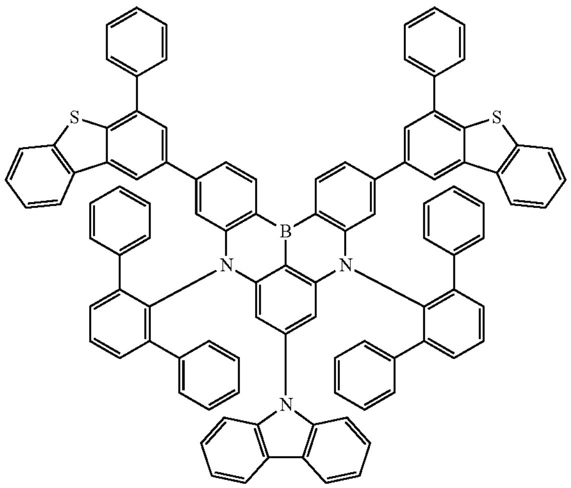
29
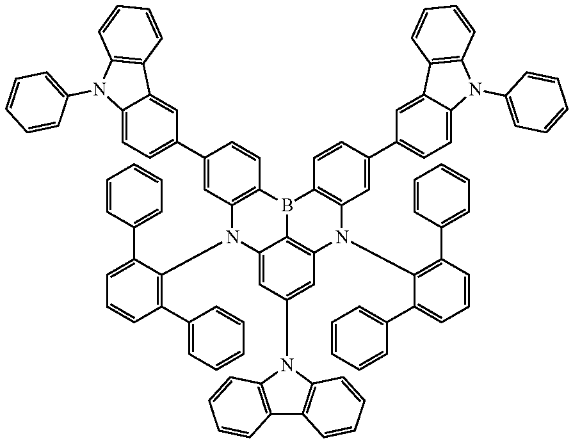
30
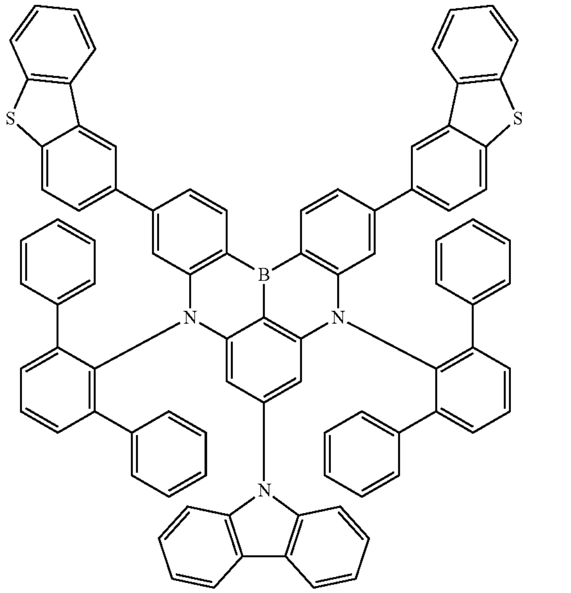

-continued
31
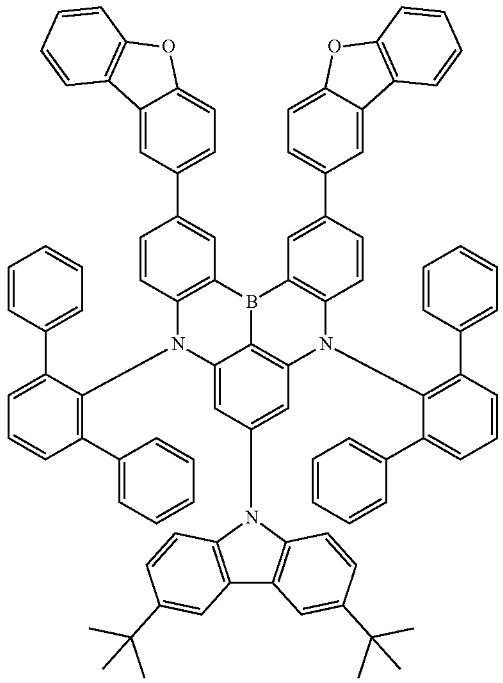
32
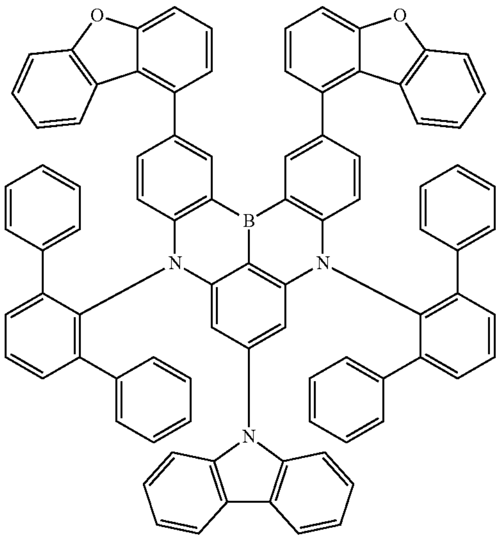
33
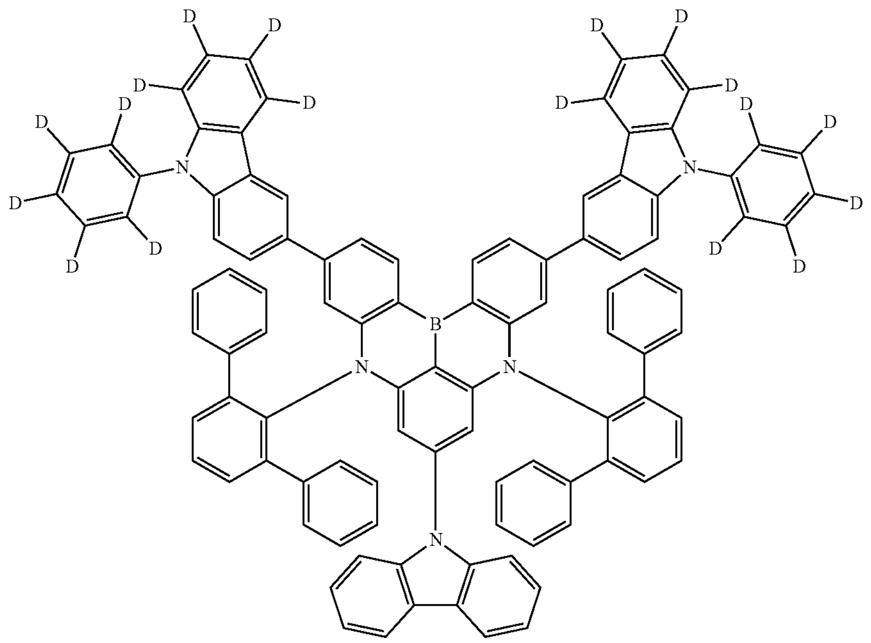

-continued
34
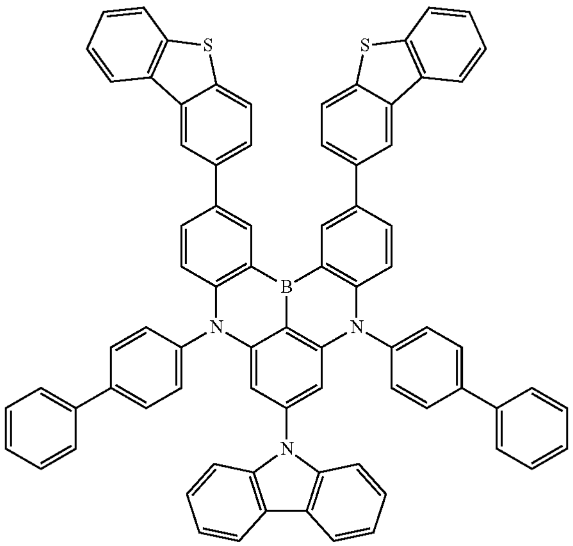
35
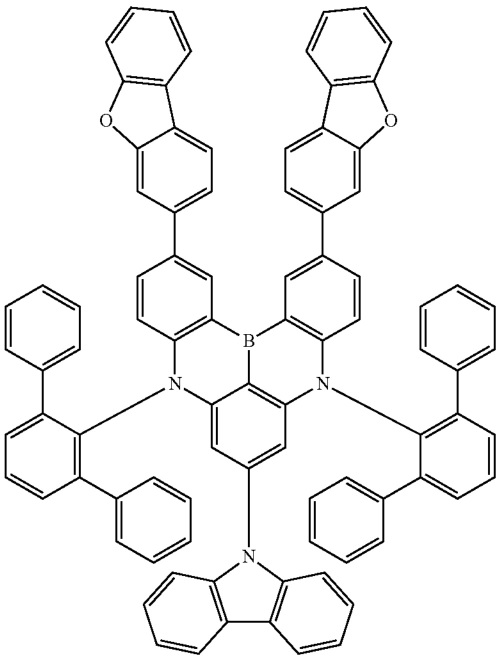
36
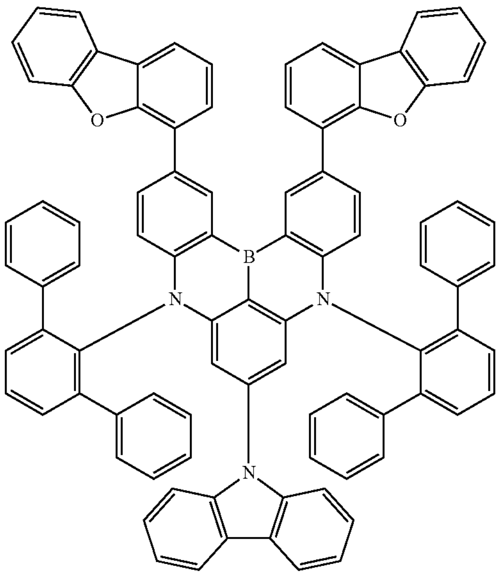
37
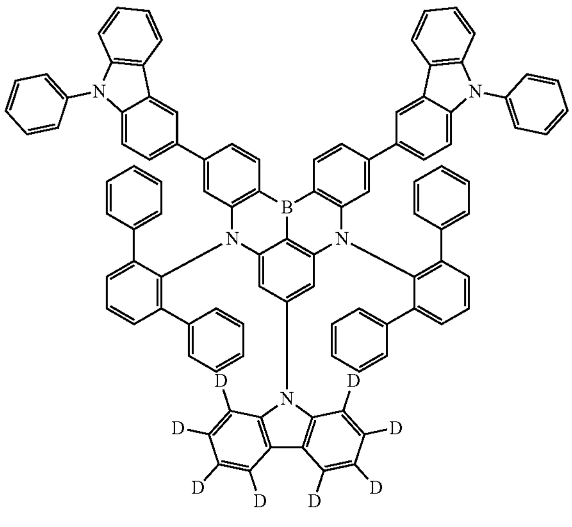

-continued
38
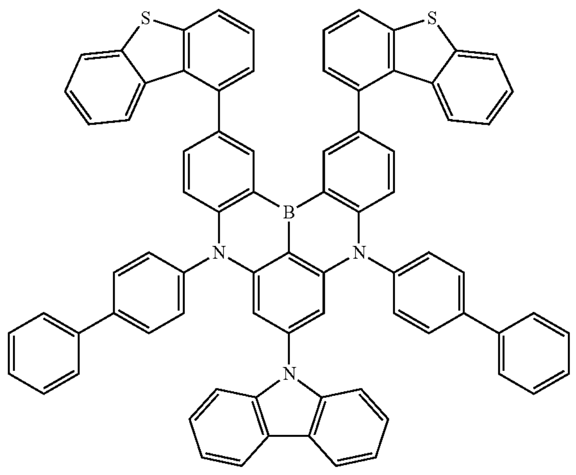
39
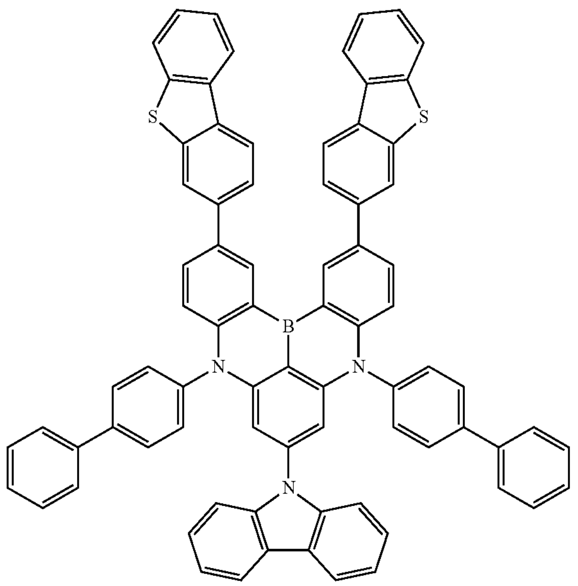
40
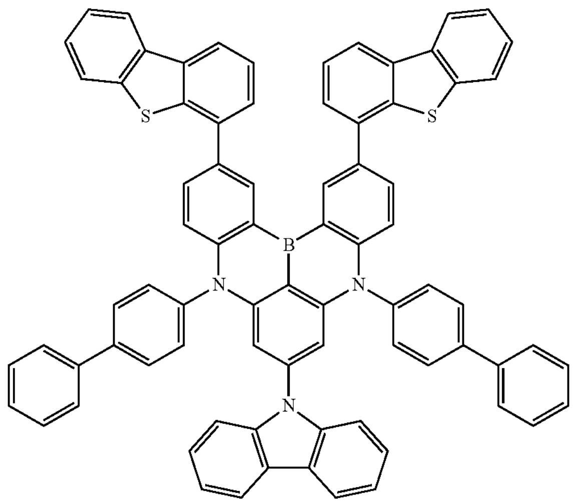
41
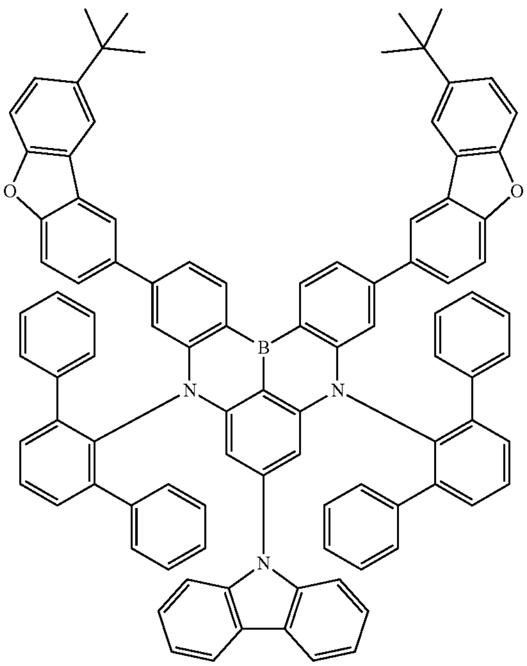

-continued
42
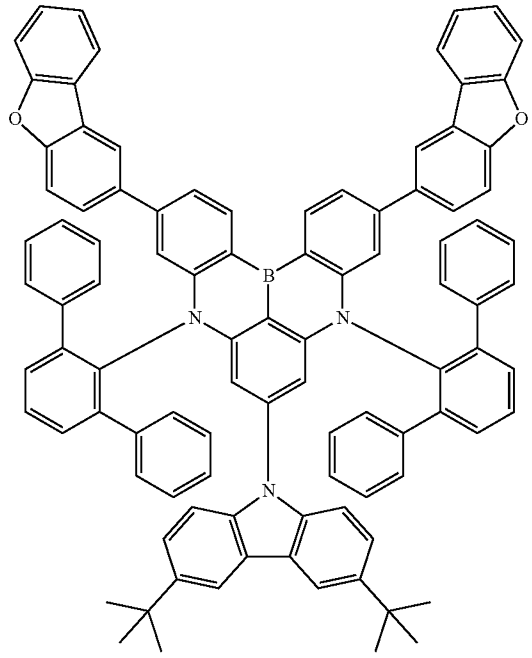
43
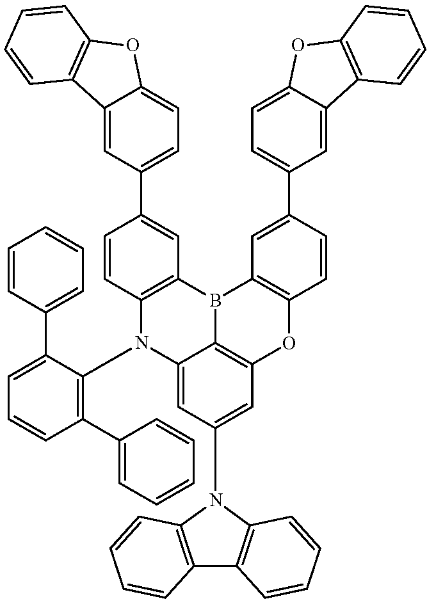
-continued
44
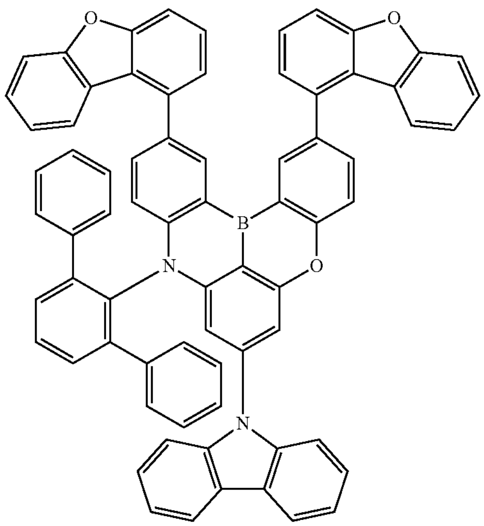

-continued
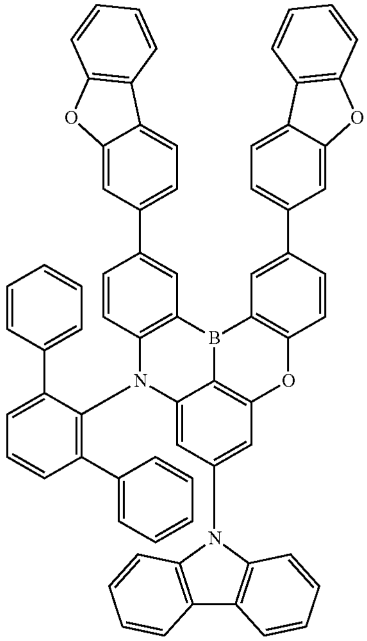
45
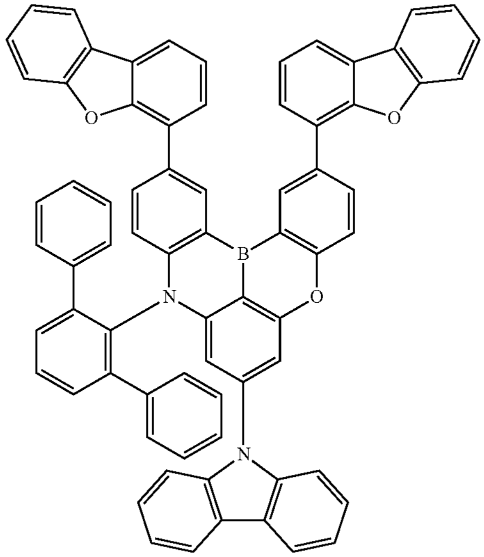
46
-continued
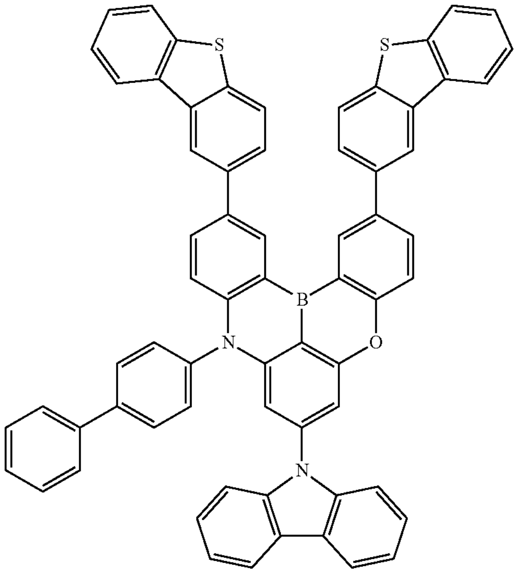
47
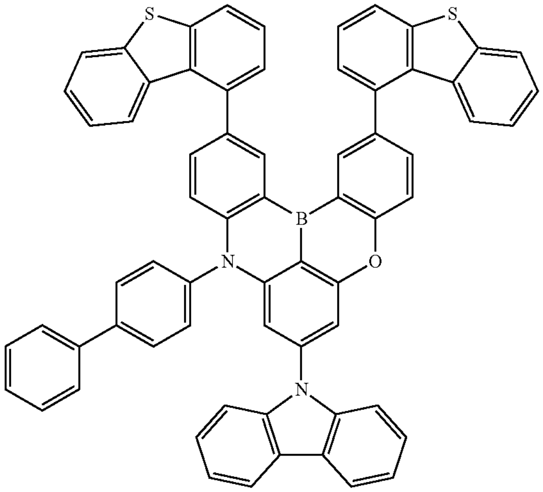
48

-continued
49
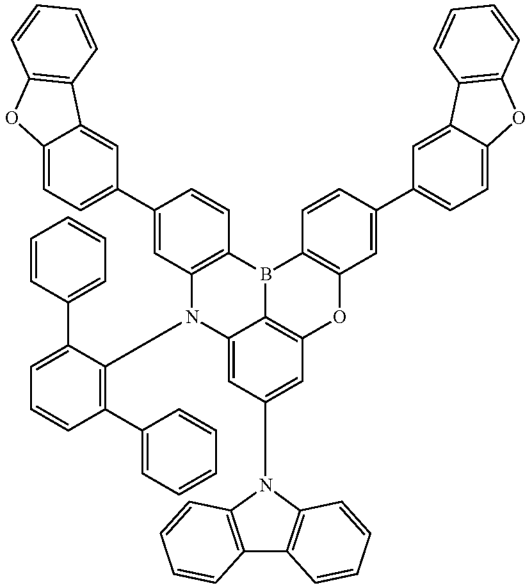
51
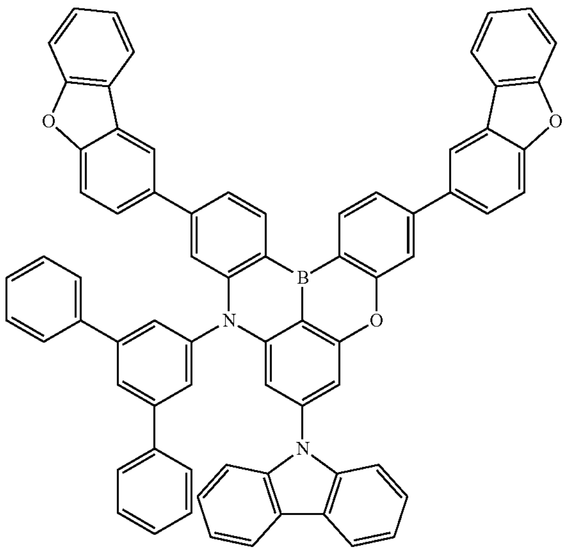
50
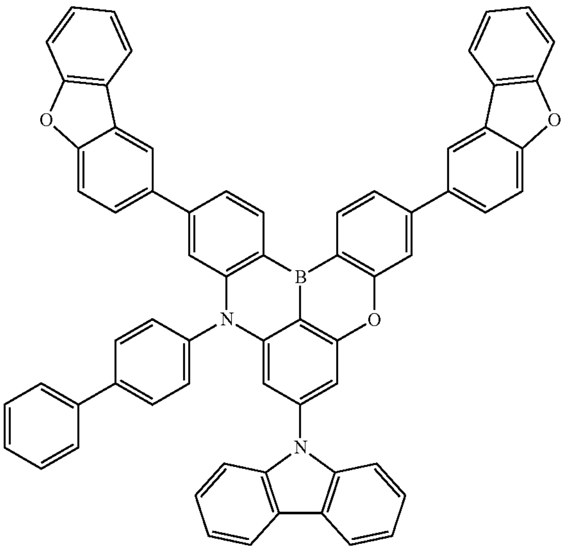
52
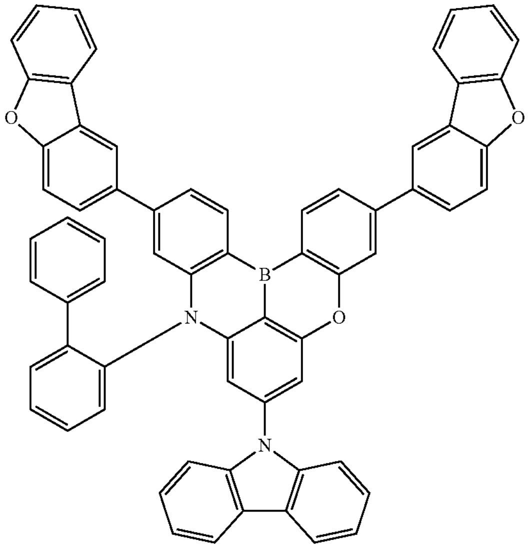

-continued
53
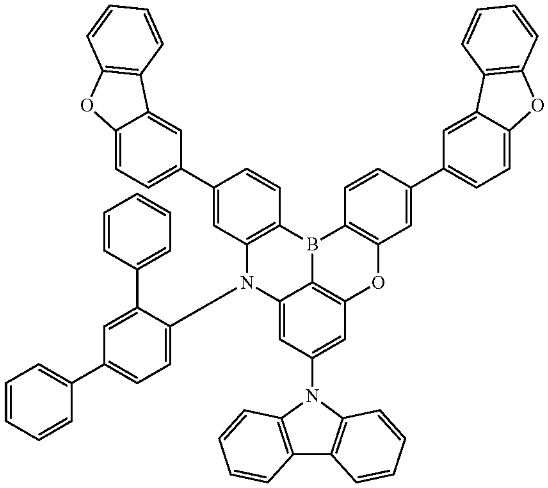
54
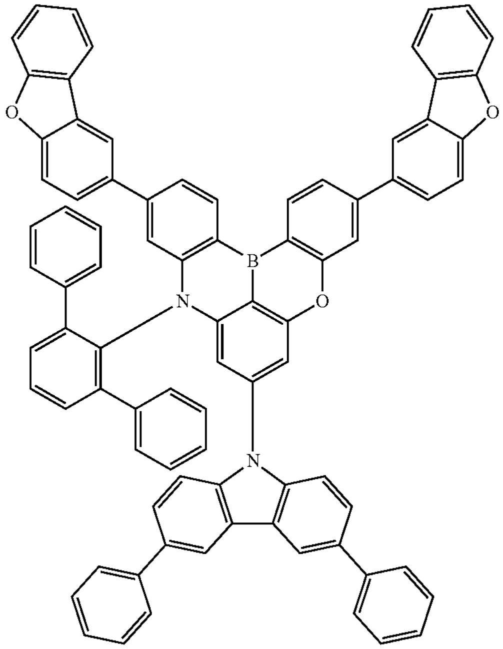
-continued
55
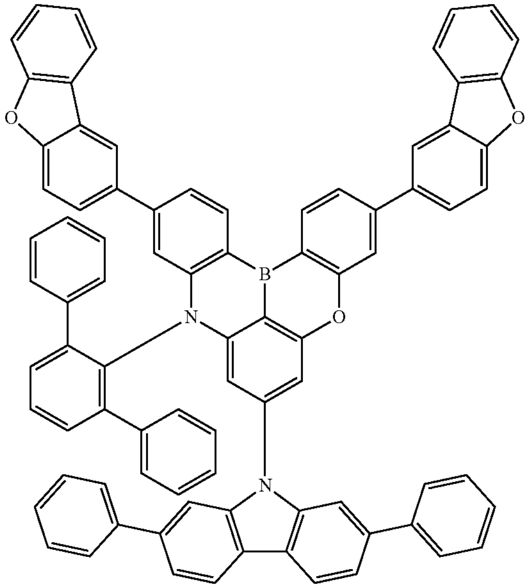
56
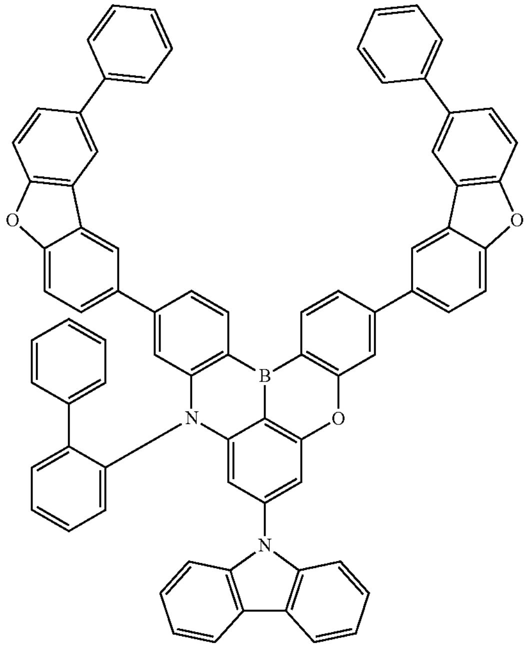

-continued
57
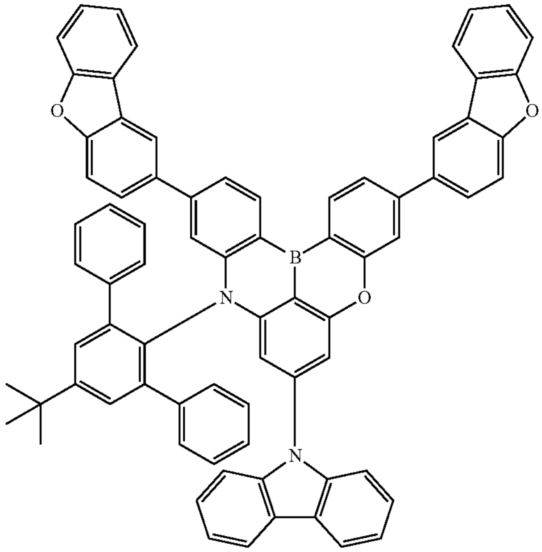
-continued
59
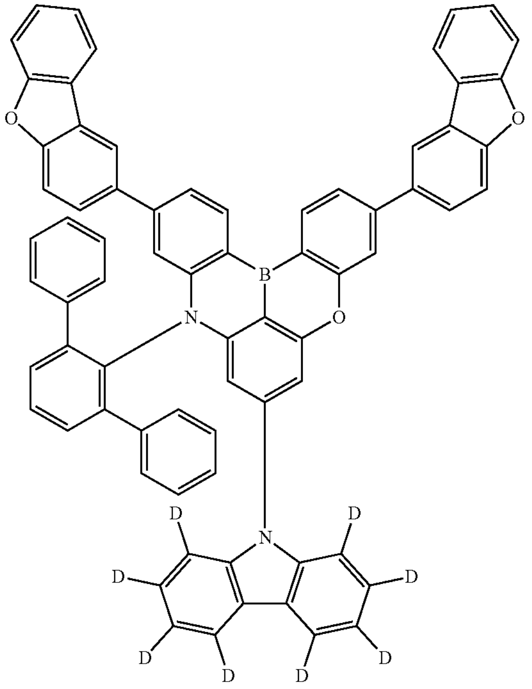
58
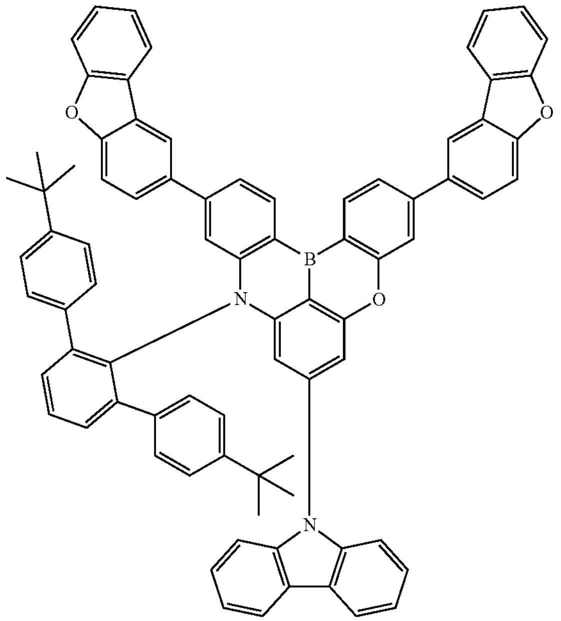
60
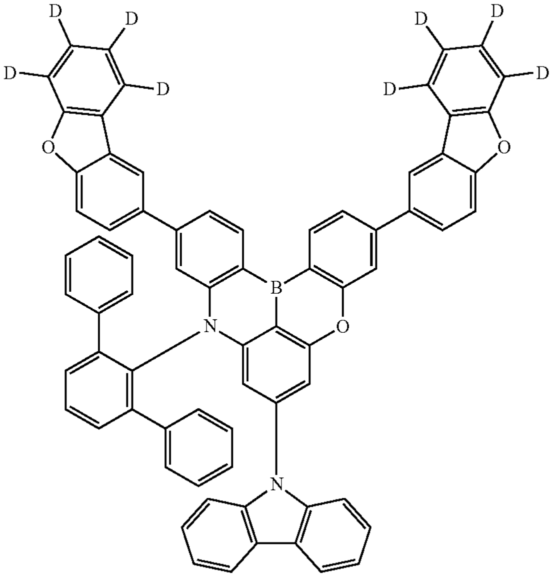

61
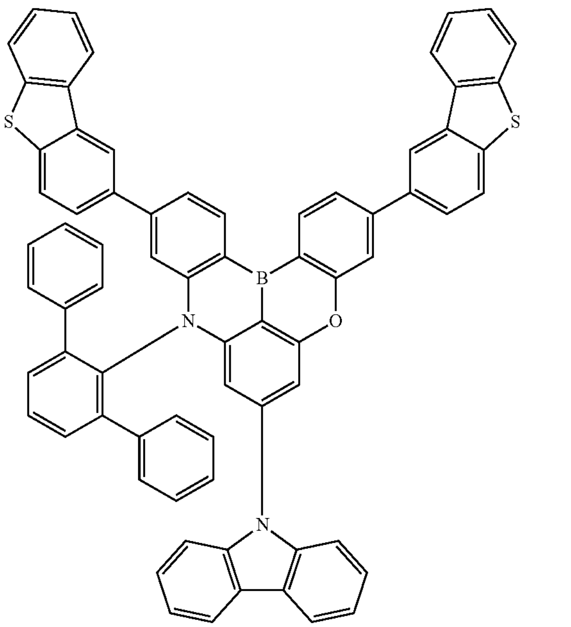
62
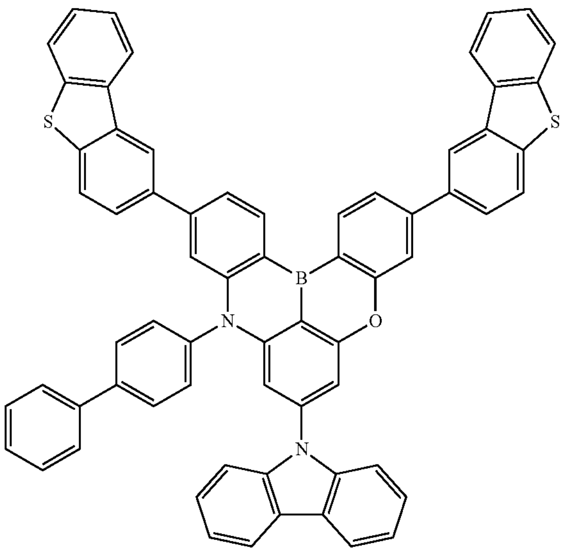
63
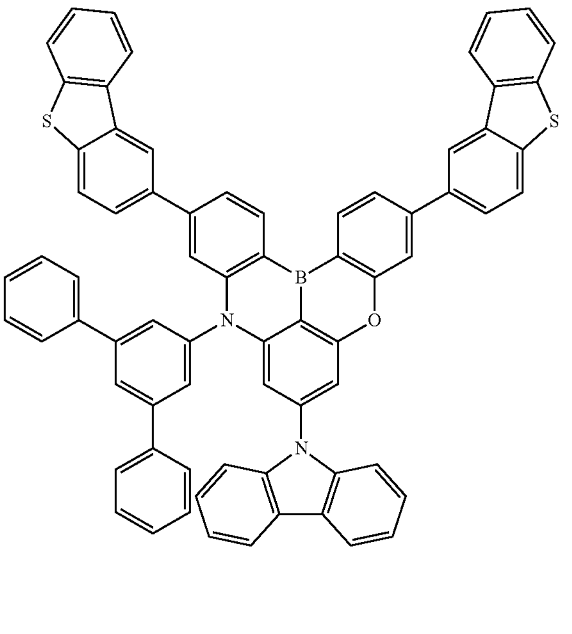
64
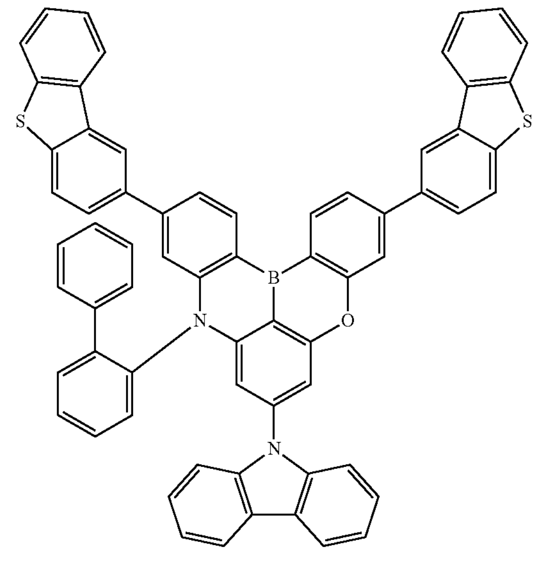

-continued
65
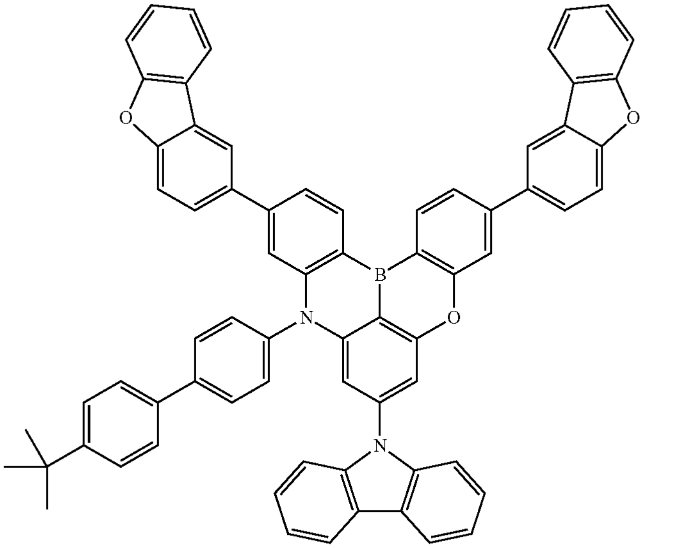
66
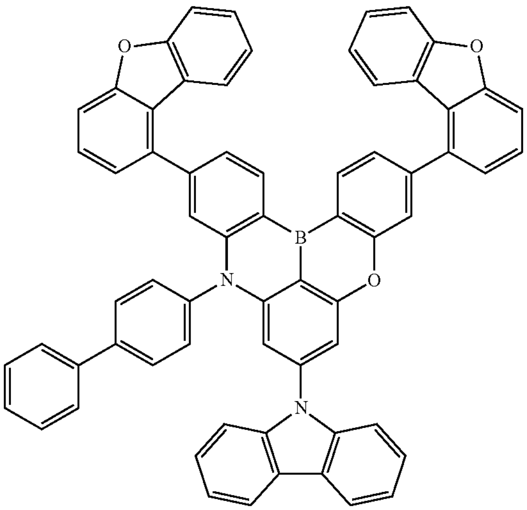
67
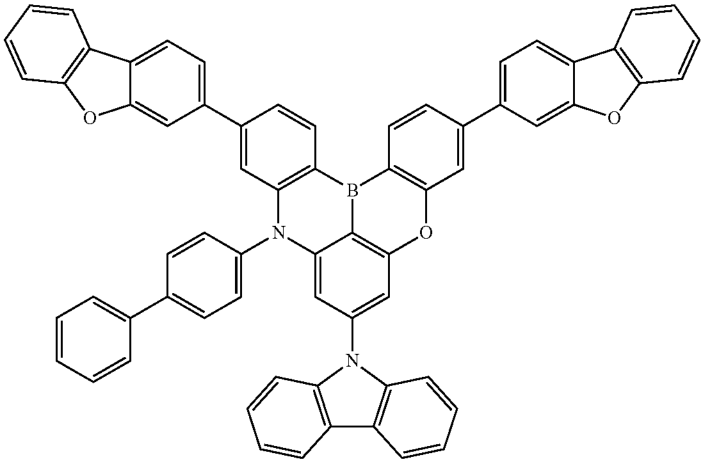

-continued
68
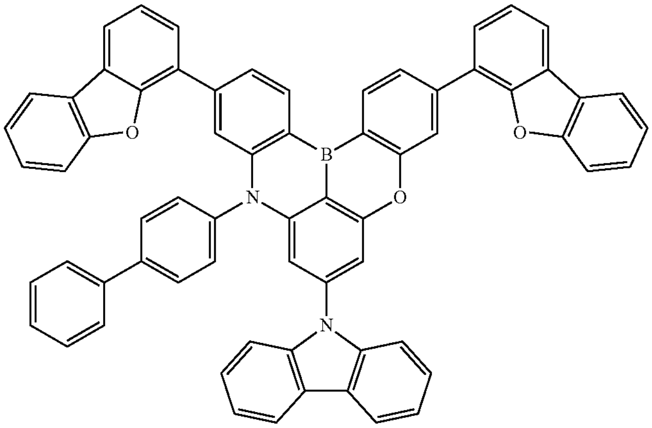
69
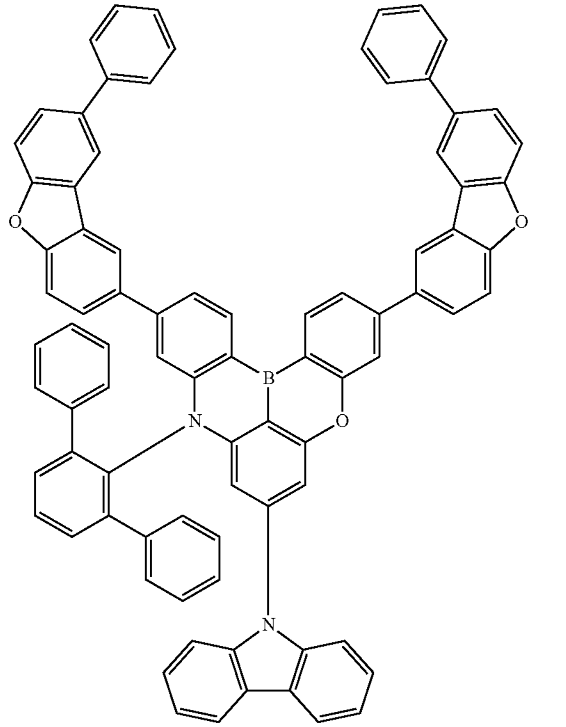
70
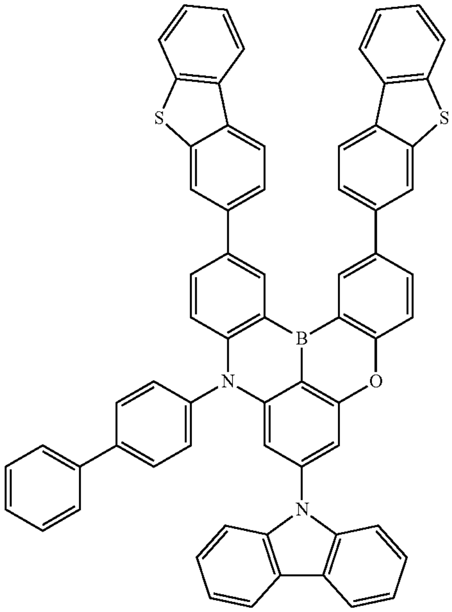

-continued
71
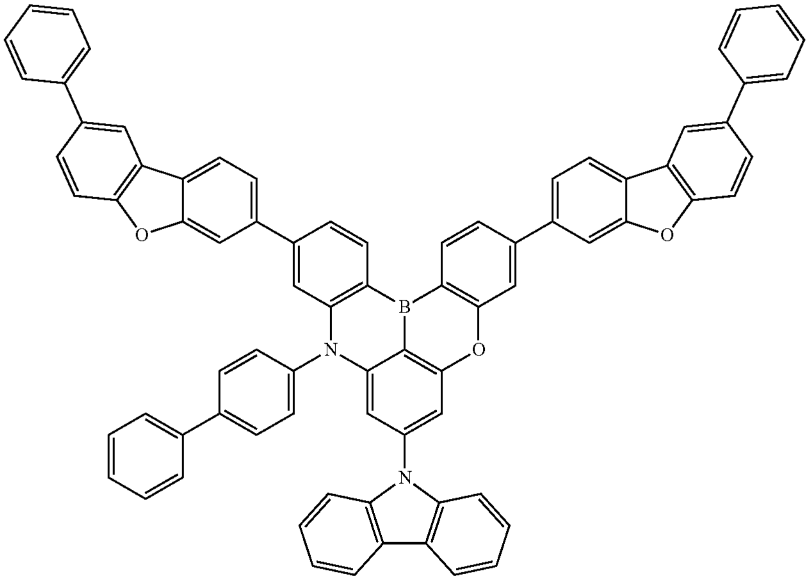
72
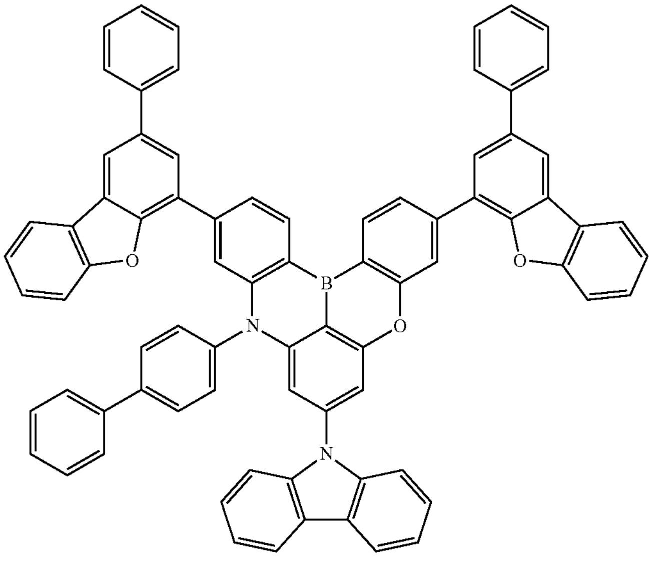

-continued
73
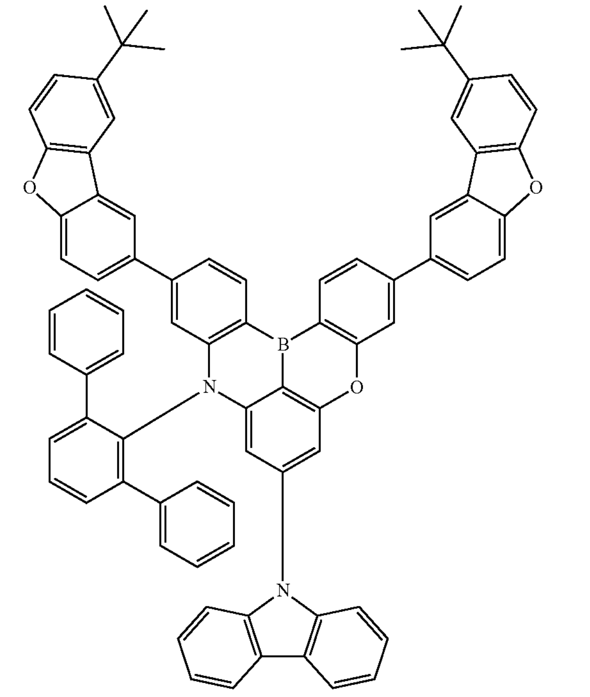
74
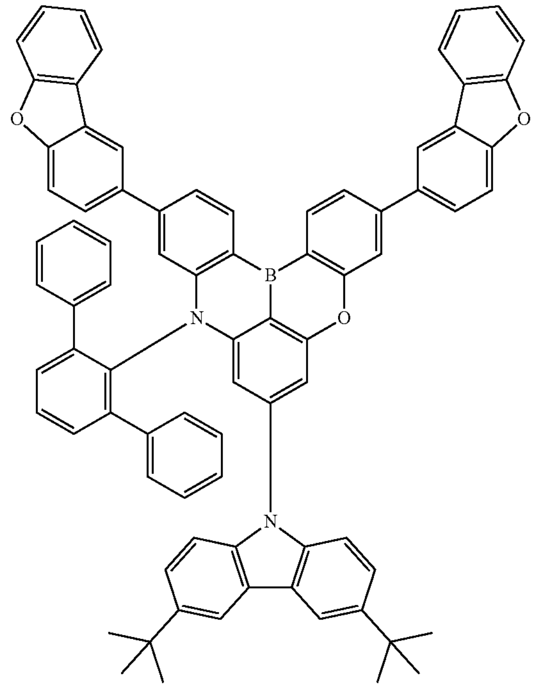
75
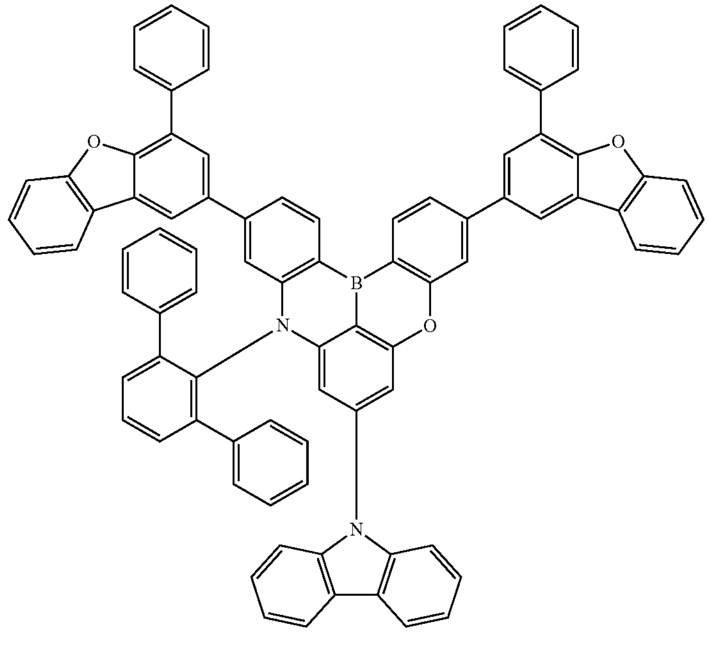

-continued
76
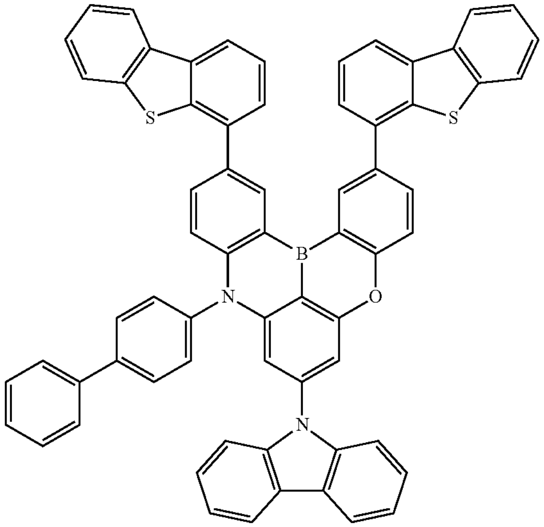
77
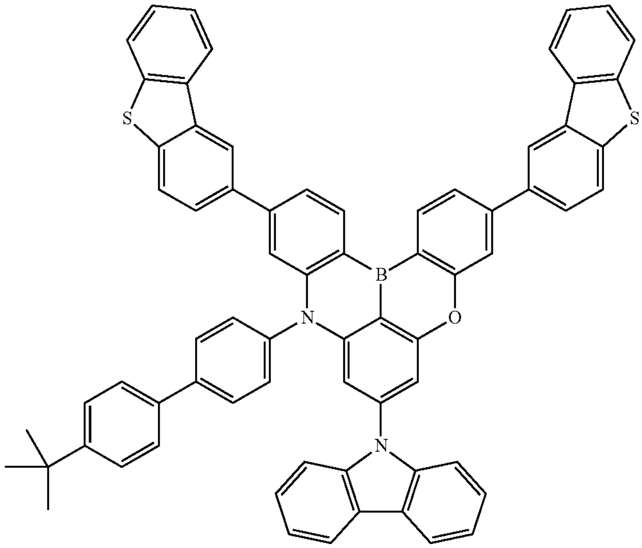

-continued
78
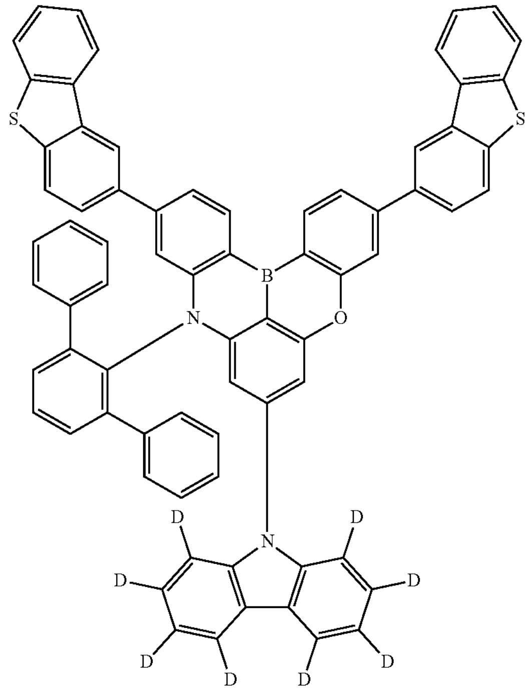
79
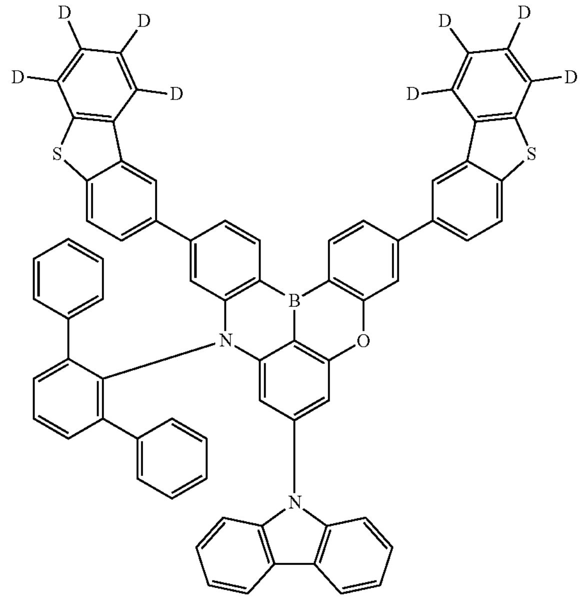
-continued
80
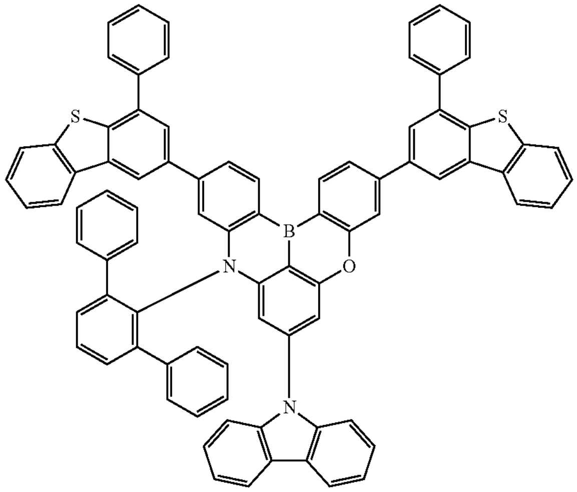

-continued
81
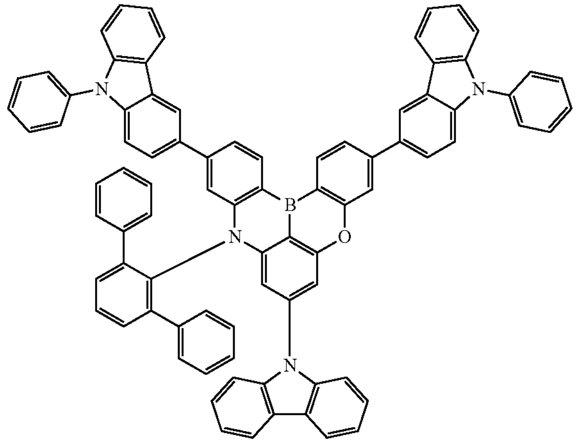
82
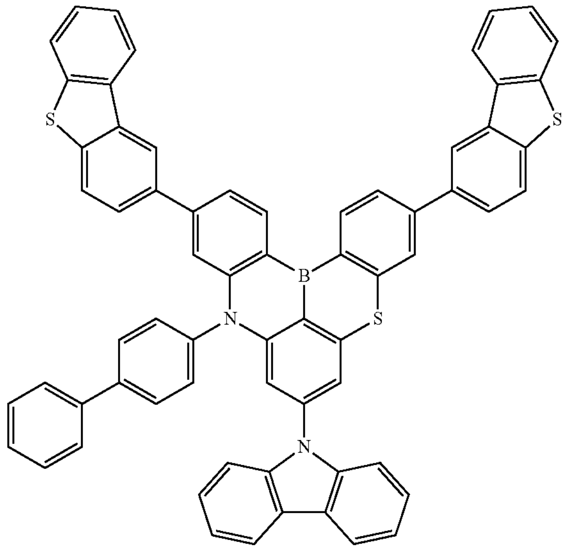
-continued
83
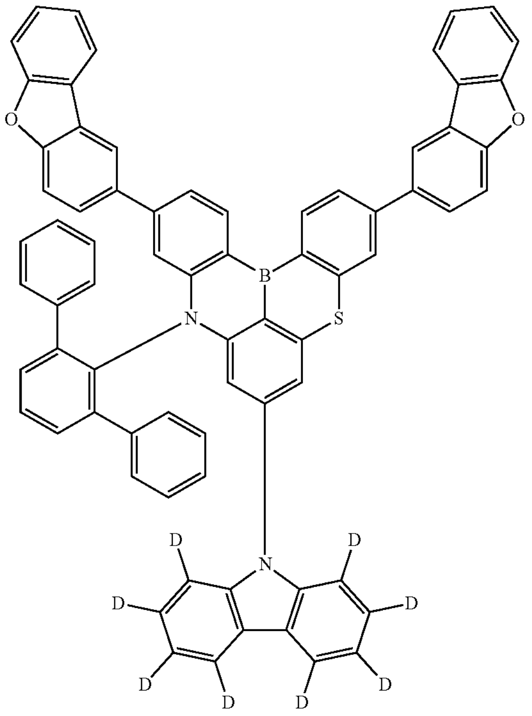
84
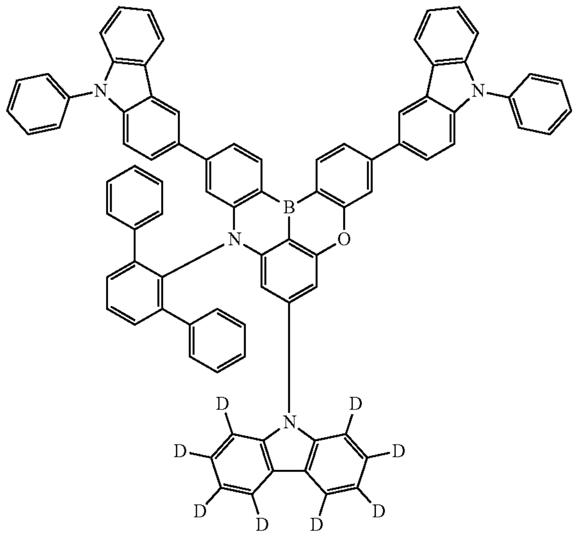

-continued
85
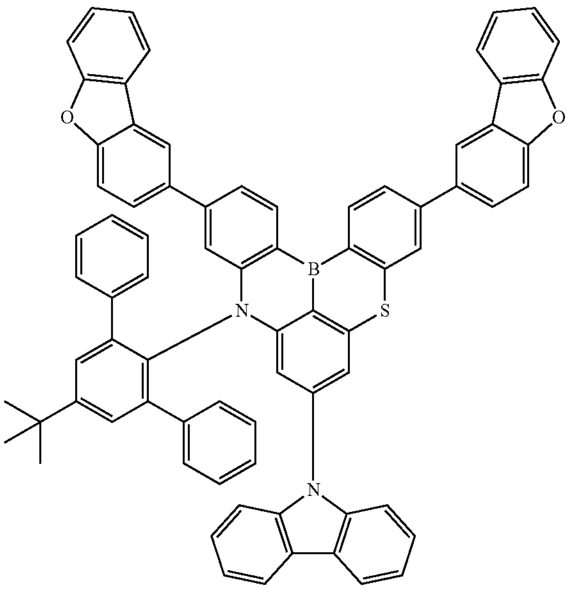
86
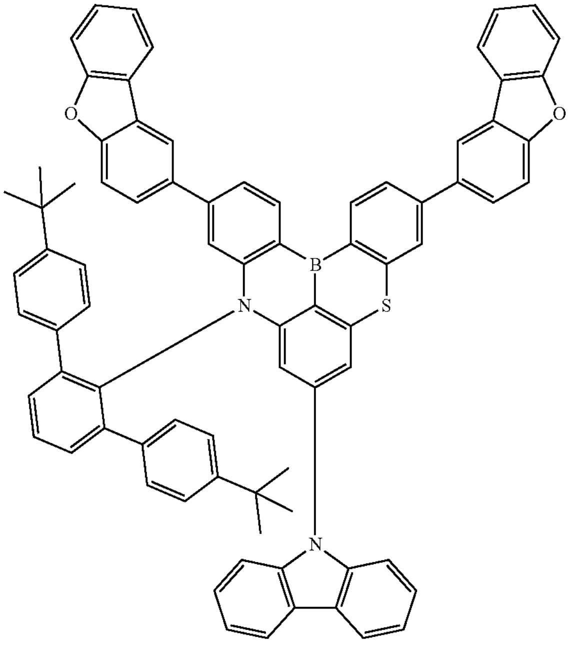
-continued
87
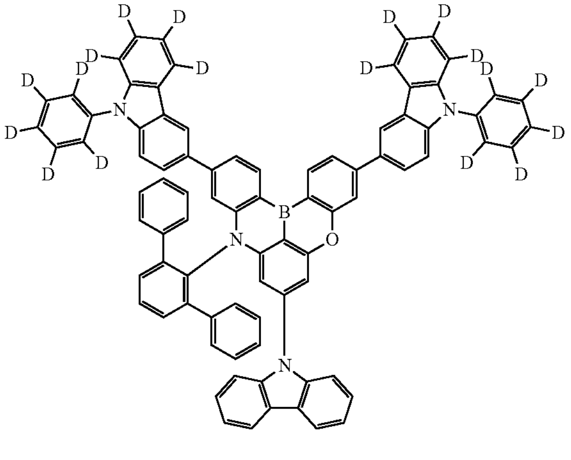
88
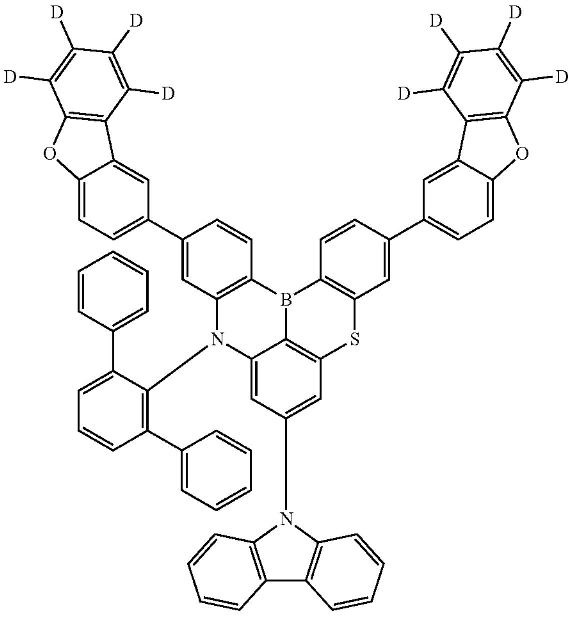

-continued
89
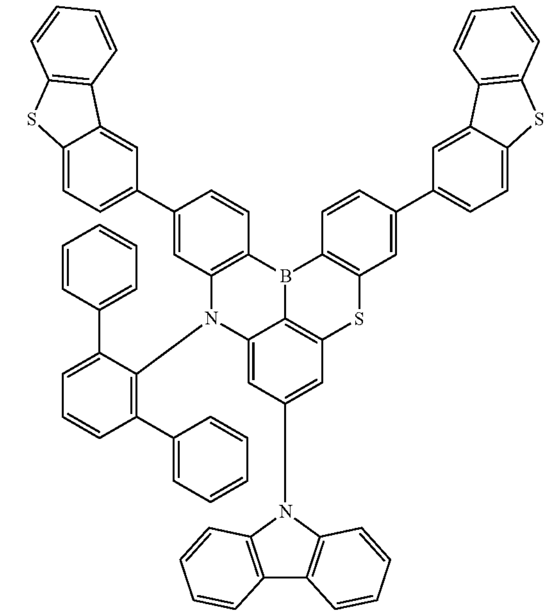
90
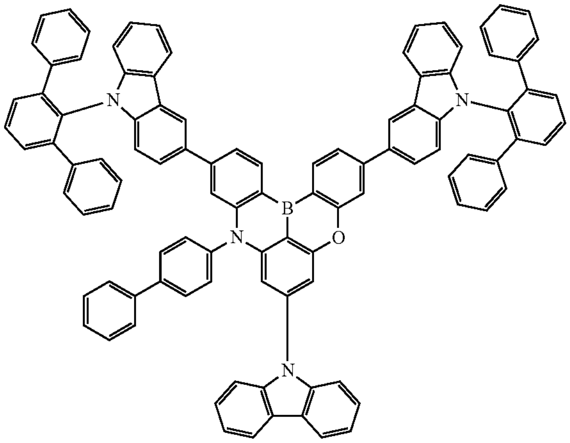
91
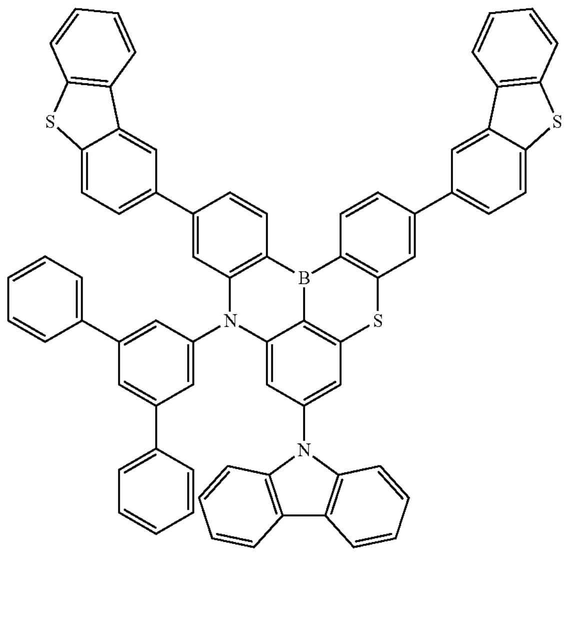
-continued
92
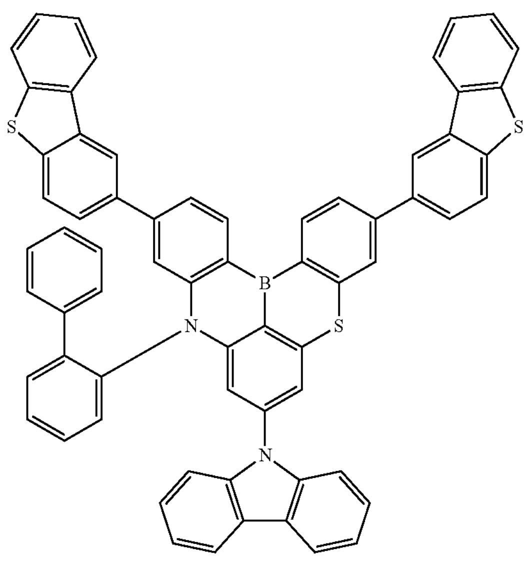
93
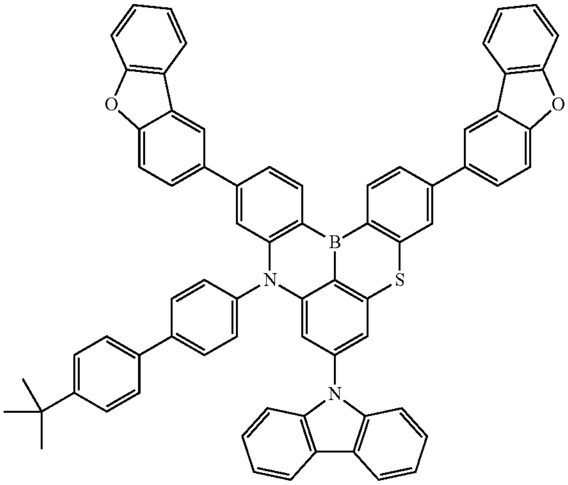
94
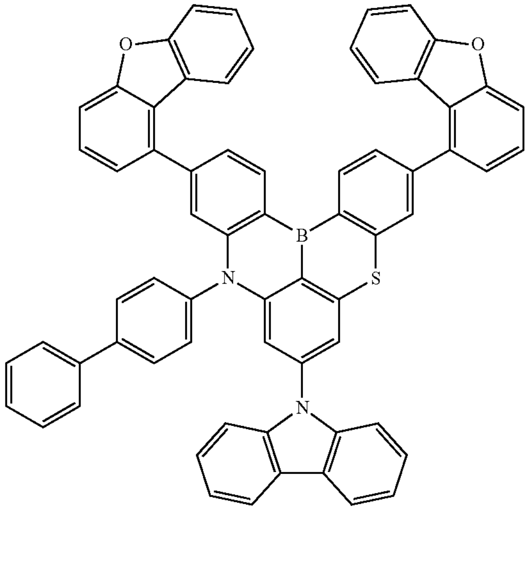

95
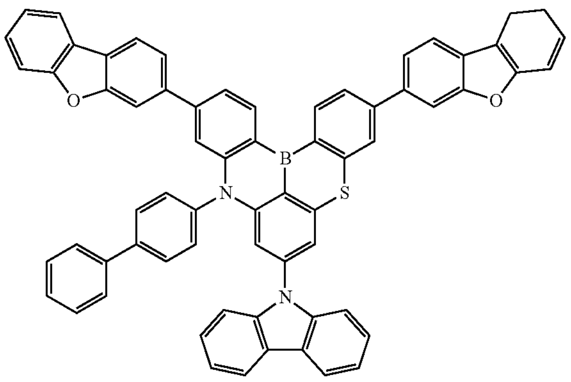
96
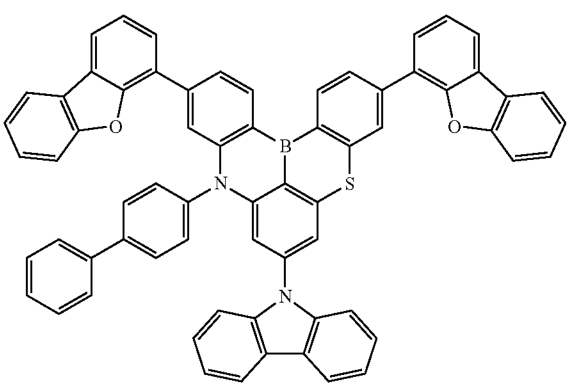
97
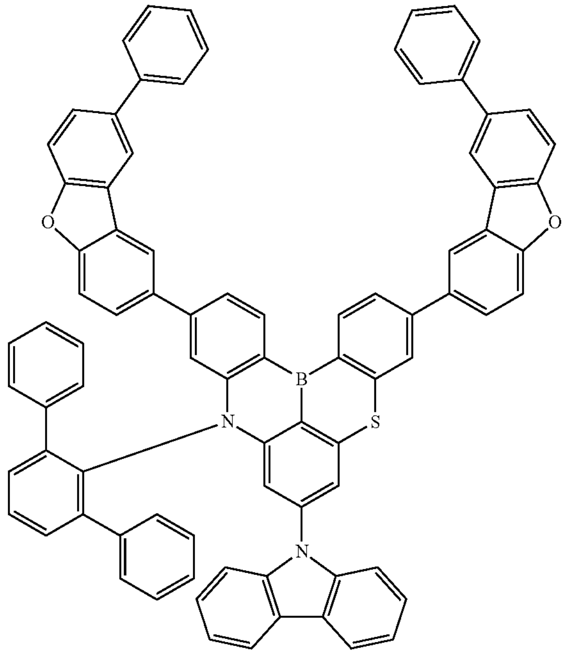
98
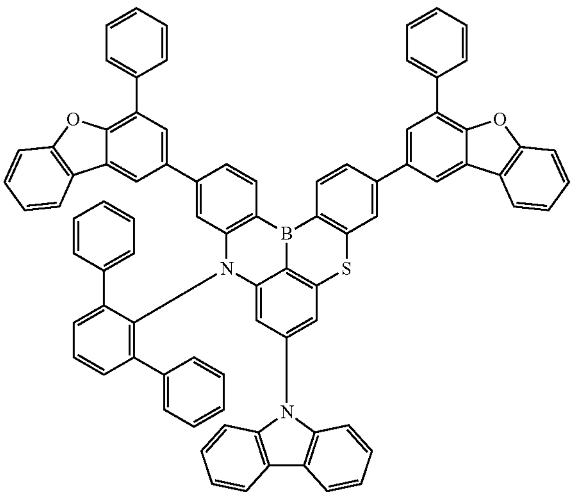
99
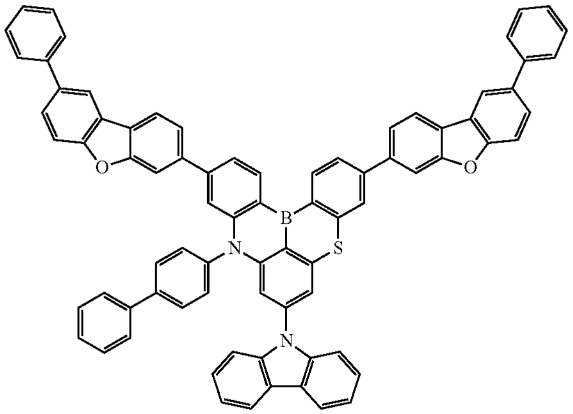
100
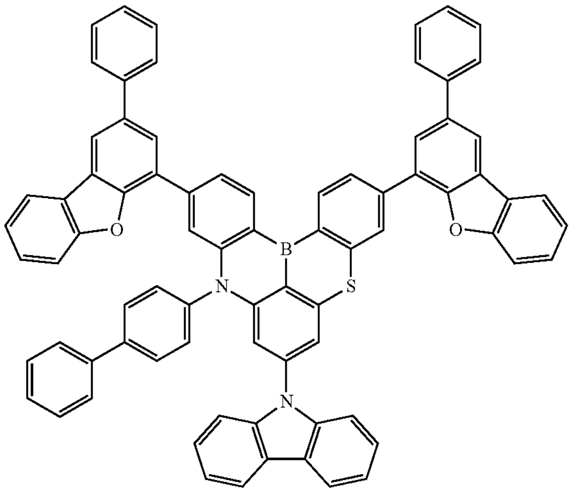

-continued
101
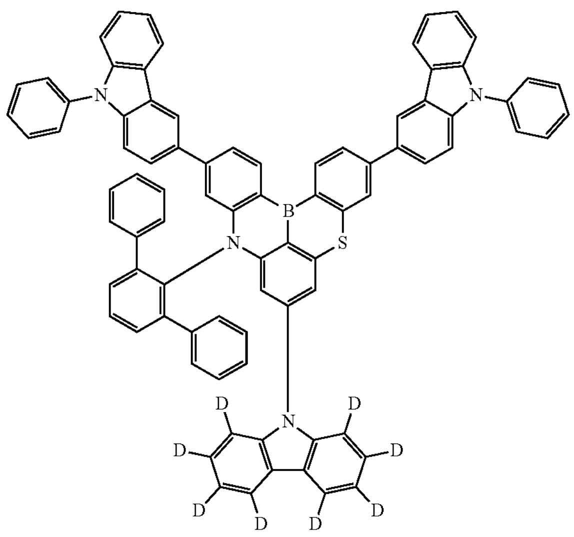
102
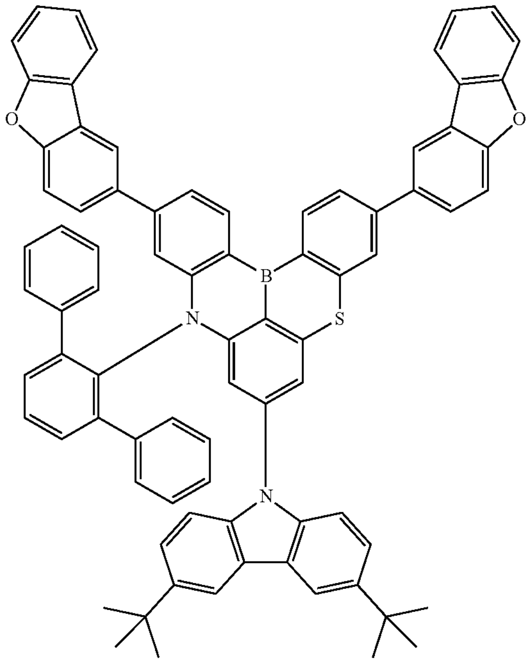
-continued
103
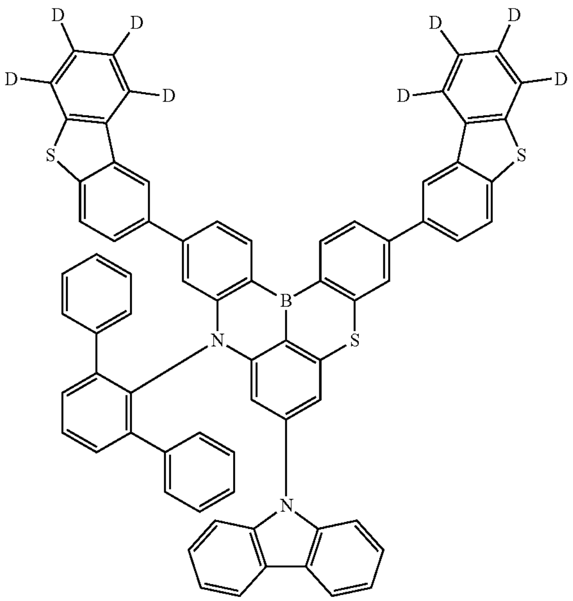
104
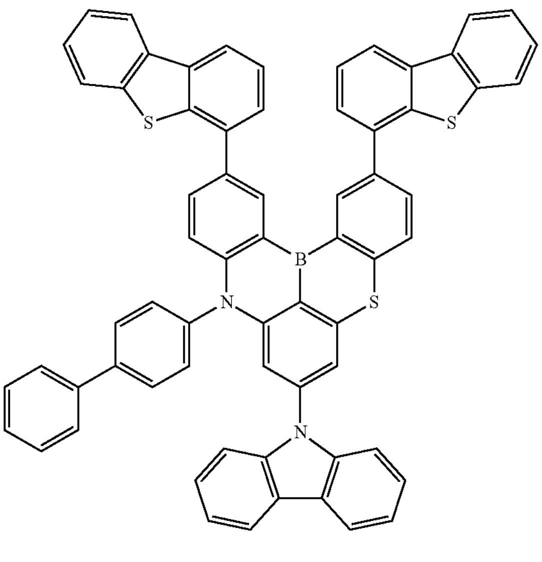

-continued
105
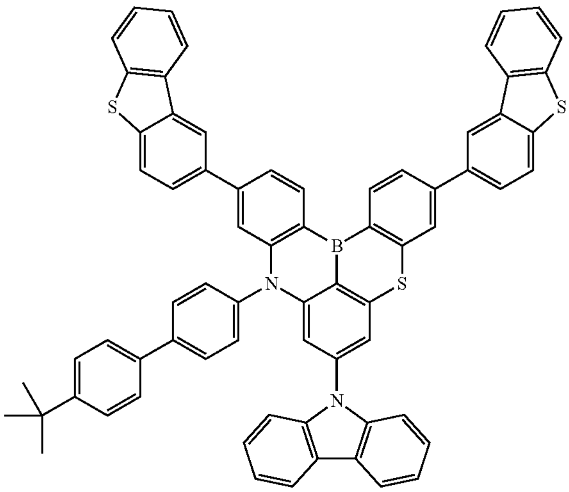
106
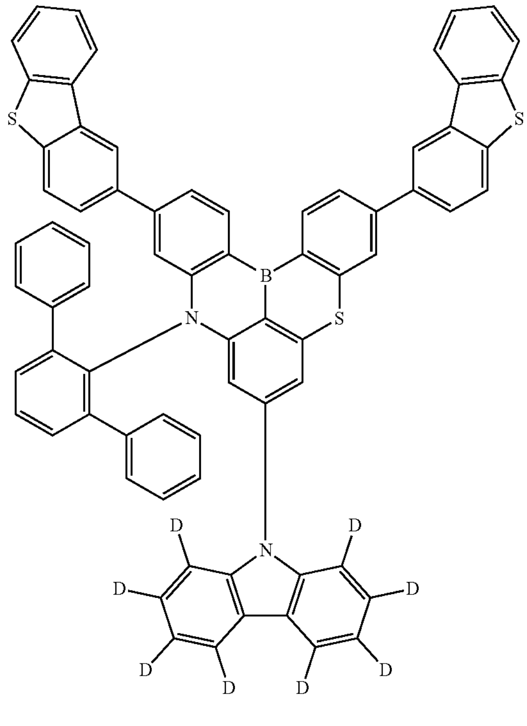
-continued
107
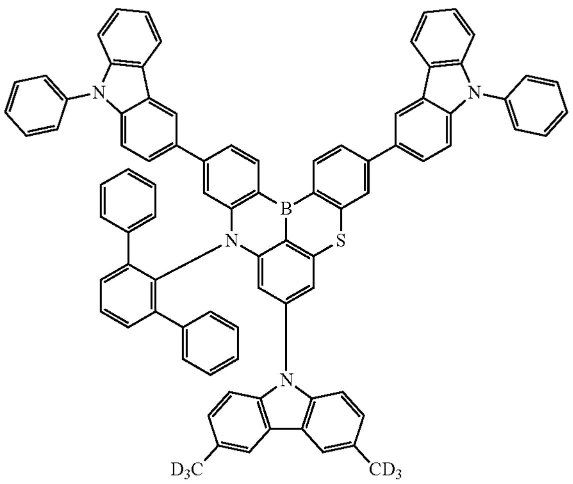
108
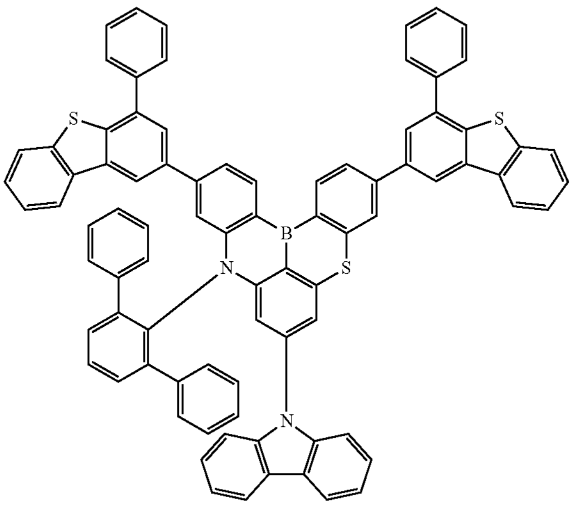

109
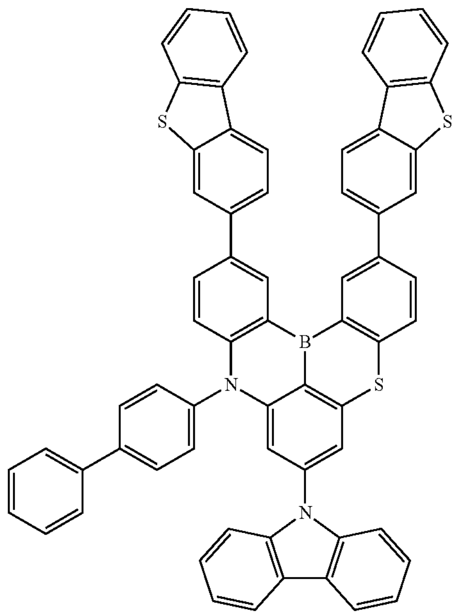
110
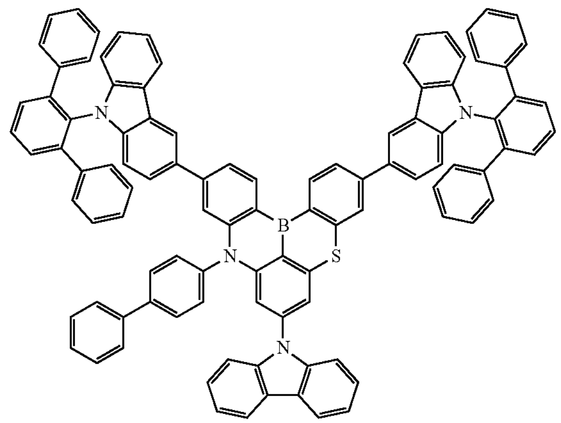
111
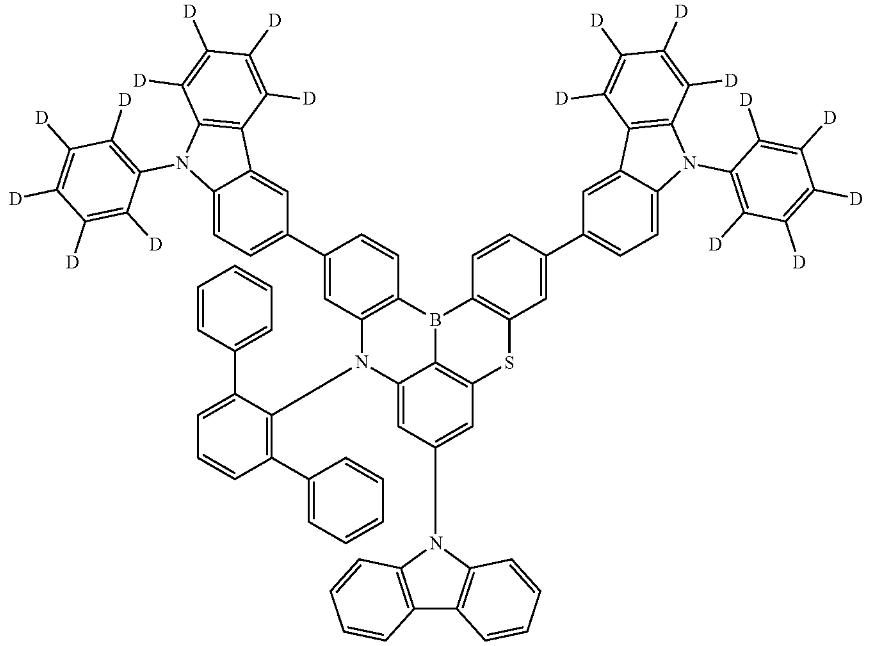

-continued
112
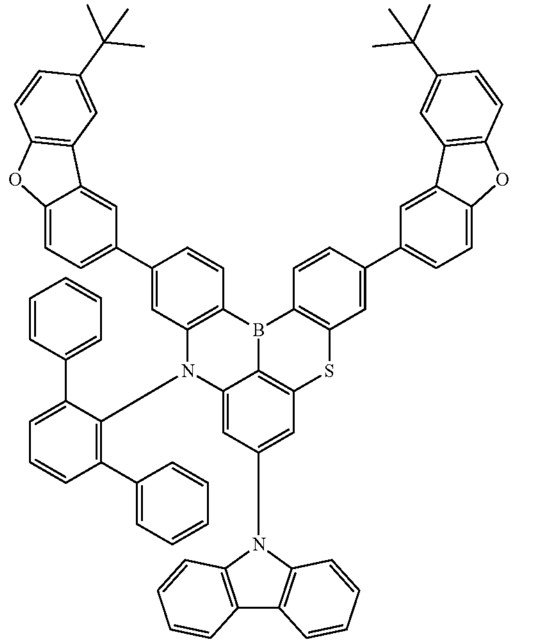
113
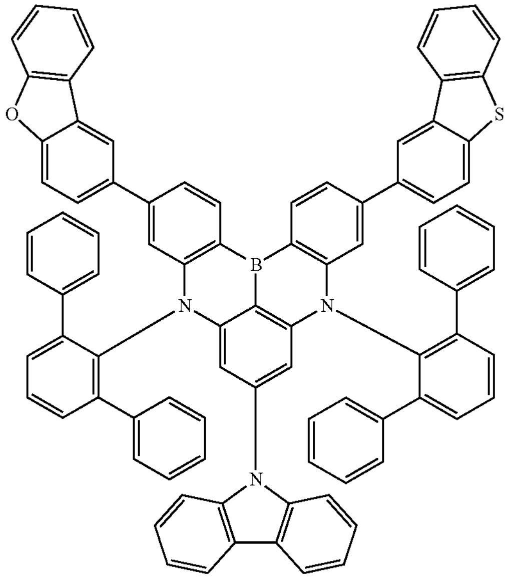
114
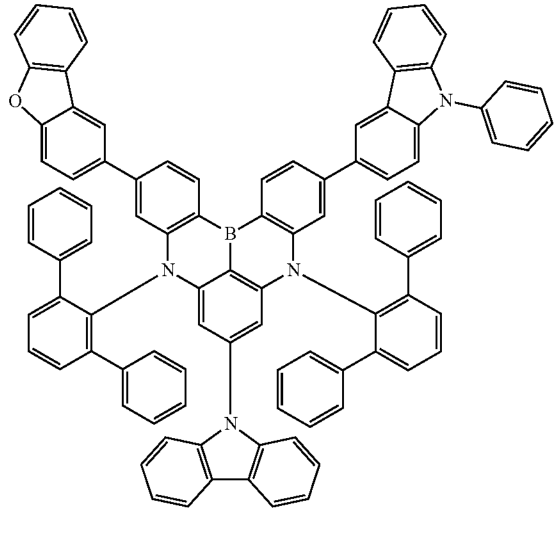
115
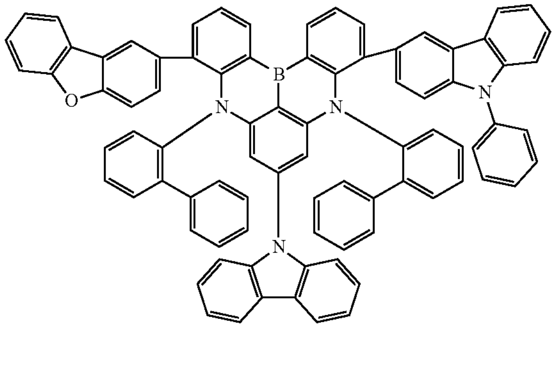

-continued
116
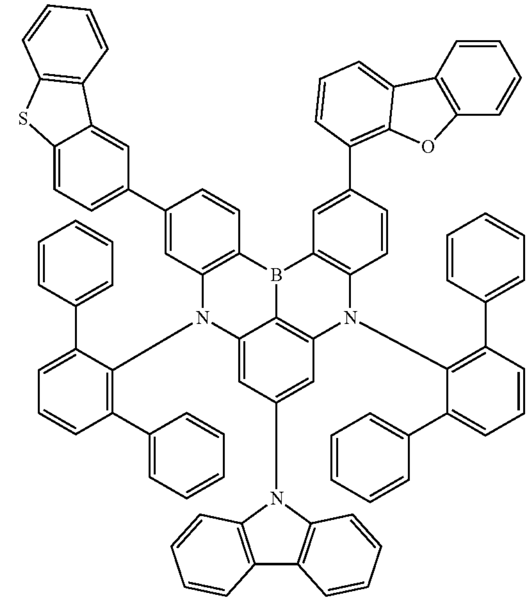
117
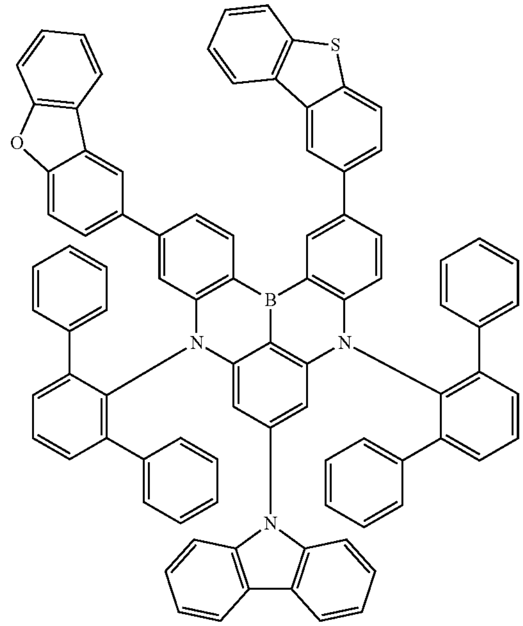
118
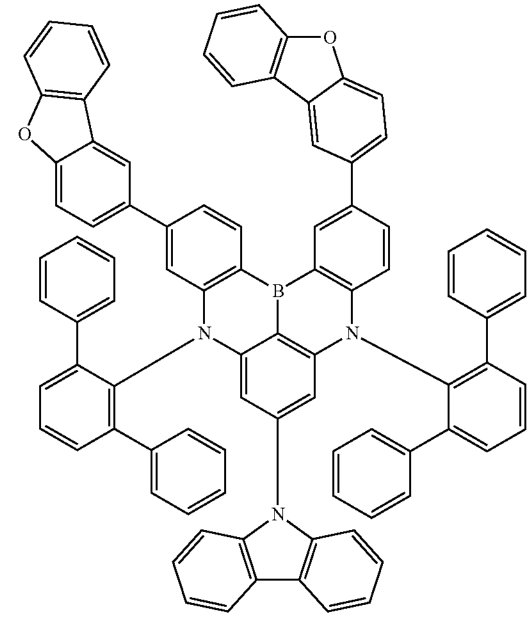
119
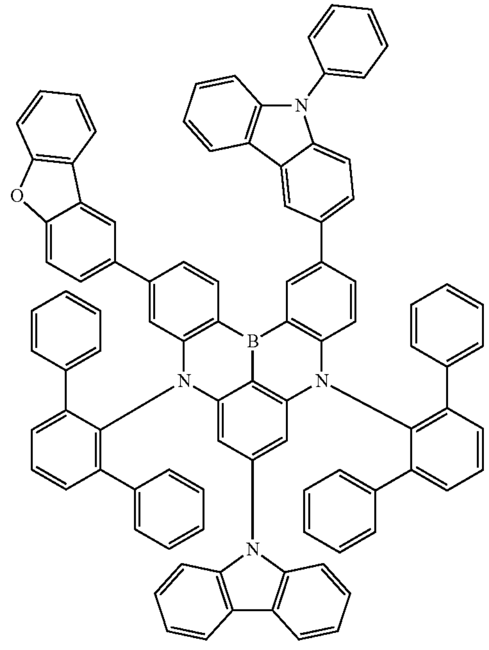

-continued
120
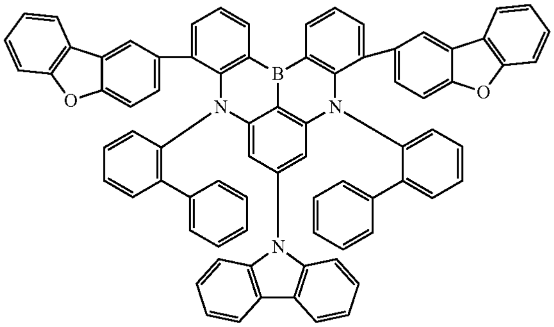
121
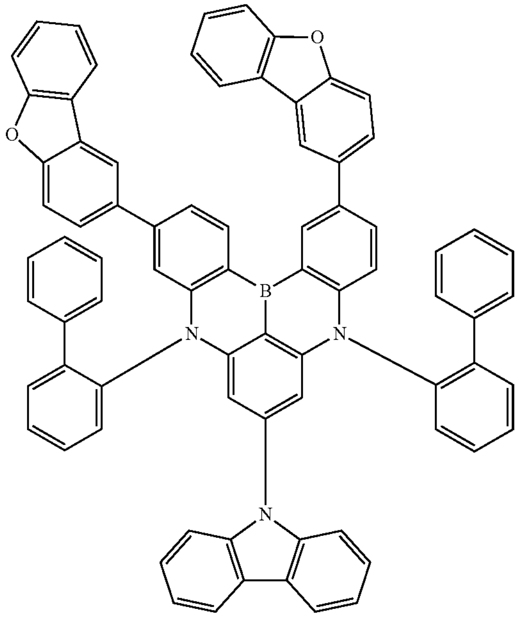
122
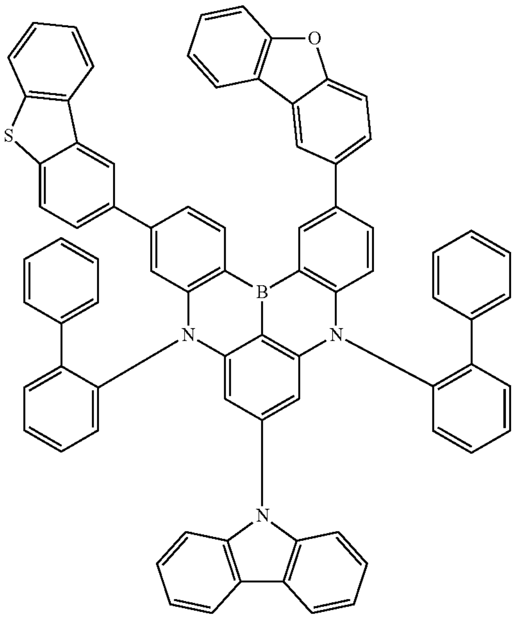
123
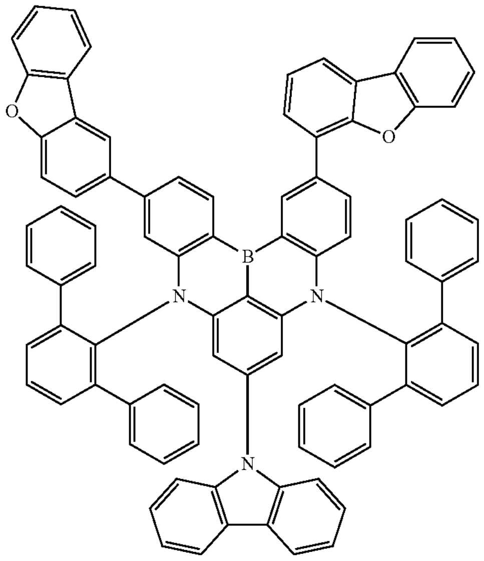

-continued
124
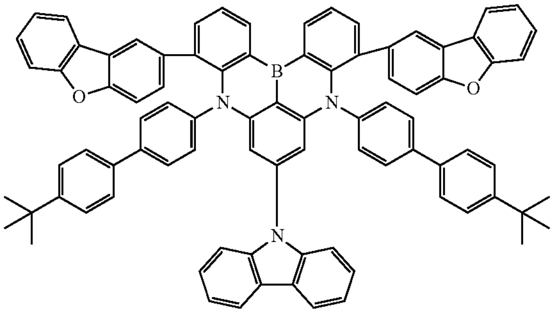
125
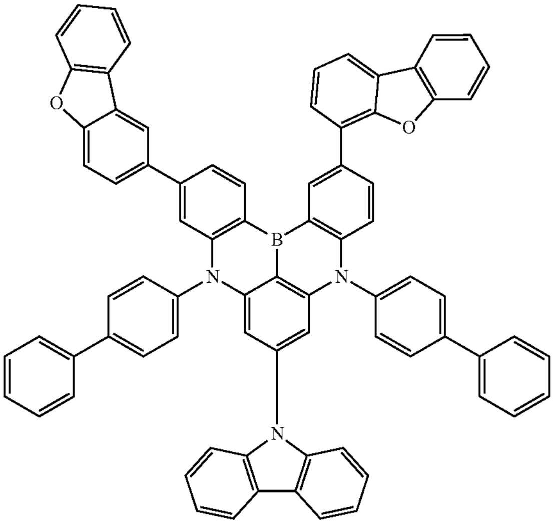
126
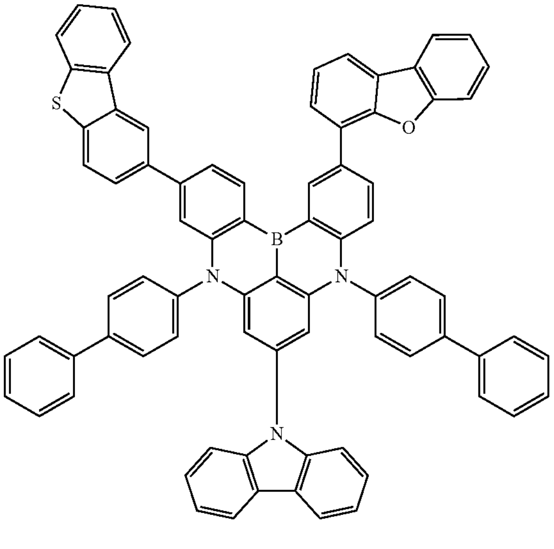
127
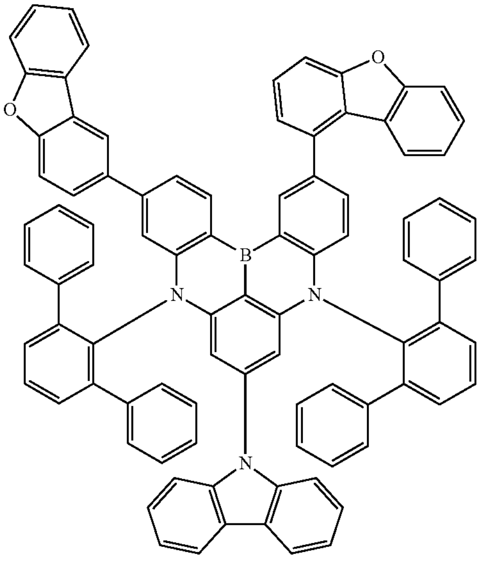

-continued
128
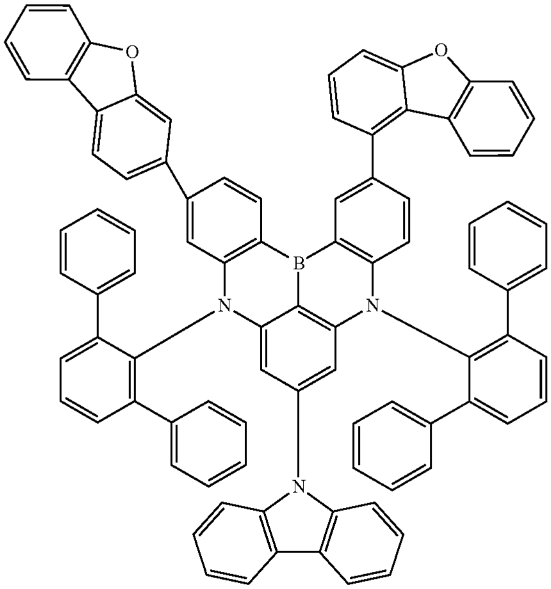
129
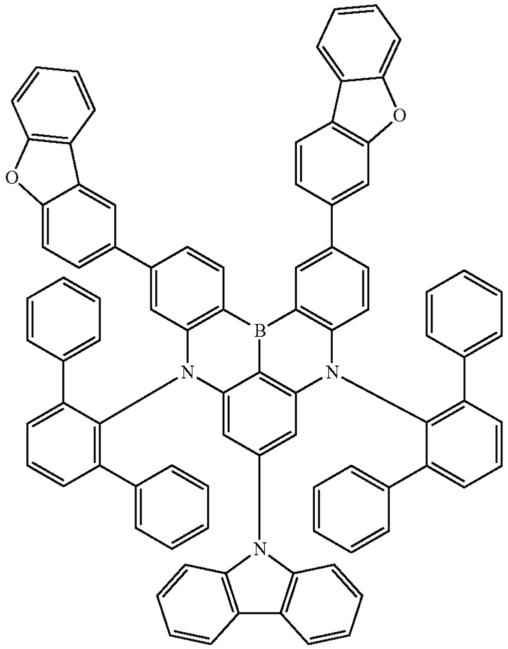
130
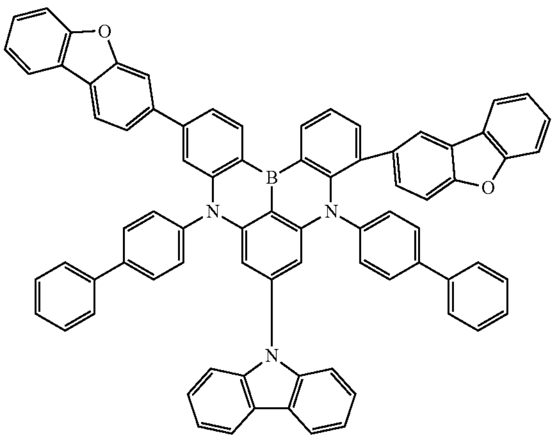
131
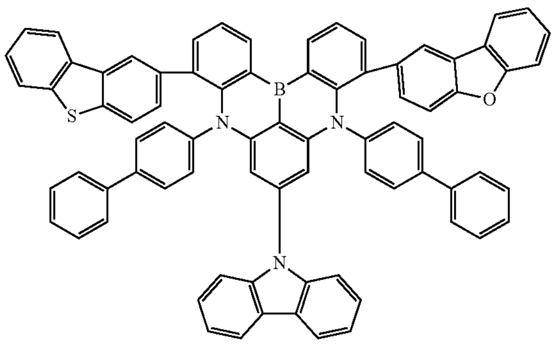

-continued

132

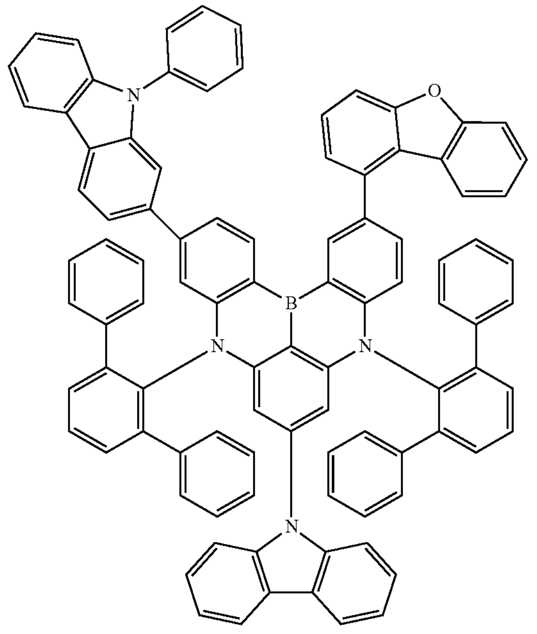

14. A light emitting device comprising:

a first electrode;

a hole transport region on the first electrode;

an emission layer on the hole transport region;

an electron transport region on the emission layer; and a second electrode on the electron transport region, wherein the emission layer comprises a first compound represented by Formula 1, and the hole transport region comprises a hole transport compound represented by Formula H-a:

Formula 1

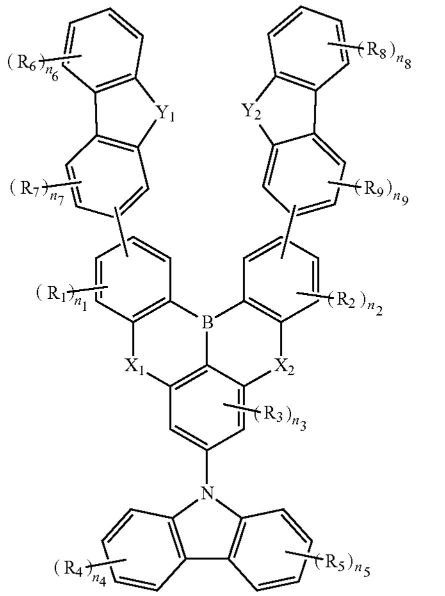

wherein, in Formula 1, $X_1$ and $X_2$ are each independently $NR_a$, O, or S, and at least one of $X_1$ or $X_2$ is $NR_a$, $Y_1$ and $Y_2$ are each independently $NR_b$, O, or S, $R_1$ to $R_9$ are each independently a hydrogen atom, a deuterium atom, a halogen atom, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $R_a$ and $R_b$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $n_1$, $n_2$, $n_7$, and $n_9$ are each independently an integer from 0 to 3, $n_3$ is an integer from 0 to 2, and $n_4$ to $n_6$, and $n_8$ are each independently an integer from 0 to 4, and Formula H-a

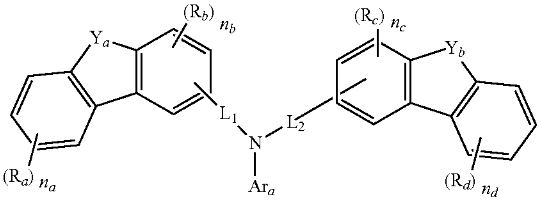

wherein, in Formula H-a, $Y_a$ and $Y_b$ are each independently $CR_eR_f$, $NR_g$, O, or S, when $Y_a$ is O then $Y_b$ is $CR_eR_f$, $NR_g$, or S, when $Y_a$ is $CR_eR_f$ then $Y_b$ is $NR_g$, O, or S, $Ar_a$ is a substituted or unsubstituted aryl group having 6 to 30 ring-forming carbon atoms, or a substituted or unsubstituted heteroaryl group having 2 to 30 ring-forming carbon atoms, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms, $R_a$ to $R_g$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring, $n_a$ and $n_d$ are each independently an integer from 0 to 4, and $n_b$ and $n_c$ are each independently an integer from 0 to 3.

15. The light emitting device of claim 14, wherein the first compound represented by Formula 1 is represented by Formula 2-1 or Formula 2-2:

Formula 2-1

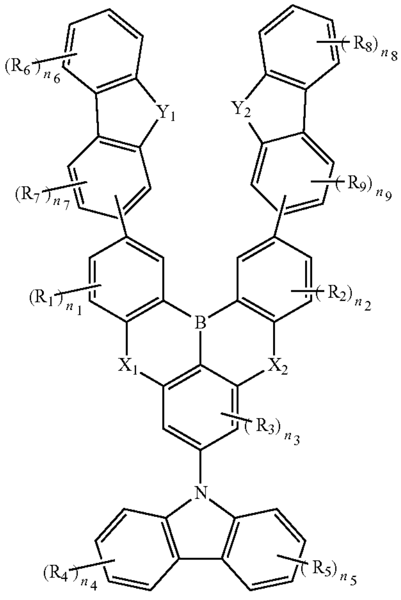

-continued

Formula 2-2

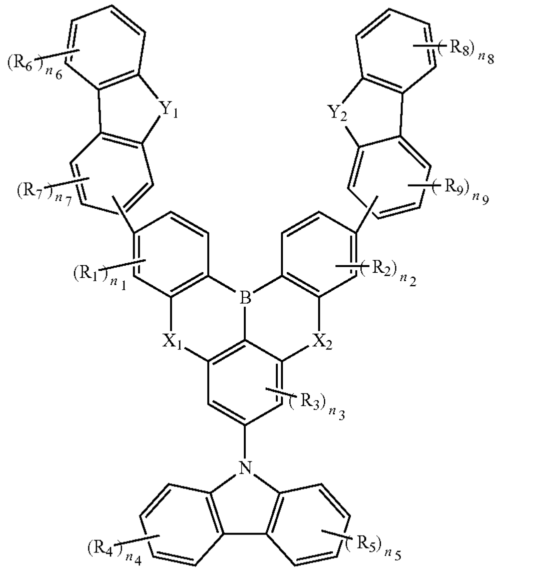

wherein, in Formula 2-1 and Formula 2-2, $X_1$, $X_2$, $Y_1$, $Y_2$, $R_a$, $R_b$, $R_1$ to $R_9$, and $n_1$ to ng are the same as defined in Formula 1.

16. The light emitting device of claim 14, wherein the first compound represented by Formula 1 is represented by any one selected from among Formula 3-1 to Formula 3-4:

Formula 3-1

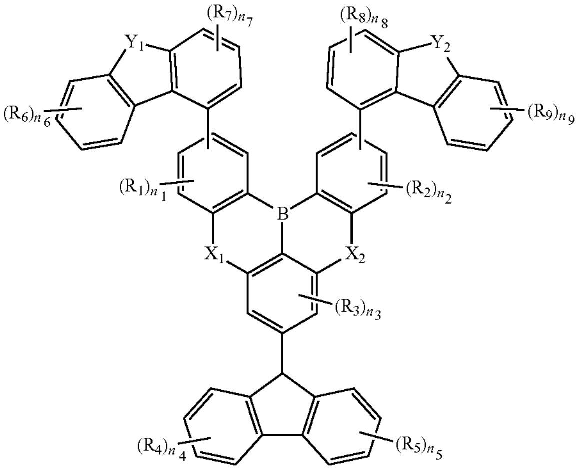

-continued
Formula 3-2
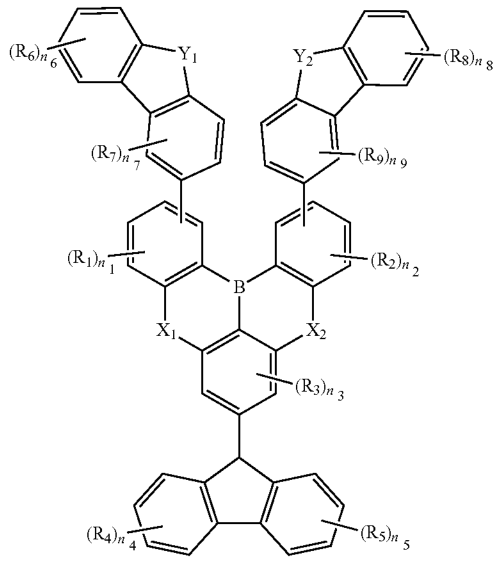
Formula 3-3
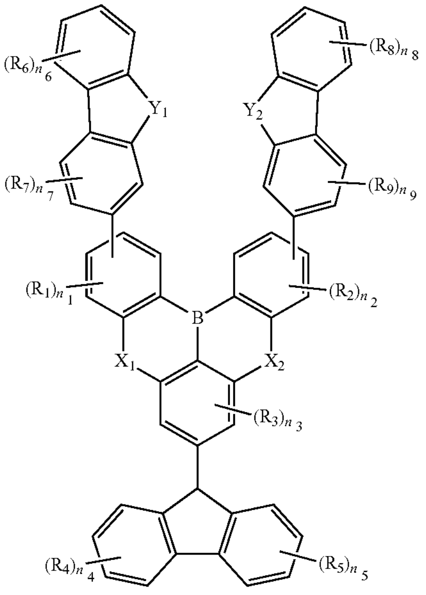
-continued
Formula 3-4
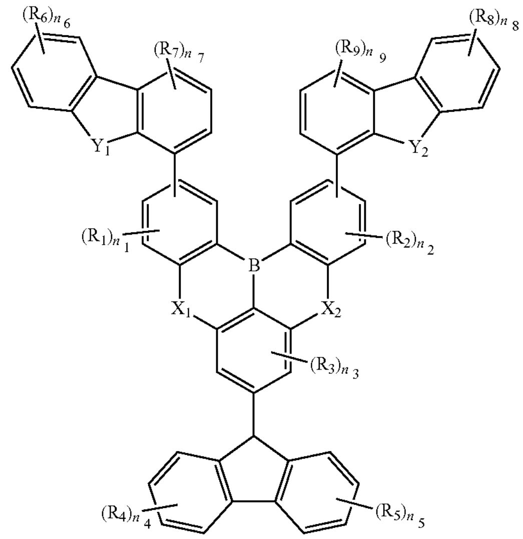
wherein, in Formula 3-1 to Formula 3-4,
$X_1$, $X_2$, $Y_1$, $Y_2$, $R_a$, $R_b$, $R_1$ to $R_9$, and $n_1$ to ng are the same as defined in Formula 1.
17. The light emitting device of claim 14, wherein the first compound represented by Formula 1 is represented by any one selected from among Formula 4-1 to Formula 4-3:
Formula 4-1
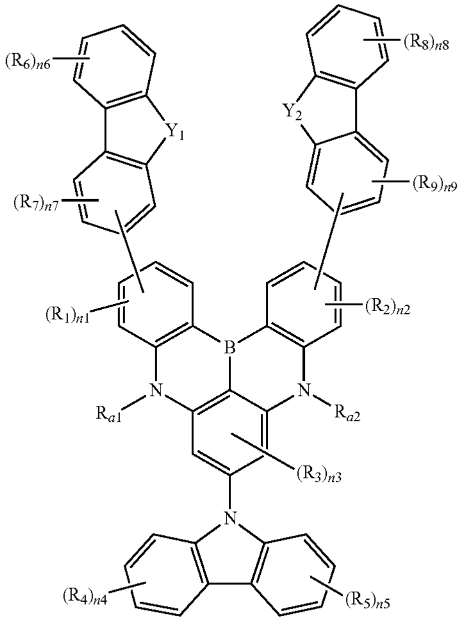

-continued

Formula 4-2

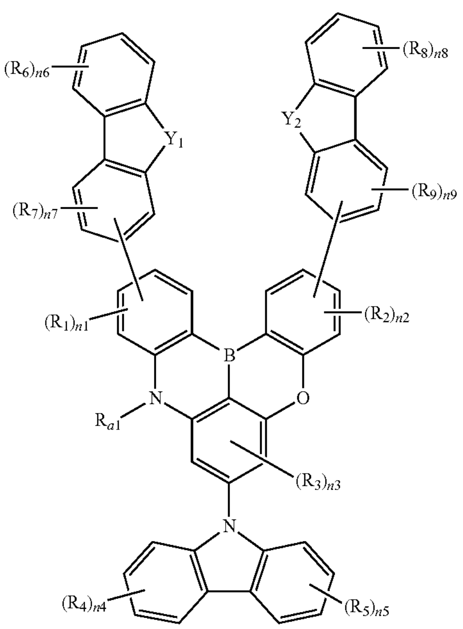

Formula 4-3

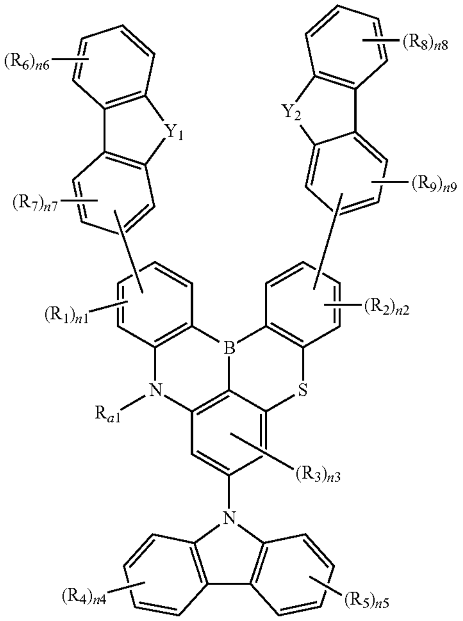

wherein, in Formula 4-1 to Formula 4-3, $R_{a1}$ to $R_{a2}$ are each independently a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Y_1$, $Y_2$, $R_a$, $R_b$, $R_1$ to $R_9$, and $n_1$ to ng are the same as defined in Formula 1.

18. The light emitting device of claim 14, wherein the first compound represented by Formula 1 is represented by any one selected from among Formula 5-1 to Formula 5-3:

Formula 5-1

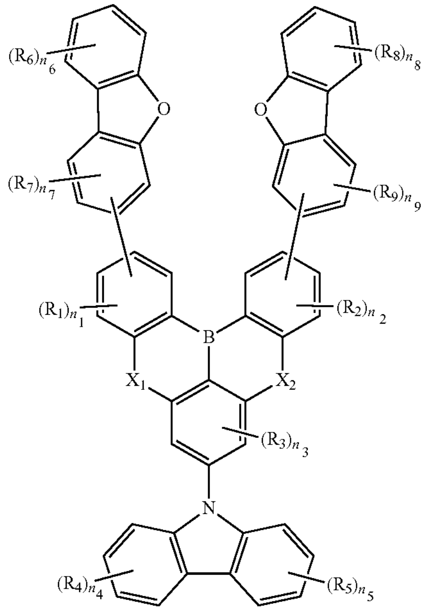

Formula 5-2

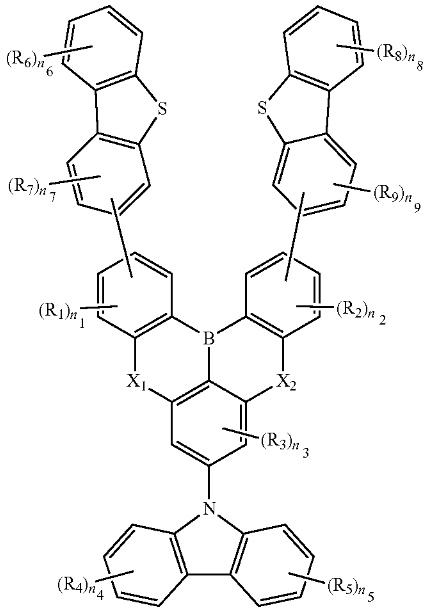

-continued

Formula 5-3

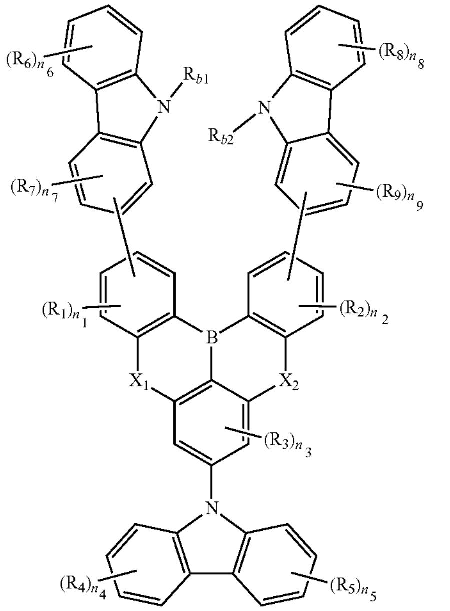

wherein, in Formulae 5-1 to 5-3, $R_{b1}$ to $R_{b2}$ are each independently a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $X_1$, $X_2$, $R_a$, $R_b$, $R_1$ to $R_9$, and $n_1$ to ng are the same as defined in Formula 1.

19. The light emitting device of claim 14, wherein, in Formula 1, when each of $X_1$ and $X_2$ is $NR_a$, $R_a$ is represented by any one selected from among Formulae 6-1 to 6-4:

Formula 6-1

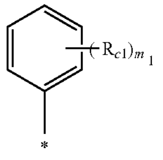

Formula 6-2

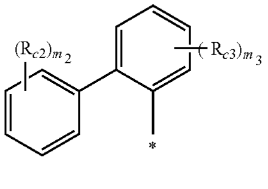

-continued

Formula 6-3

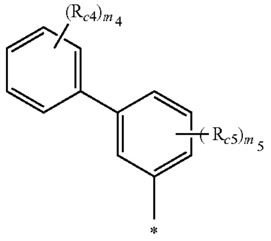

Formula 6-4

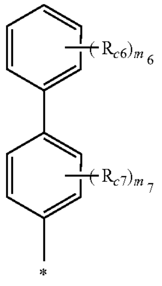

wherein, in Formula 6-1 to Formula 6-4, $R_{c1}$ to $R_{c7}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $m_1$, $m_2$, $m_4$, and $m_6$ are each independently an integer from 0 to 5, $m_3$, $m_5$, and $m_7$ are each independently an integer from 0 to 4, and "—— * *" is a position linked to the nitrogen atom.

20. The light emitting device of claim 14, wherein the first compound comprises at least one selected from among compounds represented by Compound Group 1:

Compound Group 1
1
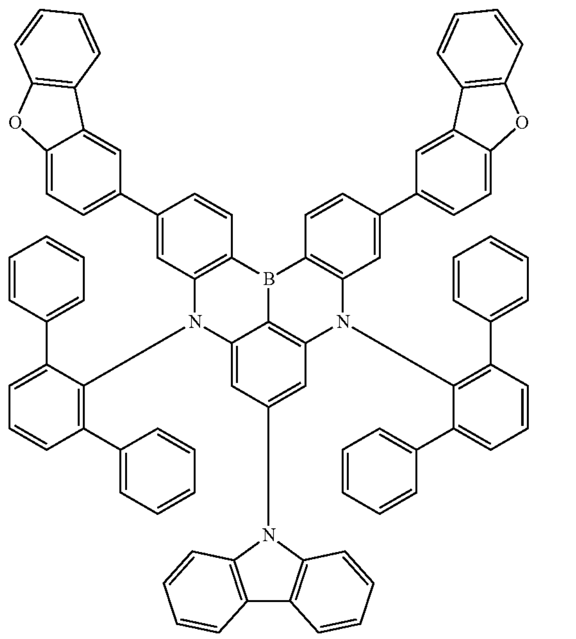
2
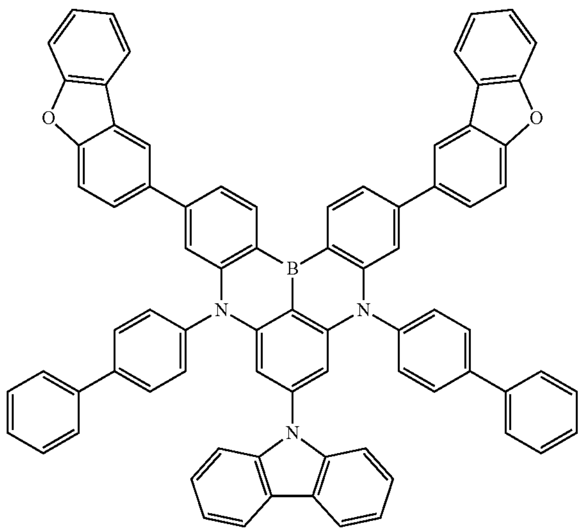
3
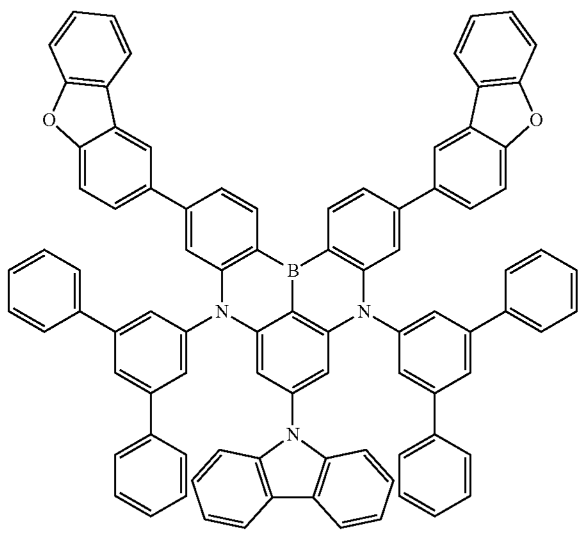
4
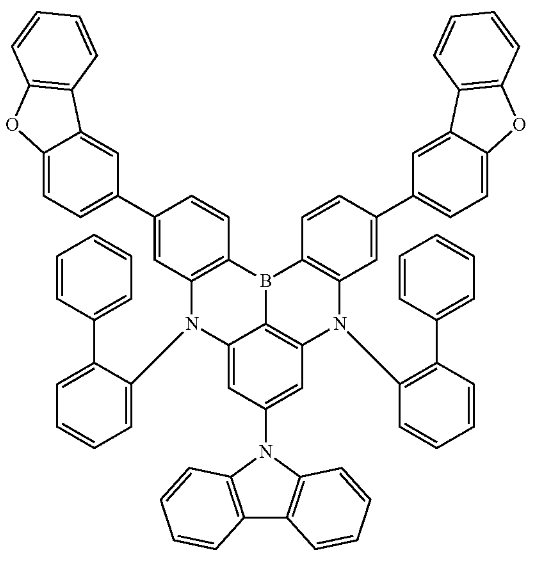

-continued
5
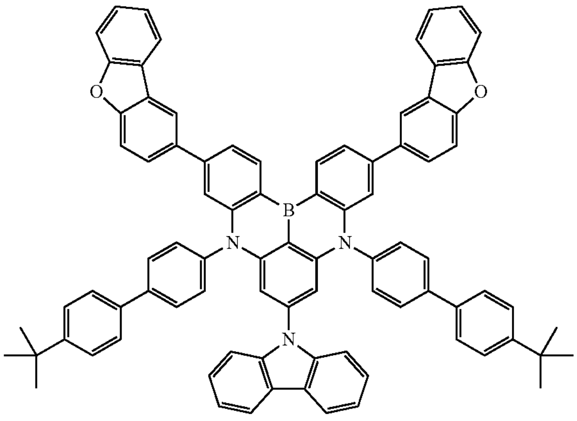
6
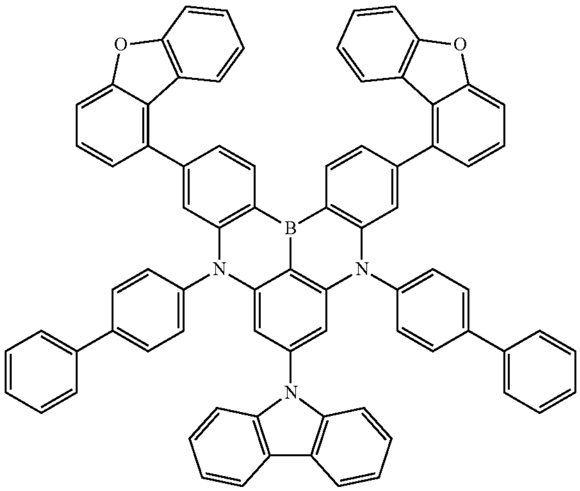
7
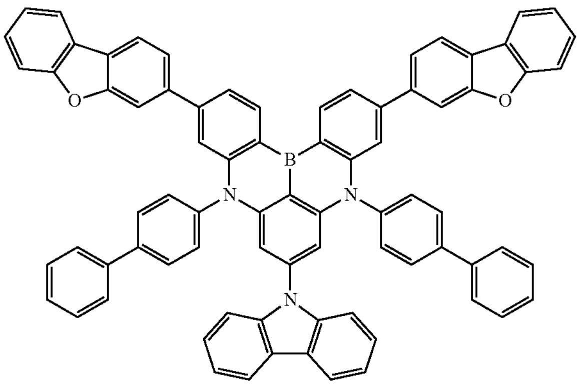
8
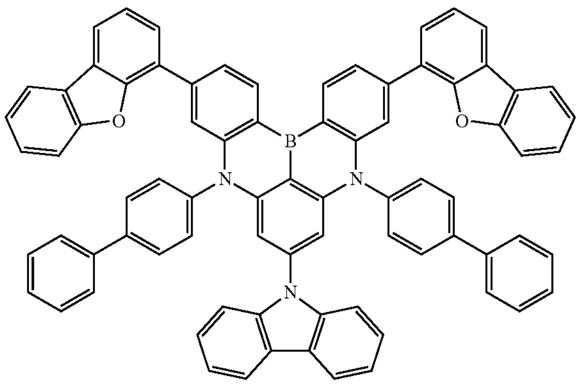
9
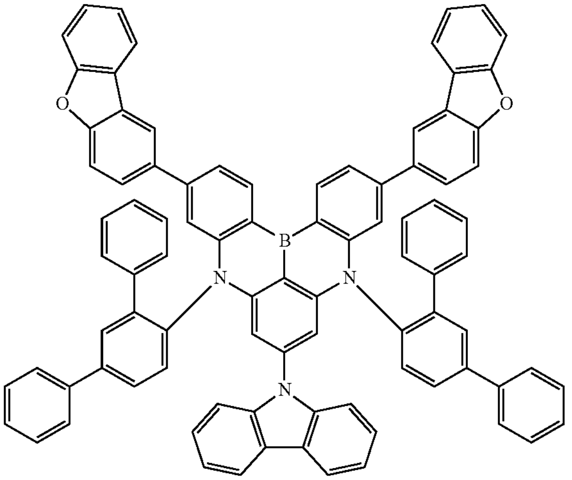
10
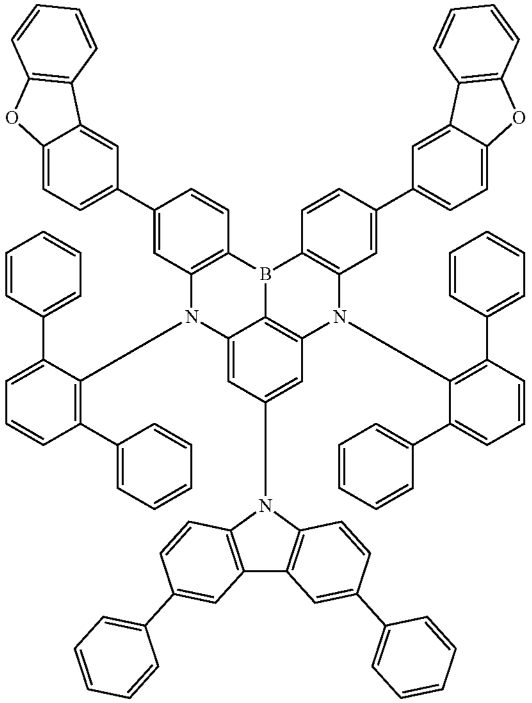

-continued
11
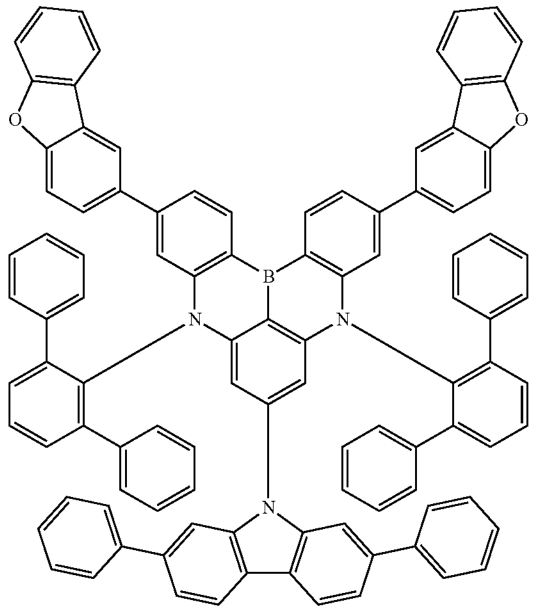
12
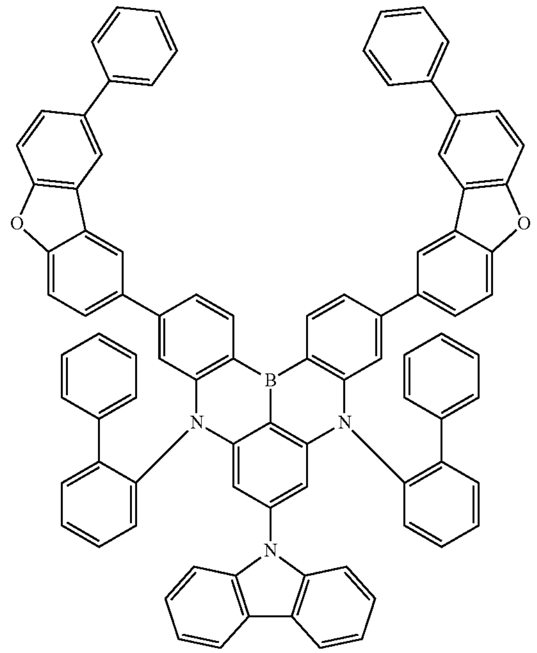
13
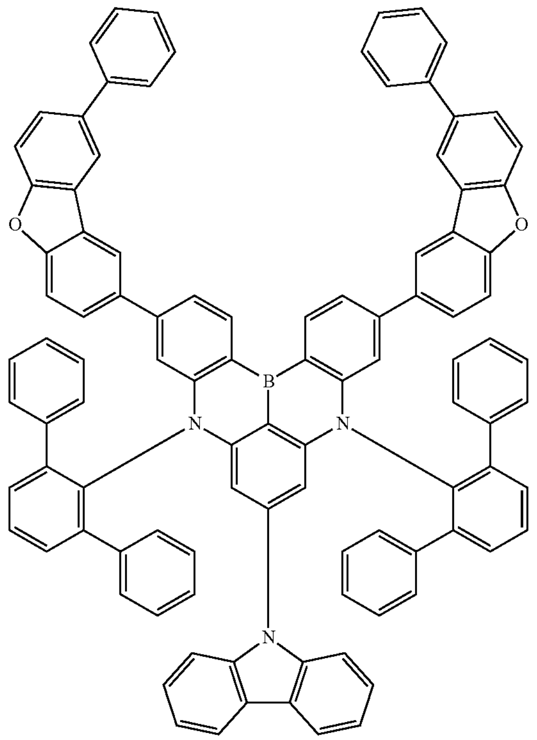
14
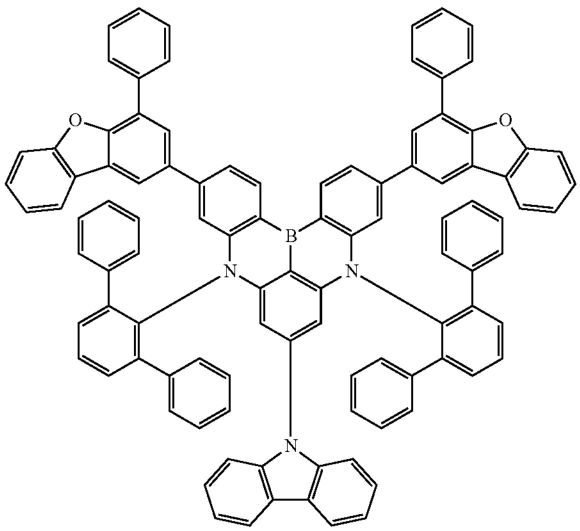

-continued
15
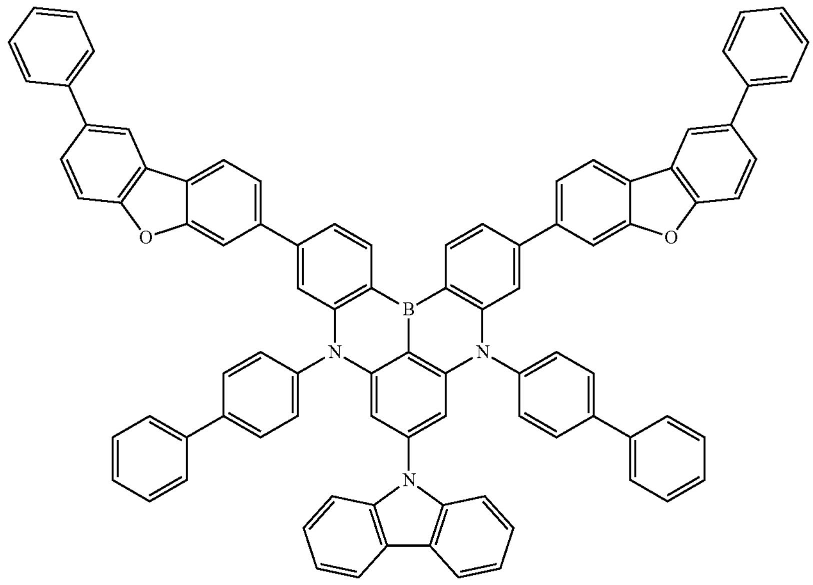
16
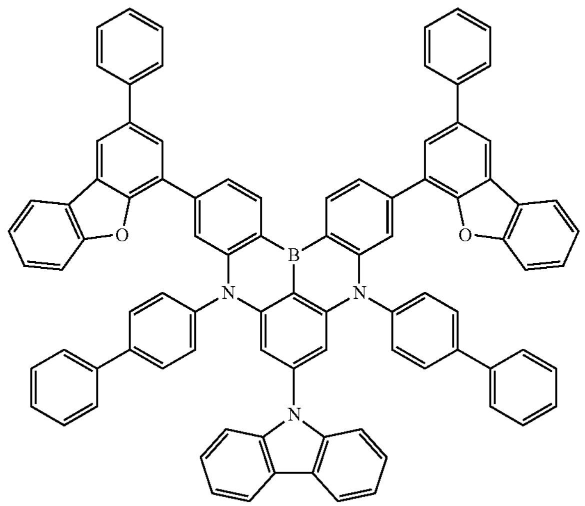
17
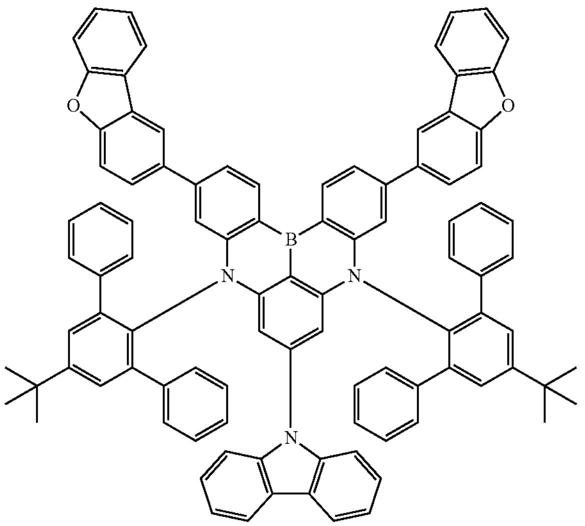

-continued
18
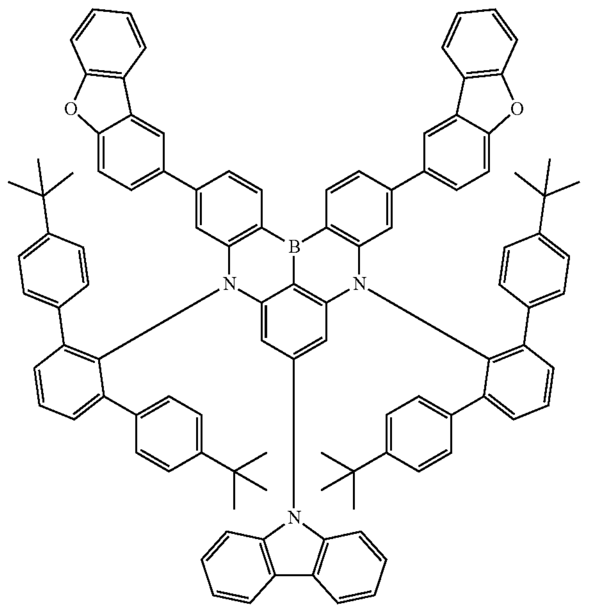
19
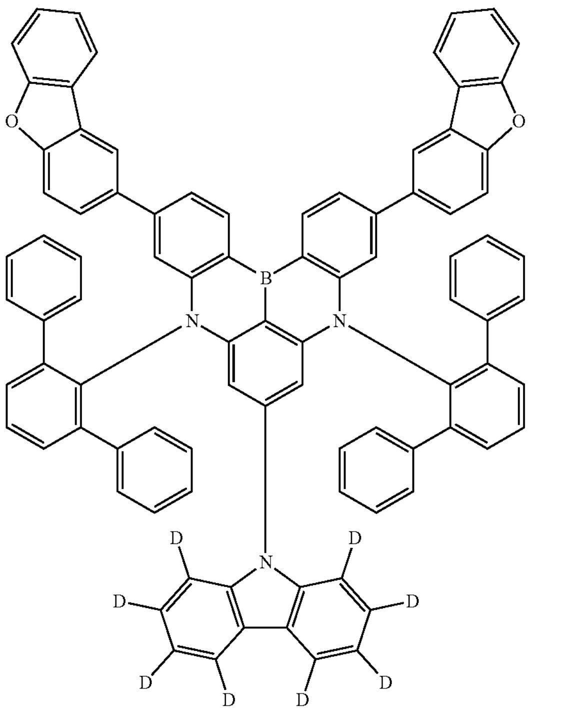

-continued
20
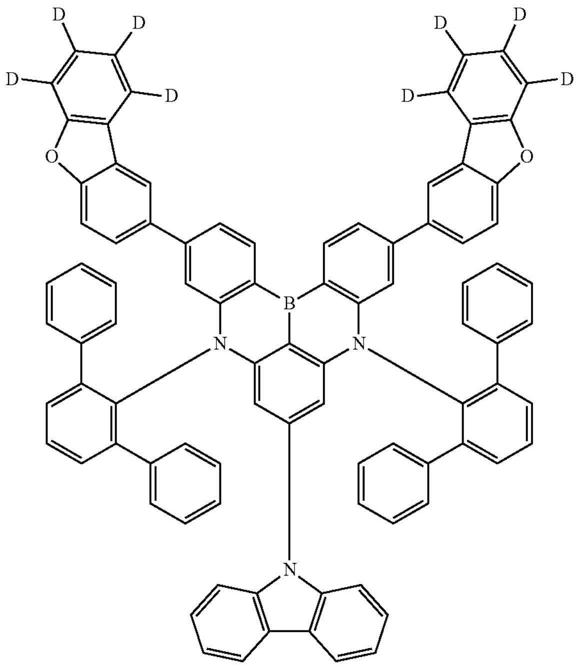
21
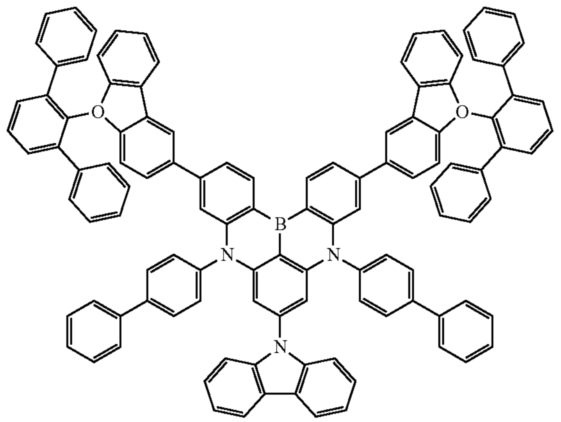
22
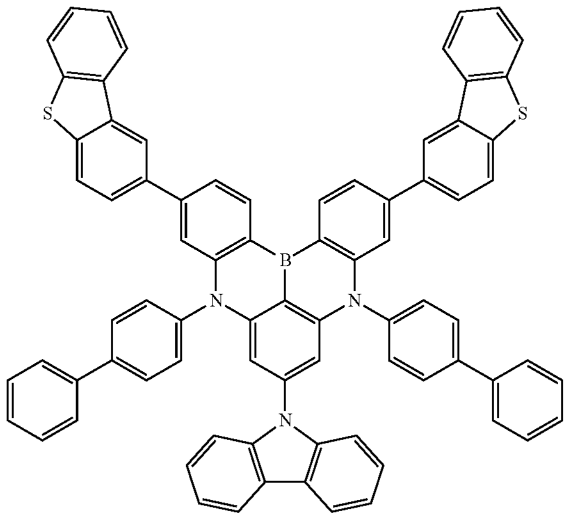

-continued
23
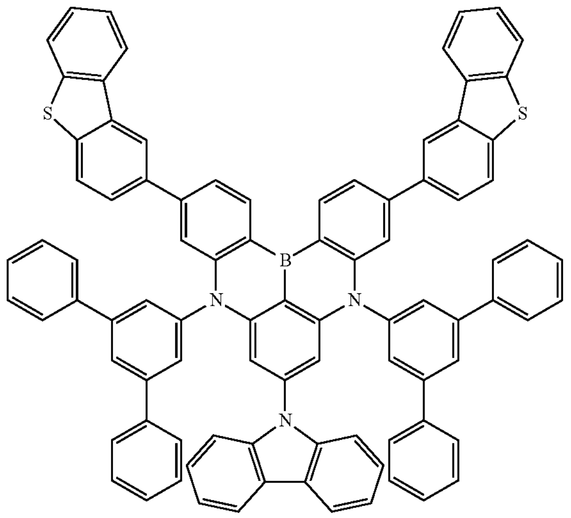
24
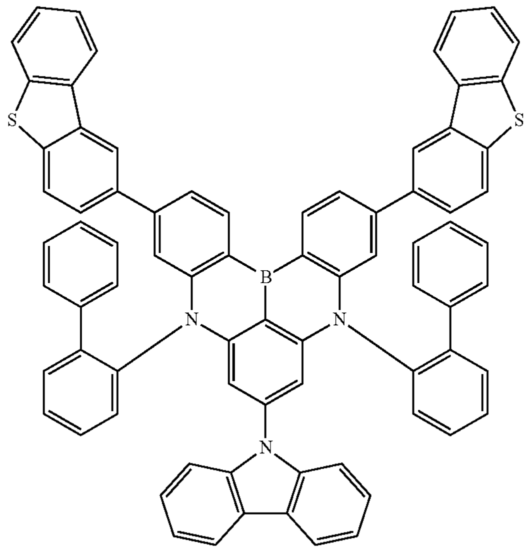
25
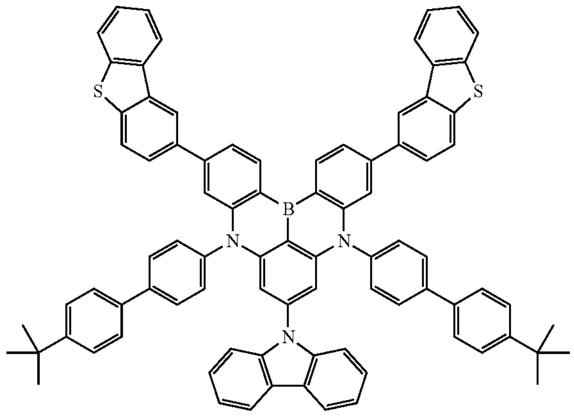

-continued
26
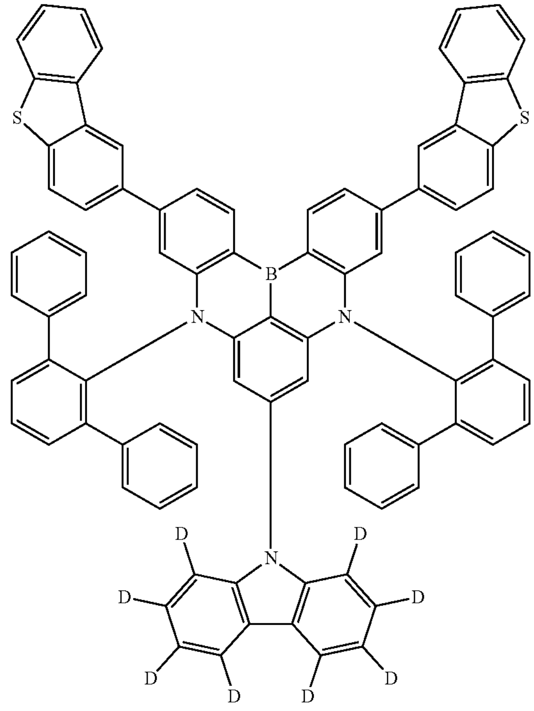
27
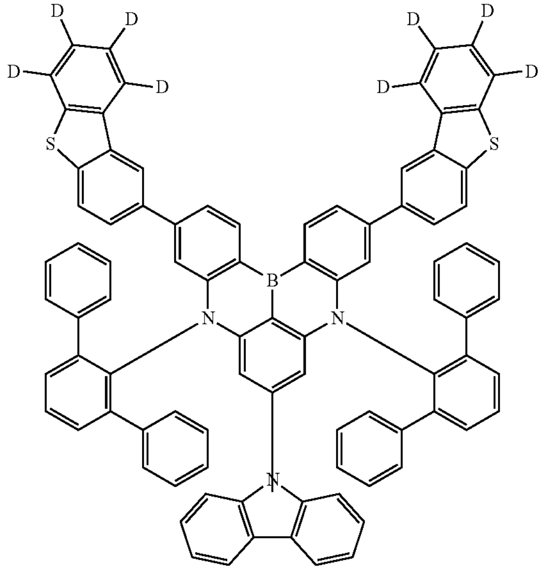

-continued
28
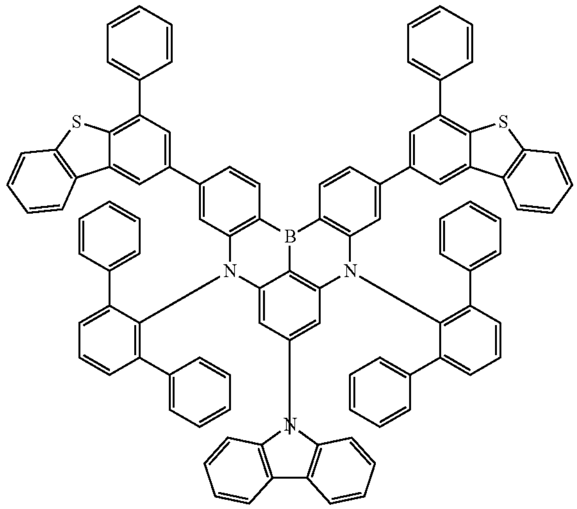
29
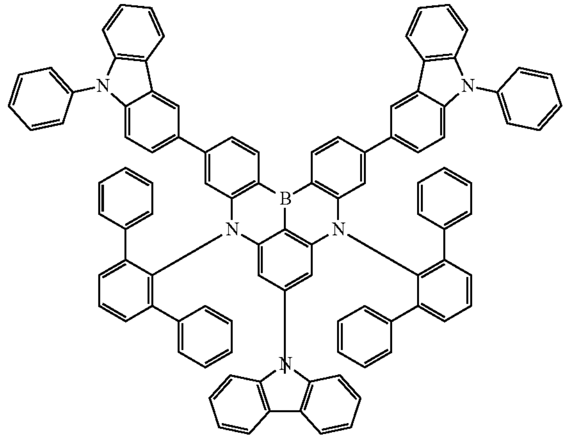
30
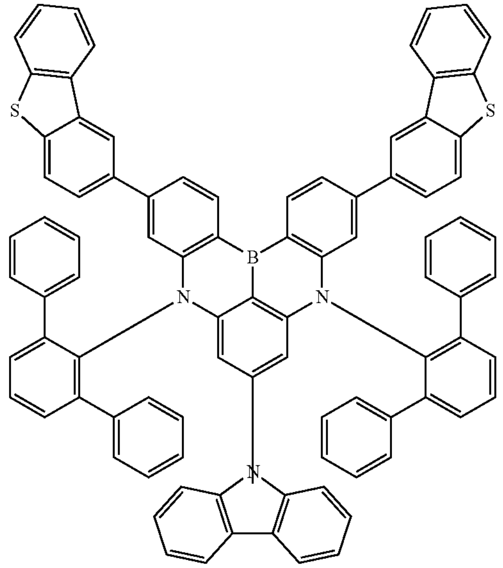

-continued
31
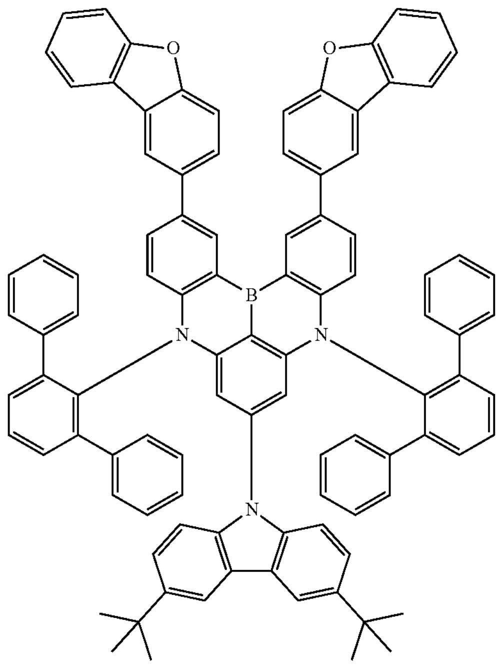
32
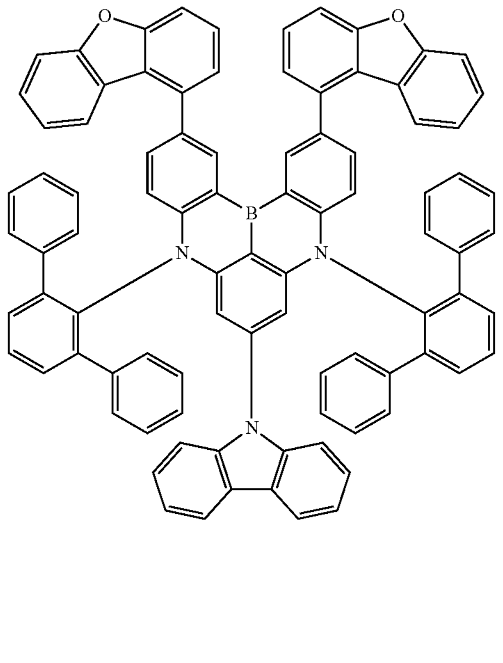

-continued
33
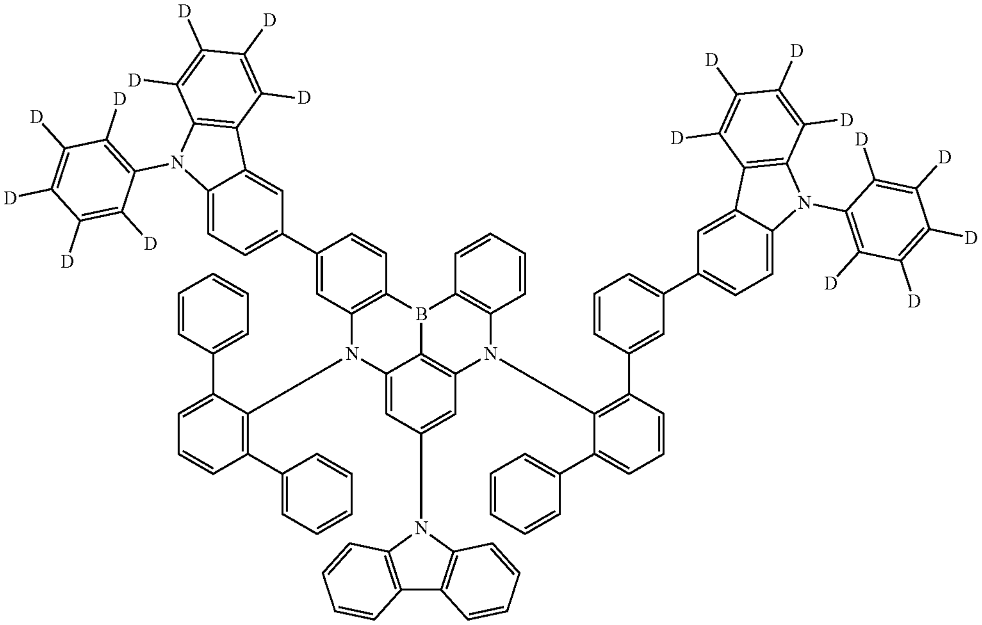
34
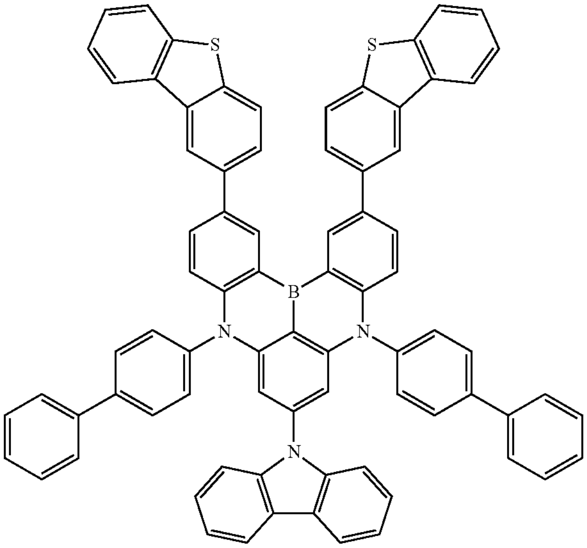

-continued
35
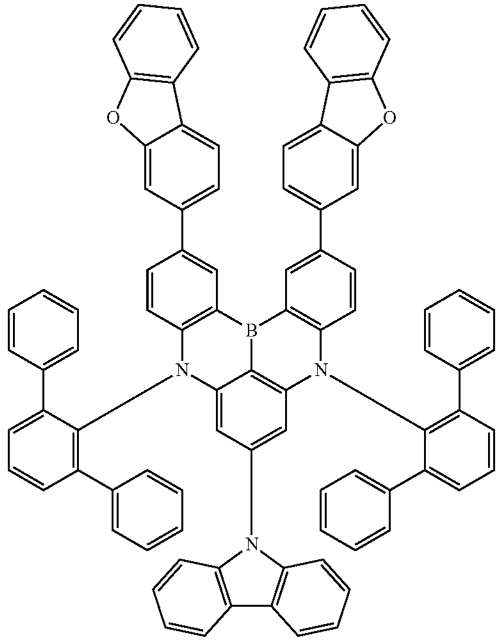
36
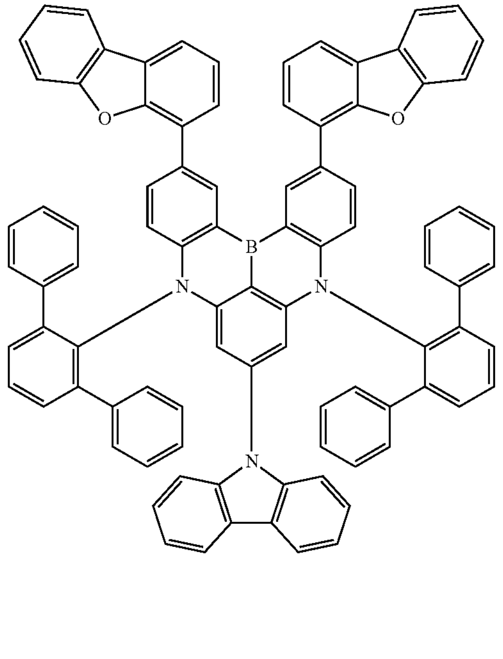

-continued
37
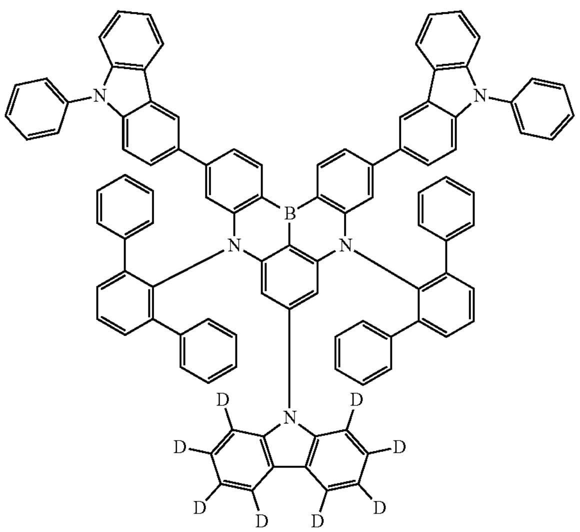
40
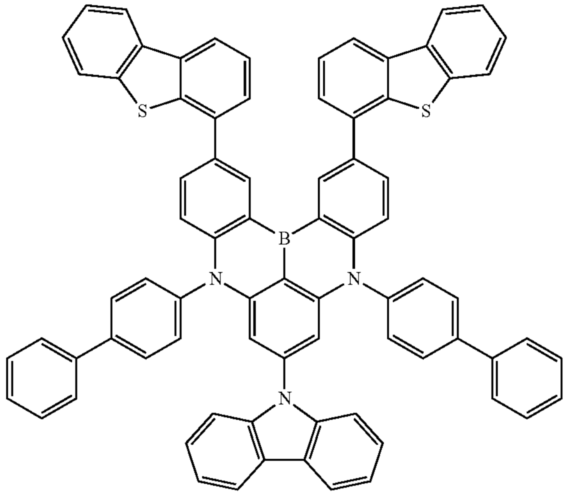
38
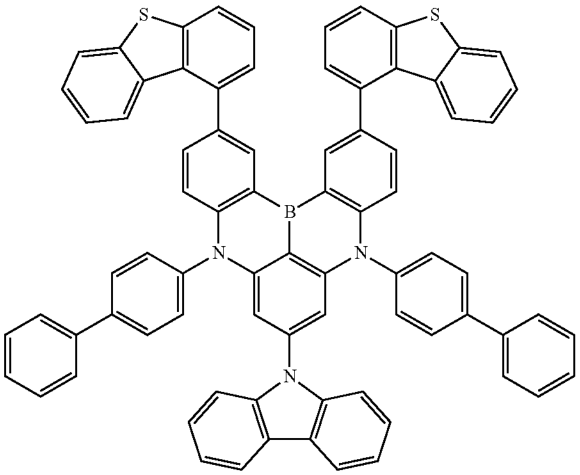
39
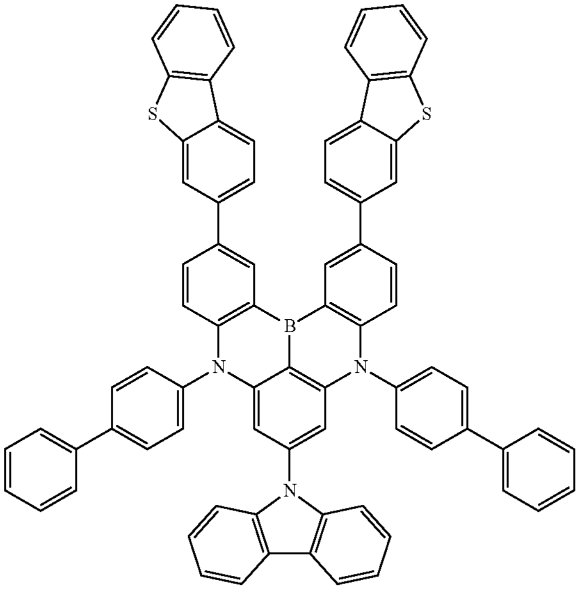
41
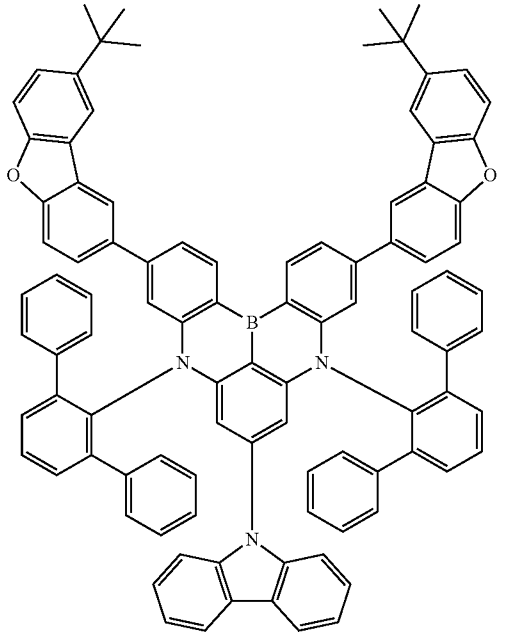

-continued
42
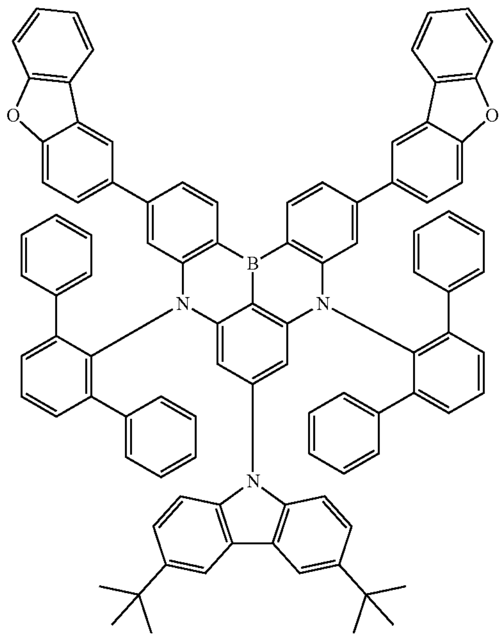
43
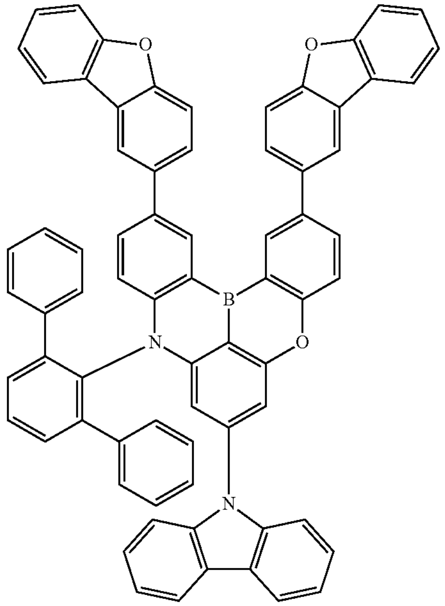
-continued
44
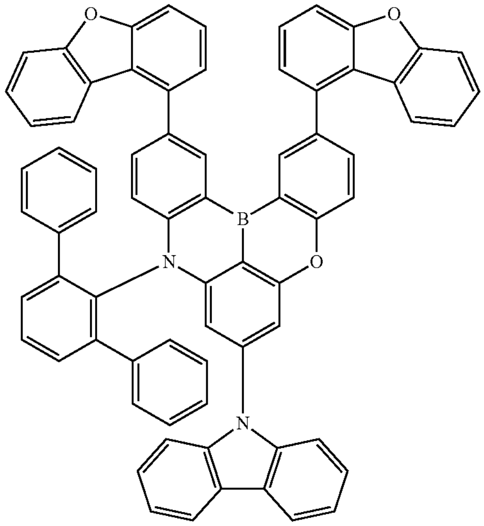
45
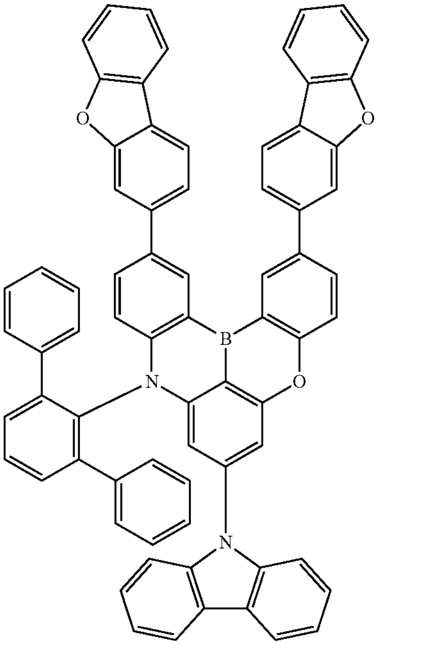

-continued
46
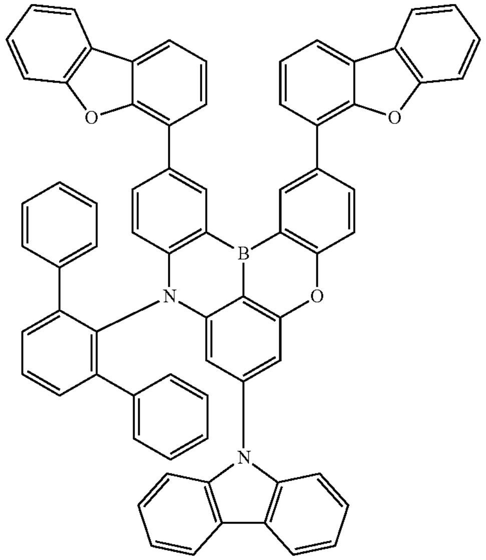
47
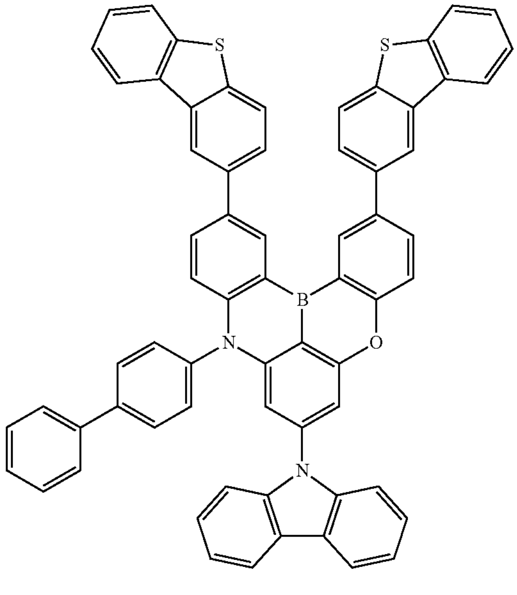
48
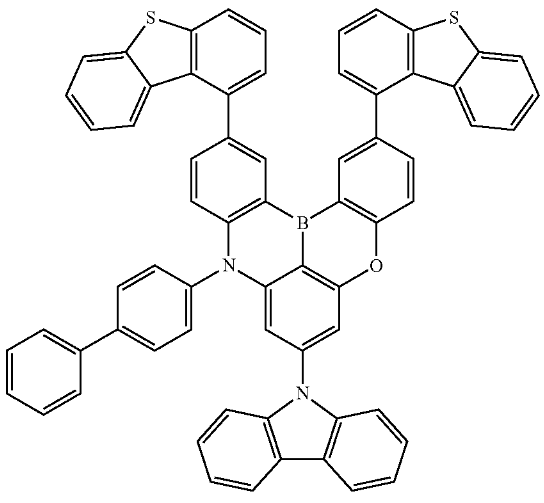
-continued
49
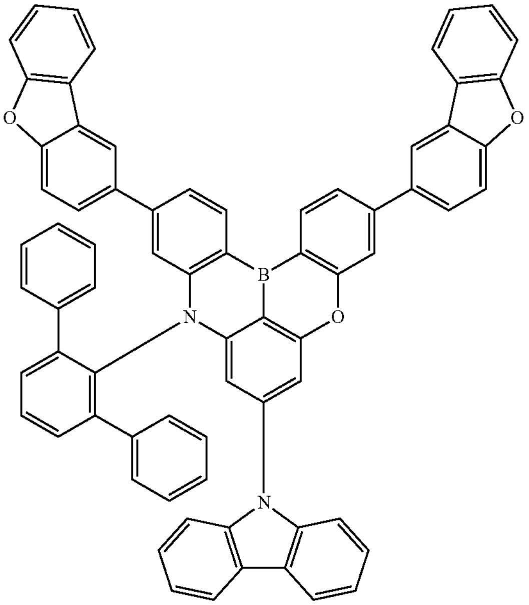
50
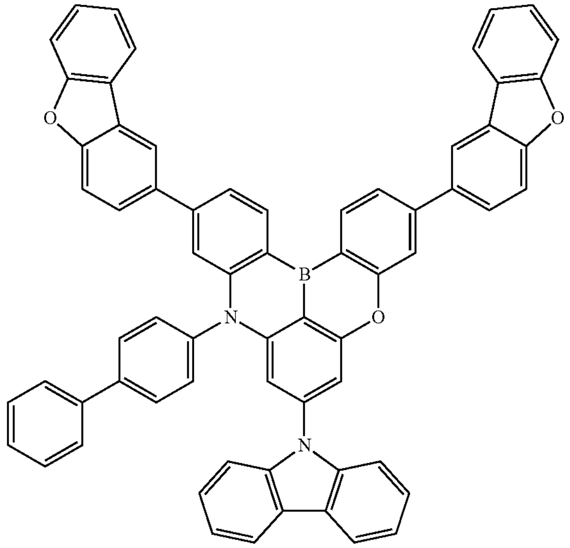

-continued
51
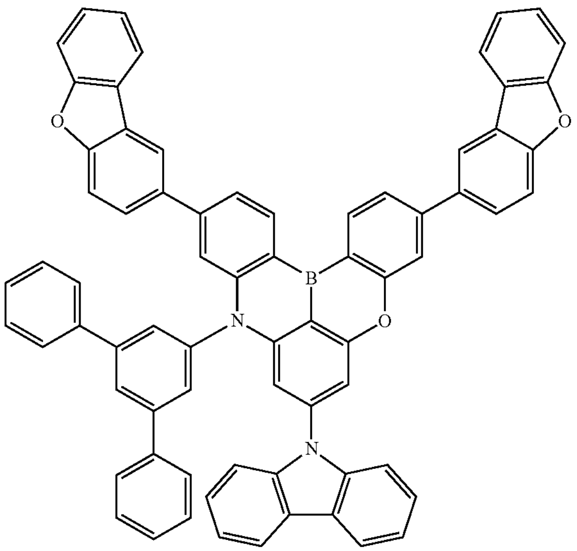
52
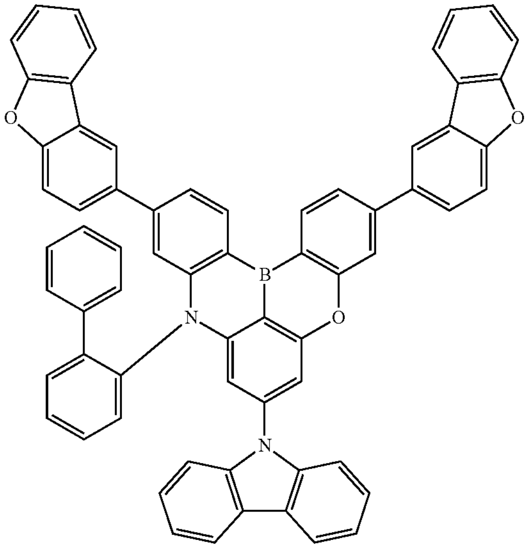
-continued
53
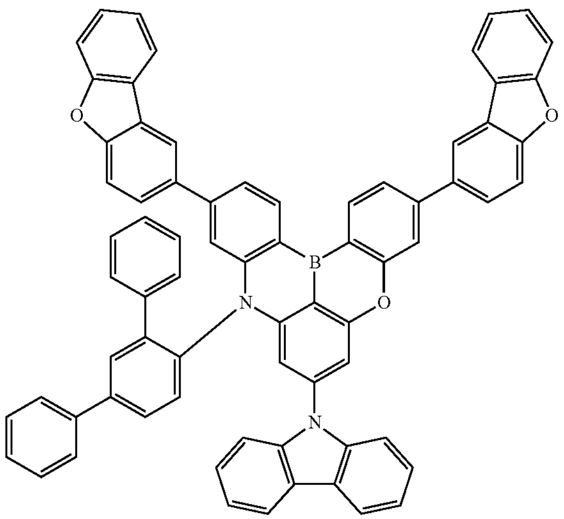
54
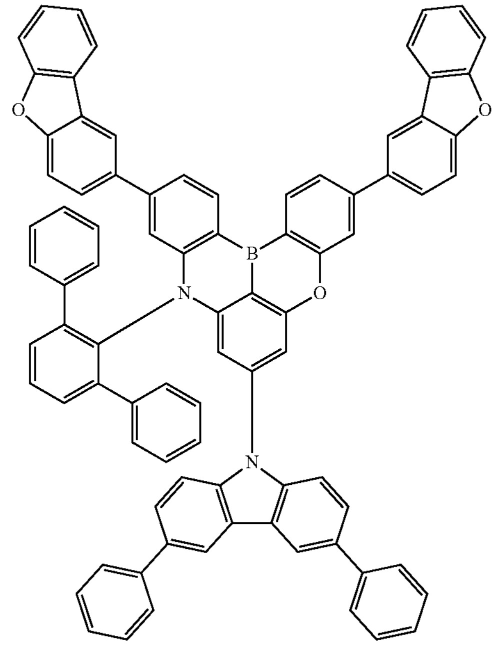

55
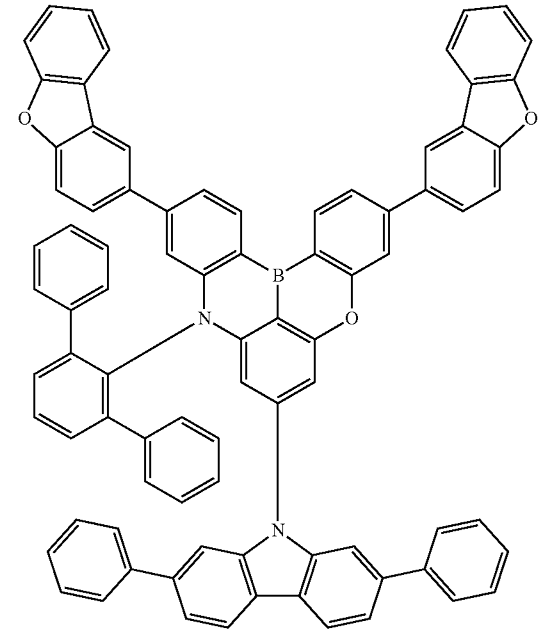
56
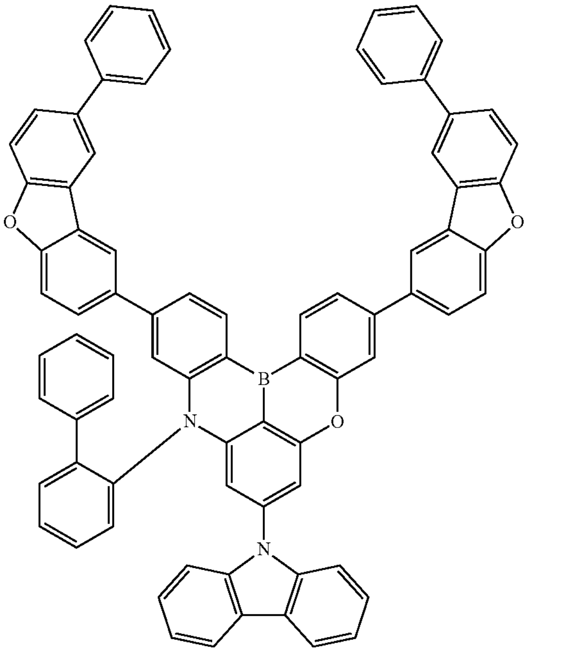
57
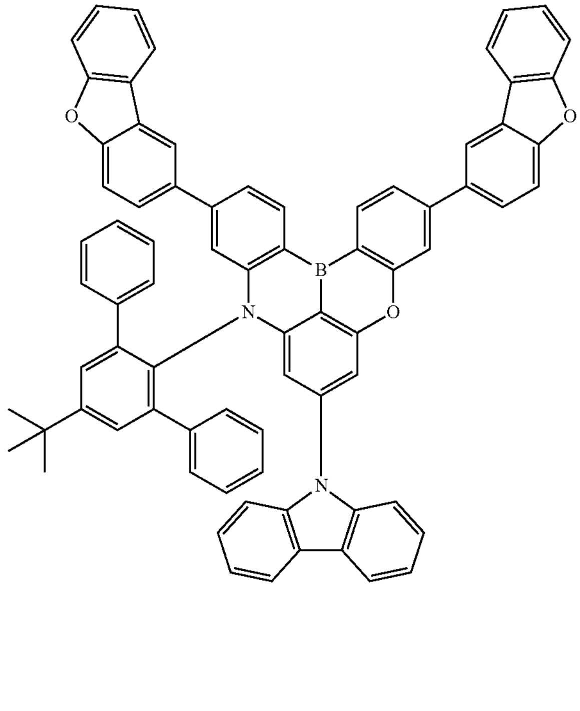
58
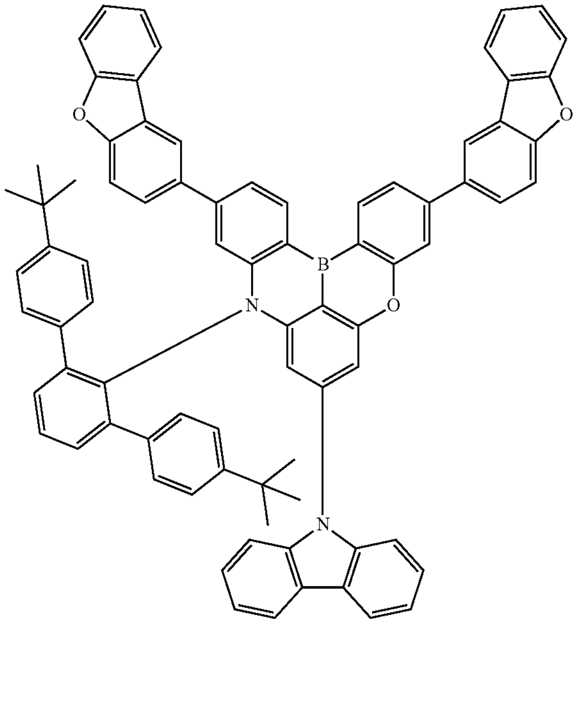

-continued
59
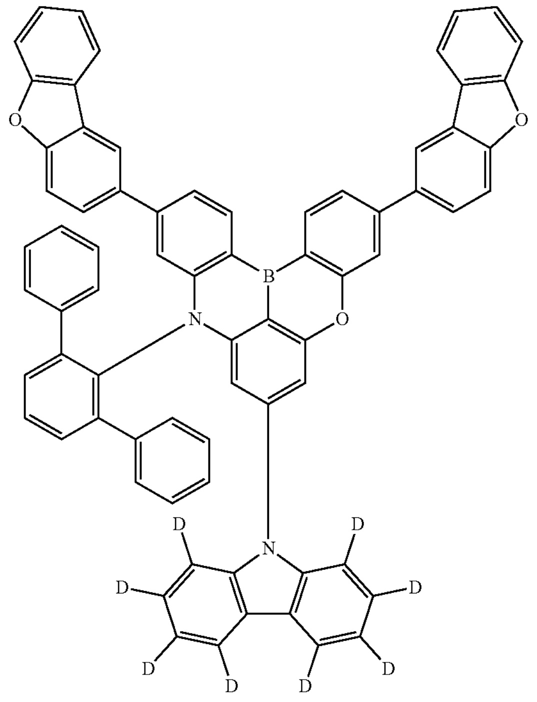
60
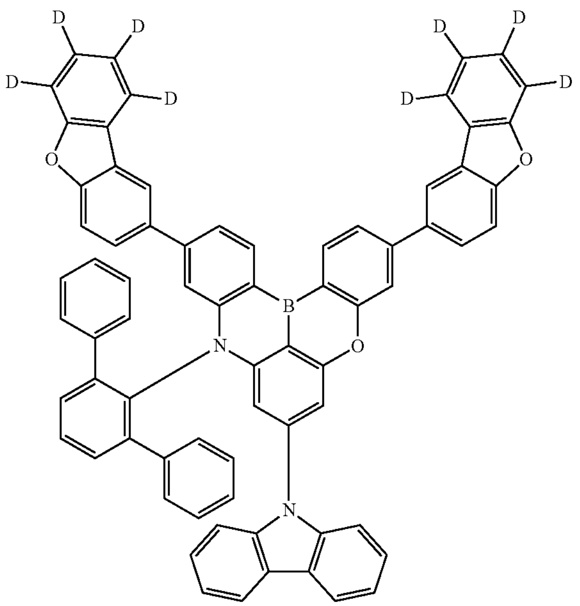
61
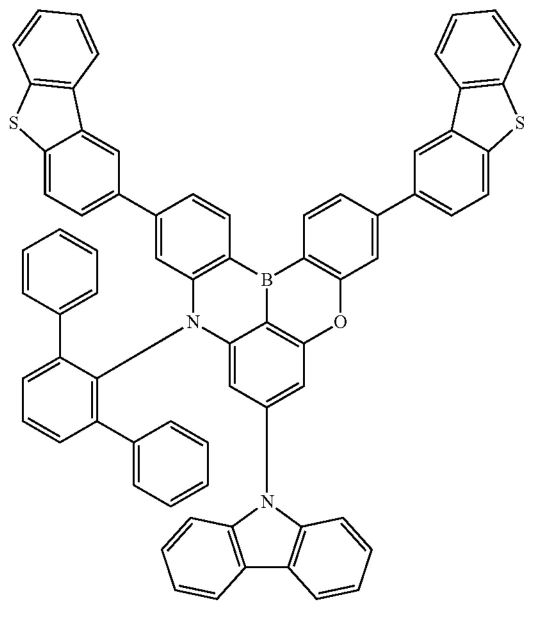
62
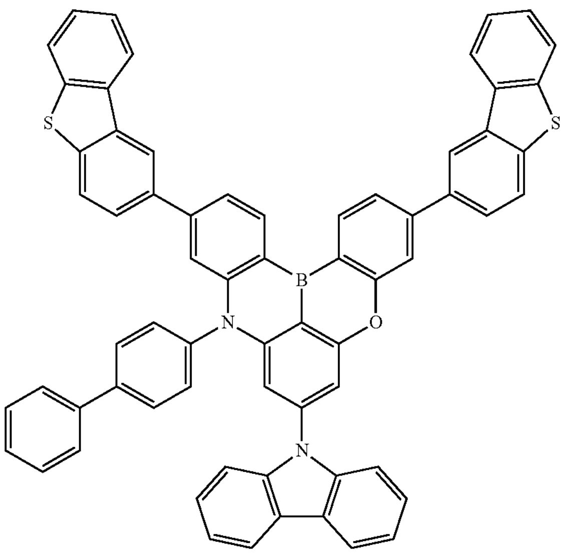

-continued
63
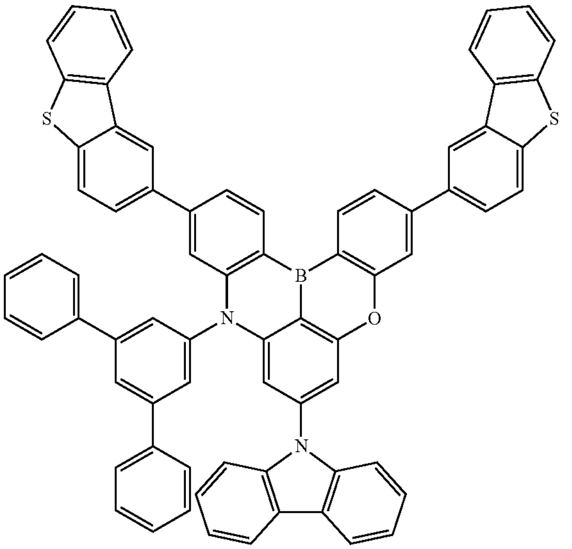
64
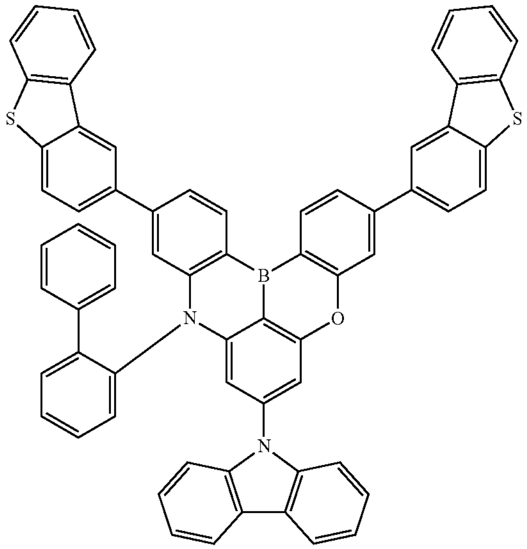
65
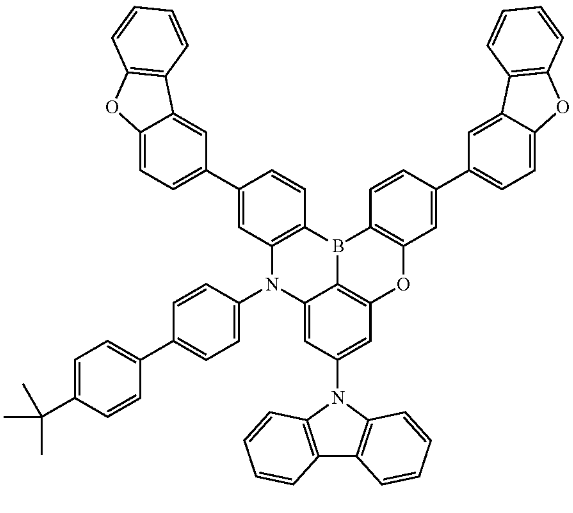
66
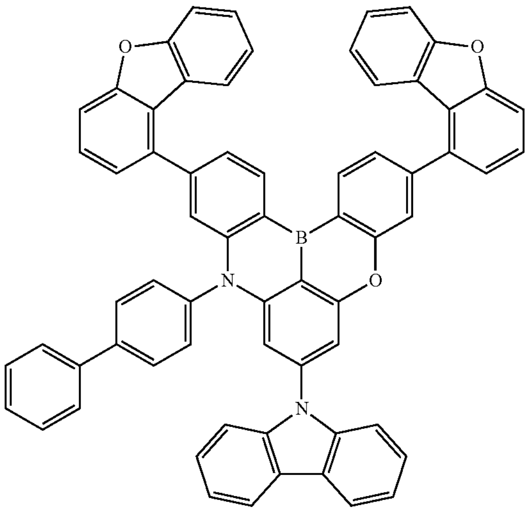
67
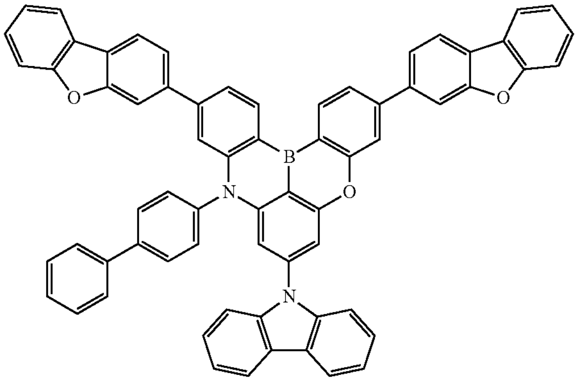
68
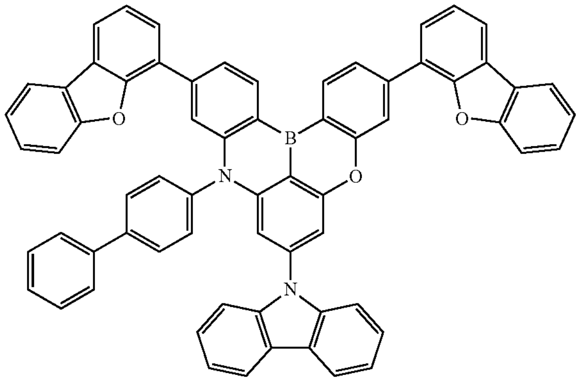

-continued
69
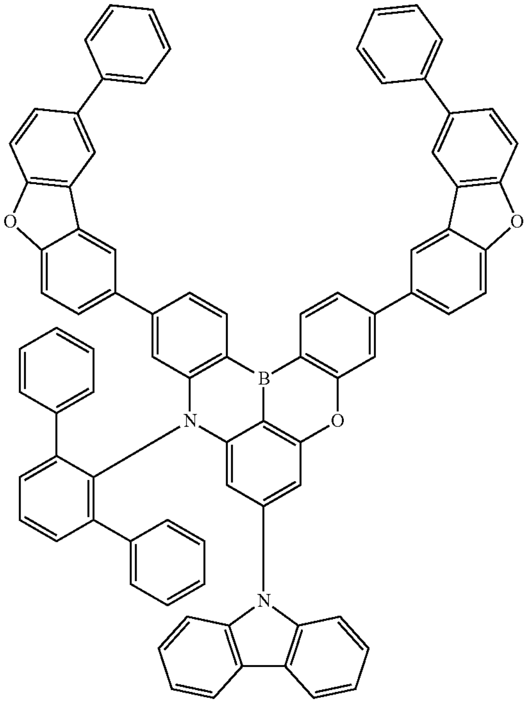
70
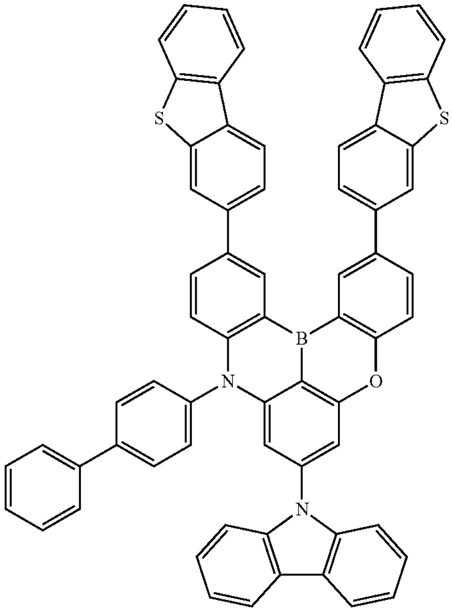
71
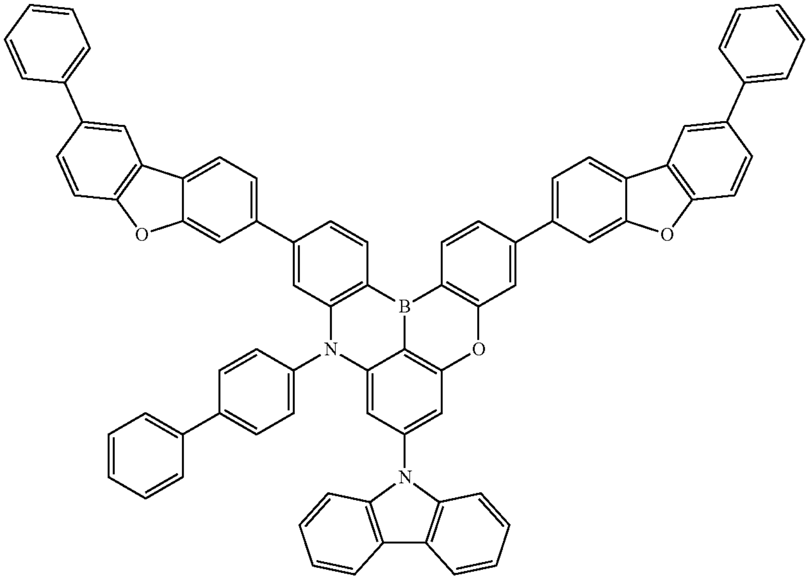

-continued
72
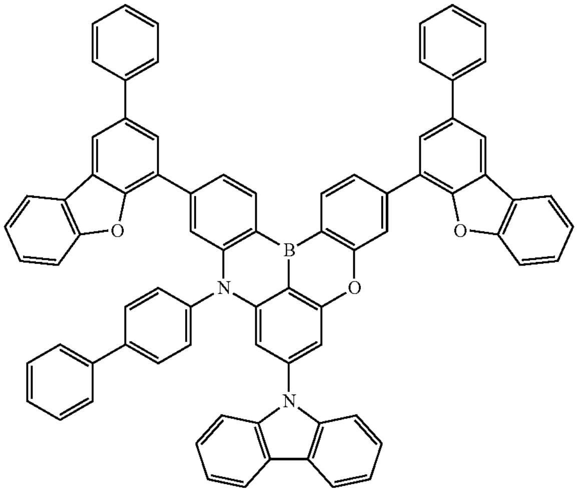
73
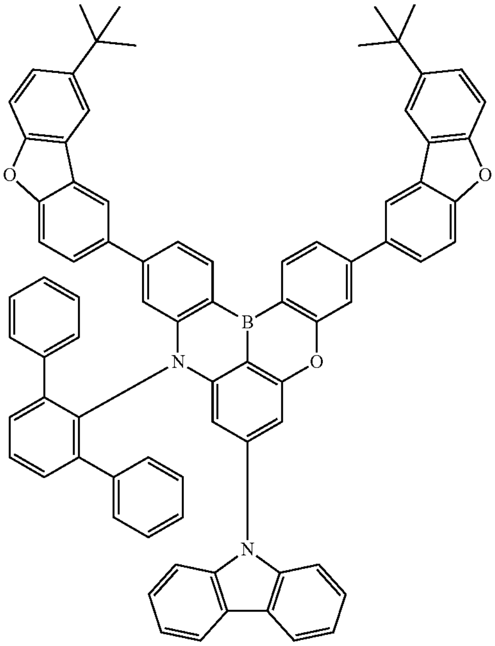
74
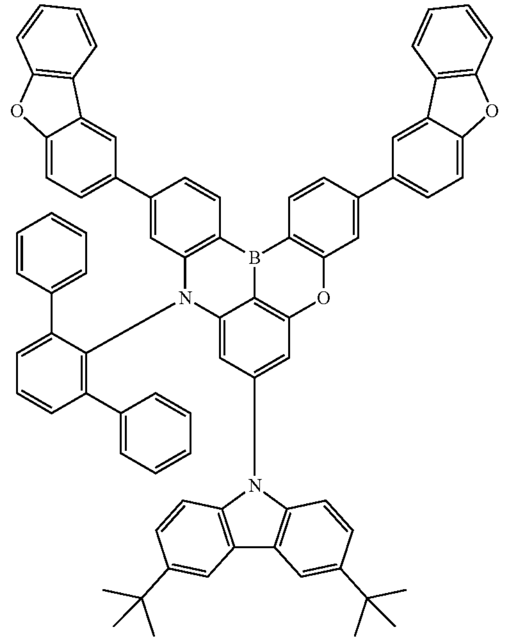

-continued
75
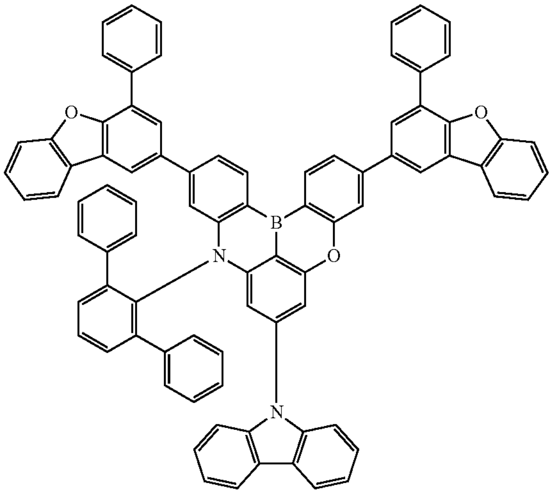
76
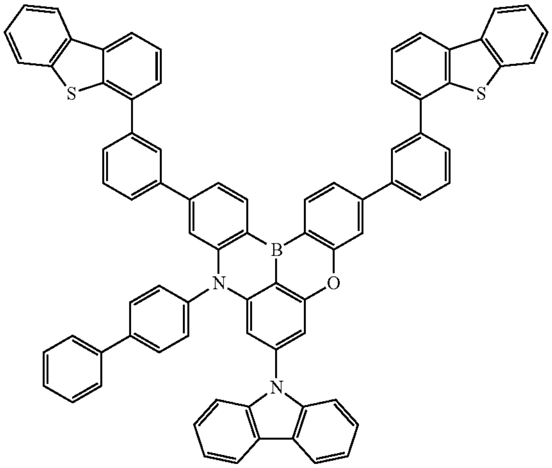
77
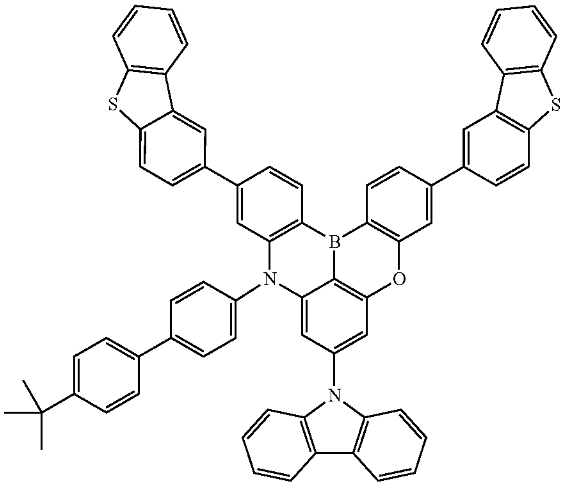
78
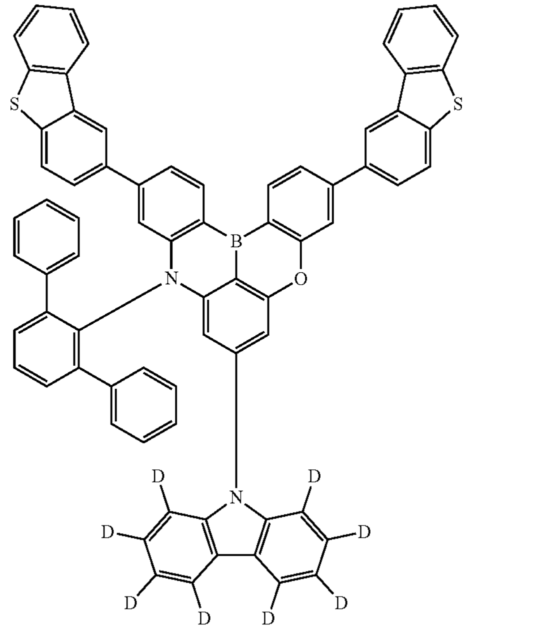

-continued
79
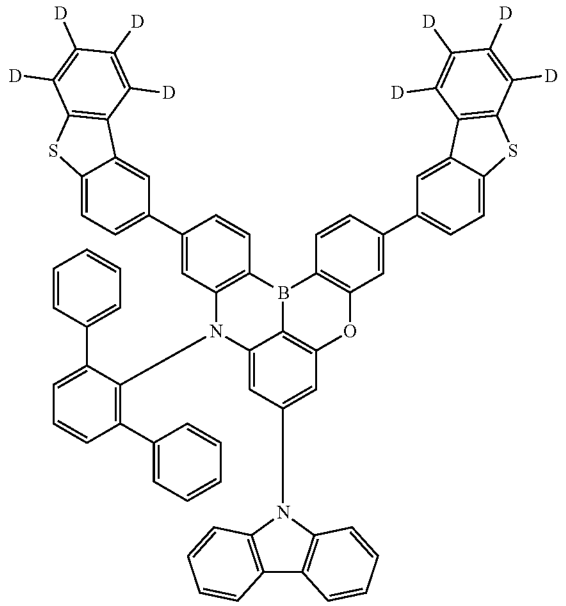
80
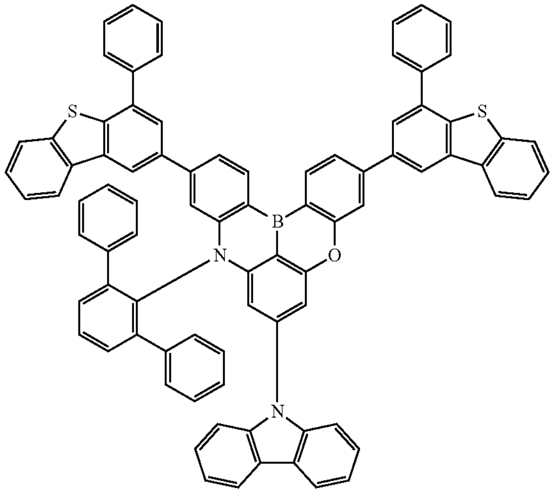
81
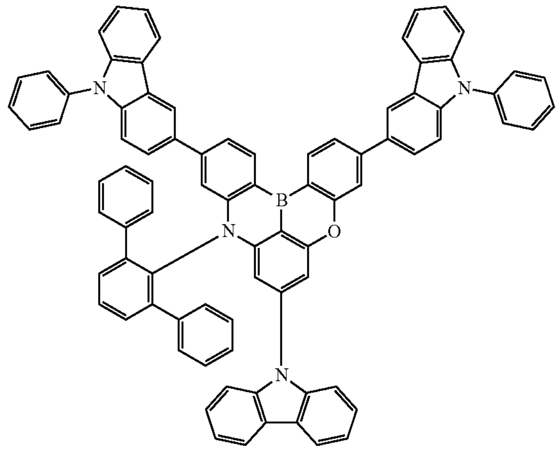
82
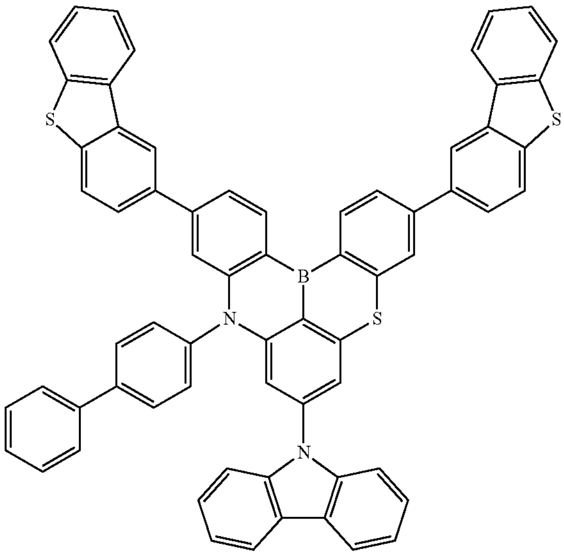

-continued
83
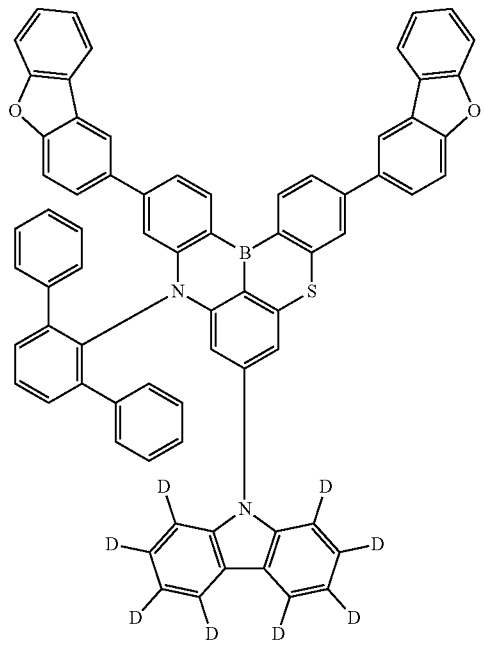
84
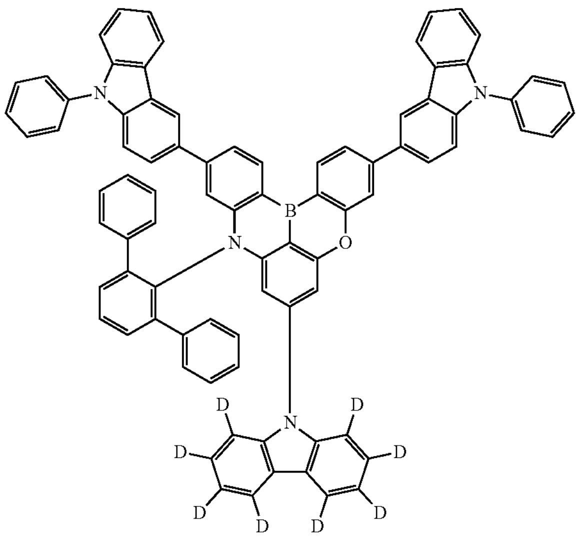
85
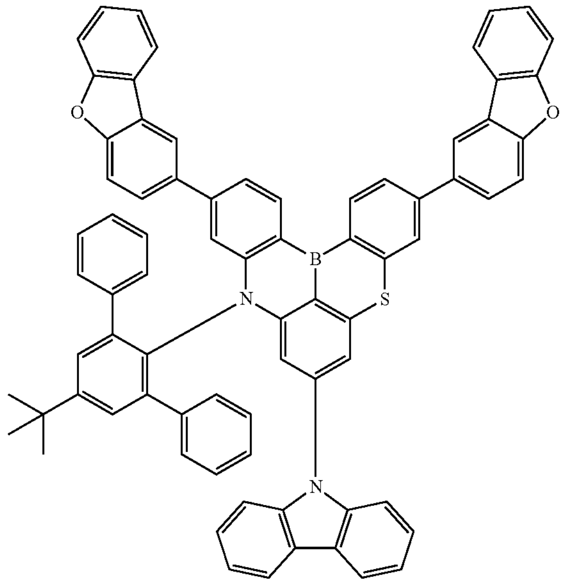
86
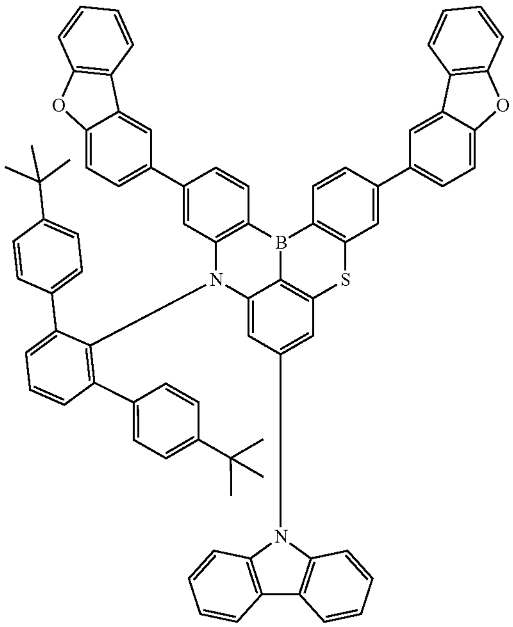

-continued
87
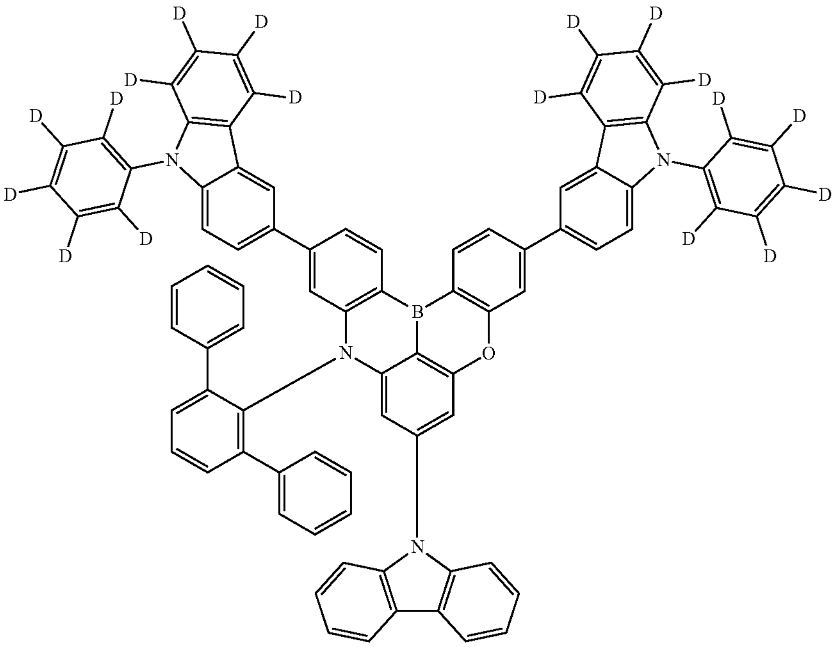
88
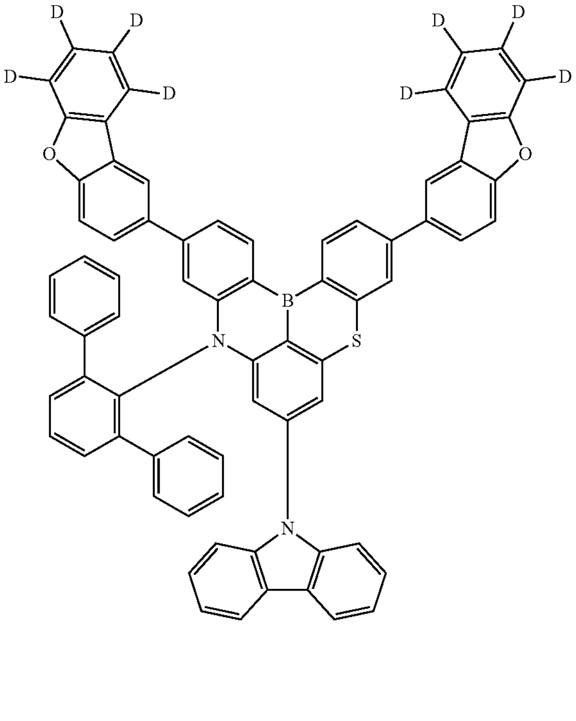
89
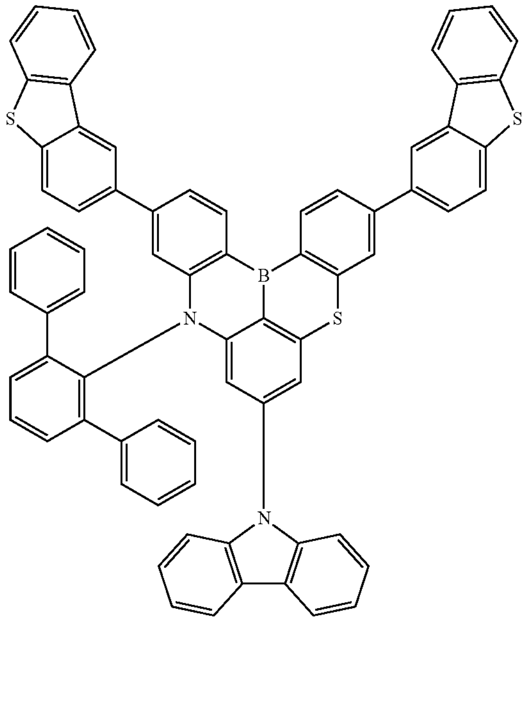

-continued
90
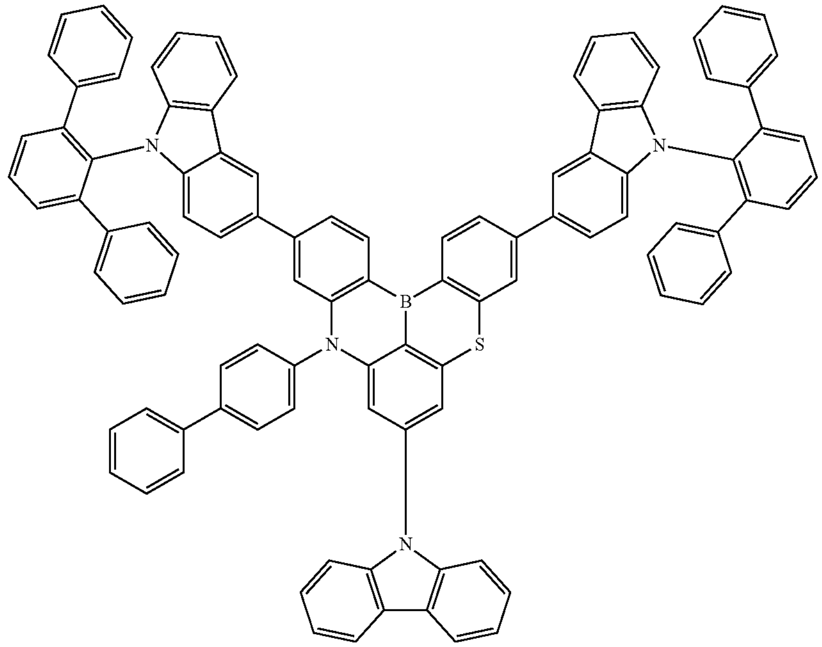
91
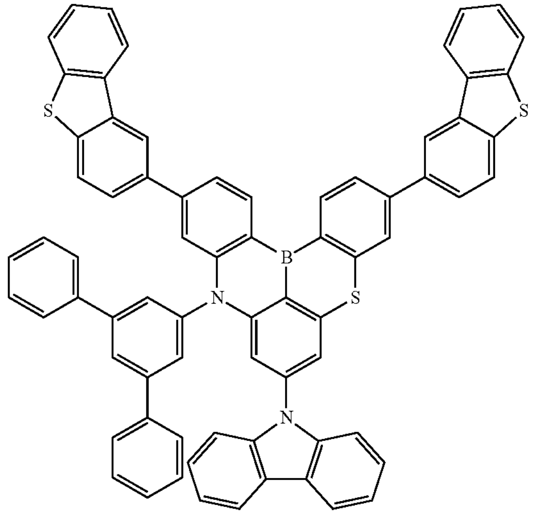
92
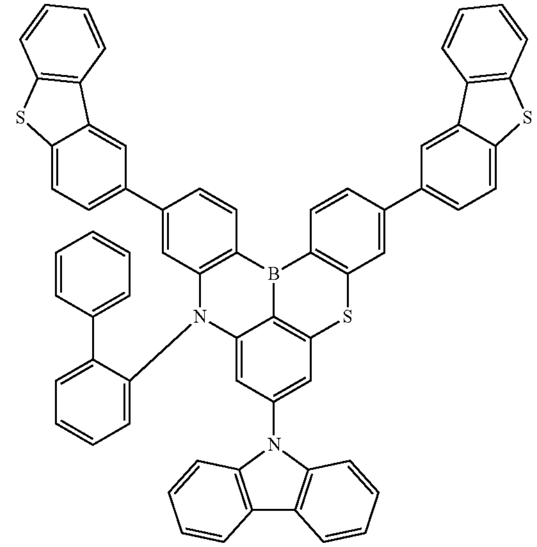

-continued
93
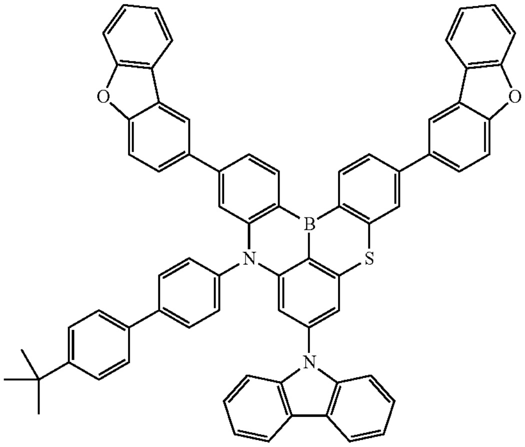
94
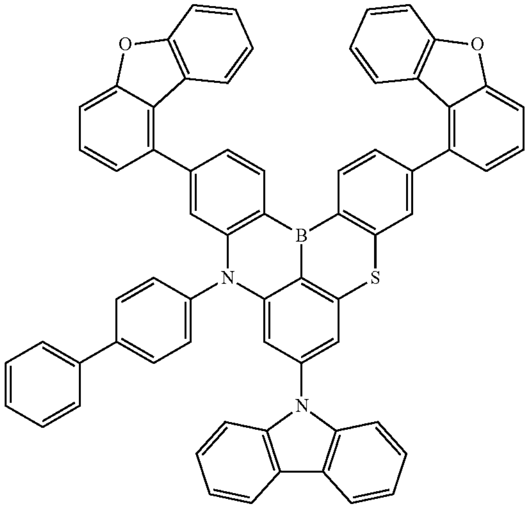
95
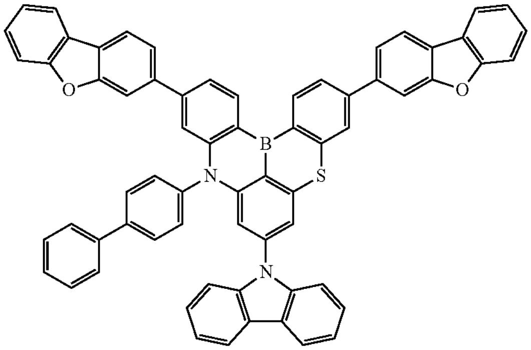
96
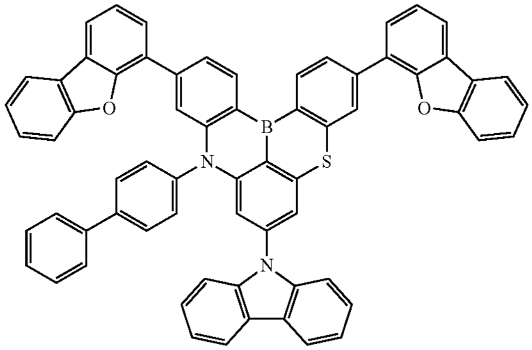
97
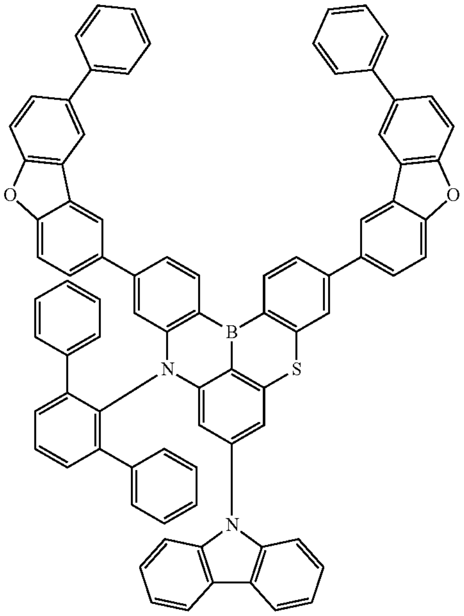
98
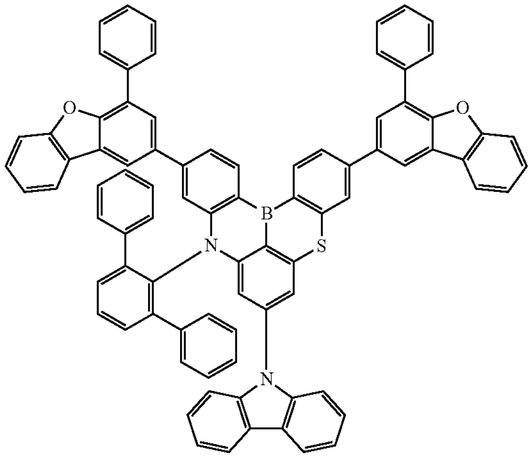

-continued
99
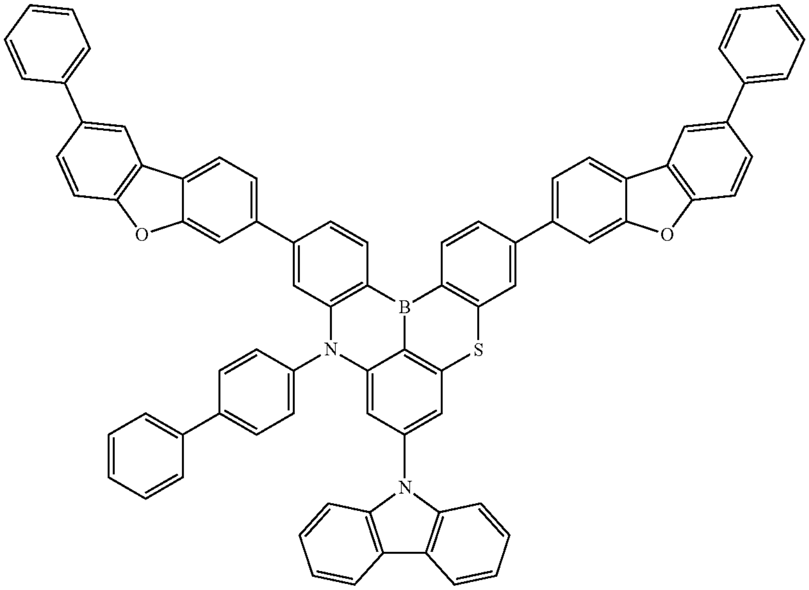
100
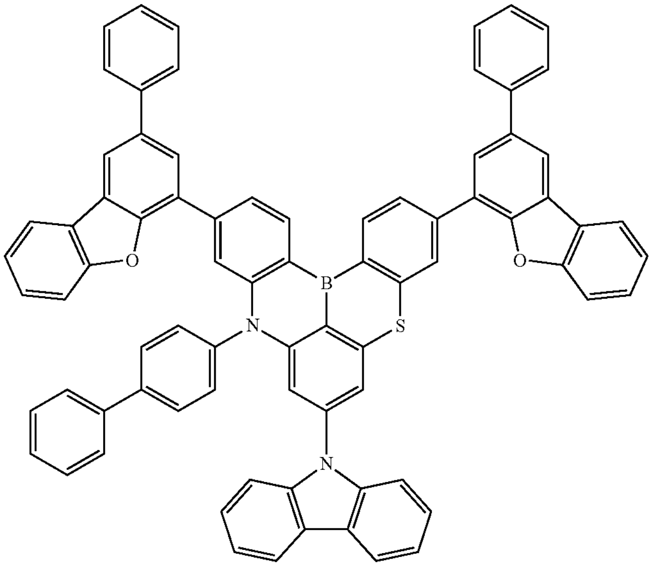

-continued
101
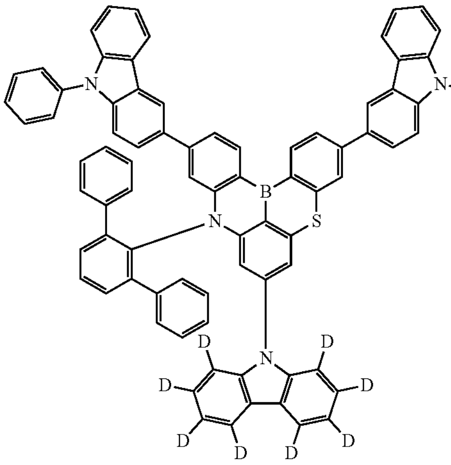
102
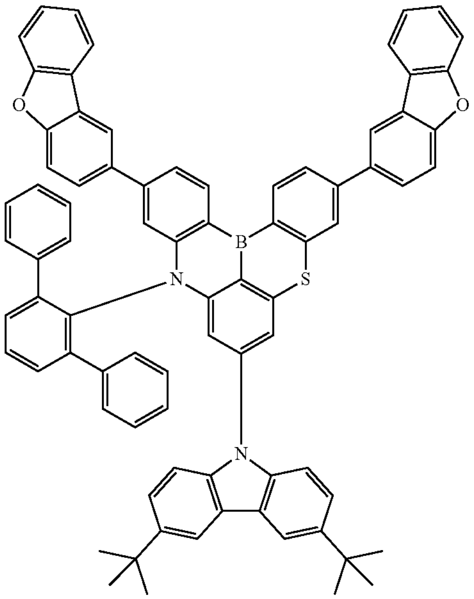
103
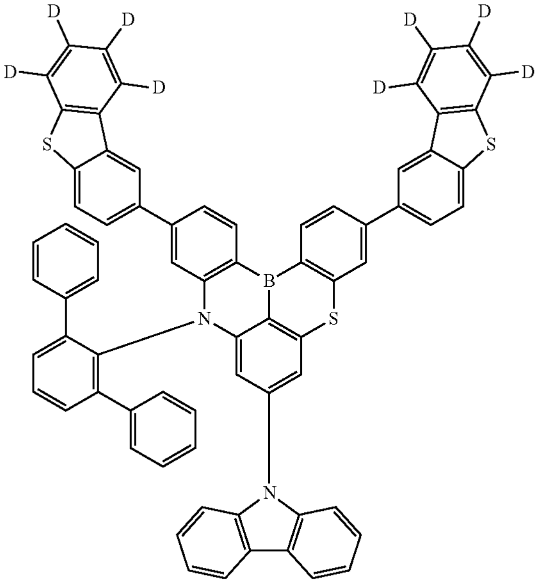
104
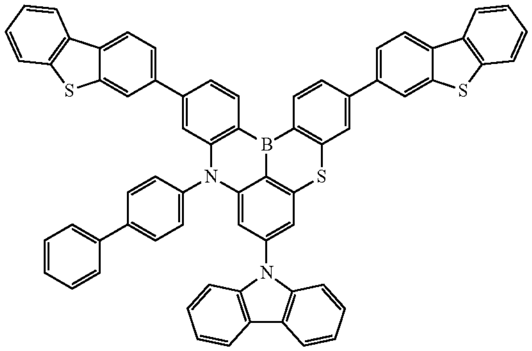
105
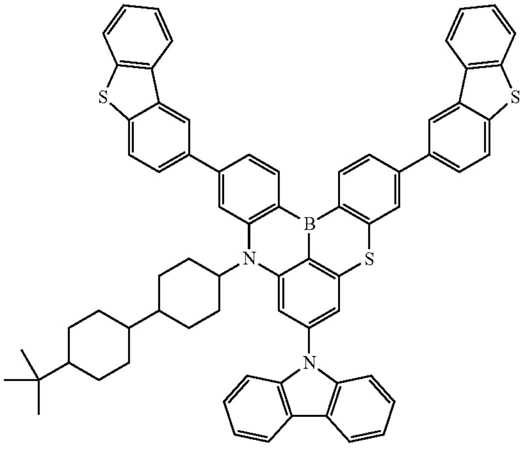
106
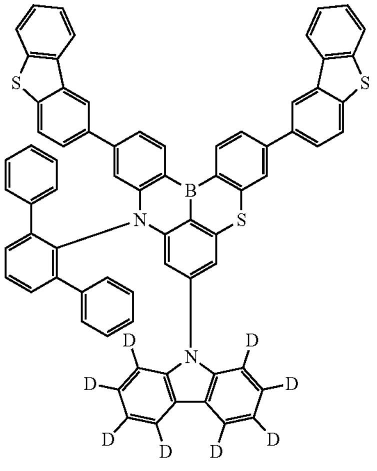

-continued
107
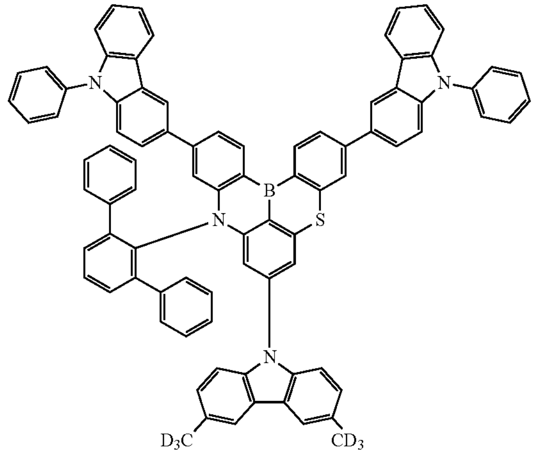
108
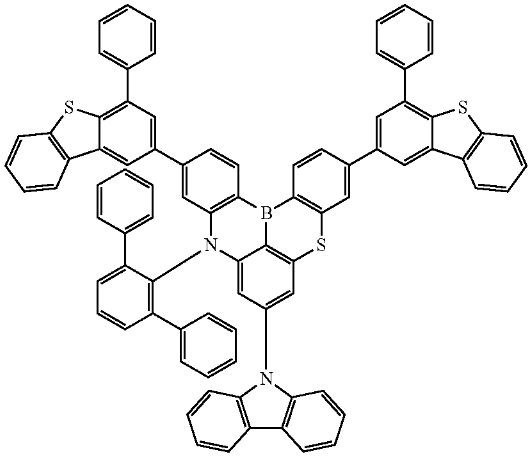
109
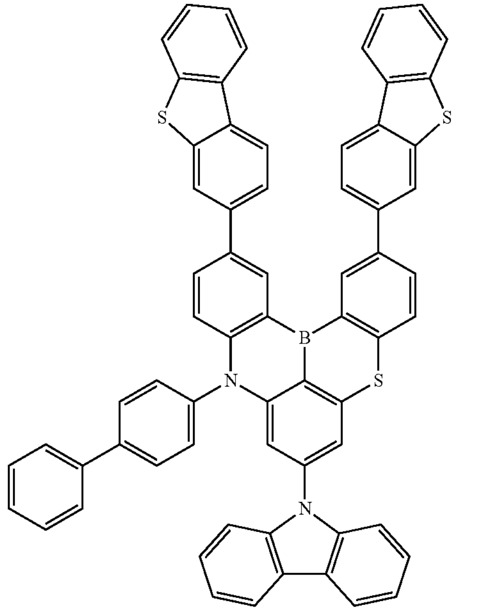
110
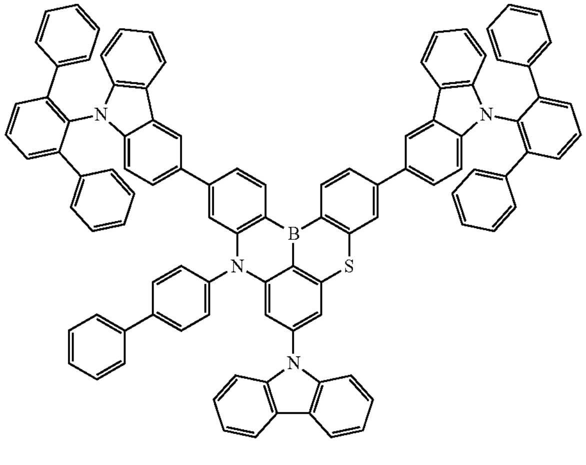

-continued
111
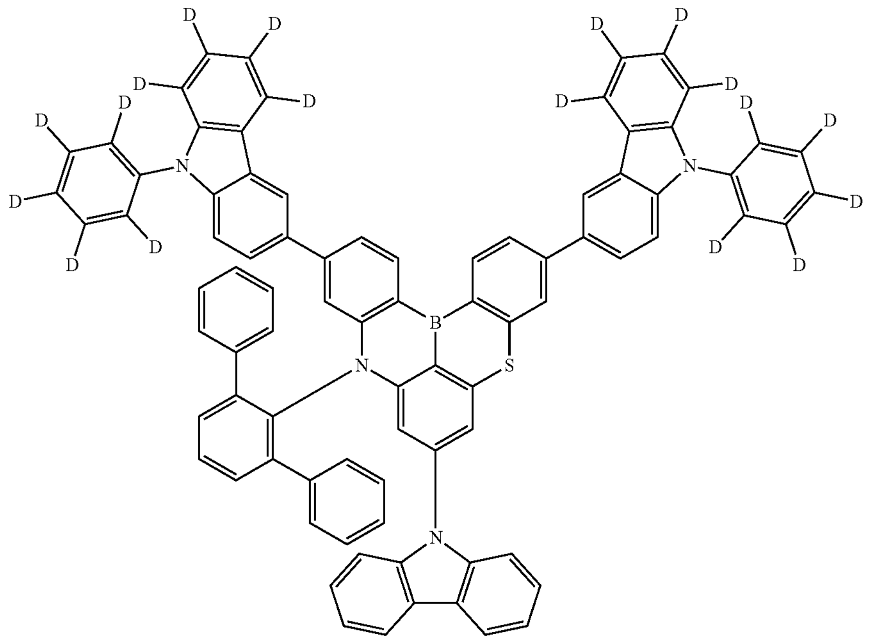
112
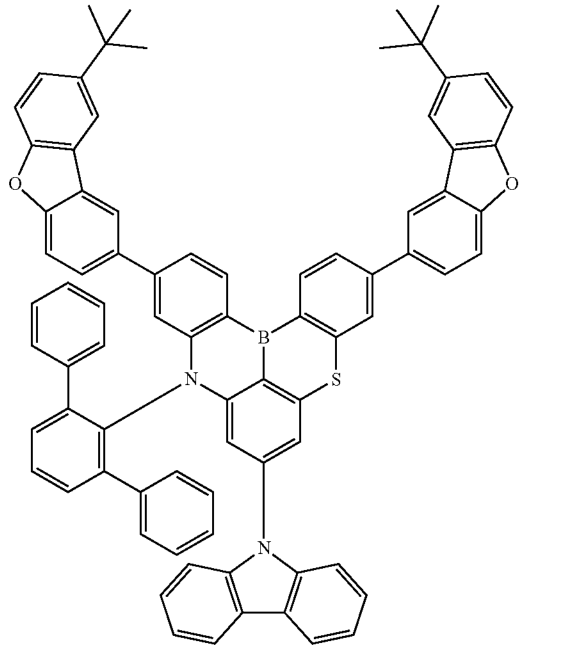
113
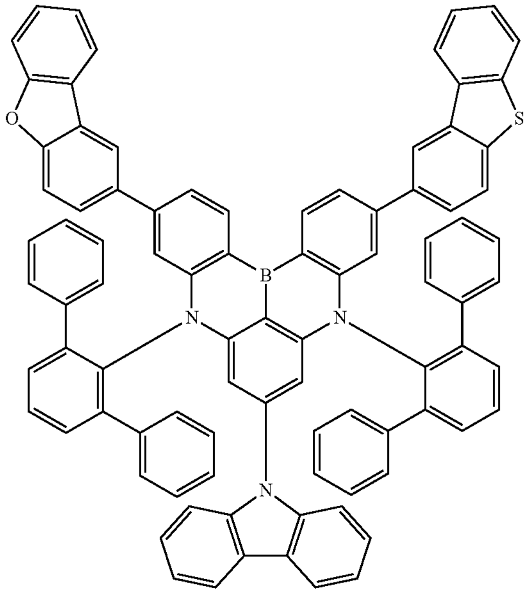

-continued
114
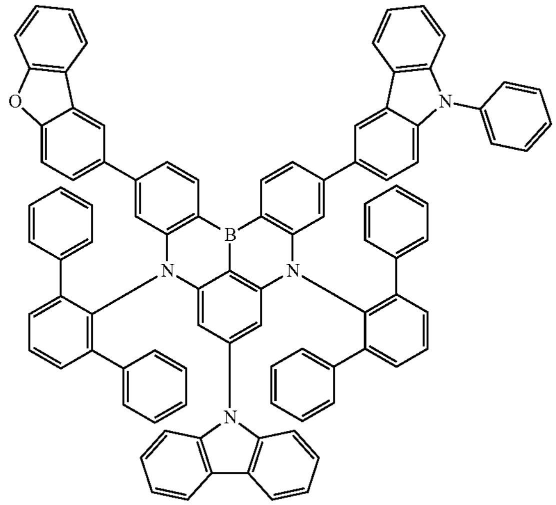
115
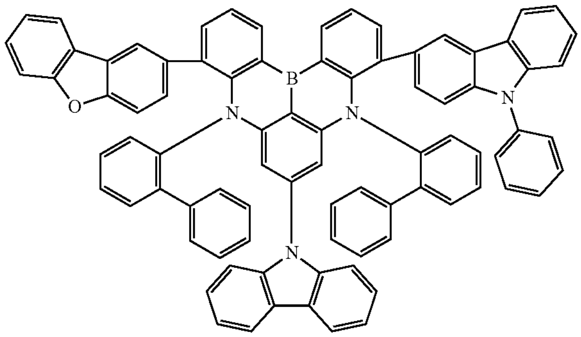
116
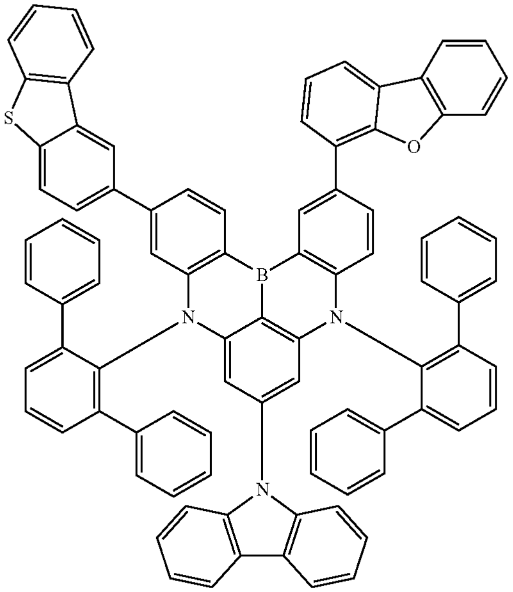
117
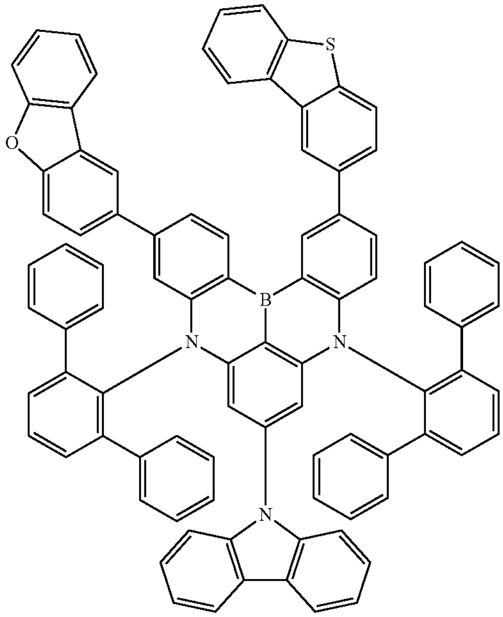

-continued
118
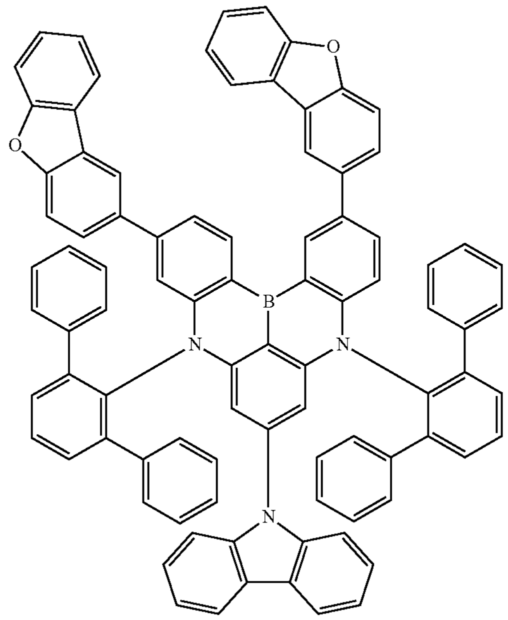
119
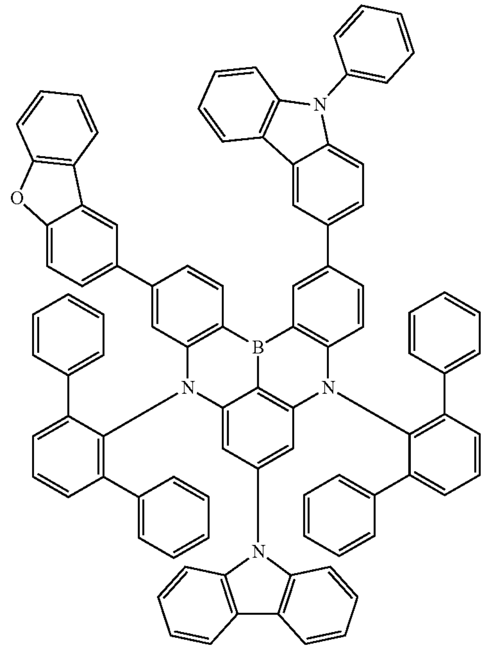
120
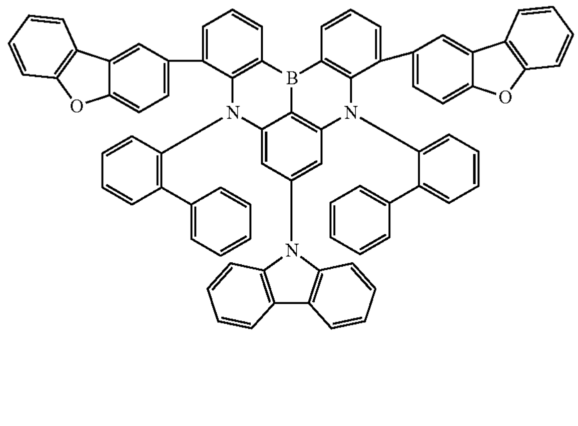
121
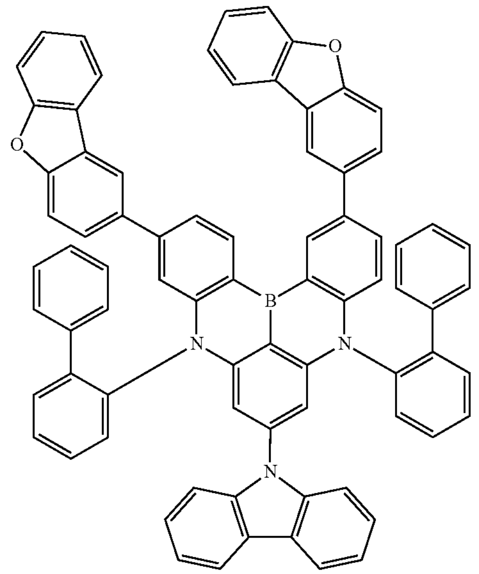

-continued
122
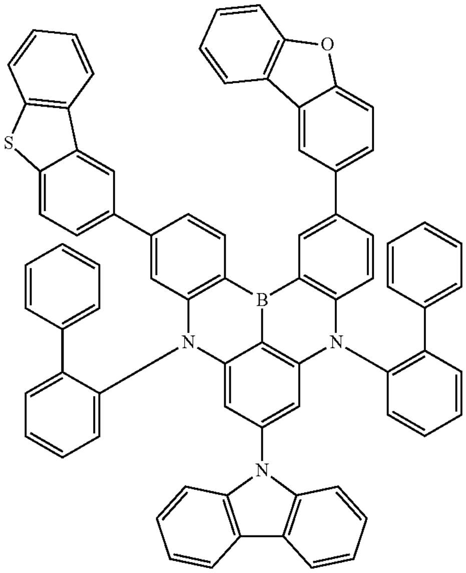
123
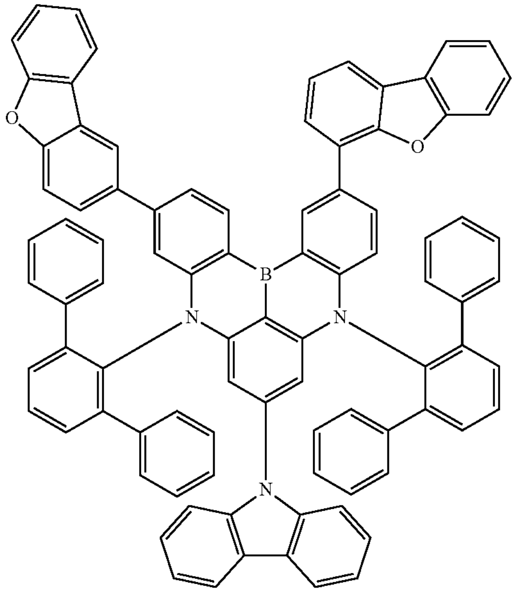
124
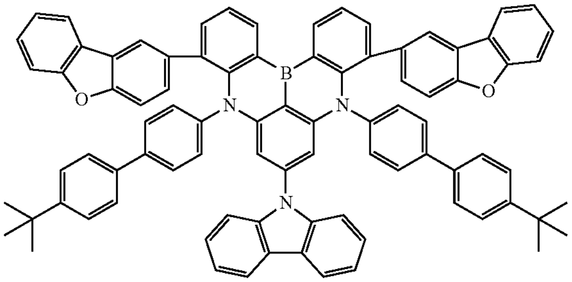
125
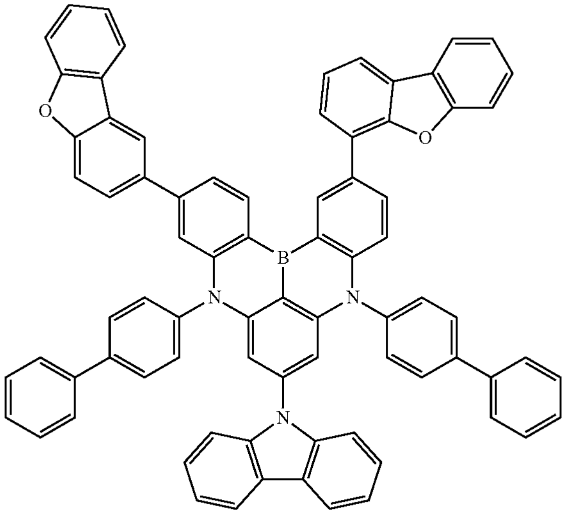

-continued
126
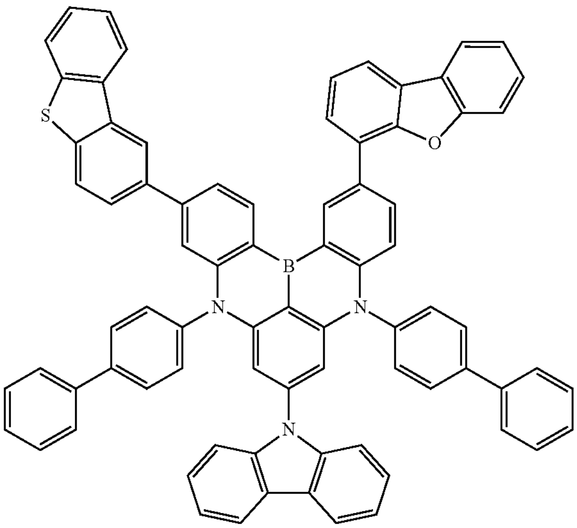
127
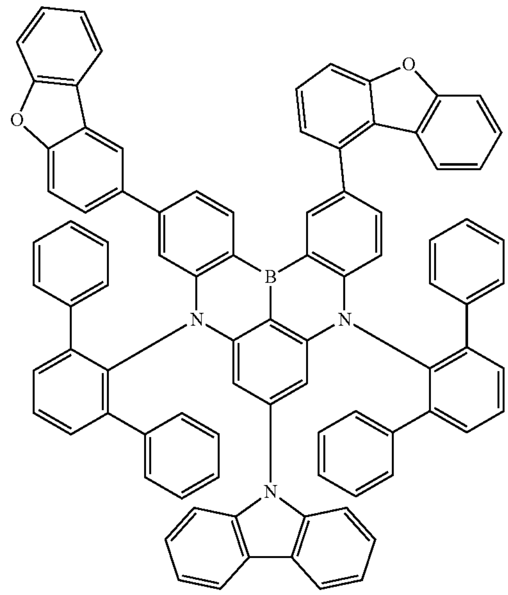
128
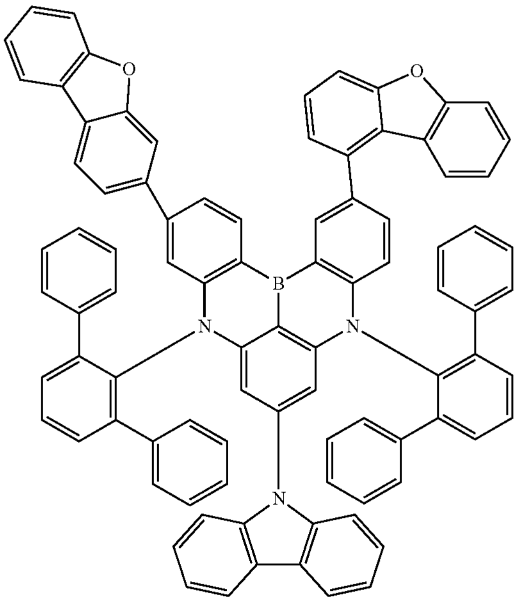
129
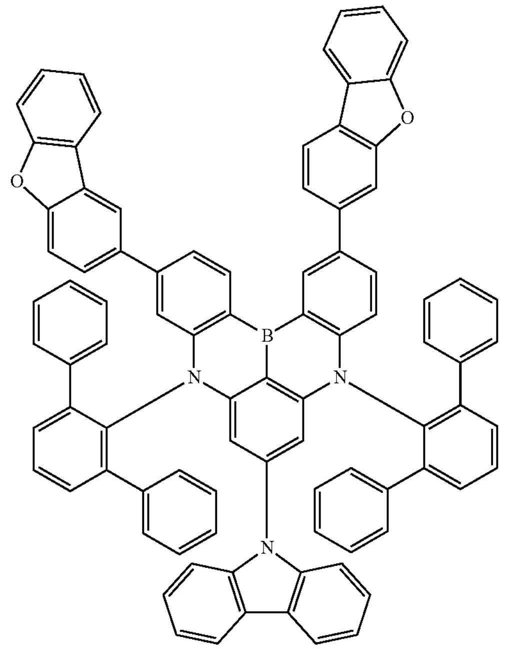
130
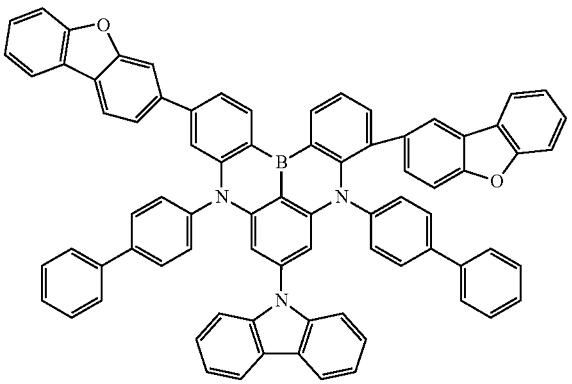
131
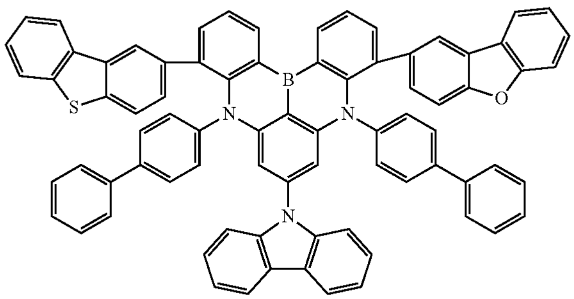

-continued
132
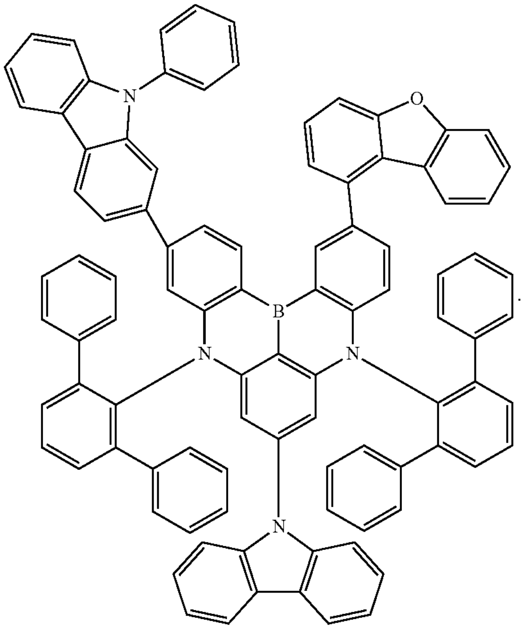
* * * * *